US012456687B2

(12) United States Patent
Said et al.

(10) Patent No.: US 12,456,687 B2
(45) Date of Patent: Oct. 28, 2025

(54) THREE-DIMENSIONAL MEMORY DEVICE WITH SOURCE LINE ISOLATION AND METHOD OF MAKING THE SAME

(71) Applicant: SANDISK TECHNOLOGIES LLC, Addison, TX (US)

(72) Inventors: Ramy Nashed Bassely Said, San Jose, CA (US); Jiahui Yuan, San Francisco, CA (US); Lito De La Rama, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 595 days.

(21) Appl. No.: 17/934,685

(22) Filed: Sep. 23, 2022

(65) Prior Publication Data

US 2024/0105623 A1 Mar. 28, 2024

(51) Int. Cl.

| | |
|---|---|
| ***H01L 23/535*** | (2006.01) |
| ***H01L 23/00*** | (2006.01) |
| ***H01L 25/00*** | (2006.01) |
| ***H01L 25/065*** | (2023.01) |
| ***H01L 25/18*** | (2023.01) |
| ***H10B 41/27*** | (2023.01) |
| ***H10B 41/41*** | (2023.01) |

(Continued)

(52) U.S. Cl.

CPC ............ *H01L 23/535* (2013.01); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H10B 41/41* (2023.02); *H10B 43/27* (2023.02); *H10B 43/40* (2023.02); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search

CPC . H01L 2224/08145; H01L 2224/80006; H01L 2224/80895; H01L 2224/80896; H01L 23/535; H01L 24/08; H01L 24/80; H01L 25/0657; H01L 25/18; H01L 25/50; H01L 2924/1431; H01L 2924/14511; H10B 41/27; H10B 41/41; H10B 43/27; H10B 43/40; H10B 43/50

See application file for complete search history.

(56) References Cited

U.S. PATENT DOCUMENTS

| | | |
|---|---|---|
| 10,629,616 B1 | 4/2020 | Kai et al. |
| 10,916,556 B1 | 2/2021 | Sakakibara et al. |

(Continued)

FOREIGN PATENT DOCUMENTS

| | | |
|---|---|---|
| WO | WO2022-108624 A1 | 5/2022 |

OTHER PUBLICATIONS

USPTO Office Communication, Notice of Allowance for U.S. Appl. No. 17/934,676, mailed May 20, 2025, 24 pages.

(Continued)

*Primary Examiner* — Telly D Green

(74) *Attorney, Agent, or Firm* — THE MARBURY LAW GROUP PLLC

(57) ABSTRACT

A memory device includes a horizontal source layer which is laterally separated into laterally isolated portions located in adjacent memory blocks by a dielectric backside trench fill structure or a source isolation dielectric structure.

14 Claims, 122 Drawing Sheets

(51) Int. Cl.

| | |
|---|---|
| ***H10B 43/27*** | (2023.01) |
| ***H10B 43/40*** | (2023.01) |

(56) References Cited

U.S. PATENT DOCUMENTS

| | | | | |
|---|---|---|---|---|
| 11,049,807 | B2 | 6/2021 | Li et al. | |
| 11,088,076 | B2 | 8/2021 | Okina | |
| 11,088,252 | B2 | 8/2021 | Kasai | |
| 11,101,289 | B1 | 8/2021 | Ueda et al. | |
| 11,114,462 | B1 | 9/2021 | Cui et al. | |
| 11,195,781 | B2 | 12/2021 | Okina et al. | |
| 11,201,107 | B2 | 12/2021 | Okina et al. | |
| 11,444,039 | B2 | 9/2022 | Oda et al. | |
| 11,450,624 | B2 | 9/2022 | Oda et al. | |
| 11,817,305 | B2 | 11/2023 | Kirby et al. | |
| 12,347,779 | B2 * | 7/2025 | Said | H10B 43/40 |
| 2017/0047334 | A1 | 2/2017 | Lu et al. | |
| 2017/0125430 | A1 | 5/2017 | Nishikawa et al. | |
| 2018/0097009 | A1 | 4/2018 | Zhang et al. | |
| 2018/0138193 | A1 | 5/2018 | Zhang et al. | |
| 2019/0096808 | A1 | 3/2019 | Tsutsumi et al. | |
| 2020/0258817 | A1 | 8/2020 | Okina et al. | |
| 2020/0312859 | A1 | 10/2020 | Otsu et al. | |
| 2020/0312863 | A1 | 10/2020 | Iwai et al. | |
| 2021/0035965 | A1 | 2/2021 | Mizutani et al. | |
| 2021/0091063 | A1 | 3/2021 | Ninomiya et al. | |
| 2021/0175242 | A1 | 6/2021 | Kim | |
| 2021/0265385 | A1 | 8/2021 | Rajashekhar et al. | |
| 2021/0327897 | A1 | 10/2021 | Kasai et al. | |
| 2021/0351109 | A1 | 11/2021 | Sato et al. | |
| 2021/0375790 | A1 | 12/2021 | Oda et al. | |
| 2021/0375791 | A1 | 12/2021 | Oda et al. | |
| 2022/0130853 | A1 | 4/2022 | Sharangpani et al. | |
| 2022/0157841 | A1 | 5/2022 | Tsutsumi et al. | |
| 2022/0157842 | A1 | 5/2022 | Tsutsumi et al. | |
| 2022/0181283 | A1 | 6/2022 | Hosoda et al. | |
| 2022/0181343 | A1 | 6/2022 | Hosoda et al. | |
| 2022/0189984 | A1 | 6/2022 | Okina | |
| 2022/0285387 | A1 | 9/2022 | Hinoue et al. | |
| 2022/0285388 | A1 | 9/2022 | Cui et al. | |
| 2023/0042438 | A1 | 2/2023 | Hou et al. | |
| 2024/0105622 | A1 | 3/2024 | Said et al. | |

OTHER PUBLICATIONS

Endoh et al., "Novel Ultra High-Density Memory with a Stacked-Surrounding Gate Transistor (S-SGT) Structured Cell," IEDM Proc. (2001) 33-36.

Varadarajan, B., "SPARC: A Novel Technology for Depositing Conformal Dielectric Thin Films with Compositional Tuning for Etch Selectivity", Proc. SPIE 10963, Advanced Etch Technology for Nanopatterning VIII, 1096307 (Mar. 20, 2019); https://doi.org/10.1117/12.2517407.

U.S. Appl. No. 17/134,997, filed Dec. 28, 2020, SanDisk Technologies LLC.

U.S. Appl. No. 17/232,209, filed Apr. 16, 2021, SanDisk Technologies LLC.

U.S. Appl. No. 17/577,533, filed Jan. 18, 2022, SanDisk Technologies LLC.

U.S. Appl. No. 17/655,272, filed Mar. 17, 2022, SanDisk Technologies LLC.

U.S. Appl. No. 17/684,975, filed Mar. 2, 2022, SanDisk Technologies LLC.

U.S. Appl. No. 17/716,698, filed Apr. 8, 2022, SanDisk Technologies LLC.

U.S. Appl. No. 17/931,362, filed Sep. 12, 2022, SanDisk Technologies LLC.

Said, R.N.B. et al., "Three-Dimensional Memory Device with Source Line Isolation And Method of Making the Same," U.S. Appl. No. 17/934,676, filed Sep. 23, 2022.

IPRP-WO—Notification Concerning Transmittal of International Preliminary Report on Patentability and Written Opinion of the International Searching Authority for International Patent Application No. PCT/US2023/026782, mailed Apr. 3, 2025, 13 pages.

ISR—Notification of Transmittal of The International Search Report and Written Opinion of the International Searching Authority for International Patent Application No. PCT/US2023/026782, mailed Oct. 25, 2023, 16 pages.

* cited by examiner

THREE-DIMENSIONAL MEMORY DEVICE WITH SOURCE LINE ISOLATION AND METHOD OF MAKING THE SAME

FIELD

The present disclosure relates generally to the field of semiconductor devices, and particular to a three-dimensional memory device including source lines that are laterally electrically isolated by source line isolation structures and methods of manufacturing the same.

BACKGROUND

Three-dimensional vertical NAND strings having one bit per cell are disclosed in an article by T. Endoh et al., titled "Novel Ultra High-Density Memory With A Stacked-Surrounding Gate Transistor (S-SGT) Structured Cell", IEDM Proc. (2001) 33-36.

SUMMARY

According to an aspect of the present disclosure, a memory device comprises a source layer comprising at least one doped semiconductor material, alternating stacks of insulating layers and electrically conductive layers located over the source layer, extending along a first horizontal direction and laterally spaced apart from each other along the second horizontal direction by backside trenches, wherein the backside trenches comprise at least one first backside trench containing with a respective backside contact via structure comprising an electrically conductive material contacting the source layer, and at least one second backside trench containing a respective dielectric trench fill structure which extends from above the topmost surfaces of the alternating stacks to at least a bottom surface of the source layer, memory openings, wherein each of the memory openings vertically extends through a respective one of the alternating stacks, and memory opening fill structures located in the memory openings and comprising a respective vertical stack of memory elements and a respective vertical semiconductor channel.

According to another aspect of the present disclosure, a method of forming a memory device is provided, which comprises: forming a vertically alternating sequence of continuous insulating layers and continuous sacrificial material layers over a substrate; forming memory openings through the vertically alternating sequence; forming memory opening fill structures in the memory openings, wherein each of the memory opening fill structures comprises a respective vertical stack of memory elements and a respective vertical semiconductor channel; dividing the vertically alternating sequence into alternating stacks of insulating layers and sacrificial material layers by forming backside trenches that laterally extend along a first horizontal direction and laterally spaced apart along a second horizontal direction; replacing the sacrificial material layers with electrically conductive layers to form alternating stacks of insulating layers and electrically conductive layers which are laterally spaced apart from each other by the backside trenches; vertically extending a second subset of the backside trenches without vertically extending a first subset of the backside trenches; forming dielectric trench fill structures in the second subset of the backside trenches; and forming backside trench fill structures in a first subset of the backside trenches, wherein each of the backside trench fill structures comprises a respective backside insulating spacer and a respective backside contact via structure.

According to yet another aspect of the present disclosure, a memory device comprises a source layer comprising at least one doped semiconductor material, a source isolation dielectric structure laterally extending along a first horizontal direction and laterally separating the source layer into first source layer portion and a second source layer portion which is electrically isolated from the first source layer portion, alternating stacks of insulating layers and electrically conductive layers located over the source layer, extending along the first horizontal direction and laterally spaced apart from each other along the second horizontal direction by at least one first backside trench that is filled with a respective first backside trench fill structure that comprises a respective first backside contact via structure contacting the source layer, and at least one second backside trench that is filled with a respective second backside trench fill structure that comprises a respective second dummy backside contact via structure contacting the source isolation dielectric structure, memory openings, wherein each of the memory openings vertically extends through a respective one of the alternating stacks, and memory opening fill structures located in the memory openings and comprising a respective vertical stack of memory elements and a respective vertical semiconductor channel, wherein a sidewall of the respective vertical semiconductor channel is in contact with the source layer.

According to still another aspect of the present disclosure, a method of forming a memory device comprises forming a laterally alternating sequence of in-process source-level material layers and source isolation dielectric structures over a substrate, forming a vertically alternating sequence of continuous insulating layers and continuous sacrificial material layers over the laterally alternating sequence, forming memory openings through the vertically alternating sequence, forming memory opening fill structures in the memory openings, wherein each of the memory opening fill structures comprises a respective vertical stack of memory elements and a respective vertical semiconductor channel, forming backside trenches through the vertically alternating sequence to divide the vertically alternating sequence into alternating stacks of insulating layers and sacrificial material layers, replacing a sacrificial source layer within each of the in-process source-level material layers with a respective source contact layer to convert the in-process source-level material layers into source-level material layers, replacing the sacrificial material layers with electrically conductive layers to form alternating stacks of insulating layers and electrically conductive layers that are laterally spaced apart from each other by the backside trenches, and forming backside trench fill structures in the backside trenches.

According to still yet another aspect of the present disclosure, a method of forming a memory device comprises forming in-process source-level material layers over a substrate, forming a vertically alternating sequence of continuous insulating layers and continuous sacrificial material layers over the in-process source-level material layers, forming memory openings through the vertically alternating sequence, forming memory opening fill structures in the memory openings, wherein each of the memory opening fill structures comprises a respective vertical stack of memory elements and a respective vertical semiconductor channel, forming backside trenches through the vertically alternating sequence to divide the vertically alternating sequence into alternating stacks of insulating layers and sacrificial material layers, replacing a sacrificial source layer within the in-process source-level material layers with a source contact layer to convert the in-process source-level material layers into continuous source-level material layers, replacing the sacrificial material layers with electrically conductive layers to form alternating stacks of insulating layers and electrically conductive layers that are laterally spaced apart from each other by the backside trenches, forming backside trench fill structures in the backside trenches, removing at least a backside portion of the substrate, and dividing the continuous source-level material layers into a plurality of source-level material layers by forming source isolation trenches through the continuous source-level material layers.

DETAILED DESCRIPTION

Figure 1A:
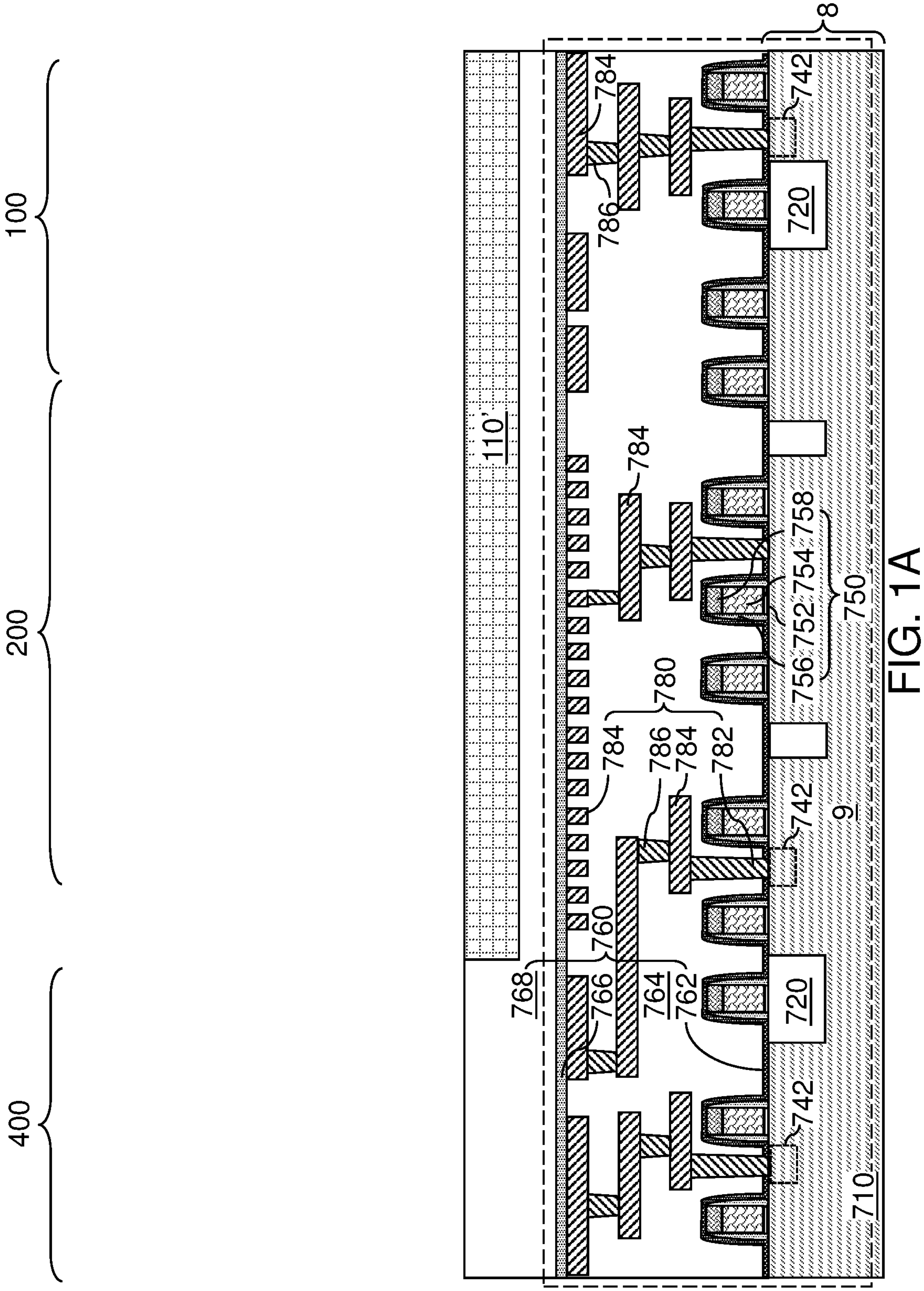
FIG. 1A is a vertical cross-sectional view of a first exemplary structure after formation of semiconductor devices, lower level dielectric layers, lower-level metal interconnect structures, and in-process source-level material layers according to a first embodiment of the present disclosure.

The embodiments of the present disclosure are directed to a three-dimensional memory device including source lines that are laterally electrically isolated by source line isolation structures and methods of manufacturing the same, the various aspects of which are described in detail herebelow.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. As used herein, a first element located “on” a second element may be located on the exterior side of a surface of the second element or on the interior side of the second element. As used herein, a first element is located “directly on” a second element if there exist a physical contact between a surface of the first element and a surface of the second element. As used herein, a first element is “electrically connected to” a second element if there exists a conductive path consisting of at least one conductive material between the first element and the second element. As used herein, a “prototype” structure or an “in-process” structure refers to a transient structure that is subsequently modified in the shape or composition of at least one component therein.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are “vertically coincident” with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming A page is also the smallest unit that may be selected to a read operation.

Figure 1B:
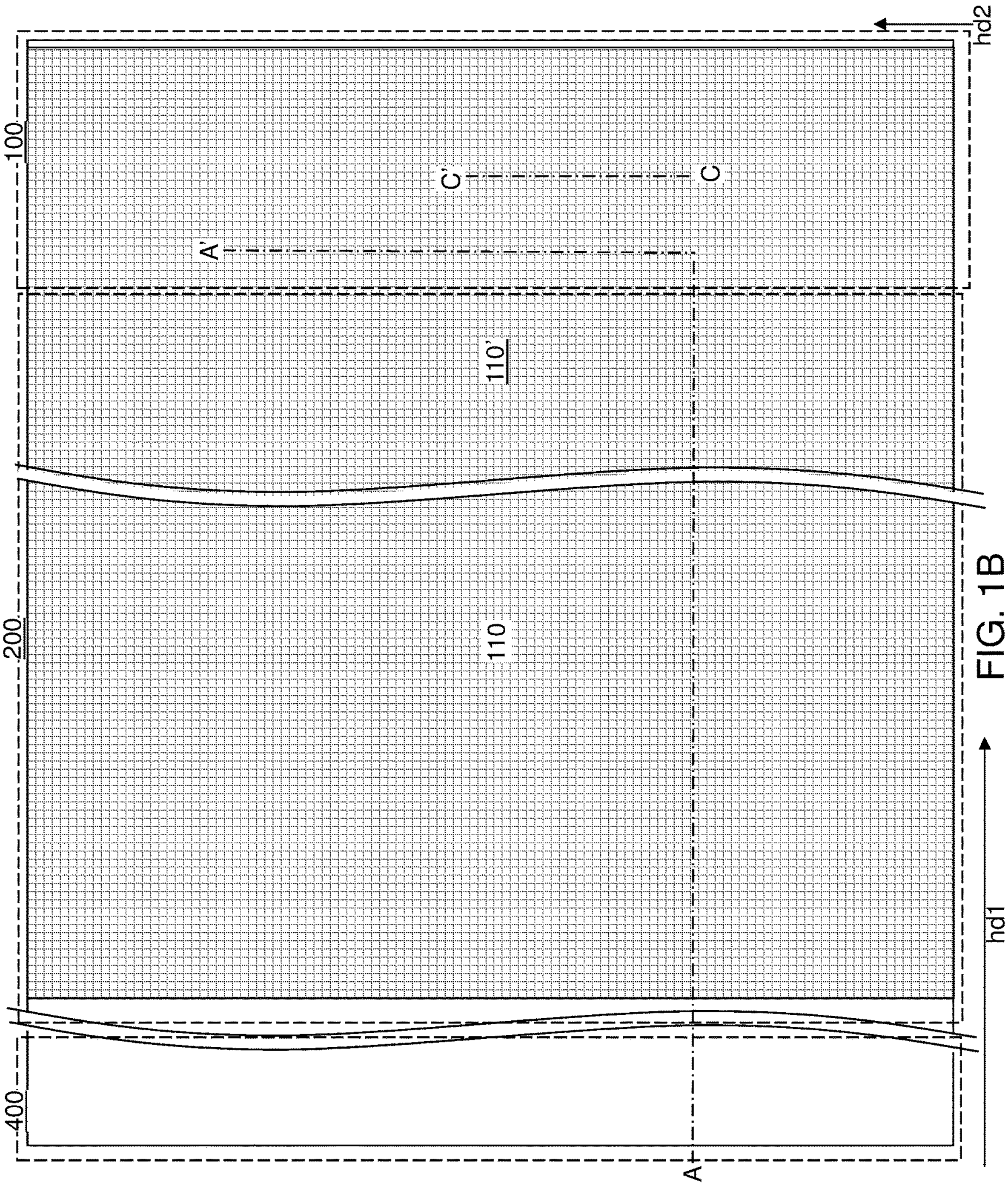
FIG. 1B is a top-down view of the first exemplary structure of FIG. 1A. The vertical plane A-A' is the plane of the vertical cross-sectional view of FIG. 1A.
Figure 1C:
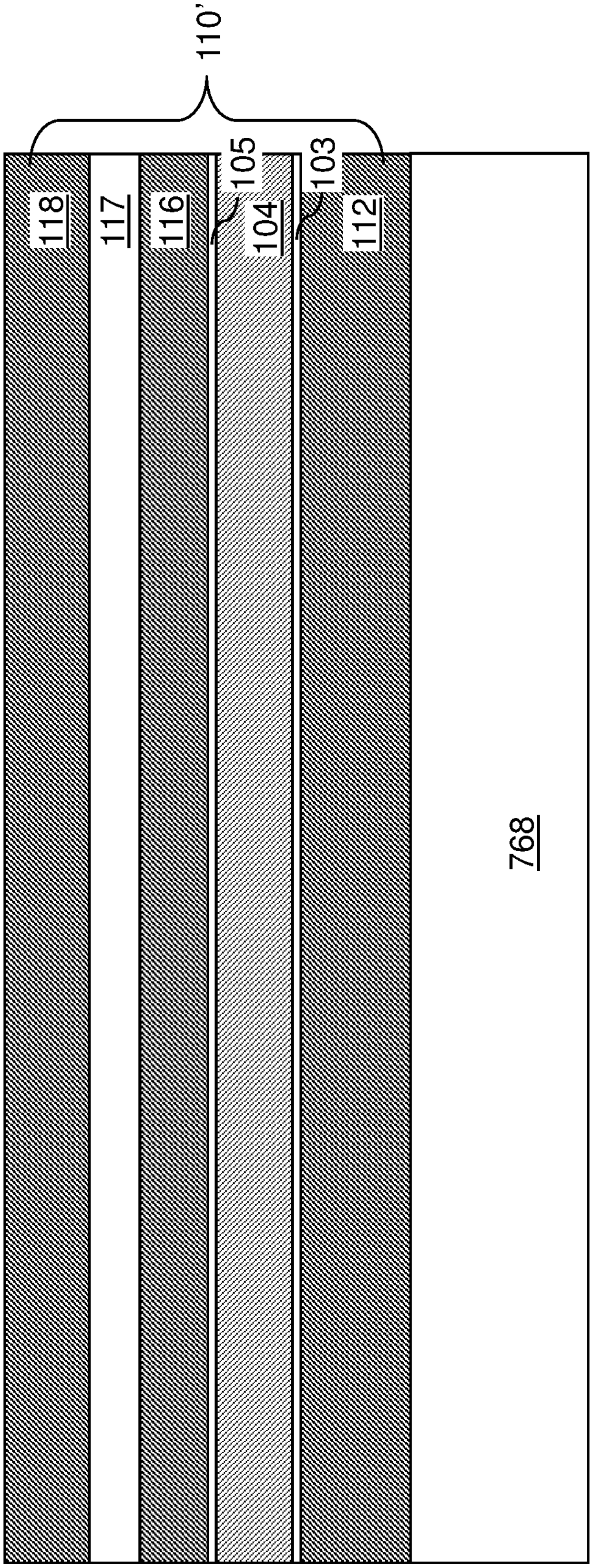
FIG. 1C is a vertical cross-sectional view of the first exemplary structure along the vertical plane C-C' of FIG. 1B.

Referring to FIGS. 1A-1C, a first exemplary structure according to a first embodiment of the present disclosure is illustrated. The first exemplary structure includes a semiconductor substrate 8 and a peripheral circuitry 710 formed thereupon. The first exemplary structure includes a memory array region 100 in which a three-dimensional memory array is to be subsequently formed, a staircase region 200 in which stepped surfaces of electrically conductive layers and contact via structures are to be subsequently formed, and a connection region 400 in which peripheral contact via structures are to be subsequently formed.

The semiconductor substrate 8 includes a substrate semiconductor layer 9 at least at an upper portion thereof. Various doped wells can be formed in upper portions of the substrate semiconductor layer 9. Shallow trench isolation structures 720 can be formed in an upper portion of the substrate semiconductor layer 9 to provide electrical isolation among the semiconductor devices. The peripheral circuitry 710 includes field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758.

The peripheral circuitry 710 can include additional semiconductor devices in addition to p-type field effect transistors and n-type field effect transistors, which can be employed to support operation of a memory structure to be subsequently formed. The peripheral circuitry 710 includes a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, and lower-level metal via structures 786. A subset of the lower-level metal line structures 784 and/or the lower-level metal via structures 786 may be configured to function as landing pads for through-memory-level contact via structures to be subsequently formed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one second dielectric material layer 768 can comprise, or consist essentially of, dielectric material layers having dielectric constants that do not exceed the dielectric constant of undoped silicate glass (silicon oxide) of 3.9.

The peripheral circuitry 710 can include peripheral devices for the memory-level assembly to be subsequently formed. The lower-level metal interconnect structures 780 are embedded in the lower-level dielectric layers 760. The combination of the lower-level dielectric layers 760 and the lower-level metal interconnect structures 780 overlie the peripheral circuitry 710.

The lower-level metal interconnect structures 780 can be electrically connected to active nodes (e.g., transistor active regions 742 or gate electrodes 754) of the peripheral circuitry 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed.

In-process source-level material layers 110' including a layer stack of material layers can be formed over lower-level dielectric layers 760. The in-process source-level material layers 110' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 110' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The doped semiconductor material of the lower source-level material layer 112 is herein referred to as a first doped semiconductor material, and the doped semiconductor material of the upper source-level material layer 116 is herein referred to as a second doped semiconductor material, which may be the same or different from the first doped semiconductor material. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a dielectric material such as silicon nitride, or a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 110' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The in-process source-level material layers 110' may be patterned to provide openings in areas in which through-memory-level contact via structures and through-dielectric contact via structures are to be subsequently formed. Patterned portions of the in-process source-level material layers 110' are present in each memory array region 100 in which three-dimensional memory stack structures are to be subsequently formed. The at least one second dielectric material layer 768 can include a blanket layer portion underlying the in-process source-level material layers 110' and a patterned portion that fills gaps among the patterned portions of the in-process source-level material layers 1110'.

The in-process source-level material layers 110' can be patterned such that an opening extends over a staircase region 200 in which contact via structures contacting word line electrically conductive layers are to be subsequently formed. In one embodiment, the staircase region 200 can be laterally spaced from the memory array region 100 along a first horizontal direction hd1. A horizontal direction that is perpendicular to the first horizontal direction hd1 is herein referred to as a second horizontal direction hd2.

Figure 2:
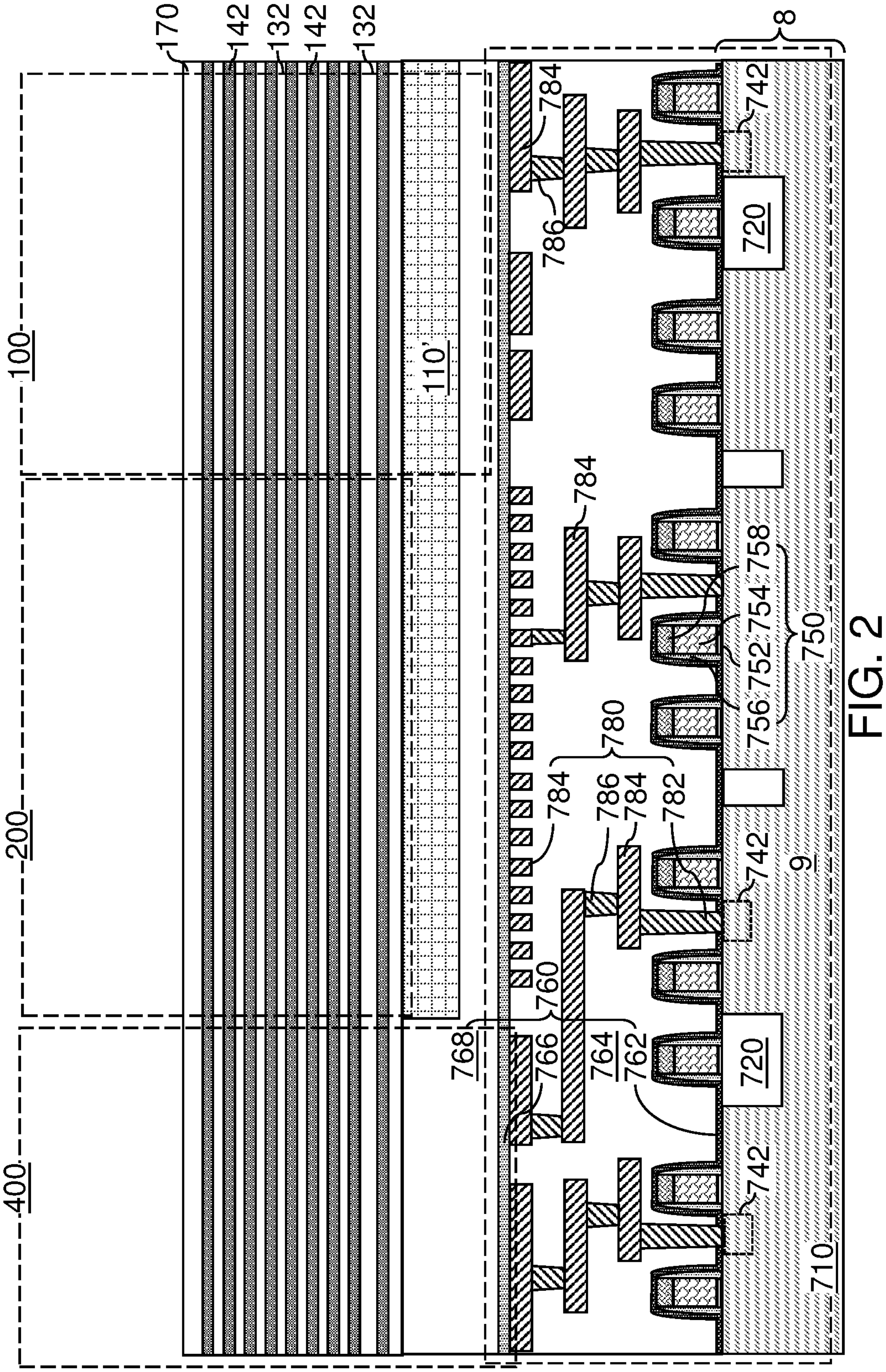
FIG. 2 is a vertical cross-sectional view of the first exemplary structure after formation of a first vertically alternating sequence of first insulating layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first vertically alternating sequence. The level of the first vertically alternating sequence is herein referred to as a first-tier level, and the level of the alternating stack to be subsequently formed immediately above the first-tier level is herein referred to as a second-tier level, etc.

The first vertically alternating sequence can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first vertically alternating sequence (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first vertically alternating sequence (132, 142) can have a uniform thickness that is substantially invariant within each respective first sacrificial material layer 142.

A first insulating cap layer 170 is subsequently formed over the alternating stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
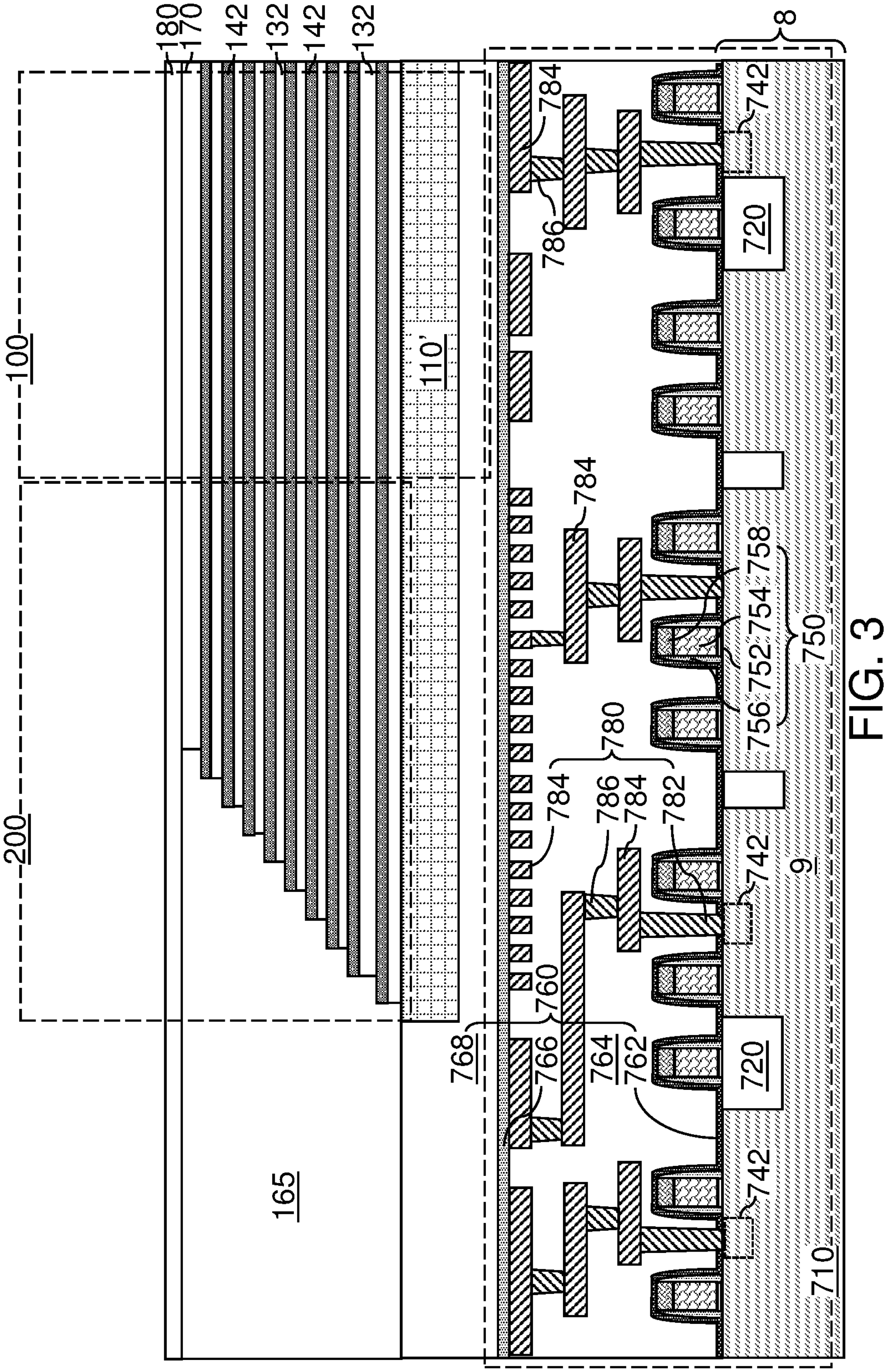
FIG. 3 is a vertical cross-sectional view of the first exemplary structure after patterning first stepped surfaces, a first retro-stepped dielectric material portion, and an inter-tier dielectric layer according to the first embodiment of the present disclosure.

Referring to FIG. 3, the first insulating cap layer 170 and the first vertically alternating sequence (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 4A:
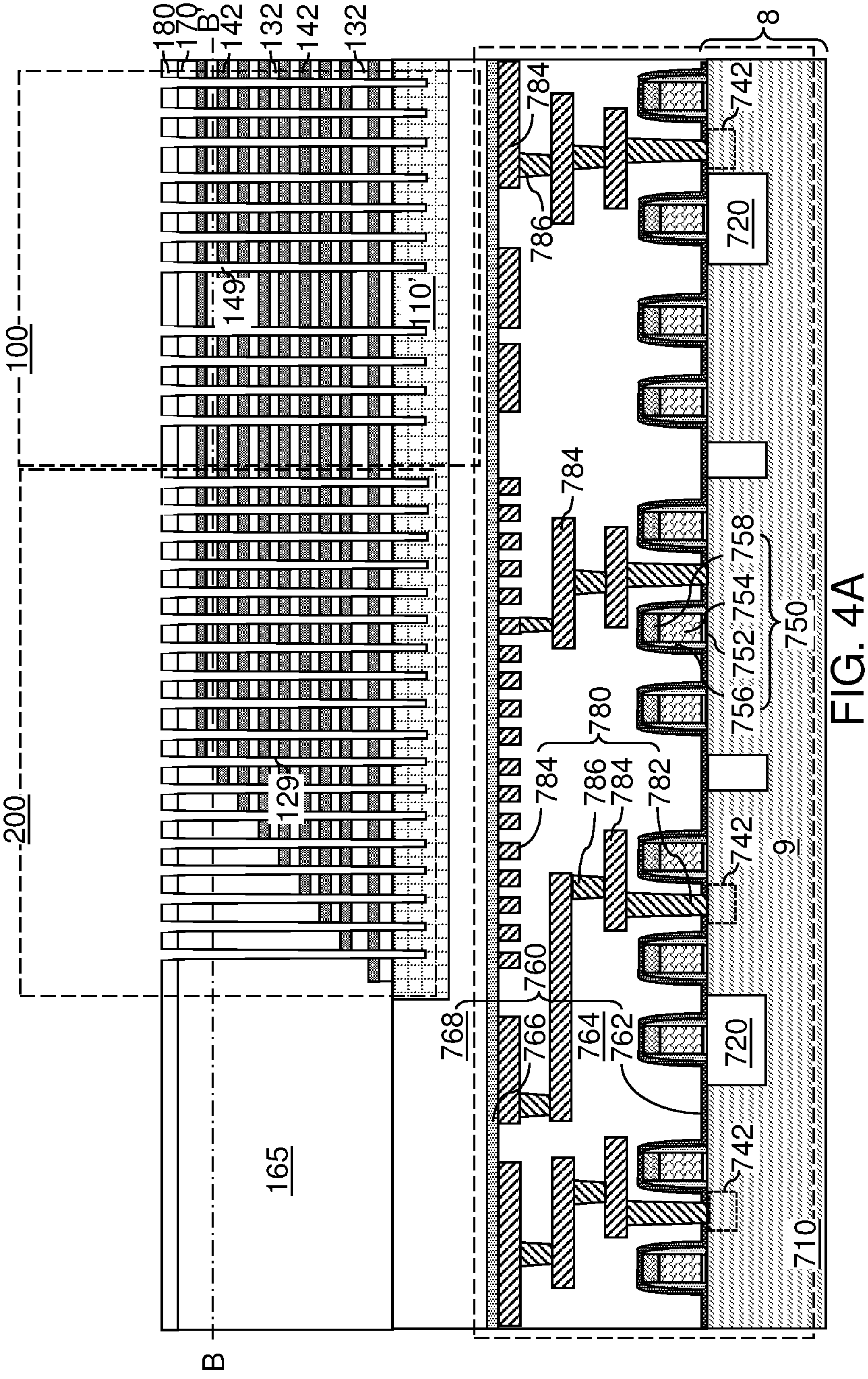
FIG. 4A is a vertical cross-sectional view of the first exemplary structure after formation of first-tier memory openings and first-tier support openings according to the first embodiment of the present disclosure.
Figure 4B:
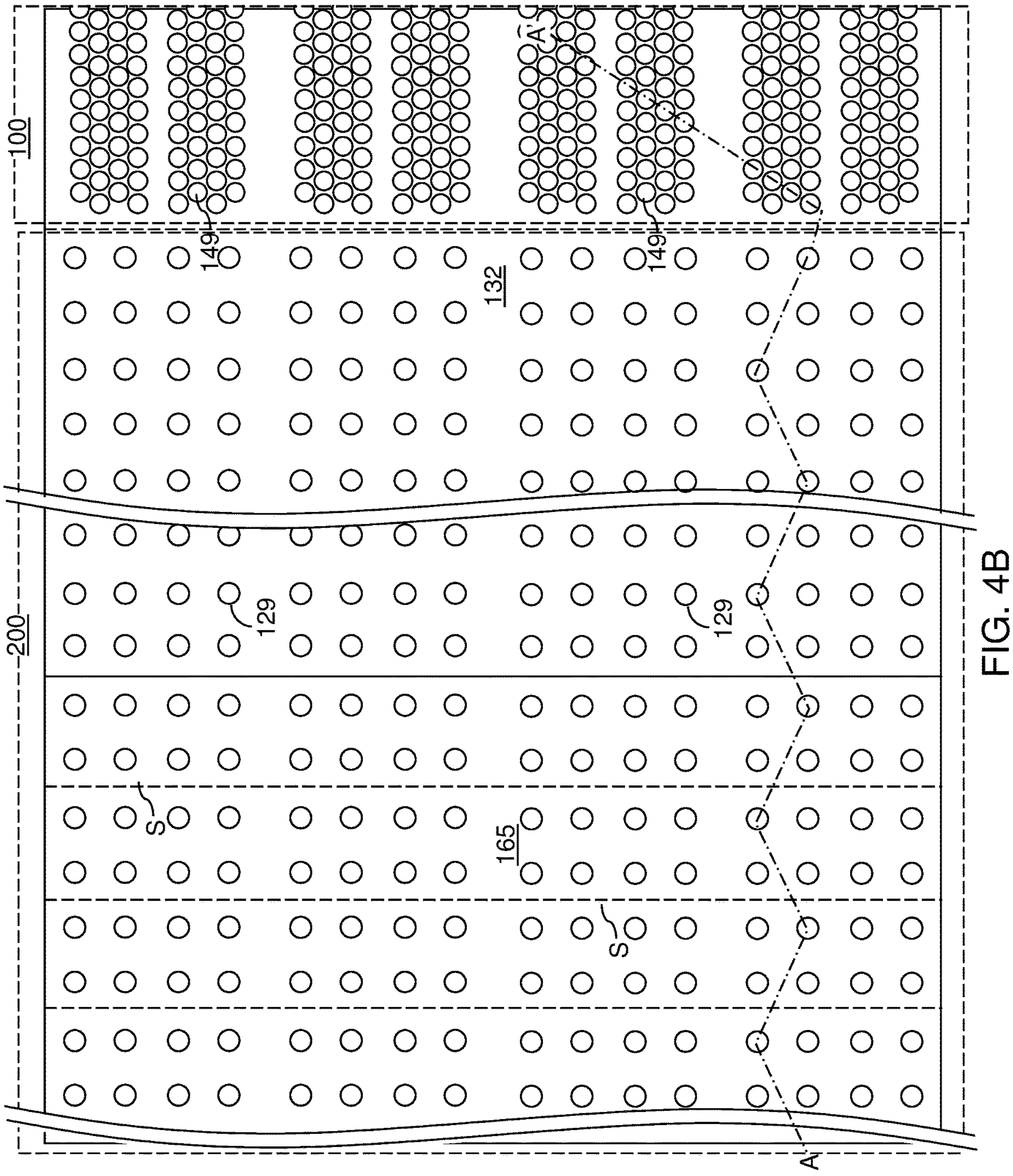
FIG. 4B is a top-down view of the first exemplary structure of FIG. 4A. The zig-zag vertical plane A-A' corresponds to the plane of the vertical cross-sectional view of FIG. 4A.

Referring to FIGS. 4A and 4B, first-tier openings (149, 129) can be formed through the inter-tier dielectric layer 180 and the first-tier structure (132, 142, 170, 165) and partly through the in-process source-level material layers 110'. For example, a photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and partly through the in-process source-level material layers 110' by a first anisotropic etch process to form the first-tier openings (149, 129) concurrently, i.e., during the first anisotropic etch process.

The first-tier openings (149, 129) can include first-tier memory openings 149 and first-tier support openings 129. The first-tier memory openings 149 are openings that are formed in the memory array region 100 through each layer within the first alternating stack (132, 142) and are subsequently employed to form memory stack structures therein. In one embodiment, the bottom surfaces of the first-tier openings (149, 129) can be a recessed surface of the source-level sacrificial layer 104. Thus, each first-tier opening (149, 129) can have a bottom surface between a horizontal plane including the bottom surface of the source-level sacrificial layer 104 and a horizontal plane including the top surface of the source-level sacrificial layer 104. In another embodiment, bottom surface of the first-tier openings (149, 129) may be formed within the lower source-level material layer 112.

The first-tier support openings 129 are openings that are formed in the staircase region 200 and are subsequently employed to form support structures that are subsequently employed to provide structural support to the first exemplary structure during replacement of sacrificial material layers with electrically conductive layers. In case the first spacer materials are formed as first electrically conductive layers, the first-tier support openings 129 can be omitted. A subset of the first-tier support openings 129 can be formed through horizontal surfaces of the first stepped surfaces of the first alternating stack (132, 142).

In one embodiment, the first-tier memory openings 149 can be formed as clusters that are laterally spaced among one another along the second horizontal direction hd2. Each cluster of first-tier memory openings 149 can include a respective two-dimensional array of first-tier memory openings 149 having a first pitch along one horizontal direction and a second pitch along another horizontal direction. In one embodiment, the direction of the first memory structure pitch can be the first horizontal direction (e.g., word line direction) hd1 and the direction of the second memory structure pitch can be the second horizontal direction (e.g., bit line direction) hd2, or vice versa.

The inter-tier dielectric layer 180 can comprise a dielectric material (such as borosilicate glass) having a greater etch rate than the first insulating layers 132 (that can include undoped silicate glass). In one embodiment, the bottom surface of each first-tier memory opening 149 can be formed between the top surface and the bottom surface of the source-level sacrificial layer 104. In this case, surfaces of the source-level sacrificial layer 104 can be exposed at a bottom portion of each first-tier memory opening 149. Locations of steps S in the first vertically alternating sequence (132, 142) are illustrated as dotted lines in FIG. 4B.

Figure 5:
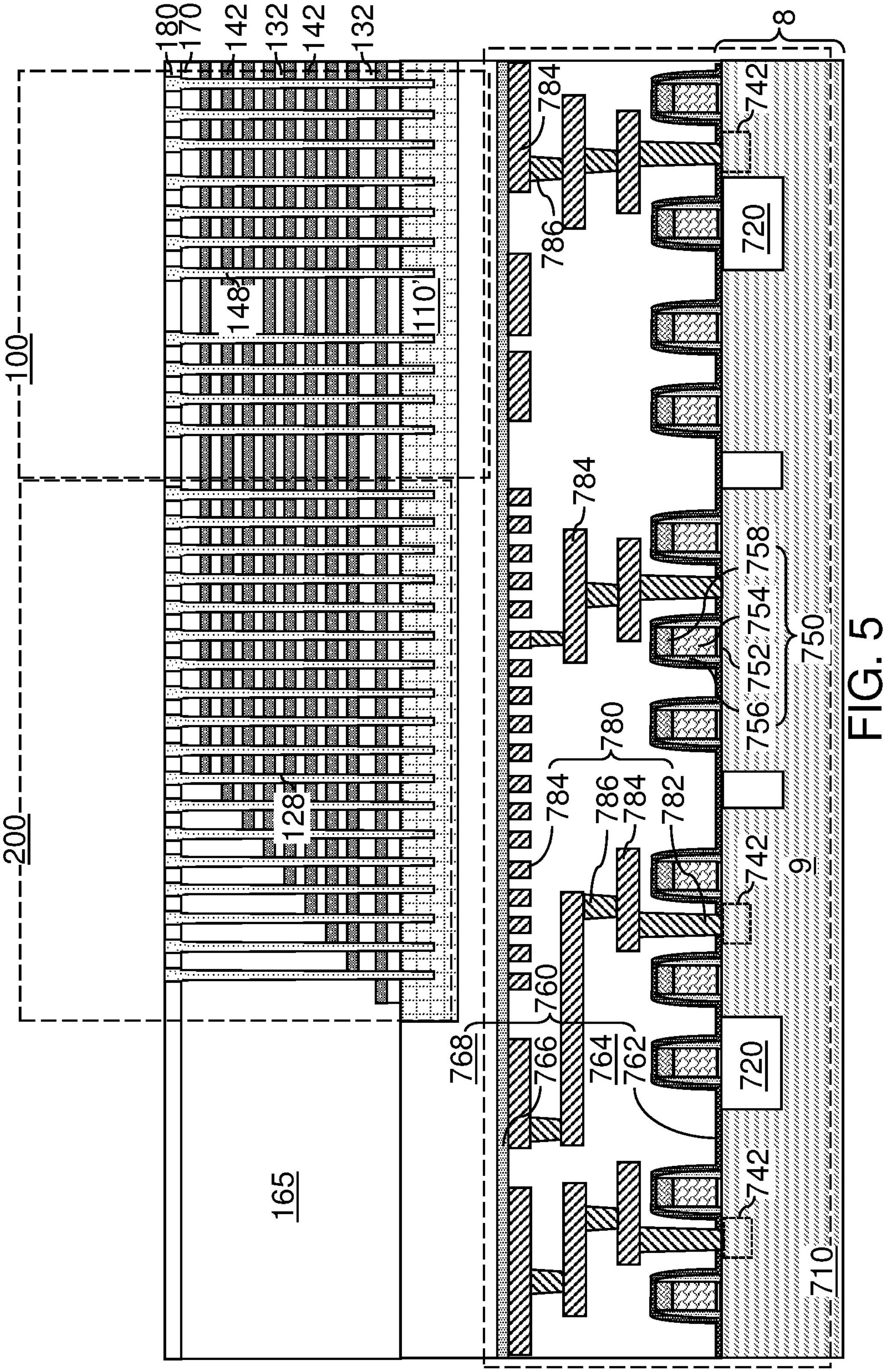
FIG. 5 is a vertical cross-sectional view of the first exemplary structure after formation of sacrificial memory opening fill portions and first-tier support opening fill portions according to the first embodiment of the present disclosure.

Referring to FIG. 5, sacrificial first-tier opening fill portions (148, 128) can be formed in the first-tier openings (149, 129). For example, a sacrificial fill material is deposited concurrently deposited in each of the first-tier openings (149, 129). The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial fill material may be formed by a non-conformal deposition or a conformal deposition method.

In another embodiment, the sacrificial fill material can include a silicon oxide material having a higher etch rate than the materials of the first insulating layers 132, the first insulating cap layer 170, and the inter-tier insulating layer 180. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be employed prior to depositing the sacrificial first-tier fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the topmost layer of the first vertically alternating sequence (132, 142), such as from above the inter-tier dielectric layer 180. For example, the sacrificial fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the sacrificial fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 6:
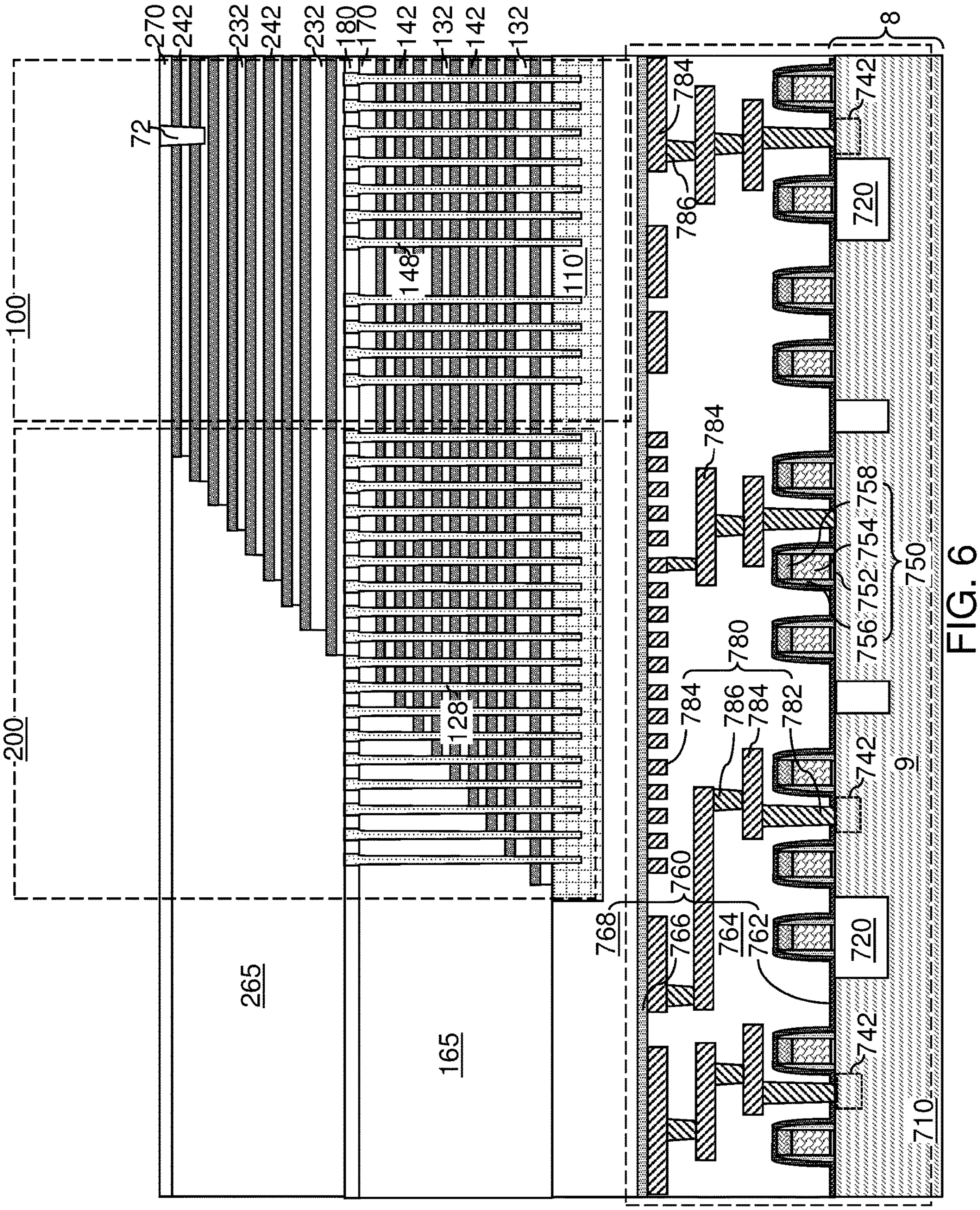
FIG. 6 is a vertical cross-sectional view of the first exemplary structure after formation of a second vertically alternating sequence of second insulating layers and second spacer material layers, second stepped surfaces, a second retro-stepped dielectric material portion, and drain-select-level isolation structures according to the first embodiment of the present disclosure.

Referring to FIG. 6, a second-tier structure can be formed over the first-tier structure (132, 142, 170, 165, 148, 128). The second-tier structure can include an additional vertically alternating sequence of additional insulating layers and additional spacer material layers, which can be additional sacrificial material layers. The second vertically alternating sequence is also referred to as a second alternating stack. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces can be formed in the second stepped area of the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242) and the second retro-stepped dielectric material portion 265. The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Optionally, drain-select-level isolation structures 72 can be formed through the second insulating cap layer 270 and through a subset of layers in an upper portion of the second vertically alternating sequence (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

In general, at least one vertically alternating sequence of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242). Each of the insulating layers (132, 232) and spacer material layers (such as sacrificial material layers (142, 242) can be formed as a respective single continuous material layer. In this case, the insulating layers (132, 232) may be referred to as continuous insulating layers, and the spacer material layers may be referred to as continuous spacer material layers (such as continuous sacrificial material layers).

Figure 7A:
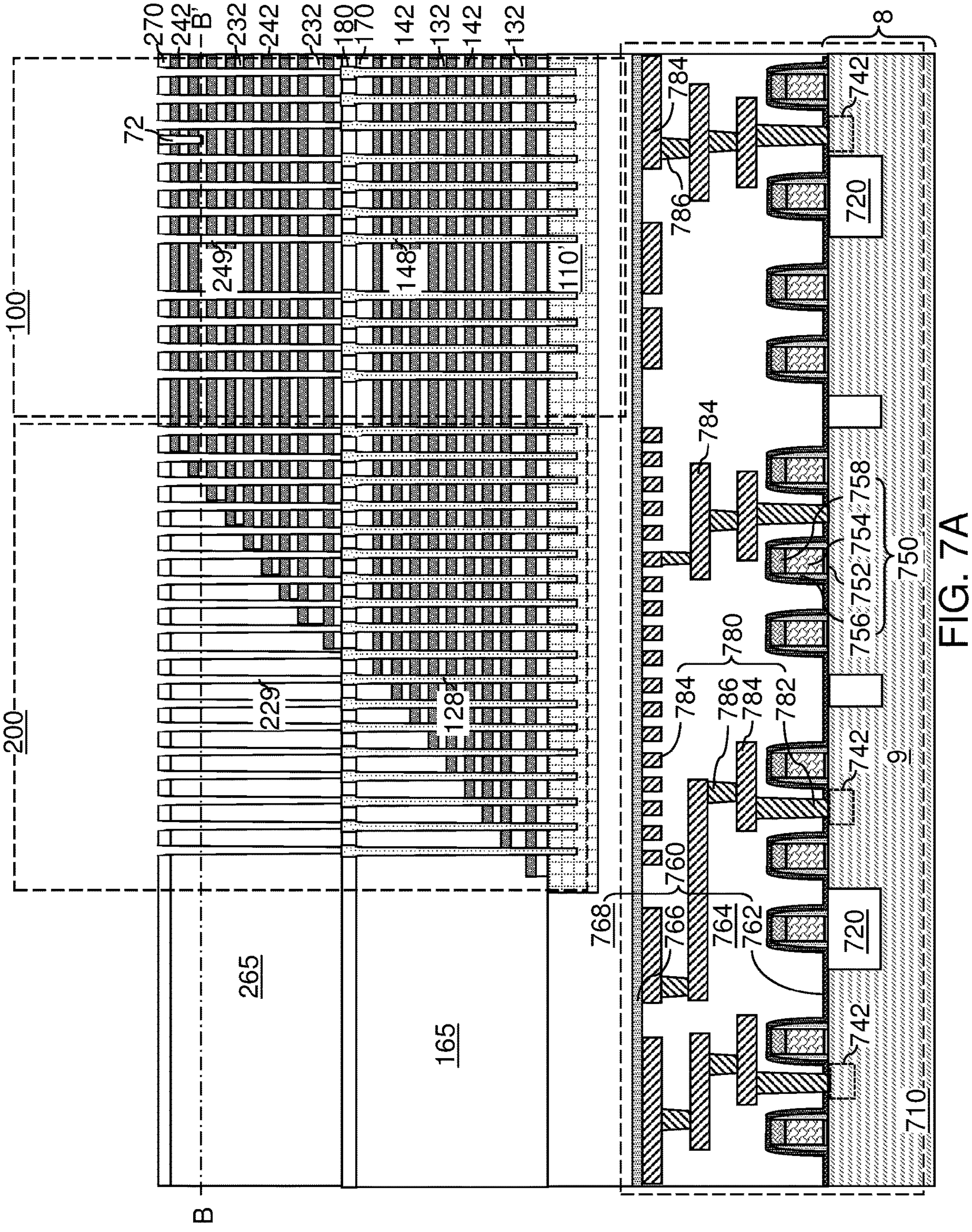
FIG. 7A is a vertical cross-sectional view of the first exemplary structure after formation of second-tier memory openings and second-tier support openings according to the first embodiment of the present disclosure.
Figure 7B:
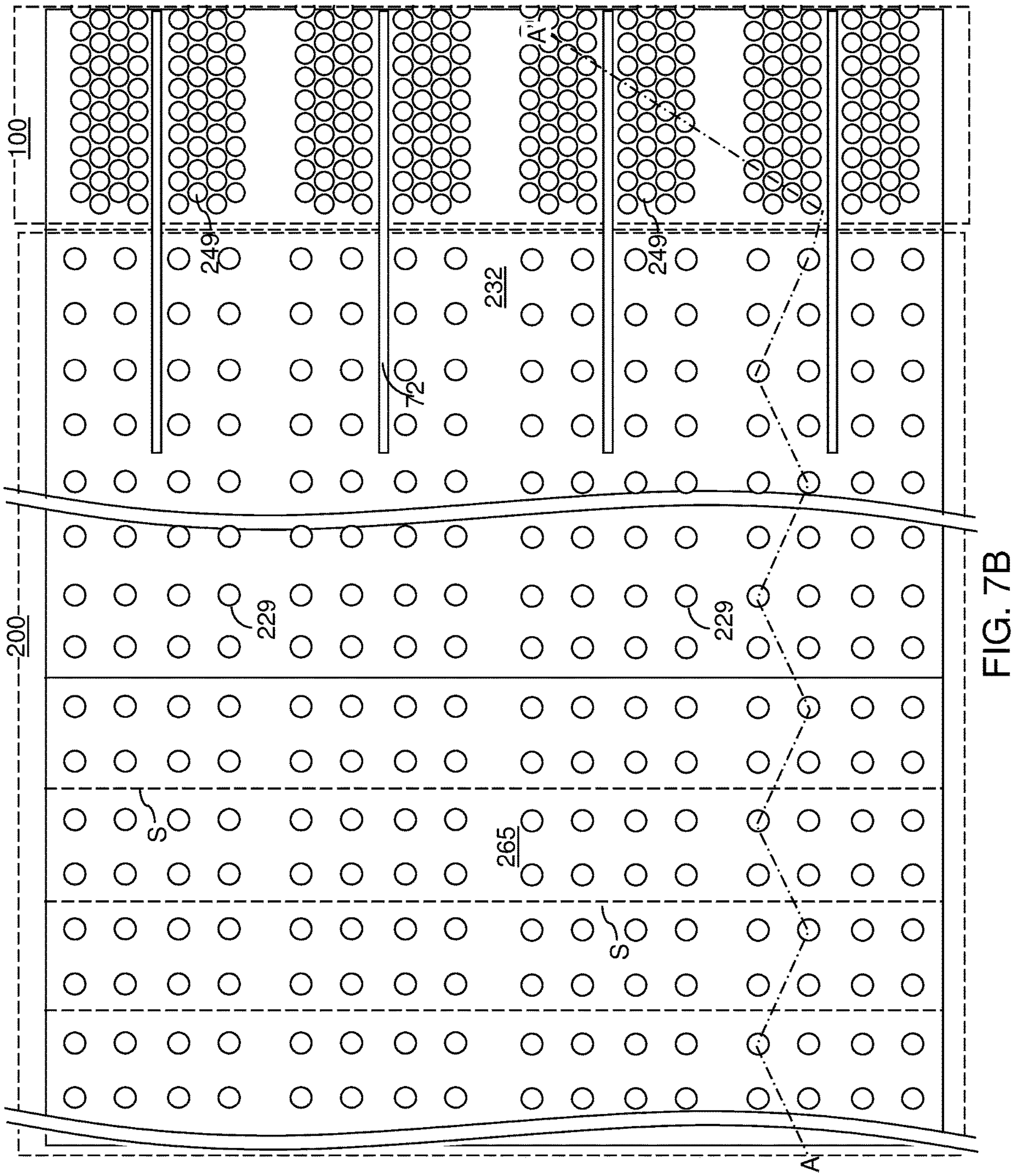
FIG. 7B is a horizontal cross-sectional of the first exemplary structure along the horizontal plane B-B' of FIG. 7A. The zig-zag vertical plane A-A' corresponds to the plane of the vertical cross-sectional view of FIG. 7A.

Referring to FIGS. 7A and 7B, second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask employed to pattern the first-tier openings (149, 129) can be employed to pattern the photoresist layer.

The pattern of openings in the photoresist layer can be transferred through the second-tier structure (232, 242, 265, 270, 72) by a second anisotropic etch process to form second-tier openings (249, 229) concurrently, i.e., during the second anisotropic etch process. The second-tier openings (249, 229) can include second-tier memory openings 249 and second-tier support openings.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Locations of steps S in the first vertically alternating sequence (132, 142) and the second vertically alternating sequence (232, 242) are illustrated as dotted lines in FIG. 7B.

Figure 8A:
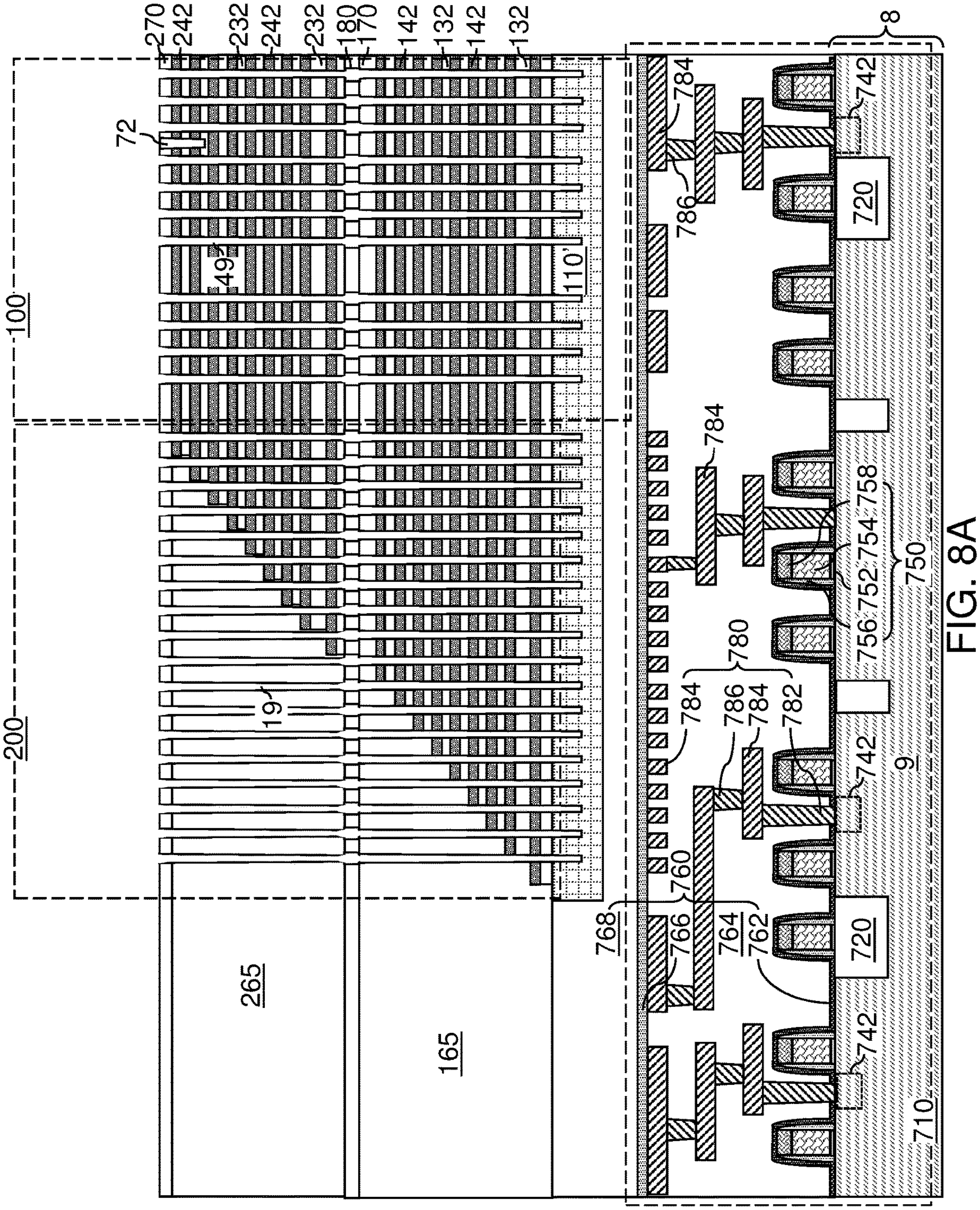
FIG. 8A is a vertical cross-sectional view of the first exemplary structure after formation of inter-tier memory openings and inter-tier support openings according to the first embodiment of the present disclosure.
Figure 8B:
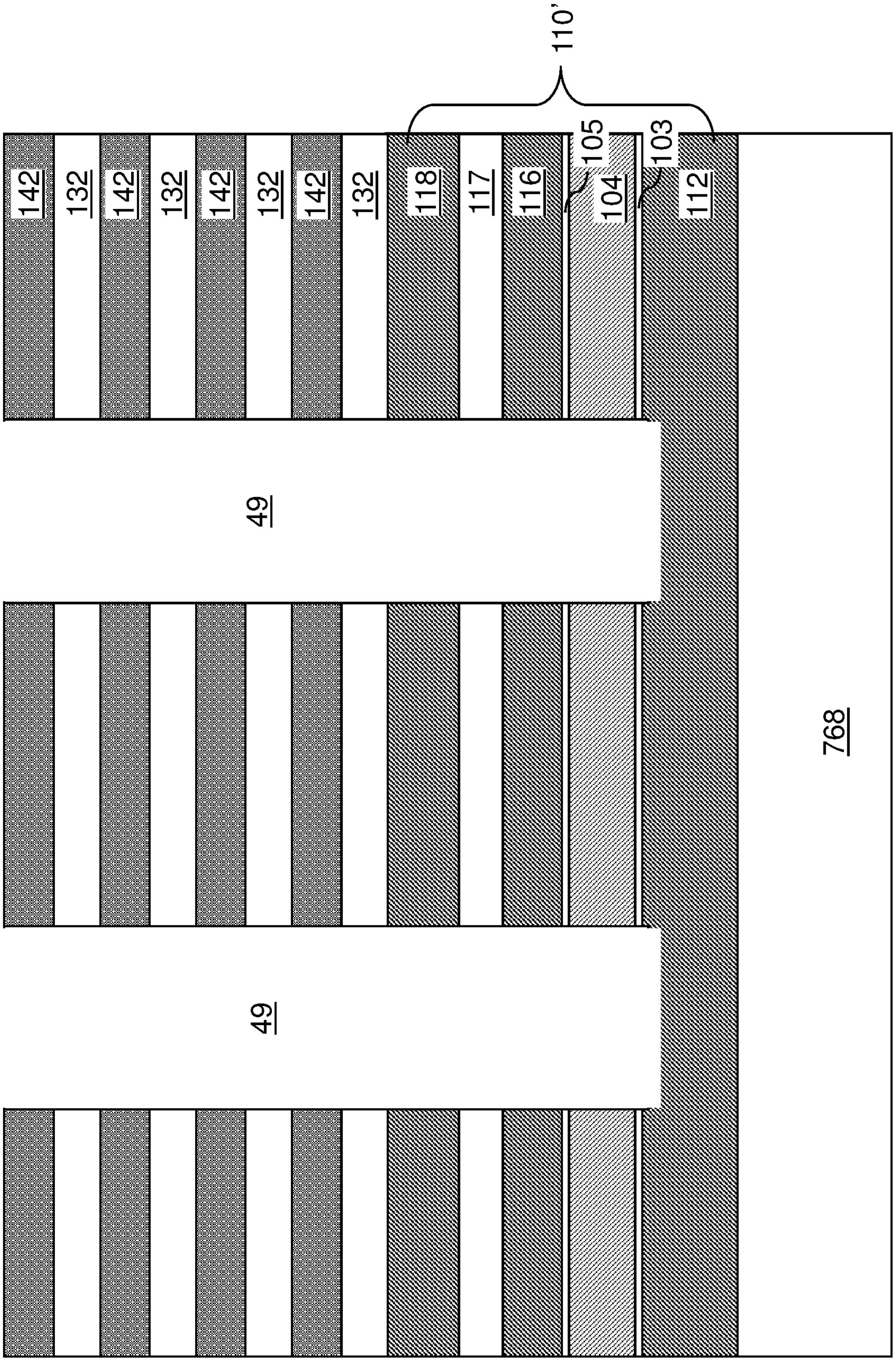
FIG. 8B is a vertical cross-sectional view of a region of the first exemplary structure of FIG. 8A.

Referring to FIGS. 8A and 8B, the sacrificial fill material can be removed from underneath the second-tier memory openings 249 and the second-tier support openings 229 employing an etch process that etches the sacrificial fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each volume from which a sacrificial first-tier memory opening fill portion 148 is removed. A support opening 19, which is also referred to as an inter-tier support opening 19, is formed in each volume from which a sacrificial first-tier support opening fill portion 128 is removed.

FIGS. 9A-9D provide sequential cross-sectional views of a memory opening 49 during formation of a memory opening fill structure 58 or a support pillar structure 20. The same structural change occurs in each memory openings 49.

Figure 9B:
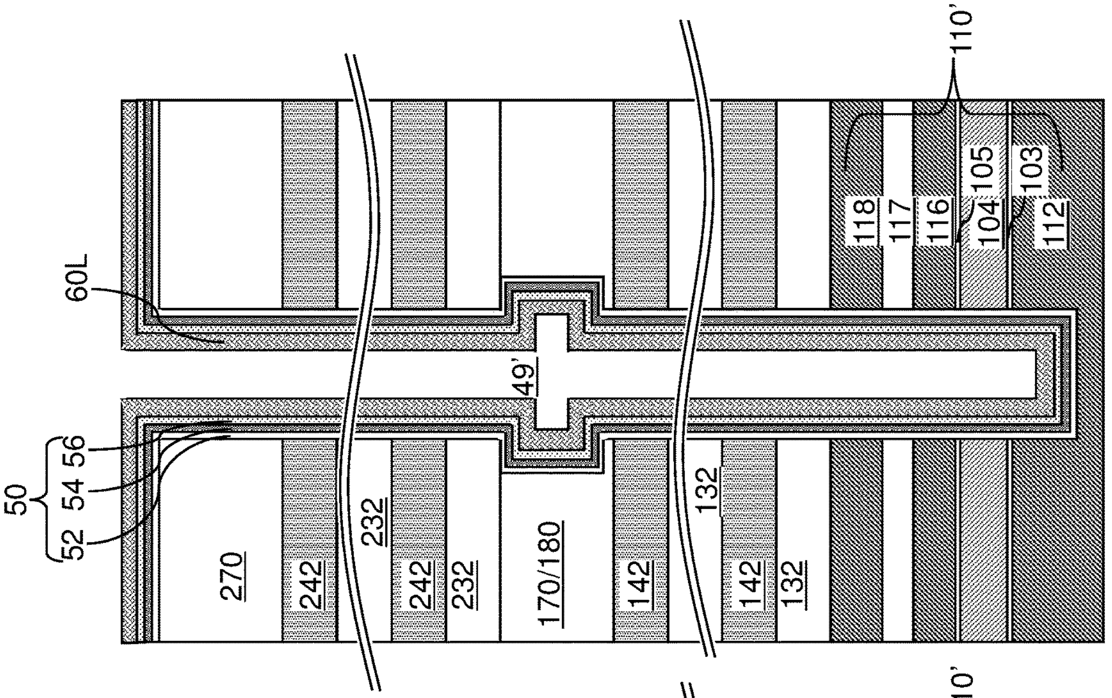
FIGS. 9A-9D are sequential vertical cross-sectional views of a pair of inter-tier memory openings during formation of a pair of memory opening fill structures according to the first embodiment of the present disclosure.
Figure 9A:
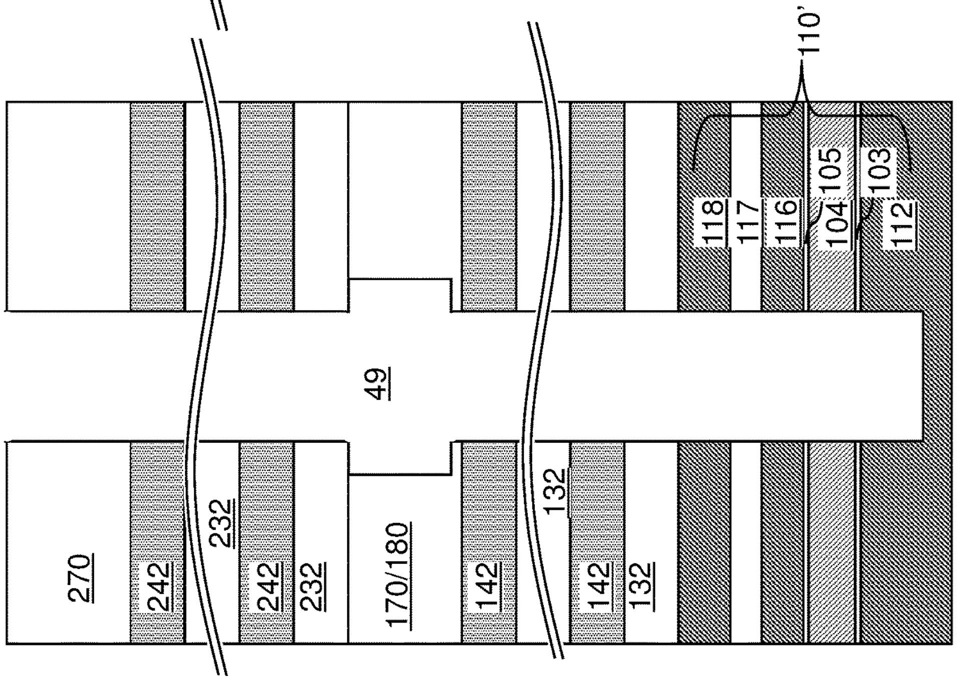

Referring to FIG. 9A, a memory opening 49 in the first exemplary device structure of FIGS. 8A and 8B is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. As used herein, a first surface and a second surface are "vertically coincident" if there exists the second surface that overlies or underlies the first surface and if there exists a vertical plane that intersects both the first surface and the second surface. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Figure 9D:
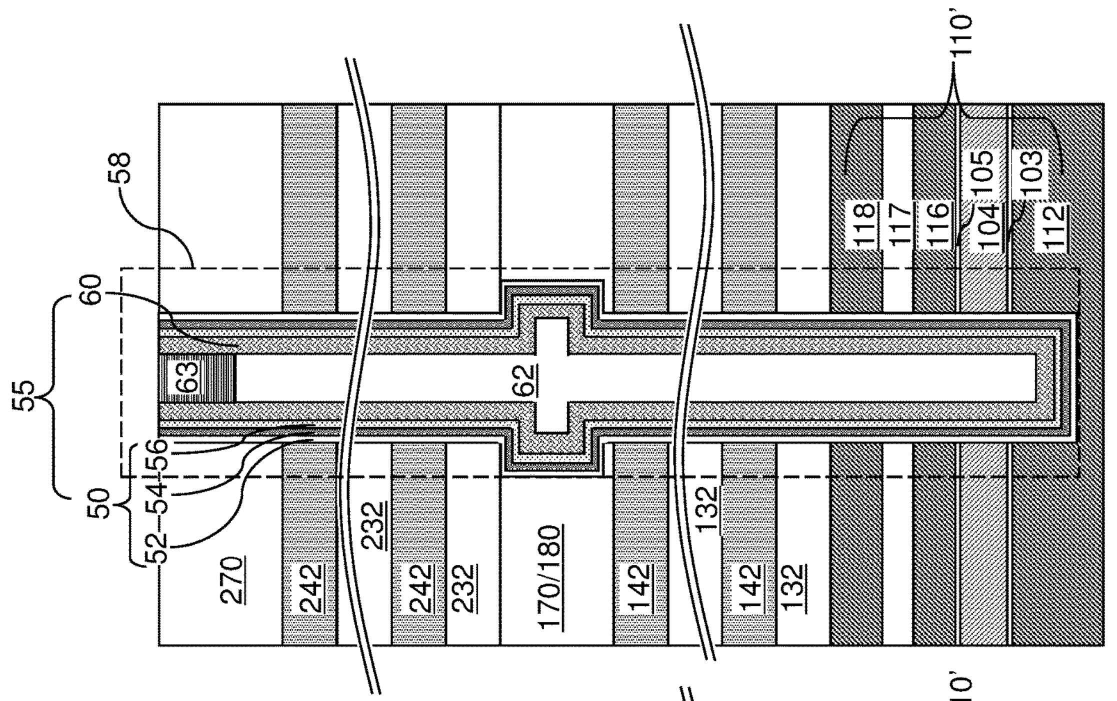
Figure 9C:
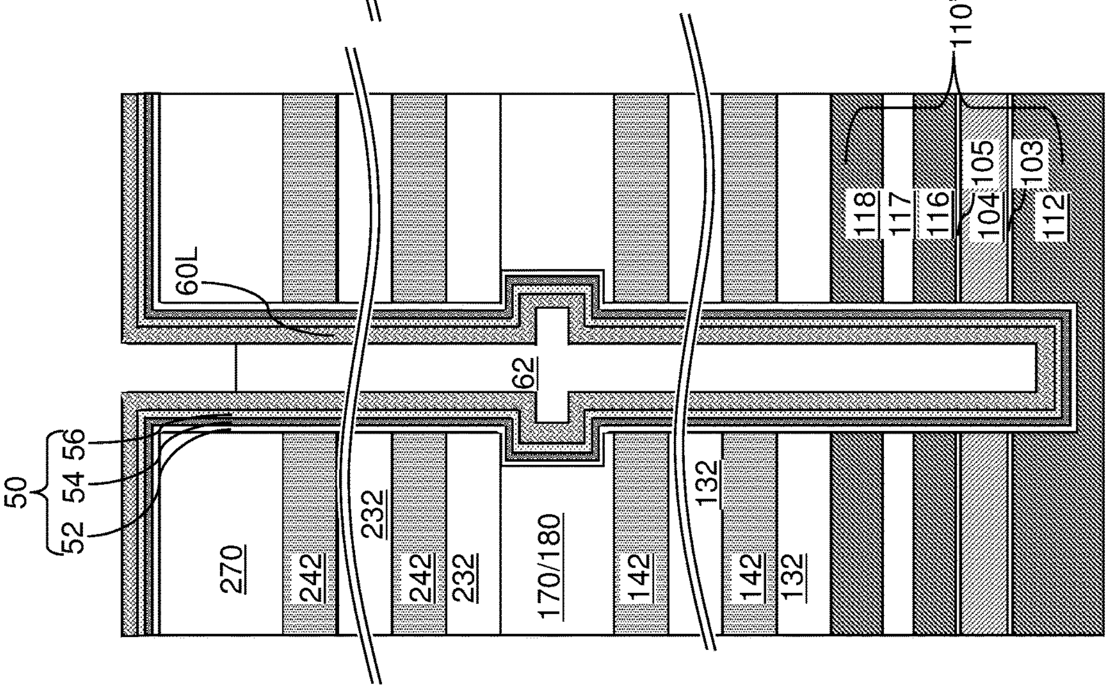

Referring to FIG. 9C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprises portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10A:
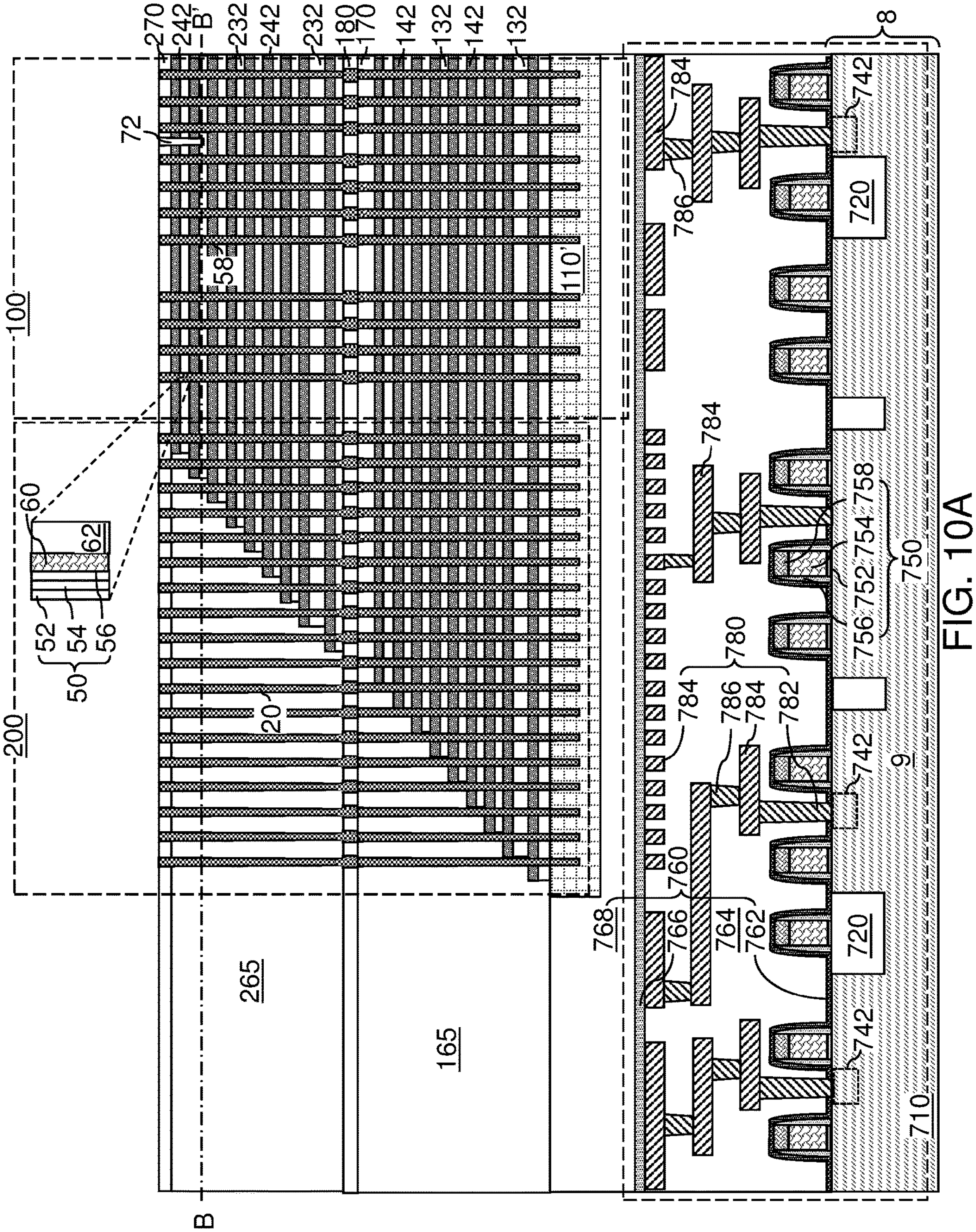
FIG. 10A is a vertical cross-sectional view of the first exemplary structure after formation of memory opening fill structures and support pillar structures according to the first embodiment of the present disclosure.
Figure 10B:
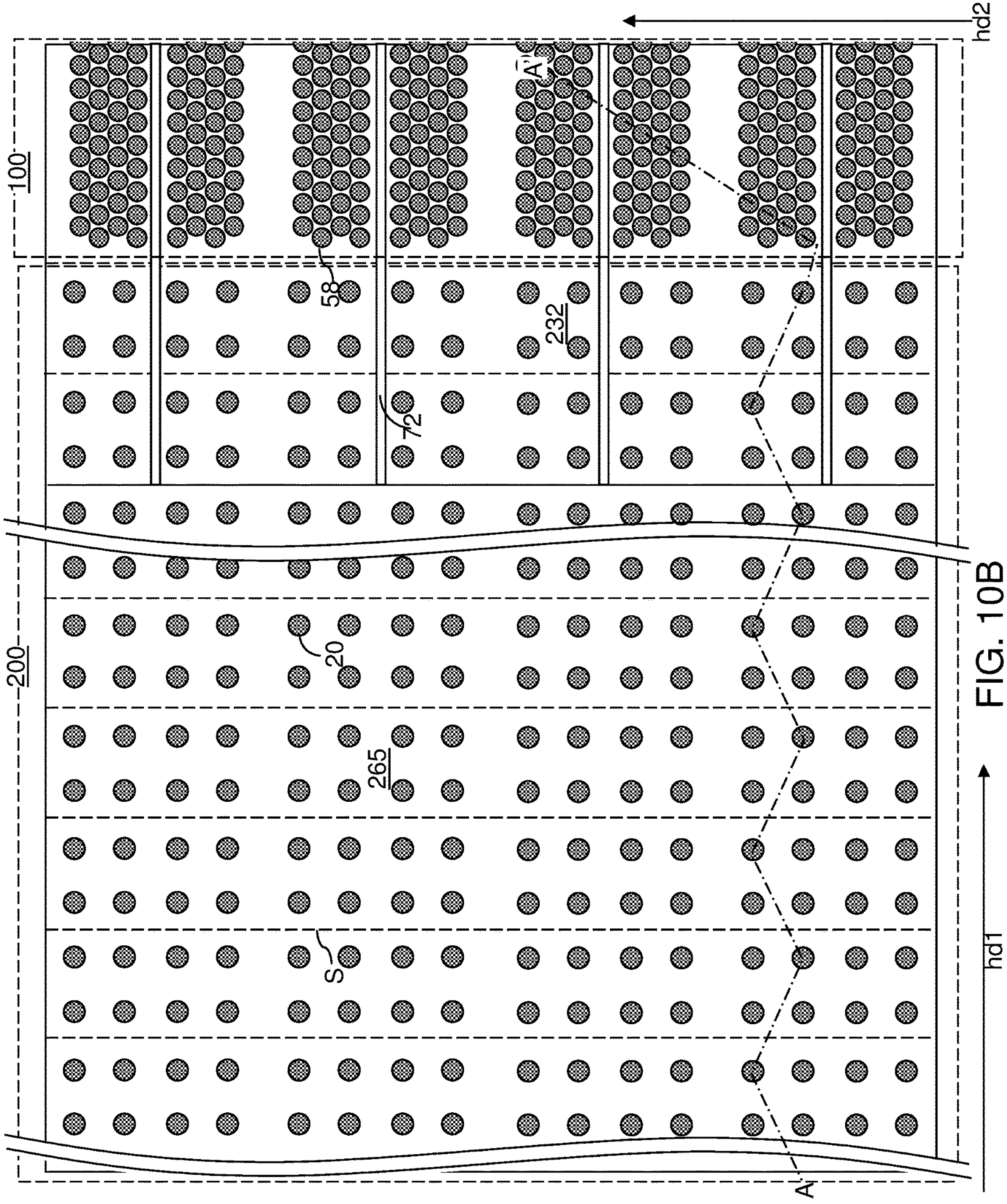
FIG. 10B is a horizontal cross-sectional of the first exemplary structure along the horizontal plane B-B' of FIG. 10A. The zig-zag vertical plane A-A' corresponds to the plane of the vertical cross-sectional view of FIG. 10A.

Referring to FIGS. 10A and 10B, the first exemplary structure is shown after formation of memory opening fill structures 58 in the memory openings 49 and support pillar structures 20 in the support openings 19. Each of the support openings 19 is filled with a respective support pillar structure 20 concurrently with formation of the memory opening fill structures 58. Each support pillar structure 20 can have the same structural elements as a memory opening fill structure 58. Each support pillar structure 20 is a dummy structure, i.e., an electrically inactive structure, and as such, is not subsequently contacted by any contact via structure.

Figure 11A:
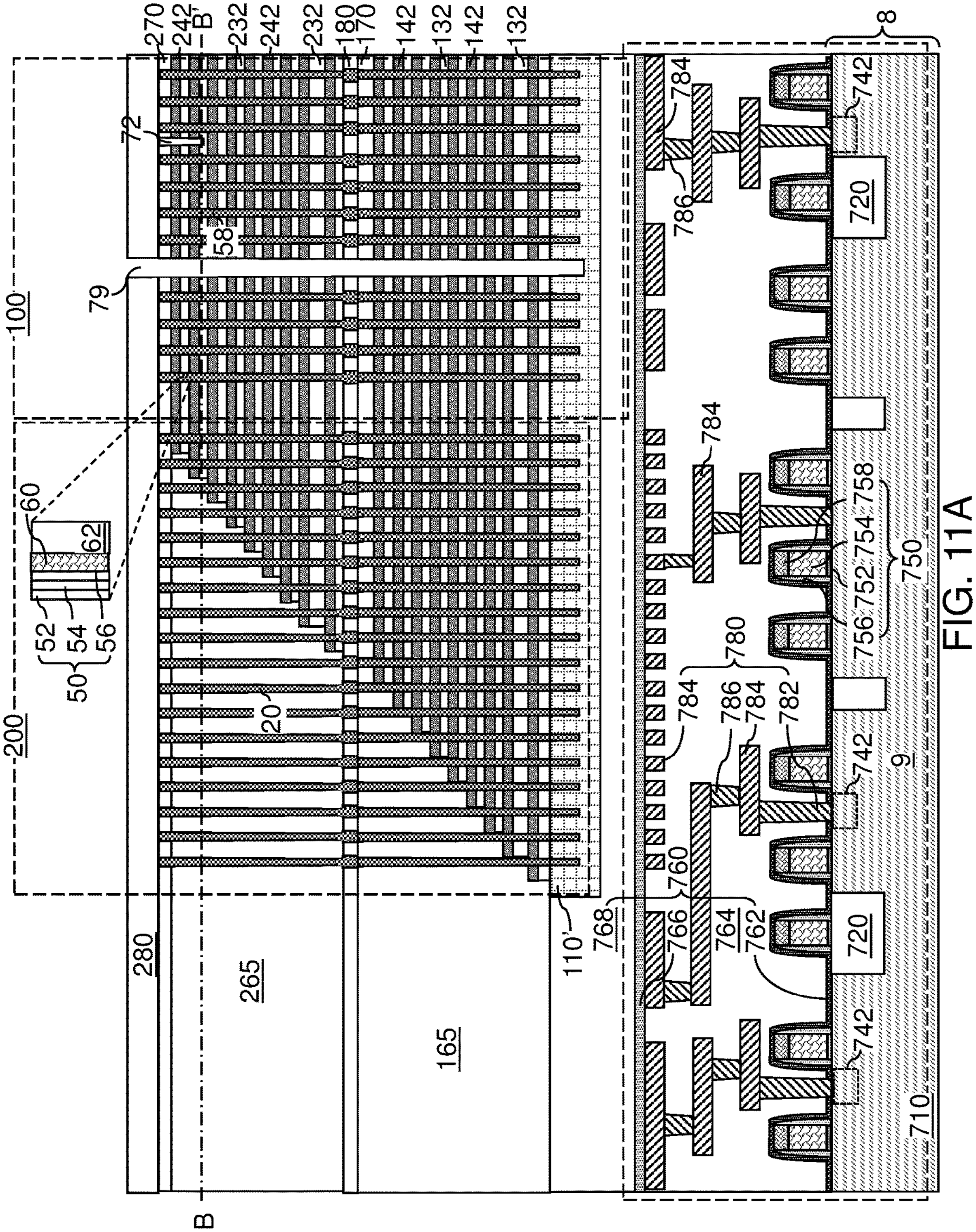
FIG. 11A is a vertical cross-sectional view of the first exemplary structure after formation of backside trenches according to the first embodiment of the present disclosure.
Figure 11B:
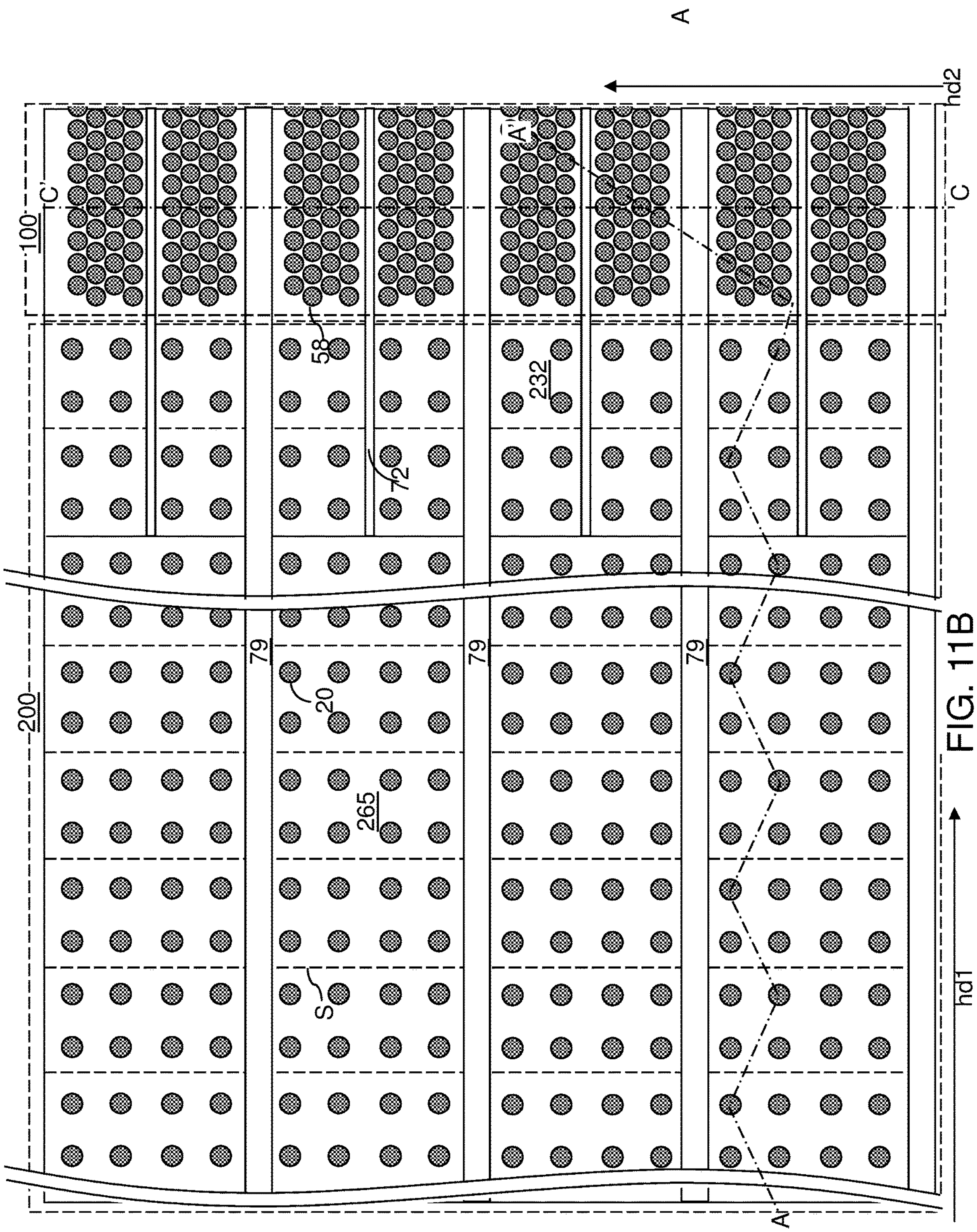
FIG. 11B is a horizontal cross-sectional of the first exemplary structure along the horizontal plane B-B' of FIG. 11A. The zig-zag vertical plane A-A' corresponds to the plane of the vertical cross-sectional view of FIG. 11A.
Figure 11C:
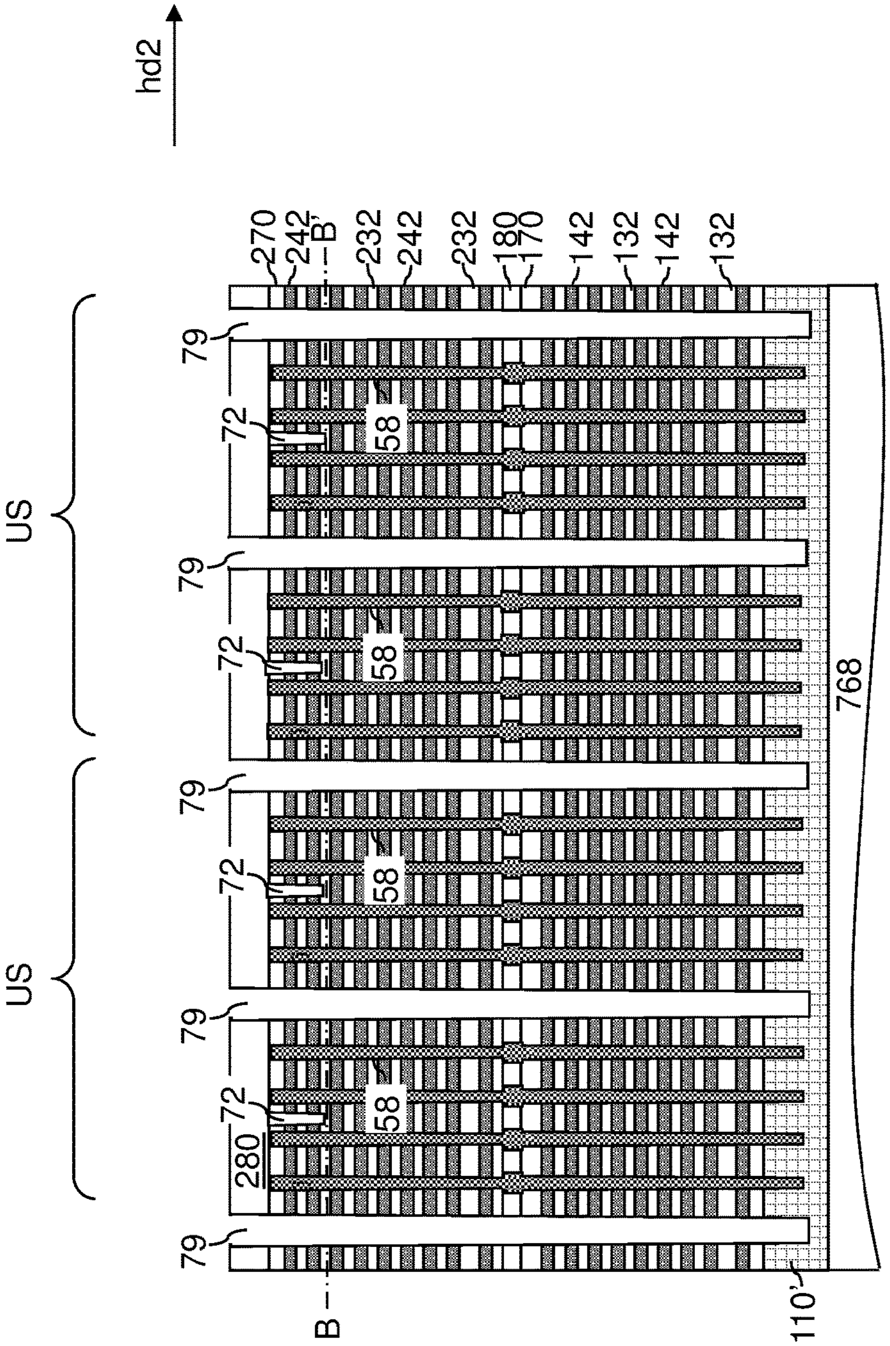
FIG. 11C is a vertical cross-sectional view of the first exemplary structure along the vertical plane C-C' of FIG. 11B.

Referring to FIG. 11A-11C, a contact-level dielectric layer 280 can be formed over the second-tier structure (232, 242, 270, 265, 72). The contact-level dielectric layer 280 includes a dielectric material such as silicon oxide, and can be formed by a conformal or non-conformal deposition process. For example, the contact-level dielectric layer 280 can include undoped silicate glass and can have a thickness in a range from 100 nm to 600 nm, although lesser and greater thicknesses can also be employed.

A photoresist layer (not shown) can be applied over the contact-level dielectric layer 280 and can be lithographically patterned to form openings within areas extending across the memory array region 100 and the staircase region 200. The openings in the photoresist layer can laterally extend along the first horizontal direction hd1 between each neighboring cluster of memory opening fill structures 58. Backside trenches 79 can be formed by transferring the pattern in the photoresist layer through the contact-level dielectric layer 280, the second alternating stack (232, 242, 270, 265, 72), the first alternating stack (132, 142, 170, 165), and the in-process source-level material layers 110'. Portions of the contact-level dielectric layer 280, the second alternating stack (232, 242, 270, 265, 72), the first alternating stack (132, 142, 170, 165), and the in-process source-level material layers 110' that underlie the openings in the photoresist layer can be removed to form backside trenches 79. In one embodiment, the backside trenches 79 can be formed between clusters of memory opening fill structures 58. The clusters of the memory opening fill structures 58 can be laterally spaced apart along the second horizontal direction hd2 by the backside trenches 79.

Generally, at least one vertically alternating sequence of continuous insulating layers (132, 232) and continuous spacer material layers (such as the continuous sacrificial material layers (142, 242)) can be divided into alternating stacks {(132, 142), (232, 242)} of insulating layers (132, 232) and spacer material layers (such as sacrificial material layers (142, 242)) by forming backside trenches 79 that laterally extend along a first horizontal direction hd1 and laterally spaced apart along a second horizontal direction hd2. The contact-level dielectric layer 280 is divided into a plurality of contact-level dielectric layers 280 by the backside trenches 280. Each contact-level dielectric layer 280 of the plurality of contact-level dielectric layers 280 overlies a respective alternating stack of insulating layers (132, 232) and spacer material layers (such as sacrificial material layers (142, 242)), and overlies a respective array of memory opening fill structures 58.

Figure 12:
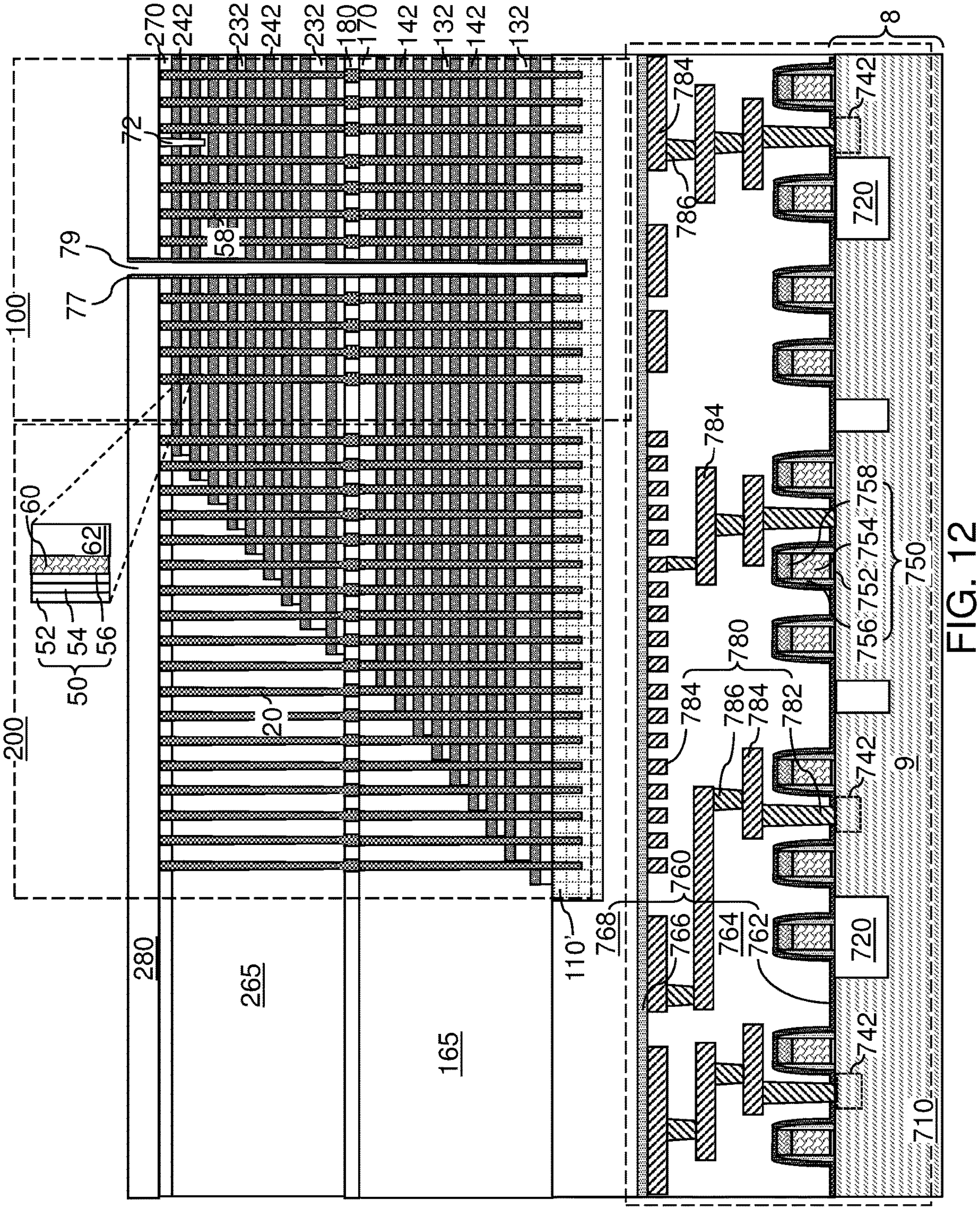
FIG. 12 is a vertical cross-sectional view of the first exemplary structure after formation of backside trench spacers in the backside trenches according to the first embodiment of the present disclosure.
Figure 13A:
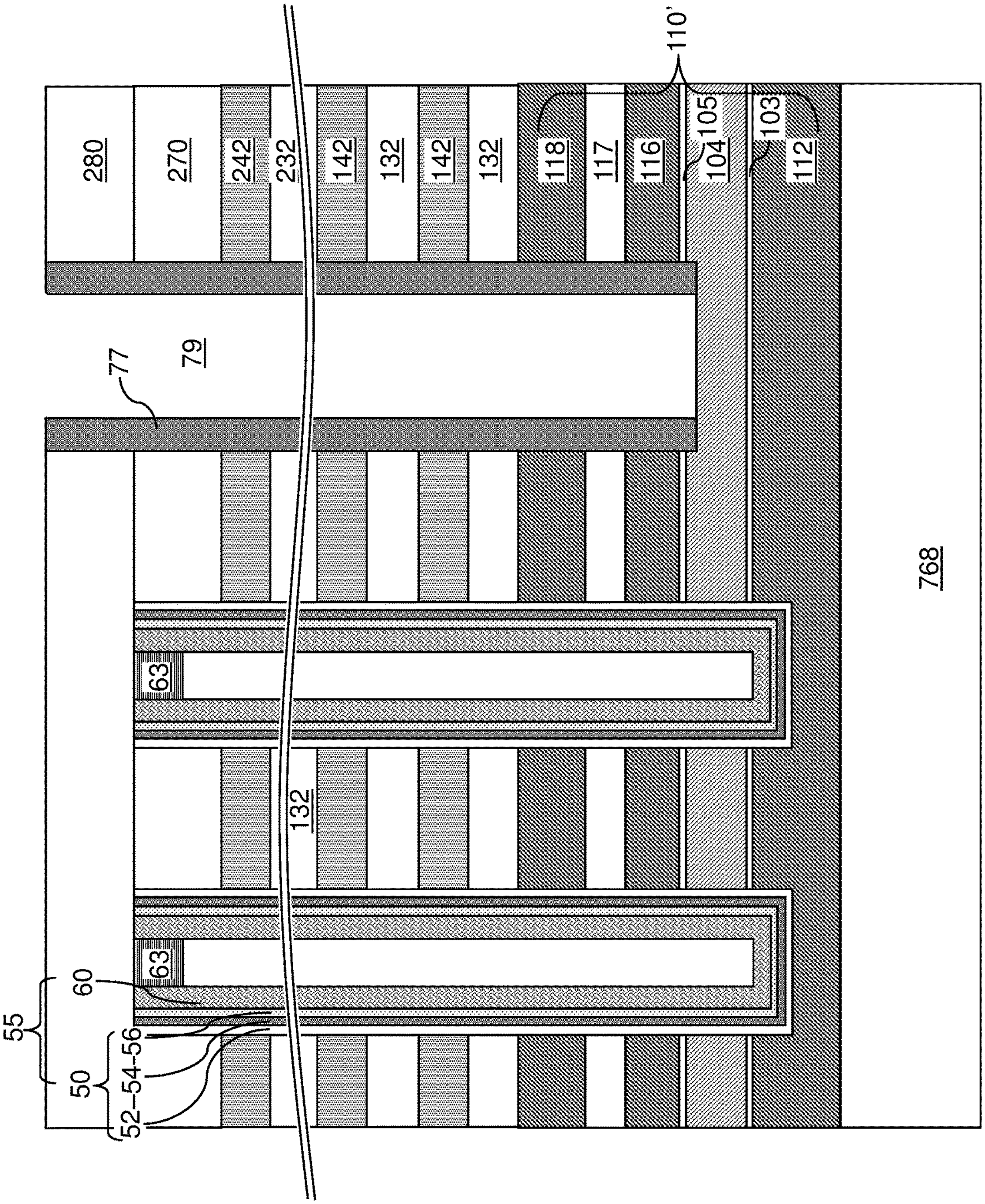
FIGS. 13A-13E illustrate sequential vertical cross-sectional views of a region of the first exemplary structure during formation of a source-level material layers according to the first embodiment of the present disclosure.

Referring to FIGS. 12 and 13A, a backside trench spacer 77 can be formed on sidewalls of each backside trench 79. For example, a conformal spacer material layer can be deposited in the backside trenches 79 and over the contact-level dielectric layer 280, and can be anisotropically etched to form the backside trench spacers 77. The backside trench spacers 77 include a material that is different from the material of the source-level sacrificial layer 104. For example, the backside trench spacers 77 can include silicon oxide, a dielectric metal oxide, or silicon nitride.

Figure 13B:
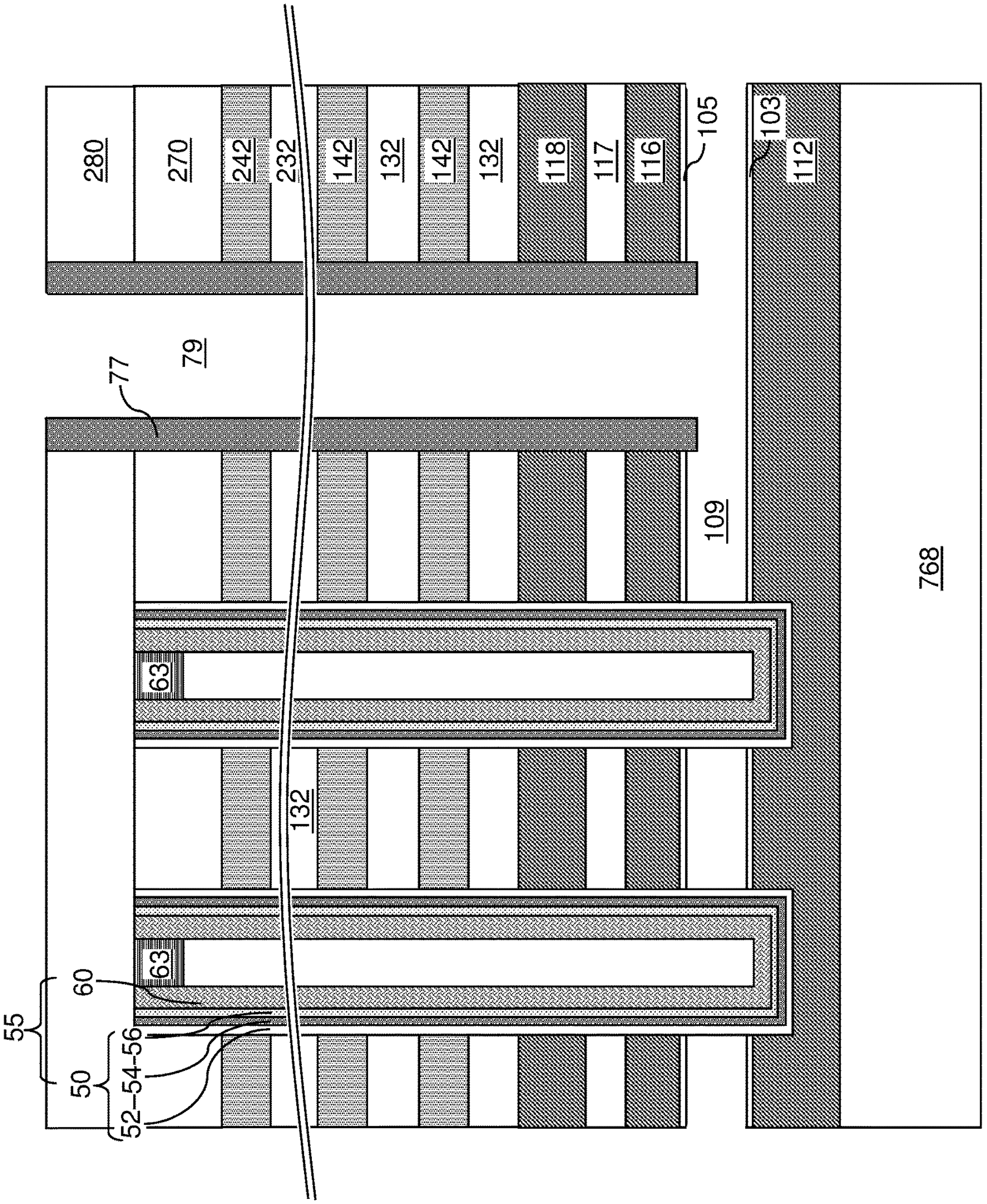

Referring to FIG. 13B, an etchant that etches the material of the source-level sacrificial layer 104 selective to the materials of the first alternating stack (132, 142), the second alternating stack (232, 242), the first and second insulating cap layers (170, 270), the upper dielectric liner layer 105, and the lower dielectric liner layer 103 can be introduced into the backside trenches 79 in an isotropic etch process. For example, if the source-level sacrificial layer 104 includes undoped amorphous silicon or an undoped amorphous silicon-germanium alloy, the backside trench spacers 77 include silicon nitride, and the upper and lower dielectric liner layers (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 77 and the upper and lower dielectric liner layers (105, 103). Alternatively, if the source-level sacrificial material layer 104 includes silicon nitride, the backside trench spacers 77 include silicon oxide or a dielectric metal oxide, and the upper and lower dielectric liner layers (105, 103) include silicon oxide, a wet etch process employing hot phosphoric acid can be employed to remove the source-level sacrificial layer 104 selective to the backside trench spacers 77 and the upper and lower dielectric liner layers (105, 103). A source cavity 109 is formed in the volume from which the source-level sacrificial layer 104 is removed.

Figure 13C:
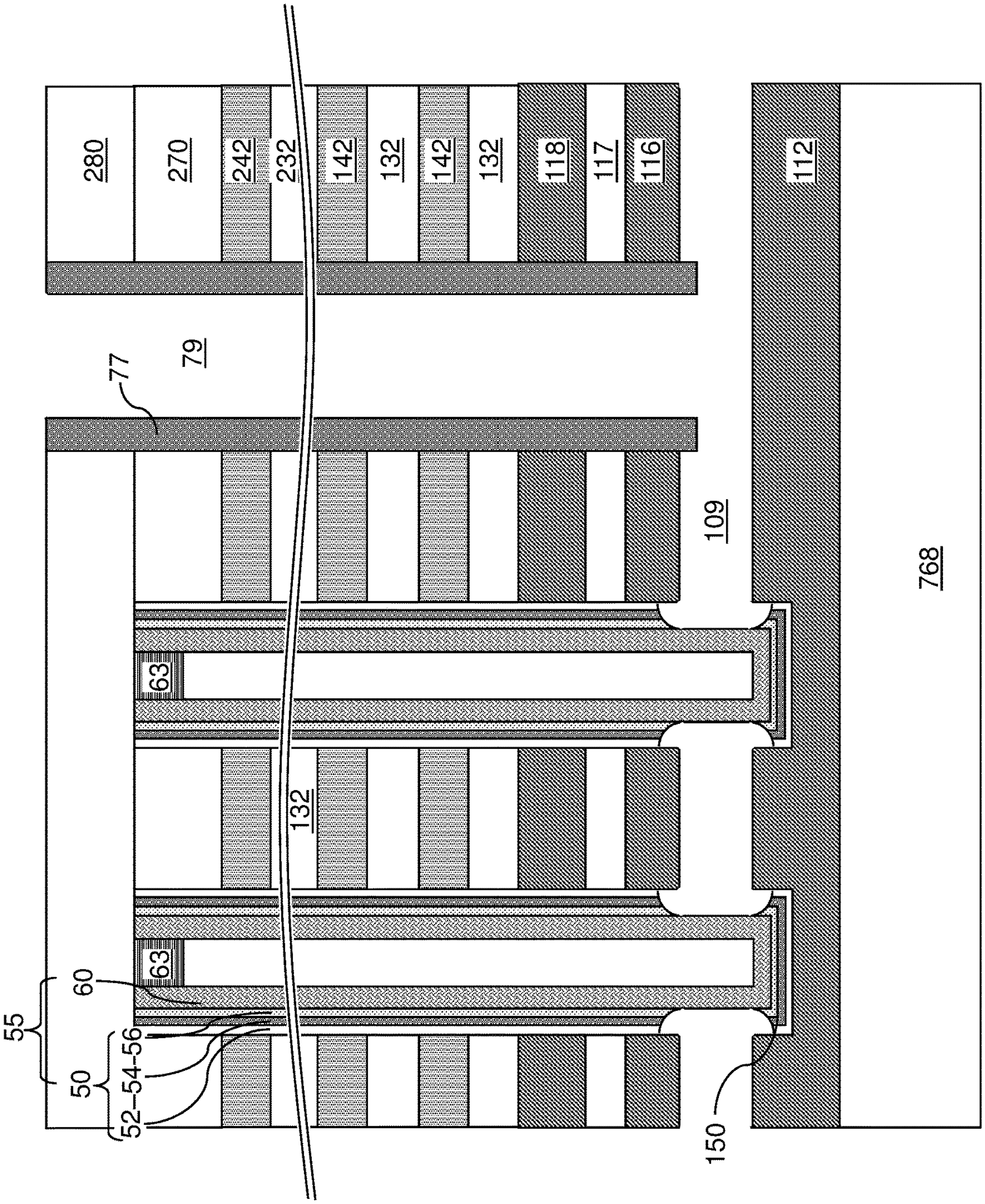

Referring to FIG. 13C, a sequence of isotropic etchants, such as wet etchants, can be applied through the backside trenches 79 and the source cavity 109 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 109. The upper and lower dielectric liner layers (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower dielectric liner layers (105, 103). A top surface of the lower source-level material layer 112 and a bottom surface of the upper source-level material layer 116 can be physically exposed to the source cavity 109. An outer sidewall of each vertical semiconductor channel 60 is physically exposed to the source cavity 109 after removing the physically exposed portions of the memory films 50. A dielectric material stack 150 is formed underneath each physically exposed cylindrical surface of the vertical semiconductor channels 60. Each dielectric material stack 150 is a remaining portion of the memory films 50, and includes the same dielectric material stack as the memory films 50.

Thus, the upper source-level material layer 116 can act as an etch stop during the selective etching of the memory film 50 through the source cavity 109 and can prevent lateral expansion of the source cavity 109. This prevents a short circuit between the source-select-level conductive layer 118 and a source contact layer that is subsequently formed in the source cavity 109 during a subsequent step.

Figure 13D:
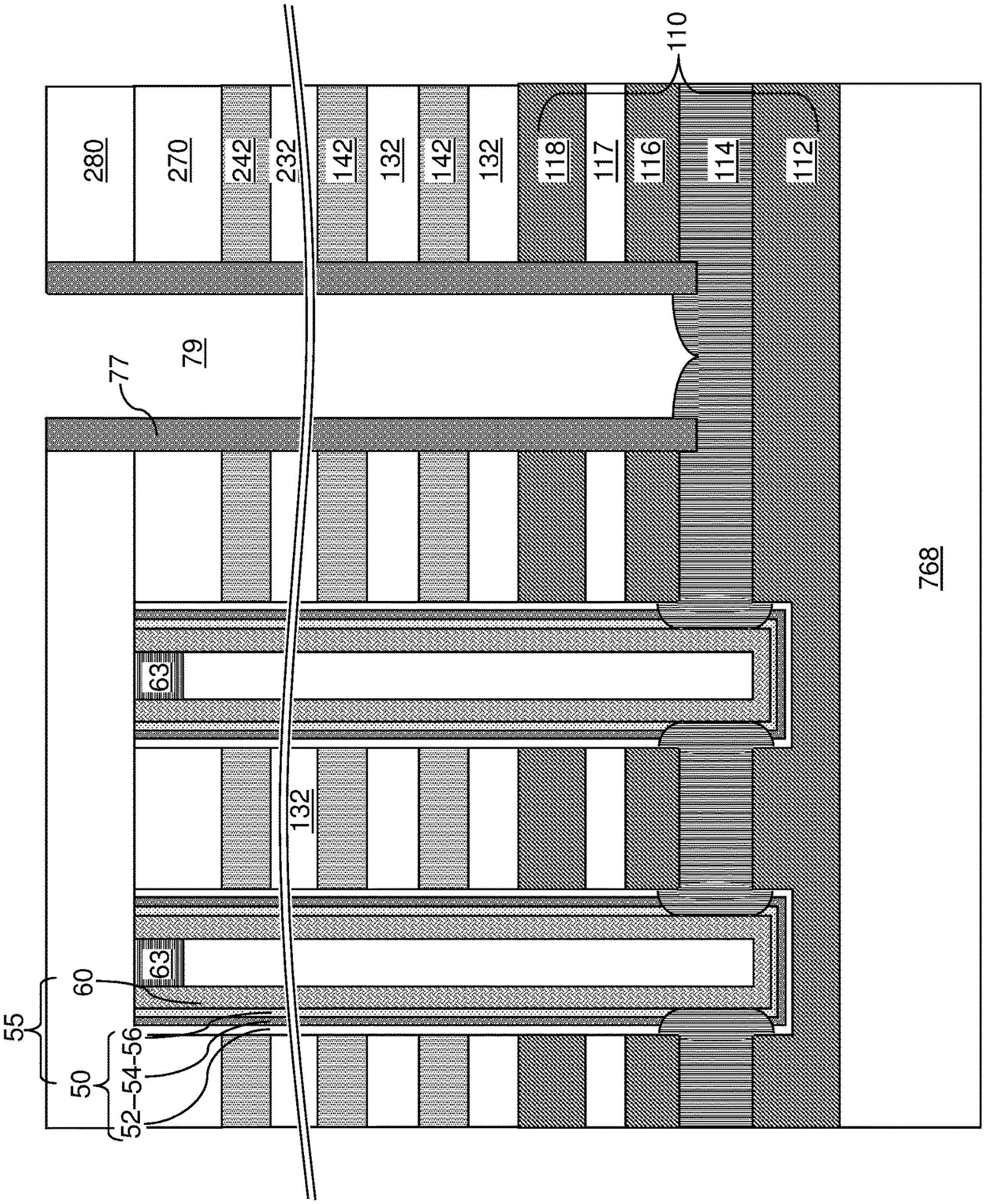

Referring to FIG. 13D, a source contact layer 114 can be formed by a selective deposition process that deposits a doped semiconductor material having a doping of the second conductivity type, which is herein referred to as a third doped semiconductor material. The doped semiconductor material can include amorphous silicon, polysilicon, or a silicon-germanium alloy. The third doped semiconductor material of the source contact layer 114 can grow from physically exposed semiconductor surfaces around the source cavity 109. The average atomic concentration of dopants of the second conductivity type in the source contact layer 114 can be in a range from $5.0\times10^{19}/cm^3$ to $2.0\times10^{21}/cm^3$, although lesser and greater dopant concentrations can also be employed.

The in-process source-level material layers 110' are replaced with source-level material layers 10. The source-level material layers 110 include a layer stack including, from bottom to top, the lower source-level material layer 112, the source contact layer 114, the upper source-level material layer 116, the source-level insulating layer 117, and the optional source-select-level conductive layer 118. The combination of the lower source-level material layer 112, the source contact layer 114, the upper source-level material layer 116 constitutes a source layer (112, 114, 116). Upon replacement of the source-level sacrificial layer 104 with a source contact layer 114, the in-process source-level material layers 110' are converted into source-level material layers 110 including a source layer (112, 114, 116).

Figure 13E:
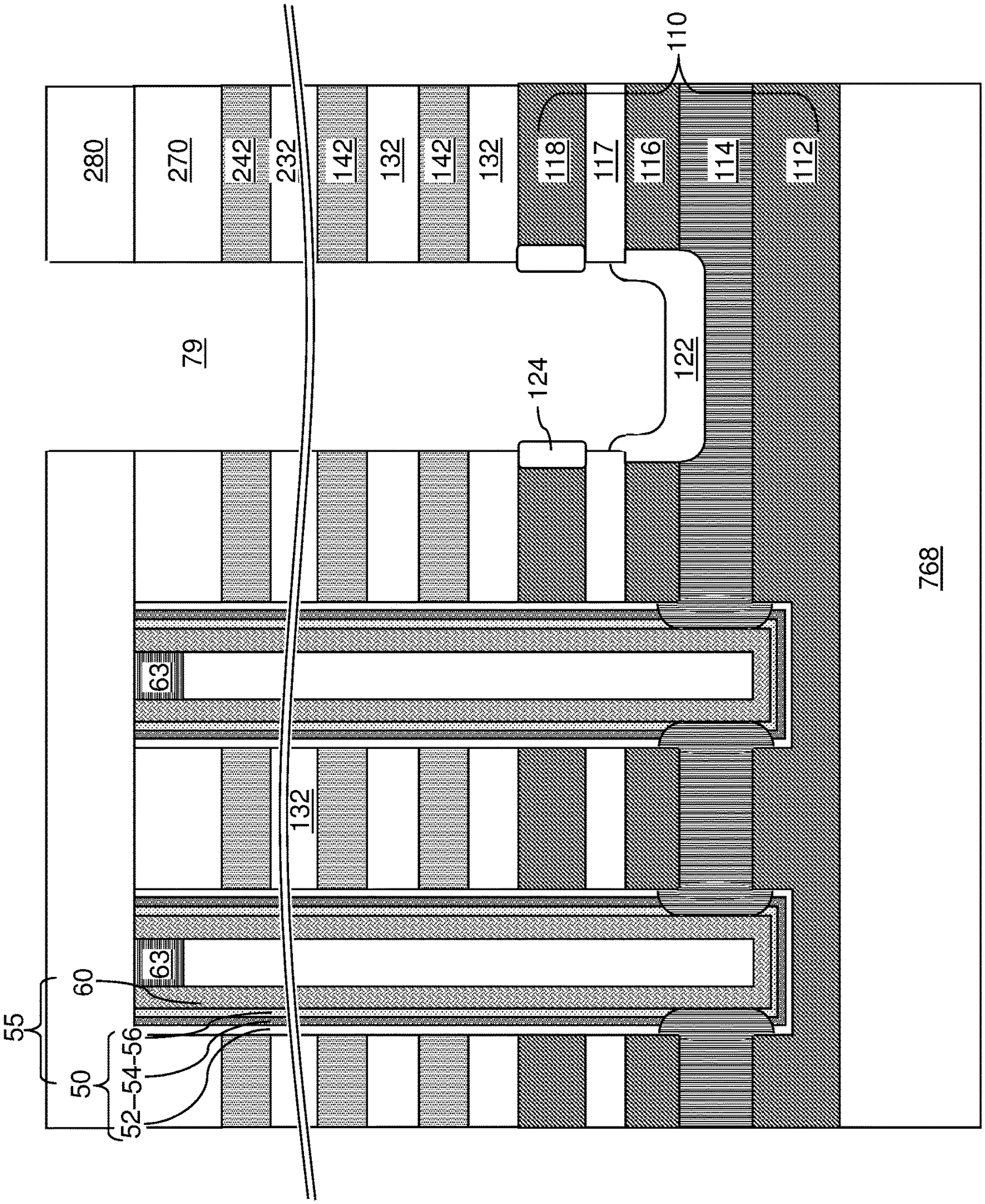
Figure 14:
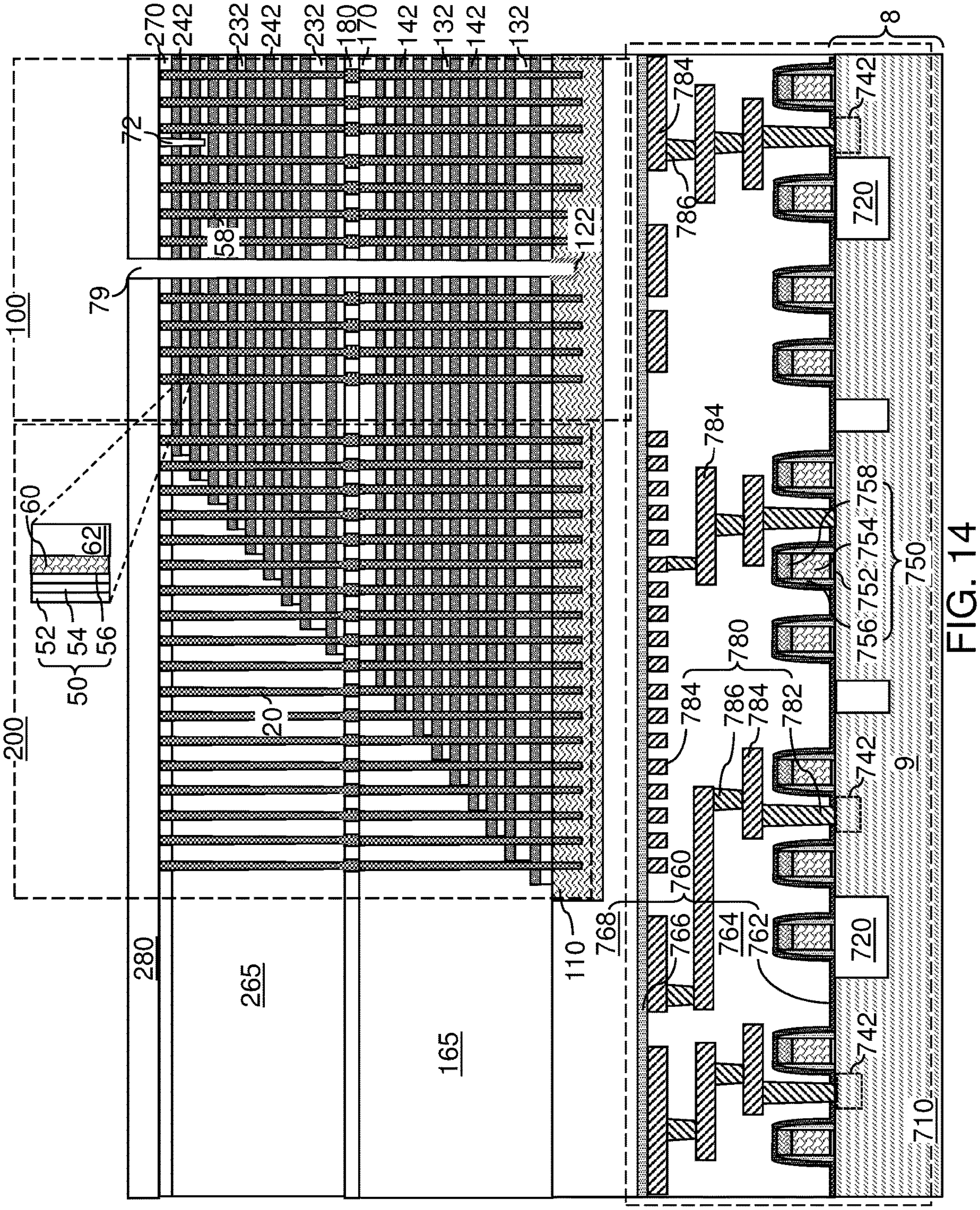
FIG. 14 is a vertical cross-sectional view of the first exemplary structure after formation of the source-level material layers according to the first embodiment of the present disclosure.

Referring to FIGS. 13E and 14, the backside trench spacers 77 can be removed selective to the semiconductor material of the source contact layer 114. For example, if the backside trench spacers 77 include silicon nitride, a wet etch process employing hot phosphoric acid can be employed to remove the backside trench spacers 77. If the backside trench spacers 77 include silicon oxide, a wet etch process employing dilute hydrofluoric acid can be employed to remove the backside trench spacers 77. Sidewalls of the first and second alternating stacks (132, 142, 232, 242), the upper source-level material layer 116, the source-level insulating layer 117, and the optional source-select-level conductive layer 118 can be physically exposed after removal of the backside trench spacers 77.

A thermal oxidation process can be performed to convert physically exposed surface portions of various semiconductor materials into semiconductor oxide portions. Specifically, physically exposed surface portions of the source contact layer 114, the upper source-level material layer 116, and the source-select-level conductive layer 118 (if present) are converted into thermal semiconductor oxide material portions. As used herein, a “thermal semiconductor oxide” refers to a material that is formed by thermal oxidation of a semiconductor material. Unlike a semiconductor oxide material formed by chemical vapor deposition, thermal semiconductor oxide materials do not include carbon or hydrogen above a trace level unless the semiconductor material from which the semiconductor oxide material is derived includes carbon prior to a thermal oxidation process.

The thermal oxidation process forms a semiconductor oxide plate 122 at the bottom of each backside trench 79 and semiconductor oxide rails 124 on sidewalls of the source-select-level conductive layer 118. The semiconductor oxide rails 124 are not illustrated in FIG. 14 for clarity. The semiconductor oxide plate 122 includes various thermal semiconductor oxide material portions formed by thermal conversion of surface portions of the source contact layer 114 and the upper source-level material layer 116.

The layer stack including the lower source-level material layer 112, the source contact layer 114, and the upper source-level material layer 116 constitutes a source layer (112, 114, 116), which is a buried source layer that functions as a common source region that is connected each of the vertical semiconductor channels 60 and has a doping of the second conductivity type. The average dopant concentration in the buried source layer (112, 114, 116) can be in a range from $5.0\times10^{19}/cm^3$ to $2.0\times10^{21}/cm^3$, although lesser and greater dopant concentrations can also be employed.

Figure 15:
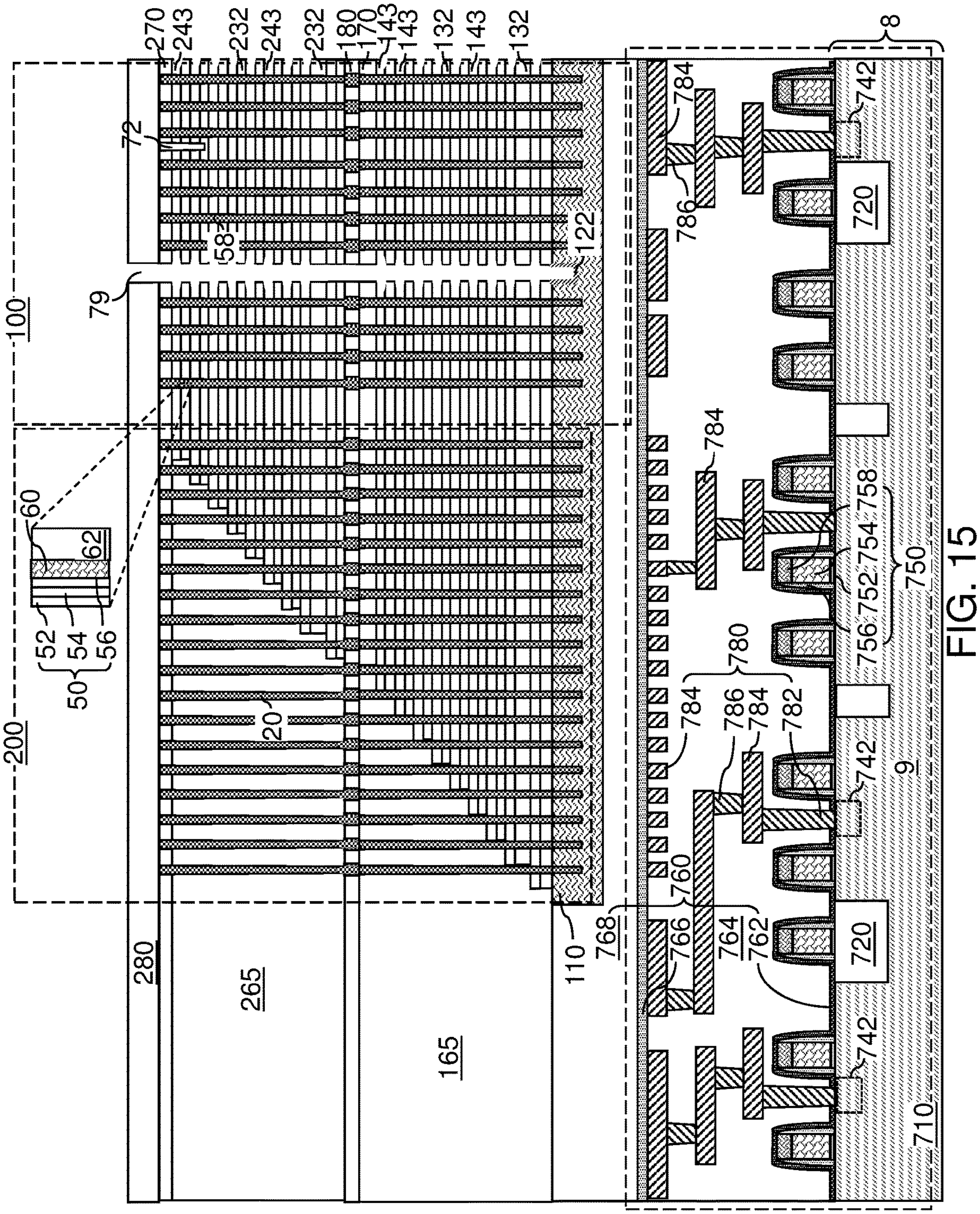
FIG. 15 is a vertical cross-sectional view of the first exemplary structure after formation of backside recesses according to the first embodiment of the present disclosure.

Referring to FIG. 15, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the first and second retro-stepped dielectric material portions (165, 265), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 16A:
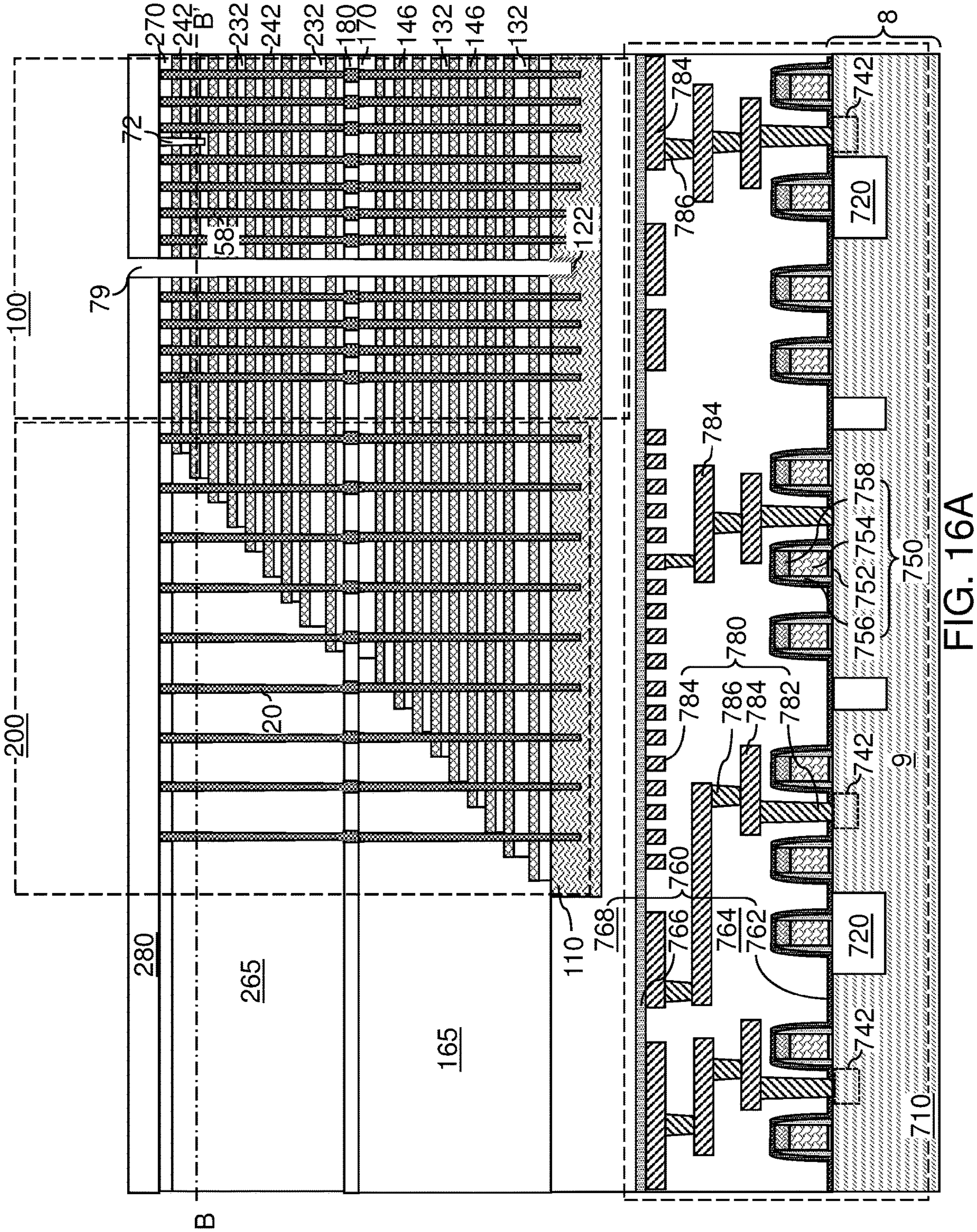
FIG. 16A is a vertical cross-sectional view of the first exemplary structure after formation of electrically conductive layers in the backside recesses according to the first embodiment of the present disclosure.
Figure 16B:
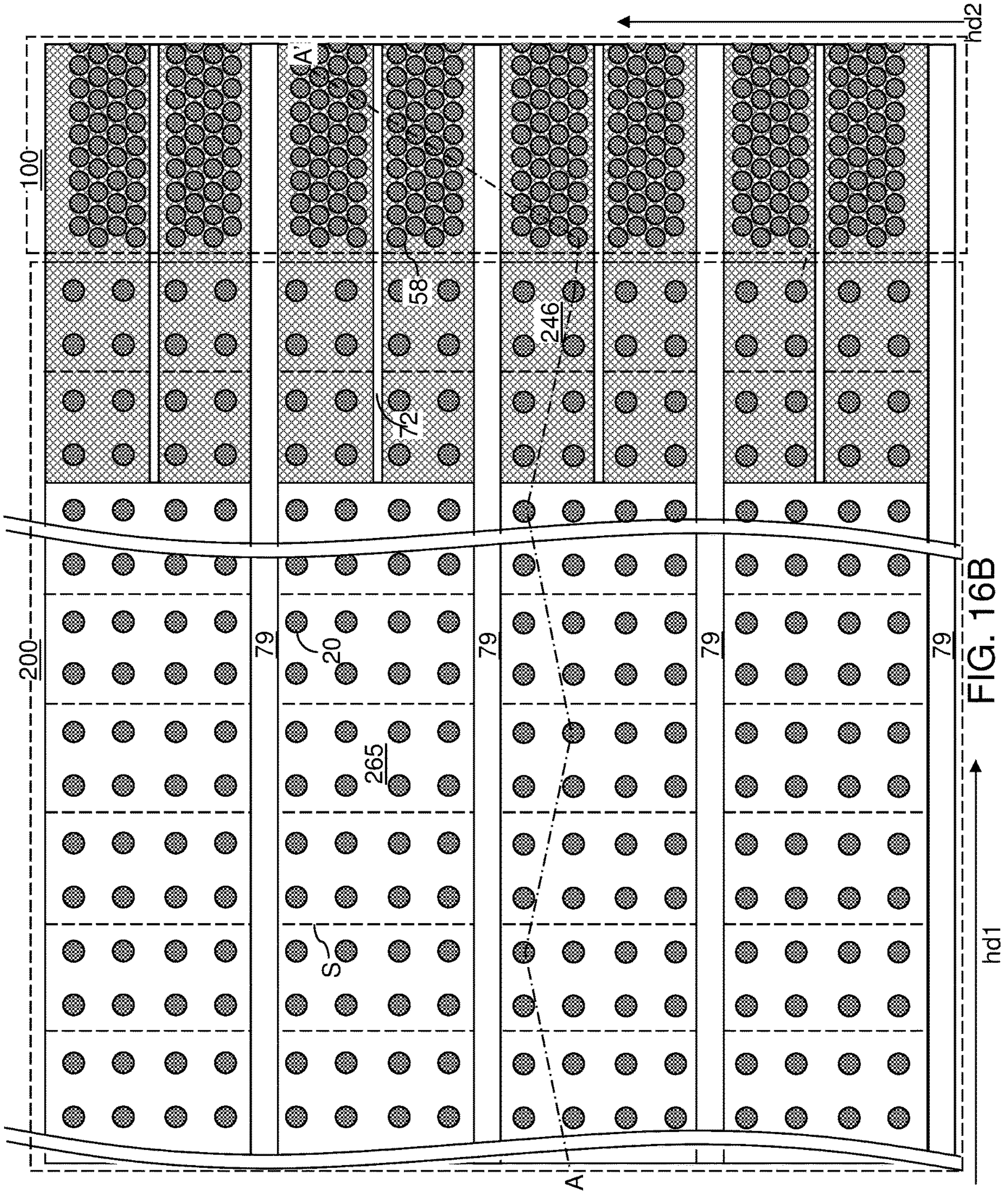
FIG. 16B is a horizontal cross-sectional view of the first exemplary structure along the horizontal plane B-B' of FIG. 16A. The zig-zag vertical plane A-A' corresponds to the plane of the vertical cross-sectional view of FIG. 16A.

Referring to FIGS. 16A and 16B, a backside blocking dielectric layer (not shown) can be optionally deposited in the backside recesses and the backside trenches 79 and over the contact-level dielectric layer 280. At least one conductive material can be deposited in the plurality of backside recesses (243, 243), on the sidewalls of the backside trench 79, and over the contact-level dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each backside trench 79 and from above the contact-level dielectric layers 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55. The source-select-level conductive layer 118 functions as a source select gate electrode.

Each of the memory opening fill structures 58 (which contains a respective memory stack structures 55) comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Alternating stacks {(132, 146), (232, 246)} of insulating layers (132, 232) and electrically conductive layers (146, 246) are formed, which are laterally spaced apart from each other by the backside trenches 79 along the second horizontal direction hd1. The source layer (112, 114, 116) comprises: a lower source-level material layer 112 comprising a first doped semiconductor material; an upper source-level material layer 116 comprising a second doped semiconductor material; and a source contact layer 114 comprising a third doped semiconductor material located between the upper source-level material layer 116 and the lower source-level material layer 112. In one embodiment, each of the vertical semiconductor channels 60 is in contact with the source contact layer 114. In one embodiment, each of the memory opening fill structures 58 comprises a respective memory film 50 that laterally surrounds the respective vertical semiconductor channel 60, has a respective annular concave bottom surface contacting the source contact layer 114, and has a respective cylindrical outer surface contacting the upper source-level material layer 116 and each insulating layer within a respective one of the alternating stacks {(132, 146), (232, 246)}.

Figure 17A:
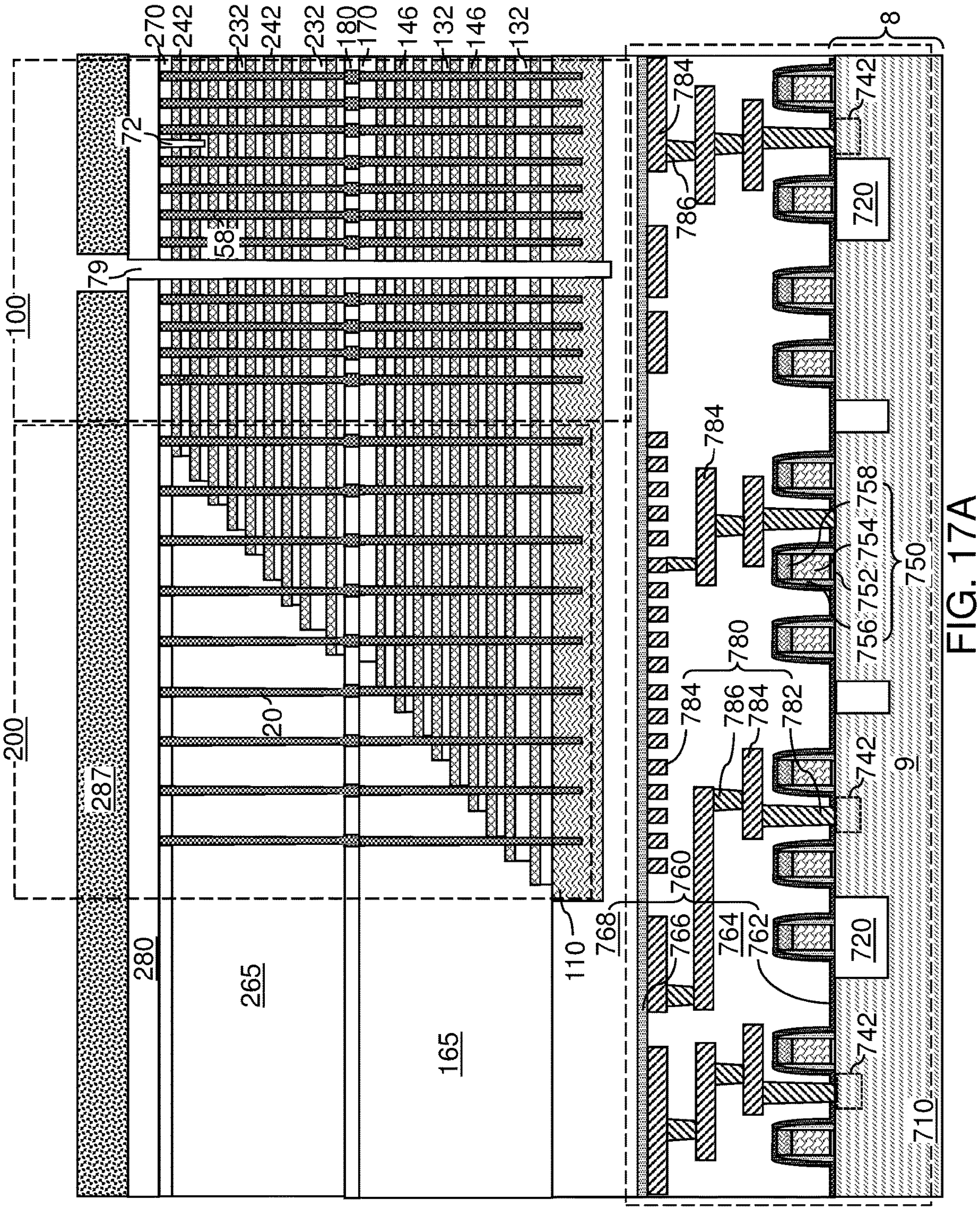
FIG. 17A is a vertical cross-sectional view of the first exemplary structure after formation of a patterned etch mask layer that covers a second subset of the backside trenches without covering a first subset of the backside trenches according to the first embodiment of the present disclosure.
Figure 17B:
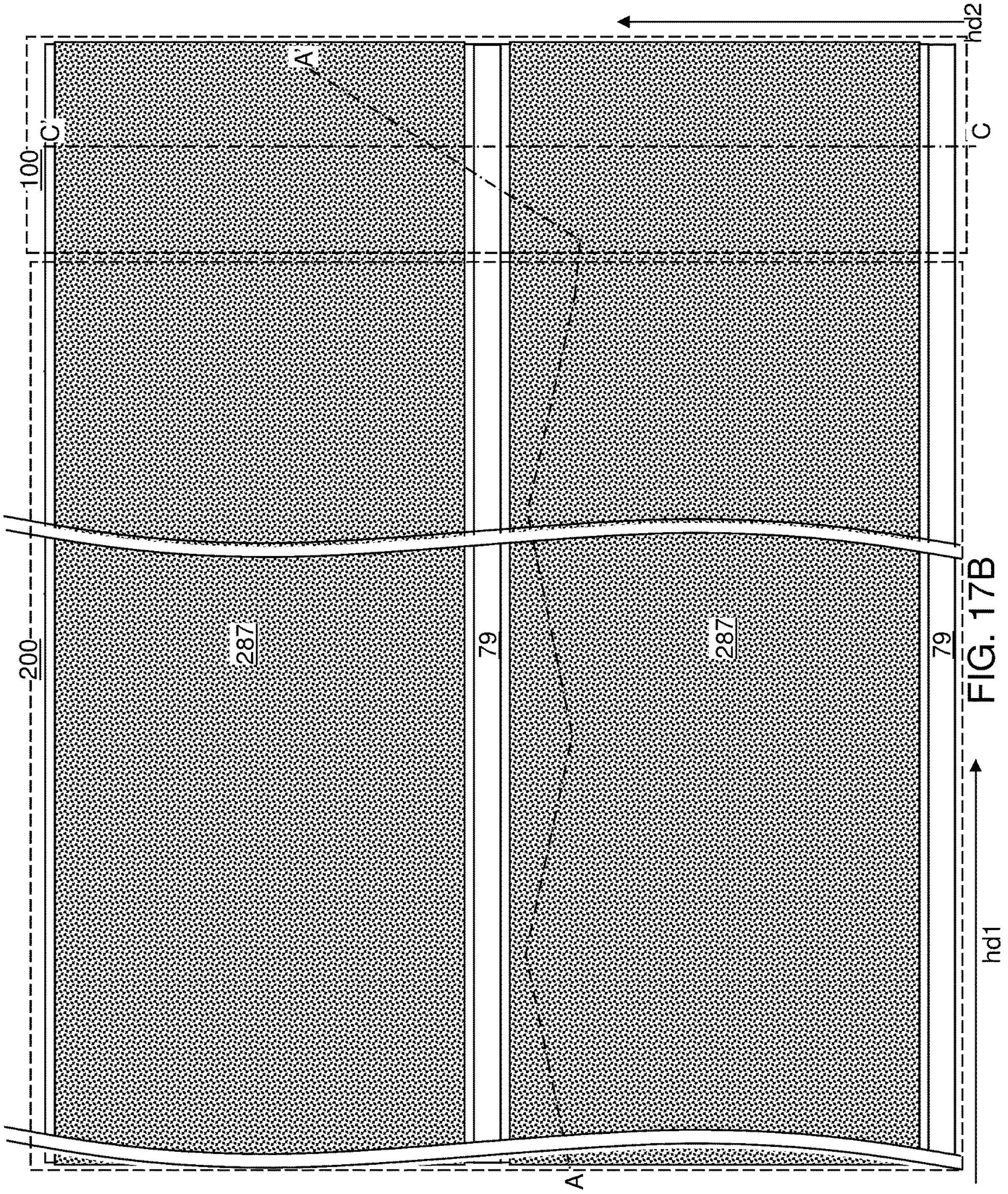
FIG. 17B is a top-down view of the first exemplary structure of FIG. 17A. The zig-zag vertical plane A-A' corresponds to the plane of the vertical cross-sectional view of FIG. 17A.
Figure 17C:
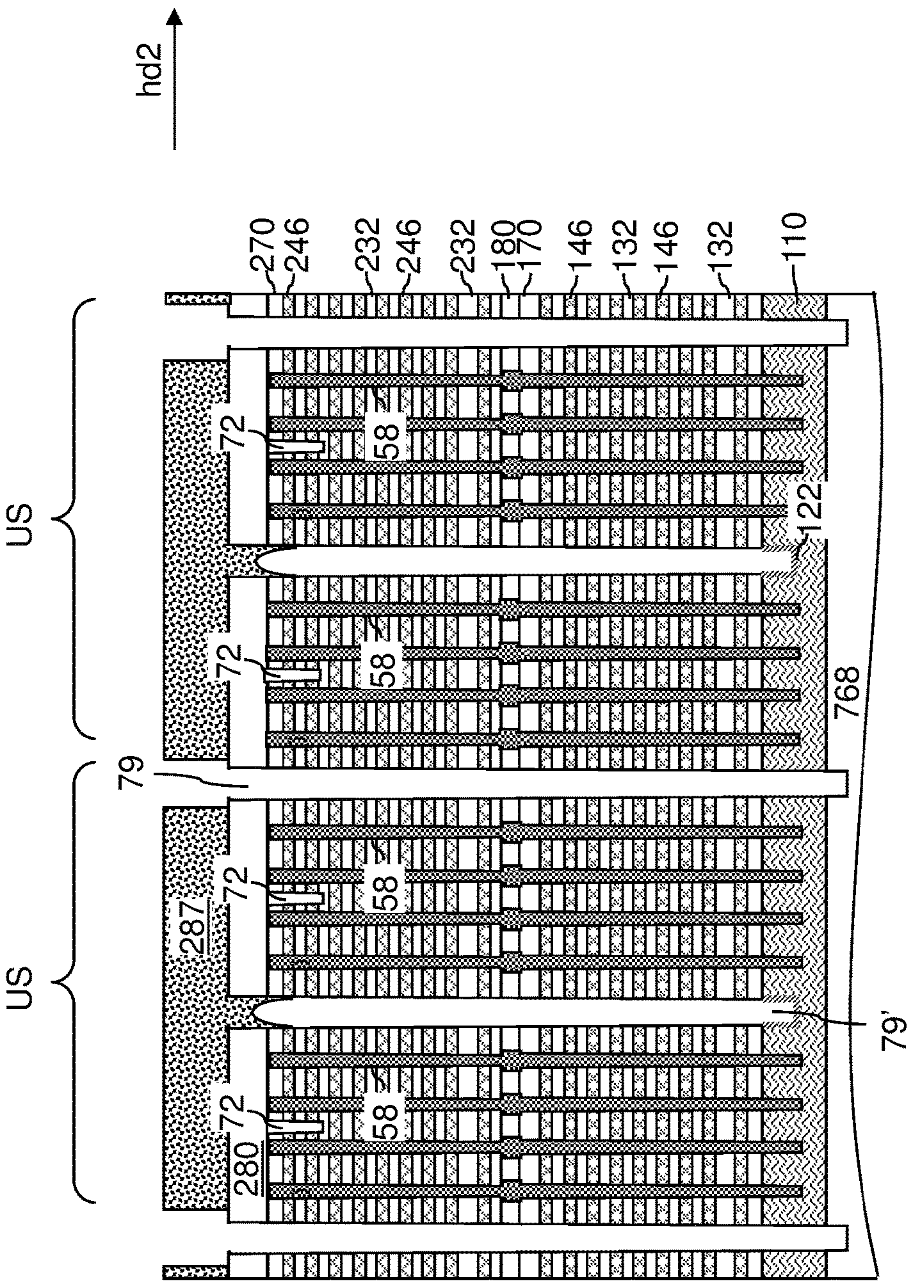
FIG. 17C is a vertical cross-sectional view of the first exemplary structure along the vertical plane C-C' of FIG. 17B.
Figure 18A:
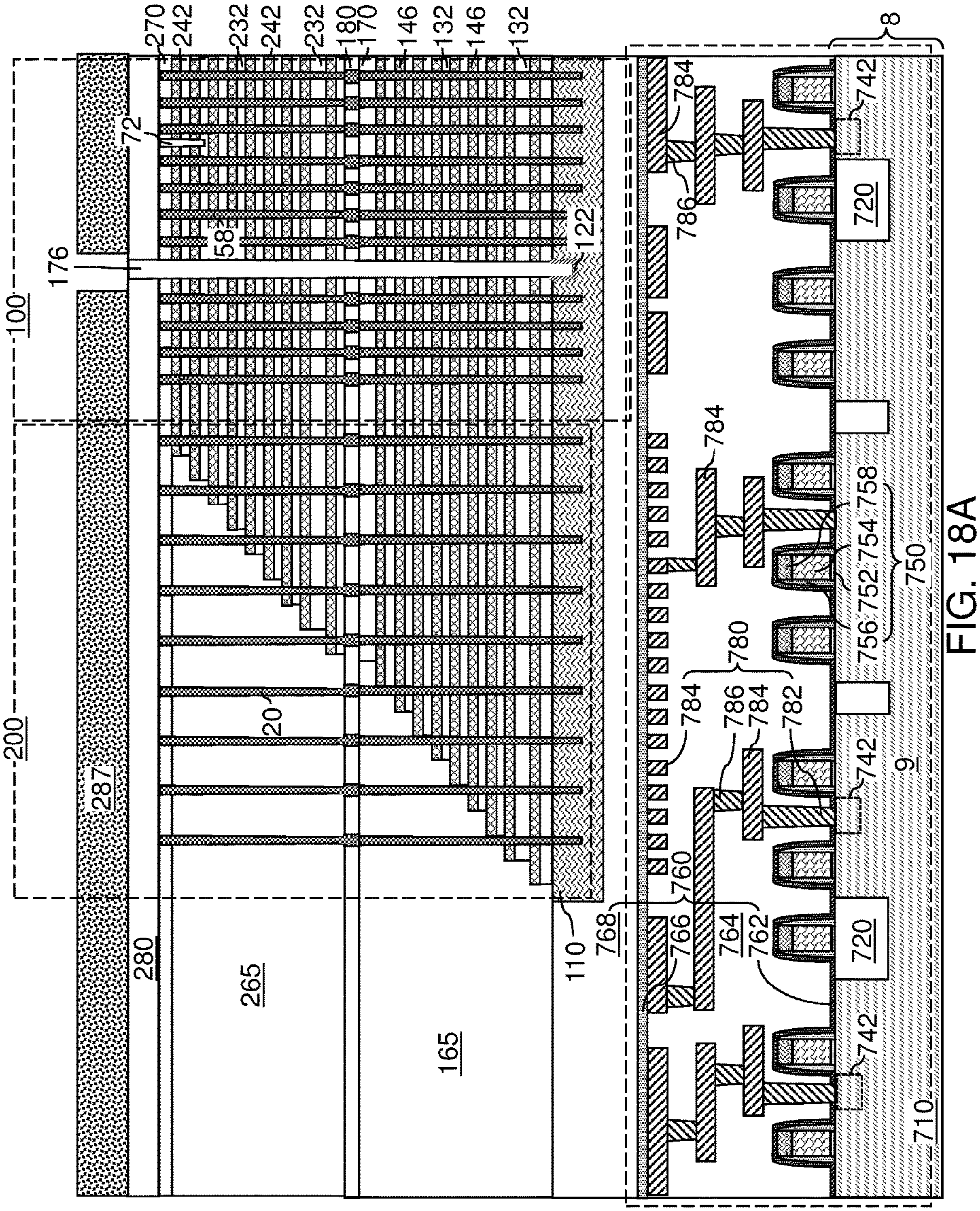
FIG. 18A is a vertical cross-sectional view of the first exemplary structure after formation of dielectric trench fill structures in a second subset of the backside trenches and removal of the patterned etch mask layer according to the first embodiment of the present disclosure.
Figure 18B:
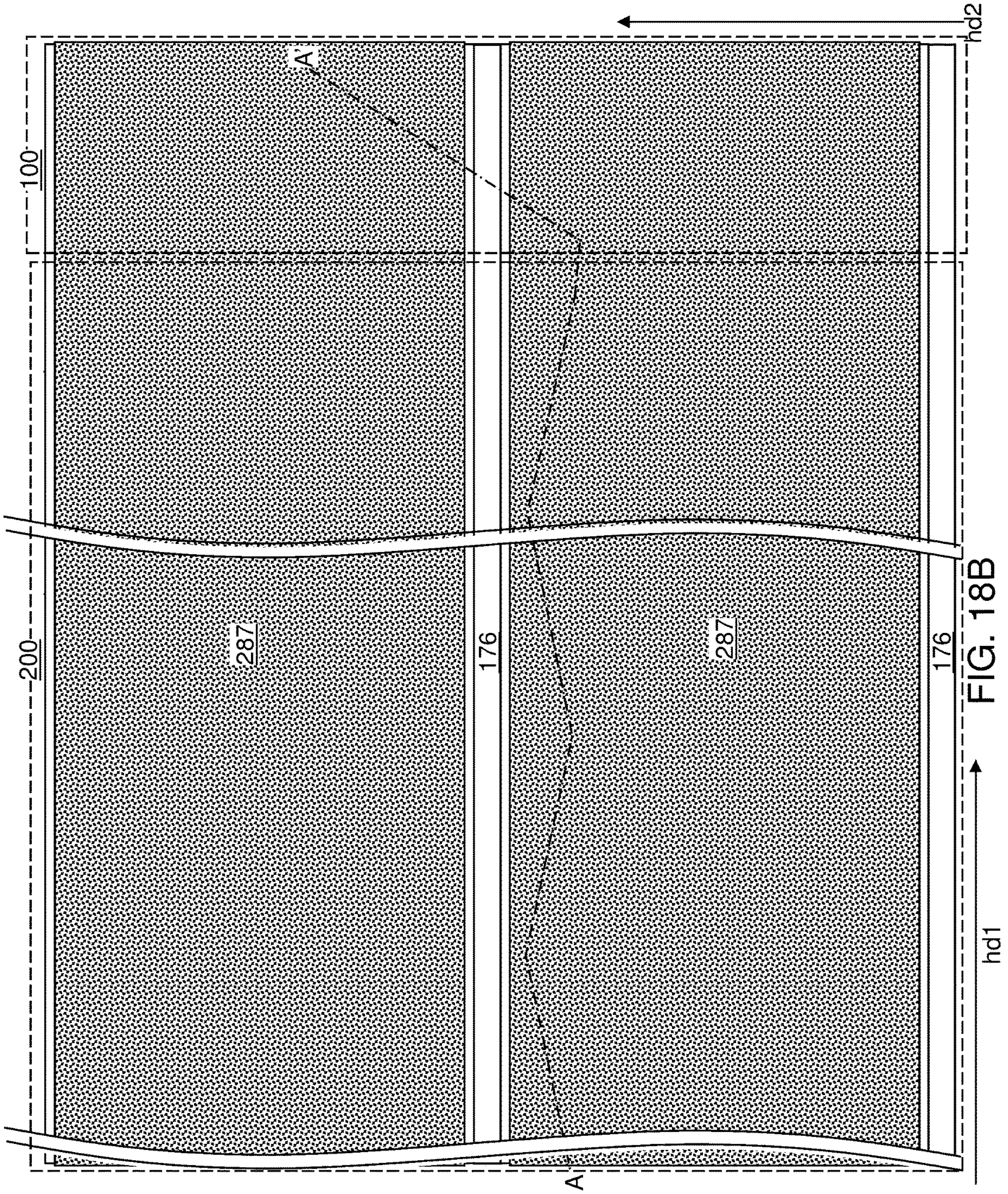
FIG. 18B is a top-down view of the first exemplary structure of FIG. 18A. The zig-zag vertical plane A-A' corresponds to the plane of the vertical cross-sectional view of FIG. 18A.
Figure 18C:
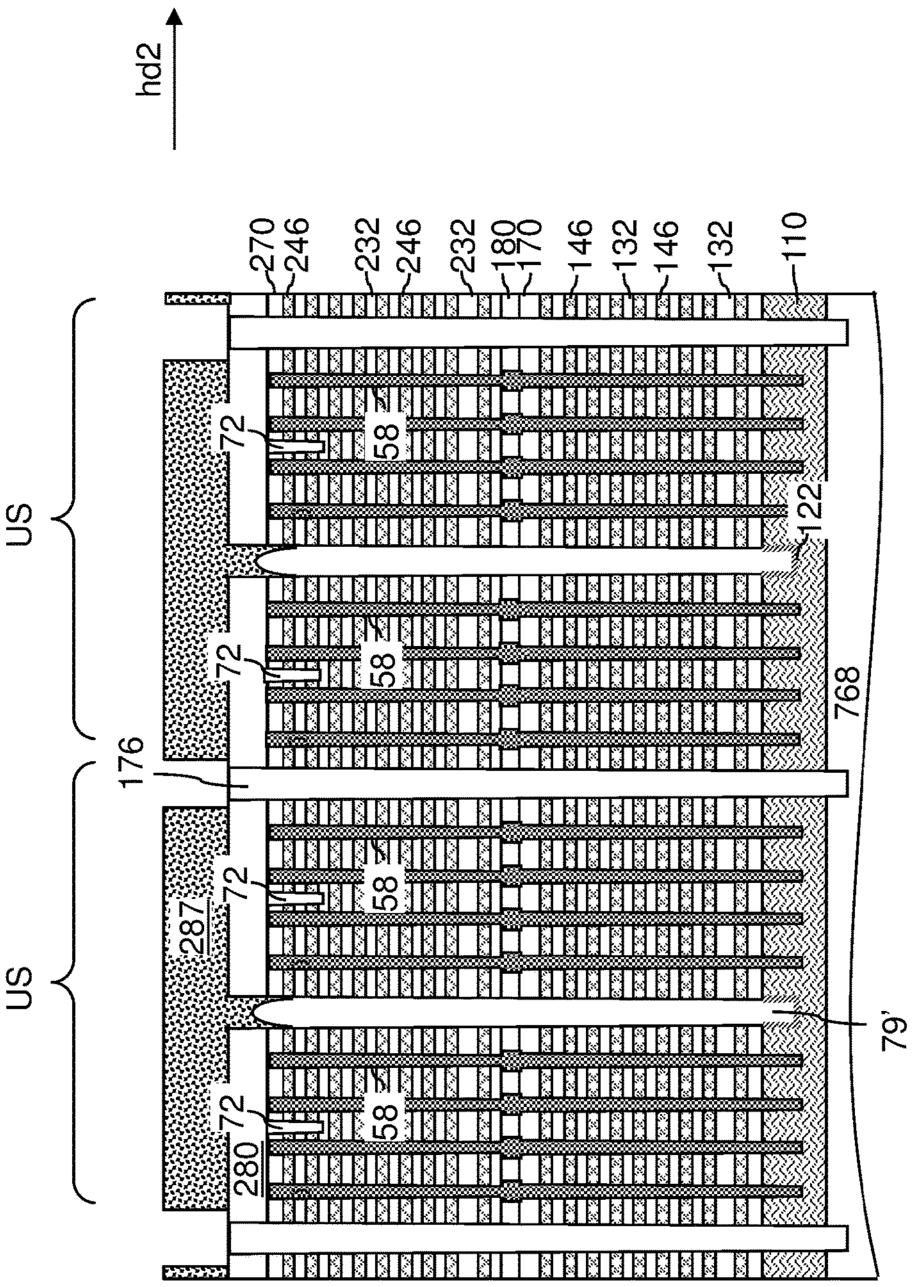
FIG. 18C is a vertical cross-sectional view of the first exemplary structure along the vertical plane C-C' of FIG. 18B.
Figure 18D:
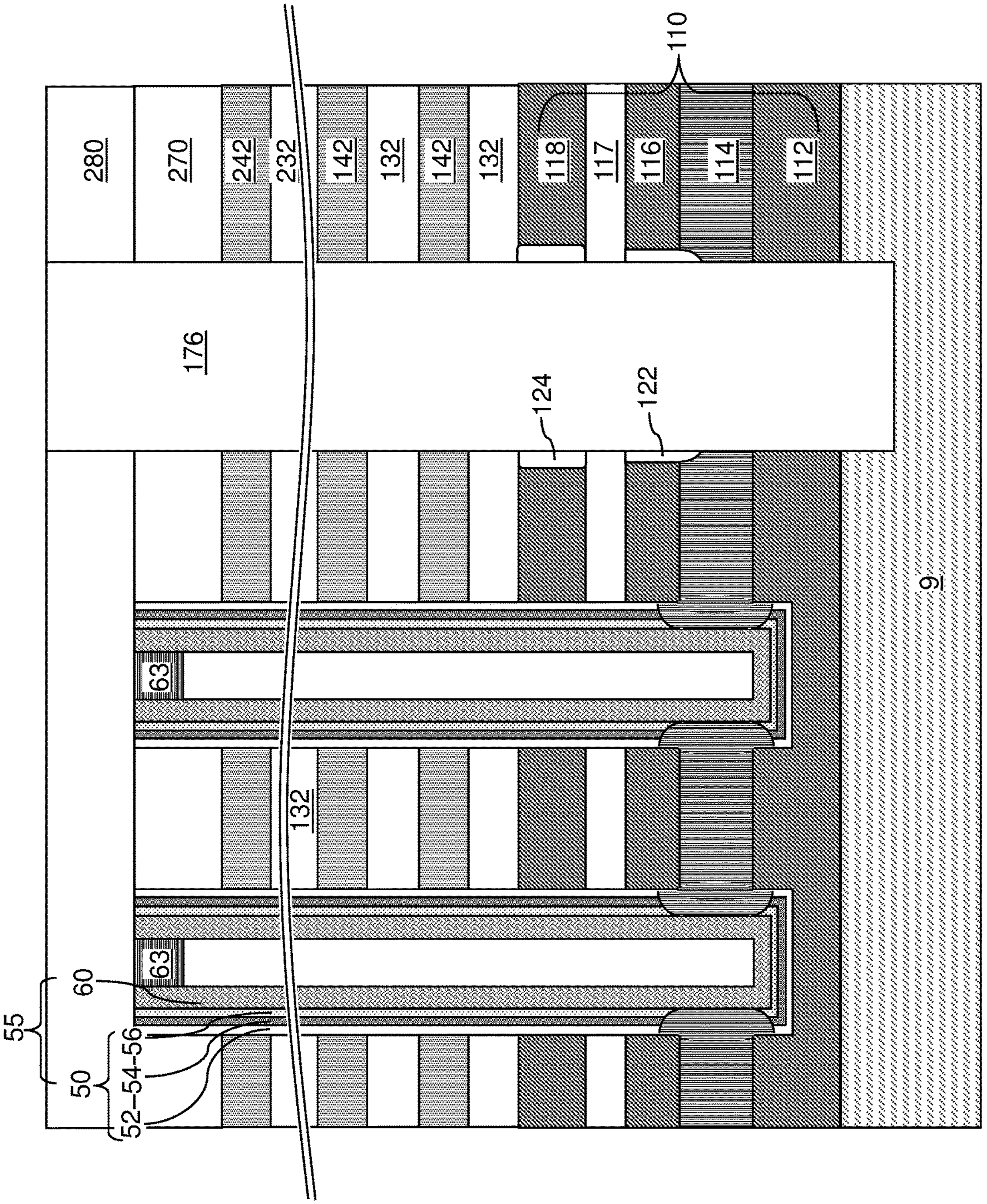
FIG. 18D is a magnified vertical cross-sectional view of a region of the first exemplary structure of FIGS. 18A-18C.

Referring to FIGS. 17A-17C, a patterned etch mask layer (e.g., hard mask layer) 287 can be formed over the first exemplary structure. For example, a carbon-based etch mask material may be non-conformally deposited over the first exemplary structure, and a photoresist layer can be formed over the carbon-based etch mask material. The carbon-based etch mask material may comprise amorphous carbon, diamond-like carbon, or any other carbon-based material including carbon at an atomic percentage greater than 50%, and/or greater than 70%, and/or greater than 90%. In one embodiment, the carbon-based etch mask material may comprise a commercially available carbon-based patterning film. The thickness of the carbon-based etch mask material above the top surfaces of the contact-level dielectric layer 280 may be in a range from 150 nm to 1 microns, although lesser and greater thicknesses may also be employed. Alternatively, other hard mask materials may be used. A photoresist layer (not shown) can be applied over the layer of the carbon-based etch mask material, and can be lithographically patterned to cover a first subset of the backside trenches 79 without covering a second subset of the backside trenches 79. An etch process can be performed to pattern the layer of the carbon-based etch mask material into a patterned carbon-based etch mask material layer, which is the patterned etch mask layer 287. The photoresist layer can be subsequently removed, for example, by ashing.

According to an aspect of the present disclosure, the lithographic pattern employed to pattern the photoresist layer and the etch mask layer can have a periodicity along the second horizontal direction hd2. In one embodiment, the backside trenches 79 can be formed as a periodic structure having a periodicity along the second horizontal direction hd2. The periodicity of the backside trenches 79 along the second horizontal direction hd2 is herein referred to as a backside-trench periodicity. The periodicity of the lithographic pattern along the second horizontal direction hd2 can be a non-unity integer multiple of the backside-trench periodicity, i.e., an integer multiple of the backside-trench periodicity that is greater than 1. In other words, the ratio of the periodicity of the lithographic pattern along the second horizontal direction hd2 to the backside-trench periodicity may be a positive integer that is greater than 1, i.e., 2, 3, 4, 5, 6, 7, etc.

In one embodiment, the patterned etch mask layer 287 may have only one slit-shaped opening that overlies one of the backside trenches 79 within each distance that encompasses the periodicity of the lithographic pattern along the second horizontal direction hd2. In one embodiment, the ratio of the periodicity of the lithographic pattern along the second horizontal direction hd2 to the backside-trench periodicity may be a positive integer N (which is greater than 1), and every N-th backside trenches 79 may belong to a second subset of the backside trenches 79, and all other backside trenches 79 may belong to a first subset of the backside trenches 79 (which is the complementary subset of the second subset of the backside trenches 79). In one embodiment, each of the backside trenches 79 may be sequentially numbered with positive integers beginning with 1, and all backside trenches having a positive residue upon a modulo-N division may be in the first subset of the backside trenches 79, and all backside trenches having a zero residue upon a modulo-N division may be in the second subset of the backside trenches 79. A modulo-N division refers to a mathematic operation in which a positive integer is divided by another positive integer N (which is greater than 1) to generate an integer quotient and a non-negative integer remainder, and the output of the operation is equal to the non-negative integer remainder. According to an embodiment of the present disclosure, the patterned etch mask layer 287 can be formed over and can cover the alternating stacks {(132, 146), (232, 246)} and the first subset of the backside trenches 79 without covering the second subset of the backside trenches 79. Thus, every N-th backside trench 79 is not covered by the patterned etch mask layer 287, and all other backside trenches 79 can be covered by the patterned etch mask layer 287. Each backside trench 79 in the first subset of the backside trenches 79 is herein referred to as a first backside trench 79, and each backside trench 79 in the second subset of the backside trenches 79 is herein referred to as a second backside trench 79.

An anisotropic etch process can be performed to vertically extend the second subset of the backside trenches 79 through the in-process source-level material layers 110' and into the at least one second dielectric layer 768. Bottom surfaces of the second subset of the backside trenches 79 are formed below the horizontal plane including the bottom surface of the in-process source-level material layers 110'. As shown in FIG. 17C, the first exemplary structure can include a periodic repetition of a unit structure US that is repeated along the second horizontal direction (e.g., bit line direction) hd2 within the periodicity of the pattern of the patterned etch mask layer 287. Each unit structure US may comprise a memory block of a memory plane. Each unit structure US includes a backside trench 79 within the second subset of the backside trenches 79, and one or more backside trenches 79 within the first subset of the backside trenches 79.

Referring to FIGS. 18A-18D, a dielectric fill material can be conformally deposited in the second subset of the backside trenches 79 and over the patterned etch mask layer 287. The dielectric fill material may be deposited by a conformal deposition process such as a low pressure chemical vapor deposition (LPCVD) process. The duration of the deposition process employed to deposit the dielectric fill material may be selected such that the dielectric fill material fills the second subset of the backside trenches 79.

The patterned etch mask layer 287 and portions of the dielectric fill material that are deposited over the patterned etch mask layer 287 are then removed from above the first exemplary structure. For example, the removal process may comprise a reactive ion etch (RIE) and/or a CMP process. Each remaining portion of the dielectric fill material that fills the second subset of the backside trenches 79 constitutes a dielectric trench fill structure 176.

The dielectric trench fill structure 176 can comprise any suitable insulating material. For example, the dielectric trench fill structure 176 can comprise silicon oxide, silicon nitride, silicon oxynitride, silicon carbonitride (SiCN), silicon oxycarbide (SiOC) or a dielectric metal oxide, such as aluminum oxide, hafnium oxide, tantalum oxide, etc.

Referring to FIGS. 19A-19F, an insulating spacer material layer such as a silicon oxide layer can be formally deposited in the first subset of the backside trenches 79 and over the contact-level dielectric layers 280 and the dielectric trench fill structures 176 filling the second subset of the backside trenches. An anisotropic etch process can be performed to remove horizontally-extending portions of the insulating spacer material layer from above the contact-level dielectric layers 280 and at the bottom of the first subset of the backside trenches 79. For example, if the insulating spacer material comprises silicon oxide, then the dielectric trench fill structure 176 can comprise, silicon nitride, silicon oxynitride, silicon carbonitride (SiCN), silicon oxycarbide (SiOC) or a dielectric metal oxide, which are resistant to the anisotropic etch process used to etch the silicon oxide insulating spacer material layer. In one embodiment, center portions of the semiconductor oxide plates 122 may be collaterally etched to physically expose top surface segments of underlying portions of the source contact layer 114. Each remaining vertically-extending tubular portion of the insulating spacer material layer constitutes a backside insulating spacer 74.

At least one electrically conductive material, such as at least metallic material, can be subsequently deposited in the cavities in the first subset of the backside trenches 79. The at least one conductive material may comprise at least one metallic barrier material (e.g., a metallic nitride material such as TiN, TaN, MoN and/or WN) and at least one metallic fill material (e.g., W, Cu, Co, Ru, Mo, etc.). Excess portions of the at least one metallic material can be removed from above the horizontal plane including the top surfaces of the contact-level dielectric layer 280 by a planarization process, which may employ a recess etch process and/or a chemical mechanical polishing process. Each remaining portion of the at least one metallic material constitutes a backside contact via structure 76. Each contiguous combination of a backside insulating spacer 74 and a backside contact via structure 76 constitutes a backside trench fill structure (74, 76). Each backside trench 79 within the first subset of the backside trenches 79 can be filled with a respective backside trench fill structure (74, 76).

Generally, backside trench fill structures (74, 76) can be formed in the first subset of the backside trenches 79. Each of the backside trench fill structures (74, 76) comprises a respective backside insulating spacer 74 and a respective backside contact via structure 76. In one embodiment, each of the backside contact via structures 76 is formed directly on a respective surface of the source contact layer 114. Thus, the backside contact via structures 76 comprise source lines or source electrodes. In one embodiment, each recessed surface segment of the source layer (112, 114, 116) that is contacted by a respective backside contact via structures 76 is a surface of the source contact layer 114. In one embodiment, each backside contact via structure 76 is laterally surrounded by and is laterally spaced from a respective neighboring pair of alternating stacks {(132, 146), (232, 246)} by a respective backside insulating spacer 74. Each backside insulating spacer 74 laterally surrounds a respective backside contact via structure 76 therein.

Figure 19A:
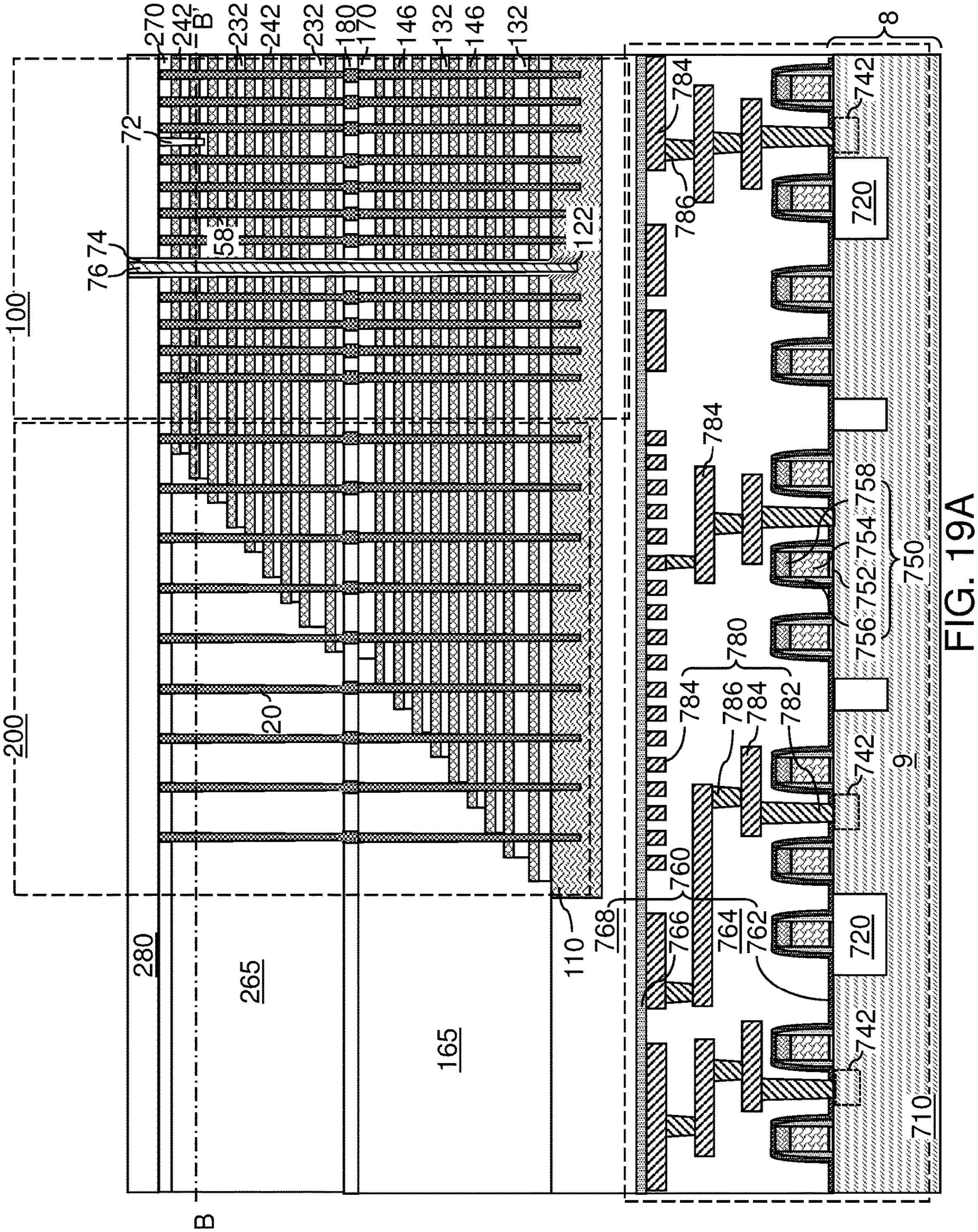
FIG. 19A is a vertical cross-sectional view of the first exemplary structure after formation of backside trench fill structures in a first subset of the backside trenches according to the first embodiment of the present disclosure.
Figure 19B:
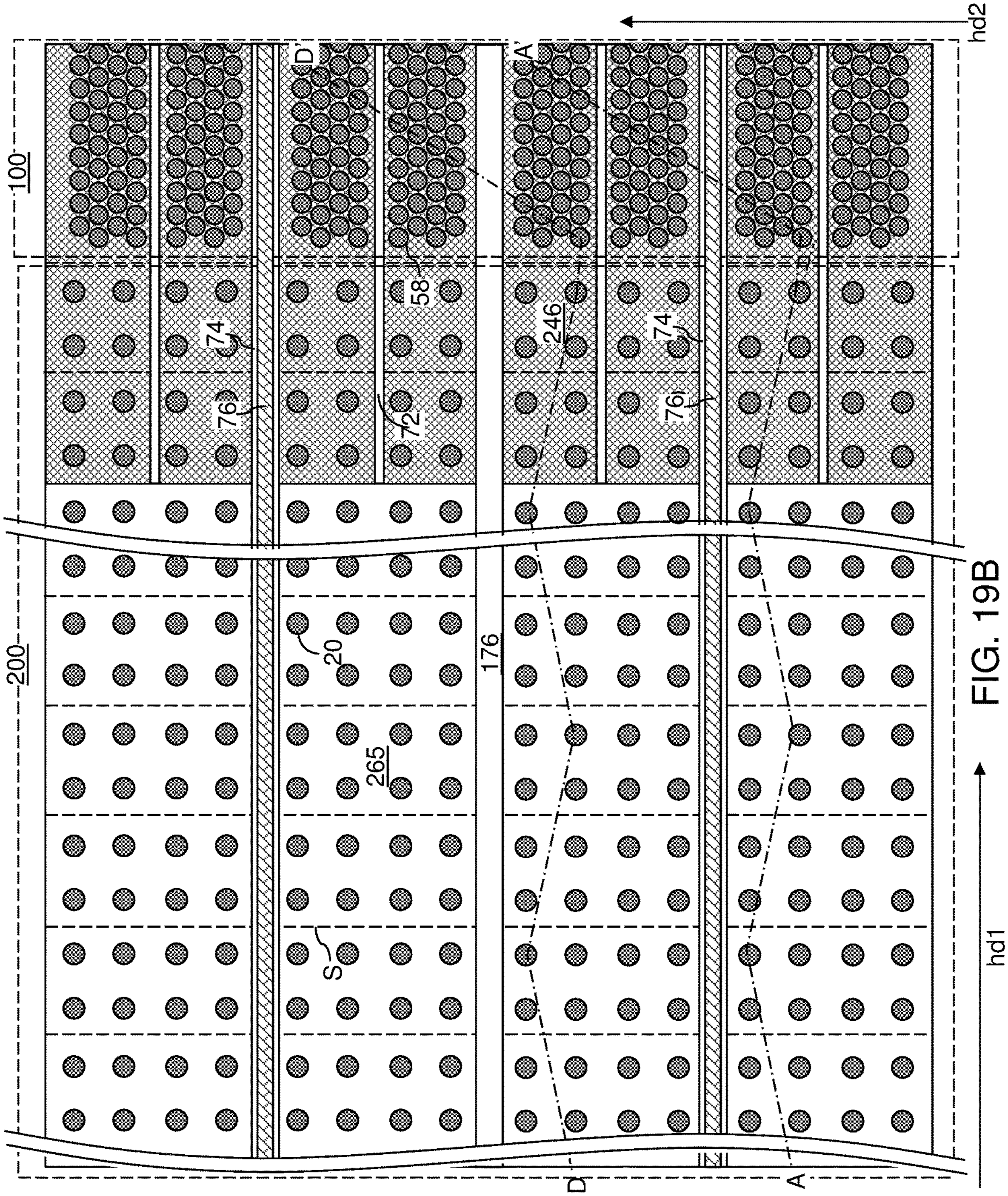
FIG. 19B is a horizontal cross-sectional view of the first exemplary structure along the horizontal plane B-B' of FIG. 19A. The zig-zag vertical plane A-A' corresponds to the plane of the vertical cross-sectional view of FIG. 19A.
Figure 19C:
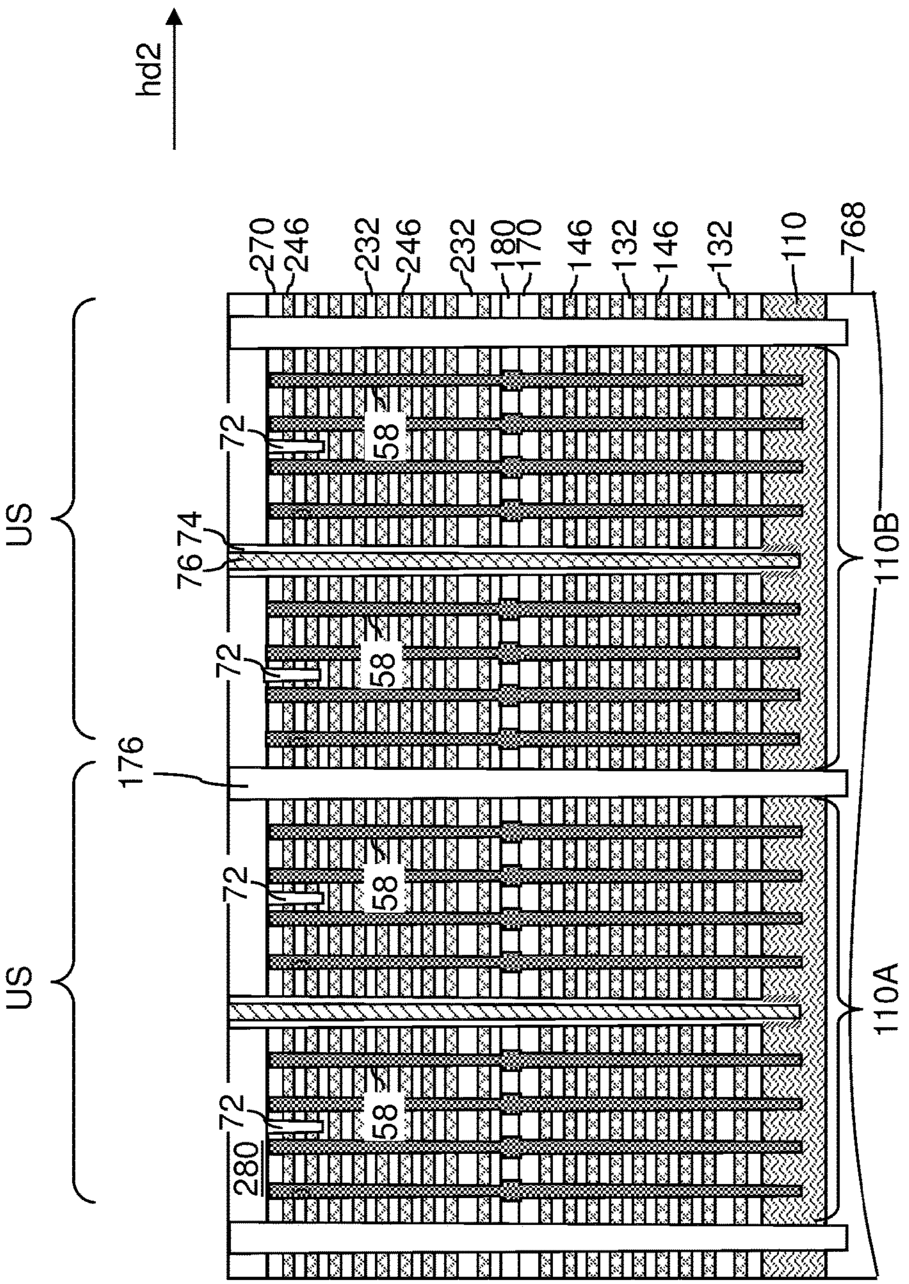
FIG. 19C is a vertical cross-sectional view of the first exemplary structure along the vertical plane C-C' of FIG. 19B.
Figure 19D:
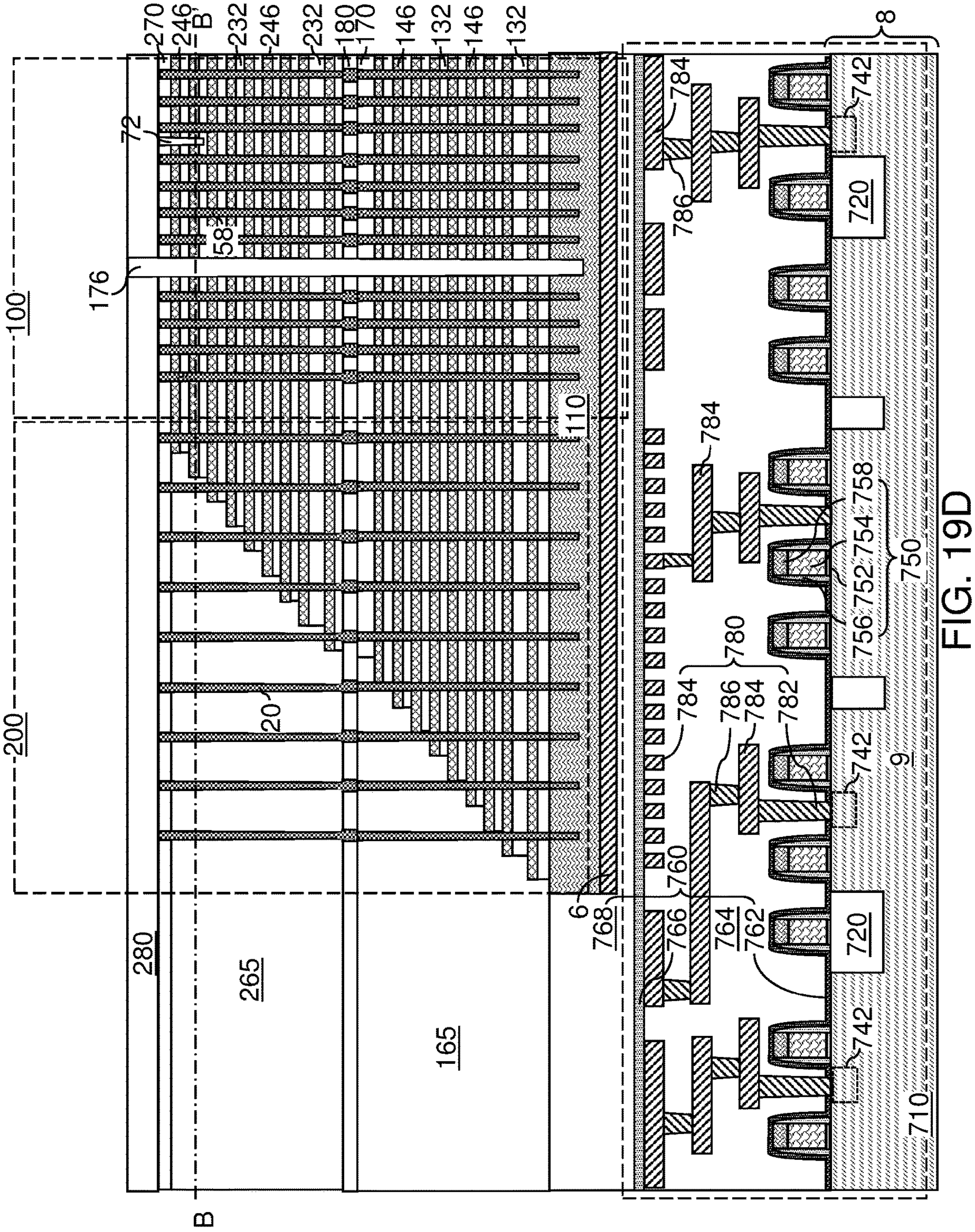
FIG. 19D is a vertical cross-sectional view of the first exemplary structure along the zig-zag vertical plane D-D' of FIG. 19B.
Figure 19E:
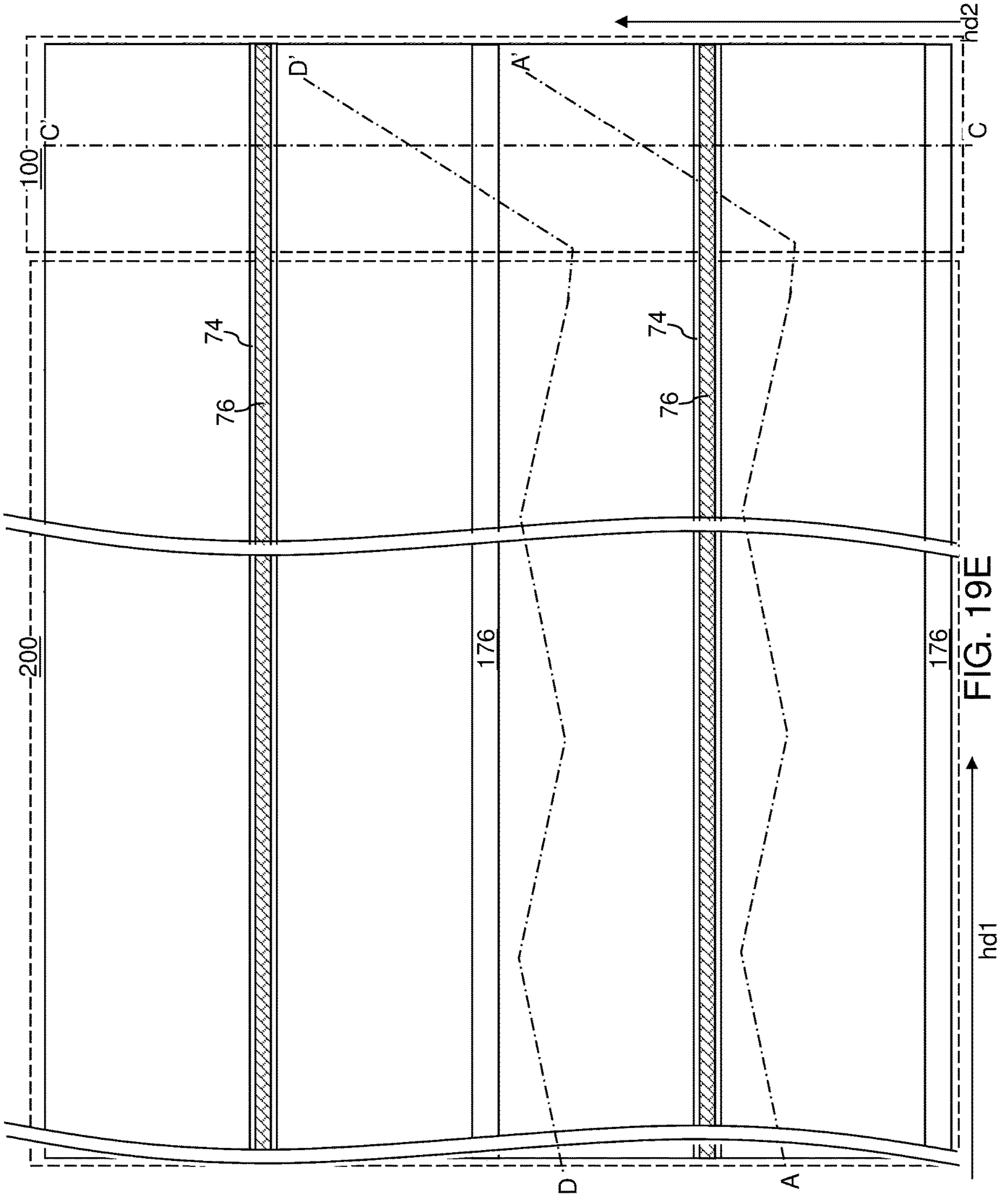
FIG. 19E is a top-down view of the first exemplary structure of FIG. 19A-19D. The zig-zag vertical plane A-A' corresponds to the plane of the vertical cross-sectional view of FIG. 19A. The zig-zag vertical plane D-D' corresponds to the plane of the vertical cross-sectional view of FIG. 19D.
Figure 19F:
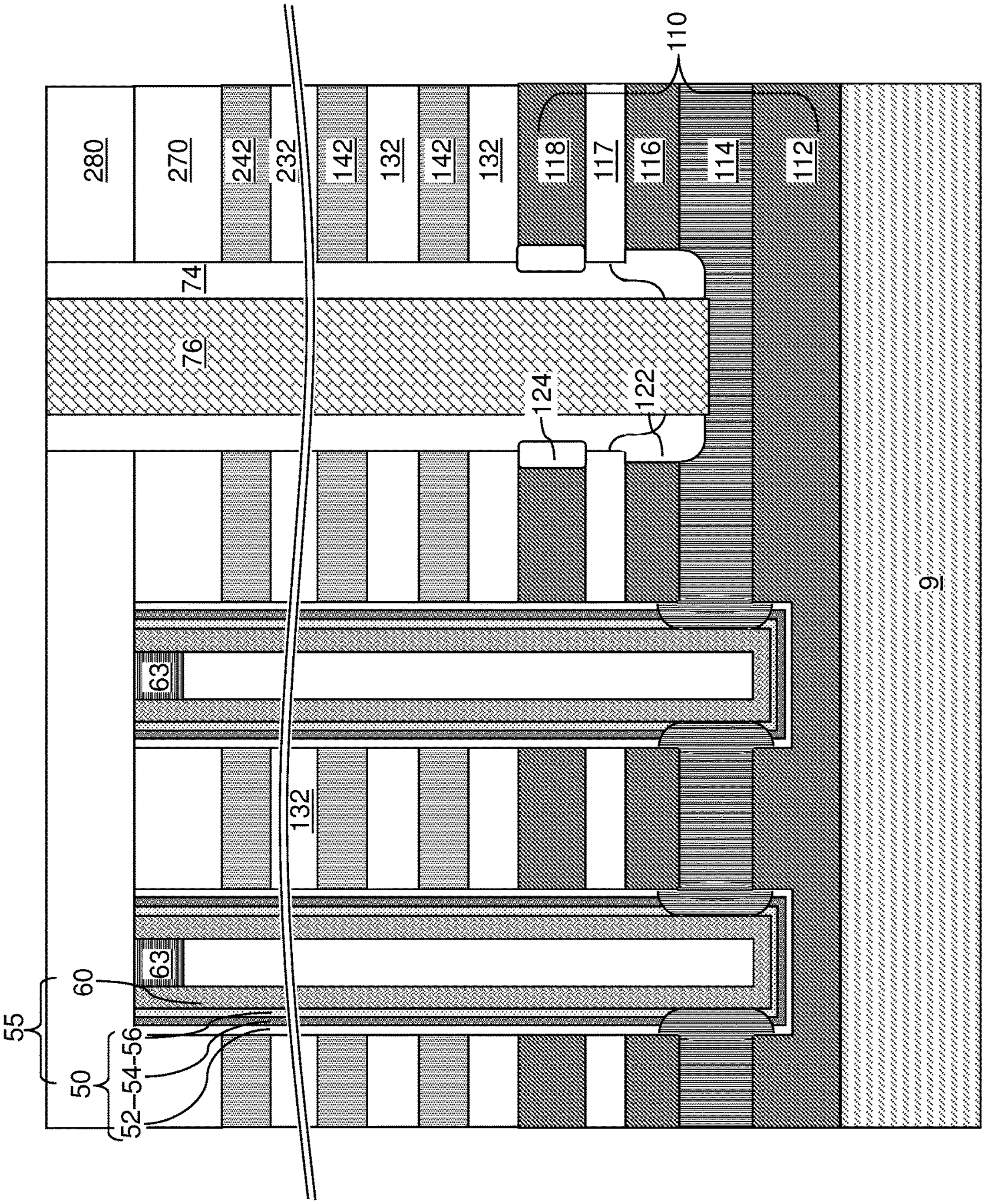
FIG. 19F is a magnified vertical cross-sectional view of a region of the first exemplary structure of FIGS. 19A-19E.

As shown in FIG. 19C, the first exemplary structure includes multiple instances of a unit structure US that laterally extends along a first horizontal direction (e.g., word line direction) hd1 and repeated along a second horizontal direction (e.g., bit line direction) hd2 that is perpendicular to the first horizontal direction hd1. Each instance of the unit structure US comprises: a source layer (112, 114, 116) comprising at least one doped semiconductor material; alternating stacks {(132, 146), (232, 246)} of insulating layers (132, 232) and electrically conductive layers (146, 246) located over the source layer (112, 114, 116) and laterally spaced apart from each other along the second horizontal direction hd2 by at least one first backside trench 79 comprising a respective backside contact via structure 76 contacting a respective recessed surface segment of the source layer (112, 114, 116); memory openings 49 vertically extending through a respective one of the alternating stacks {(132, 146), (232, 246)}; memory opening fill structures 58 located in the memory openings 49 and comprising a respective vertical stack of memory elements (which may comprise portions of memory films 50 located at levels of the electrically conductive layers (146, 246)) and a respective vertical semiconductor channel 60); and a dielectric trench fill structure 176 vertically extending from above the topmost surfaces of the alternating stacks {(132, 146), (232, 246)} to at least a bottom surface (and preferably below the bottom surface) of the source layer (112, 114, 116) and comprising a first sidewall that contacts an outermost alternating stack of the alternating stacks {(132, 146), (232, 246)}, and comprising a second sidewall that contacts another alternating stack of alternating stacks {(132, 146), (232, 246)} within a neighboring instance of the unit structure US. In one embodiment, a contact area between the source layer (112, 114, 116) and the dielectric trench fill structure 176 vertically extends continuously from a top surface of the source layer (112, 114, 116) to a bottom surface of the source layer (112, 114, 116).

In one embodiment, each instance of the unit structure US comprises a plurality contact-level dielectric layers 280 overlying a respective one of the alternating stacks {(132, 146), (232, 246)} and a respective subset of the memory opening fill structures 58 and having a respective top surface located within a horizontal plane including top surfaces of the backside contact via structures 76 and the dielectric trench fill structures 176. In one embodiment, each of the plurality contact-level dielectric layers 280 contacts sidewalls of a pair of backside insulating spacers 74 or a sidewall of a respective backside insulating spacer 74 and a sidewall of the dielectric trench fill structure 176 of a respective instance of the unit structure US or a sidewall of an additional dielectric trench fill structure 176 of a neighboring unit structure US. In one embodiment, each of the memory opening fill structures 58 comprises a respective drain region 63 comprising a respective doped semiconductor material, and each of the plurality contact-level dielectric layers 280 overlies a horizontal plane including top surface of the drain regions 63.

In one embodiment shown in FIG. 19C, the dielectric trench fill structure 176 separates the source layer (112, 114, 116) into first and second source layer portions (110A, 110B) which contact sidewalls of vertical semiconductor channels 60 located in different sets of the memory opening fill structures 58. In other words, the first source layer portion 110A contacts sidewalls of the vertical semiconductor channels 60 of memory opening fill structures 58 located in a first alternating stack of the alternating stacks, while the second source layer portion 110B contacts sidewalls of the vertical semiconductor channels 60 of memory opening fill structures 58 located in a second alternating stack of the alternating stacks.

Generally, each unit structure US may include two alternating stacks {(132, 146), (232, 246)} or three or more alternating stacks {(132, 146), (232, 246)}. Referring to FIG. 19C, in one configuration of the first exemplary structure, the number N is 4, and there are two alternating stacks within the unit structure US, one backside trench fill structure (74, 76) and one dielectric trench fill structures 176.

Figure 20A:
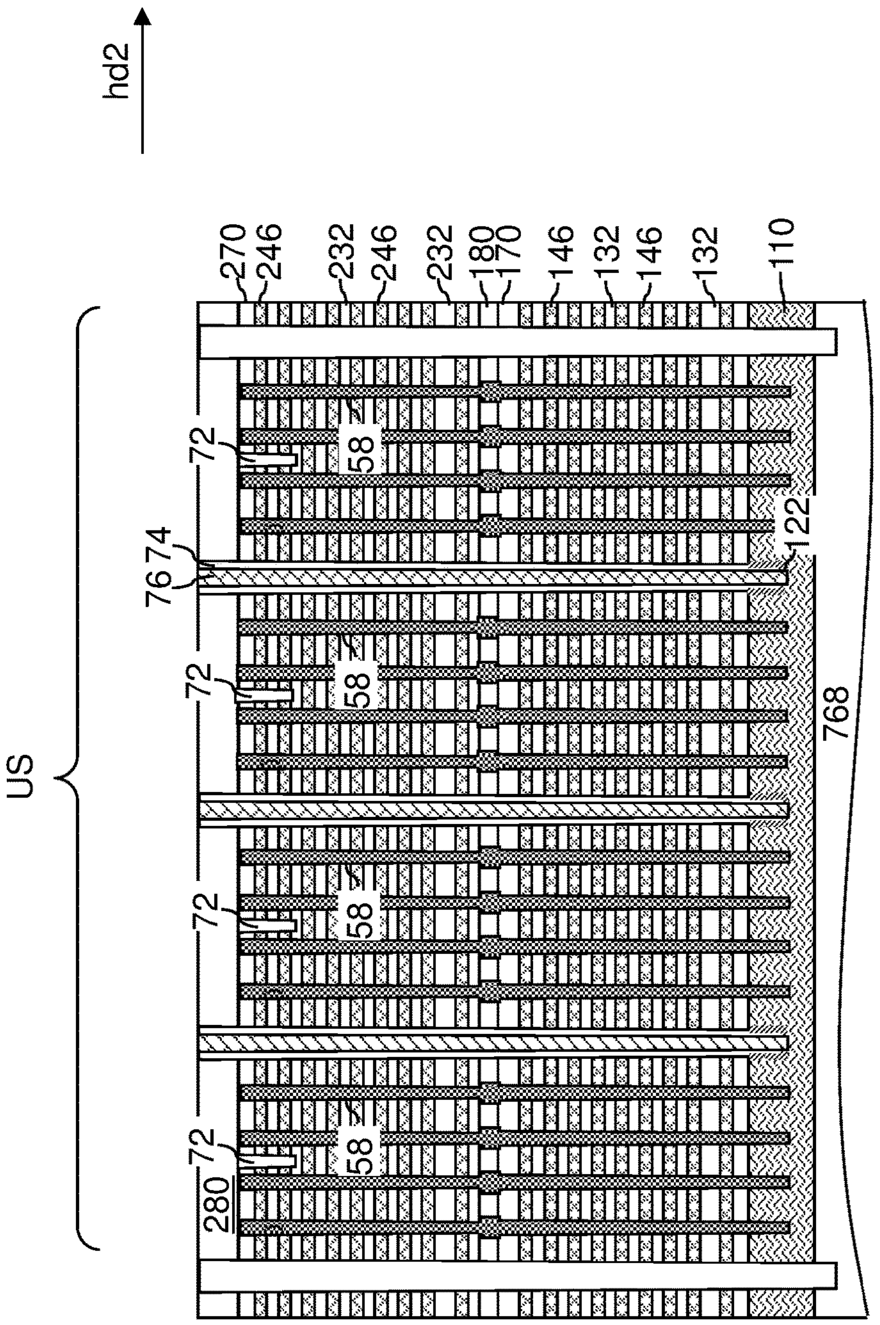
FIG. 20A is a vertical cross-sectional view of a first alternative configuration of the first exemplary structure according to the first embodiment of the present disclosure.

Referring to FIG. 20A, a first alternative configuration of the first exemplary structure is illustrated, which is a configuration in which the number N is 4, and there are four alternating stacks within the unit structure US, three backside trench fill structures (74, 76) and one dielectric trench fill structures 176.

Figure 20B:
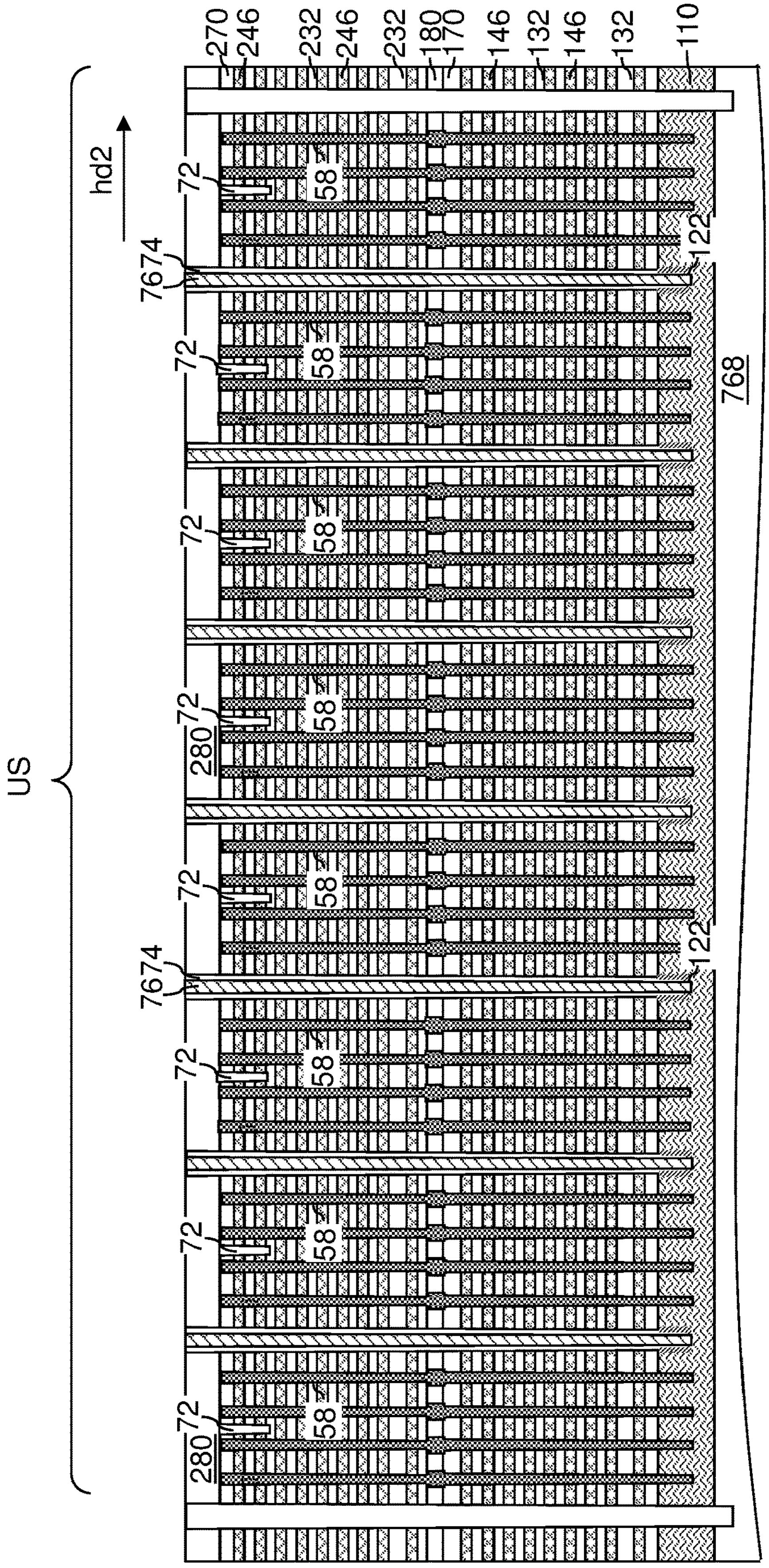
FIG. 20B is a vertical cross-sectional view of a second alternative configuration of the first exemplary structure according to the first embodiment of the present disclosure.

Referring to FIG. 20B, a second alternative configuration of the first exemplary structure is illustrated, which is a configuration in which the number N is 8, and there are eight alternating stacks within the unit structure US comprise eight alternating stacks, seven backside trench fill structures (74, 76), and one dielectric trench fill structures 176.

Thus, in the first and second alternative configurations, at least two (e.g., three and seven respectively) of the first backside trenches 79 containing the respective backside contact via structures 76 are located between a nearest neighbor pair of the second backside trenches 79 containing the respective dielectric trench fill structure 176.

Figure 21A:
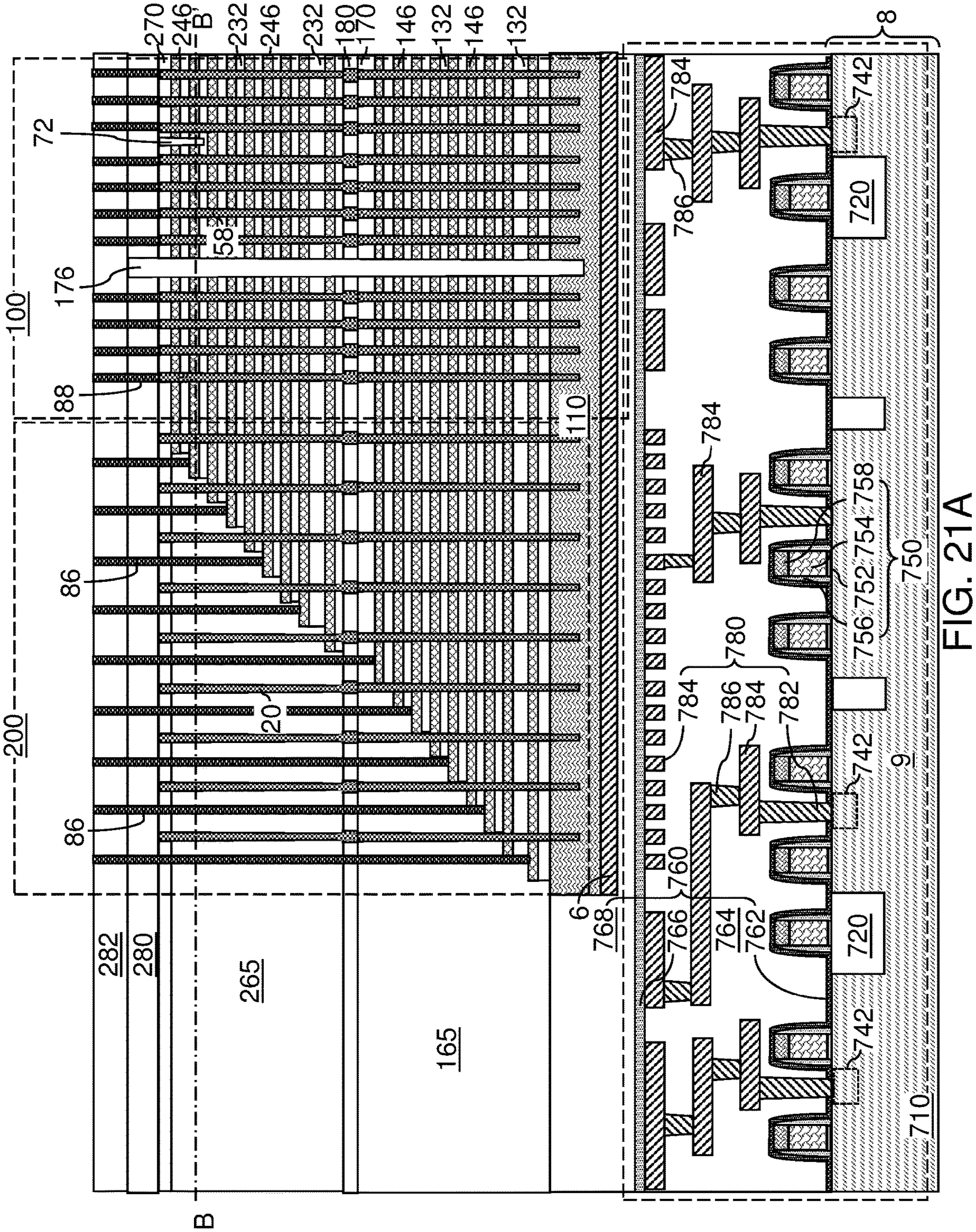
FIG. 21A is a vertical cross-sectional view of the first exemplary structure after formation of drain contact via structures and layer contact via structures according to the first embodiment of the present disclosure.
Figure 21B:
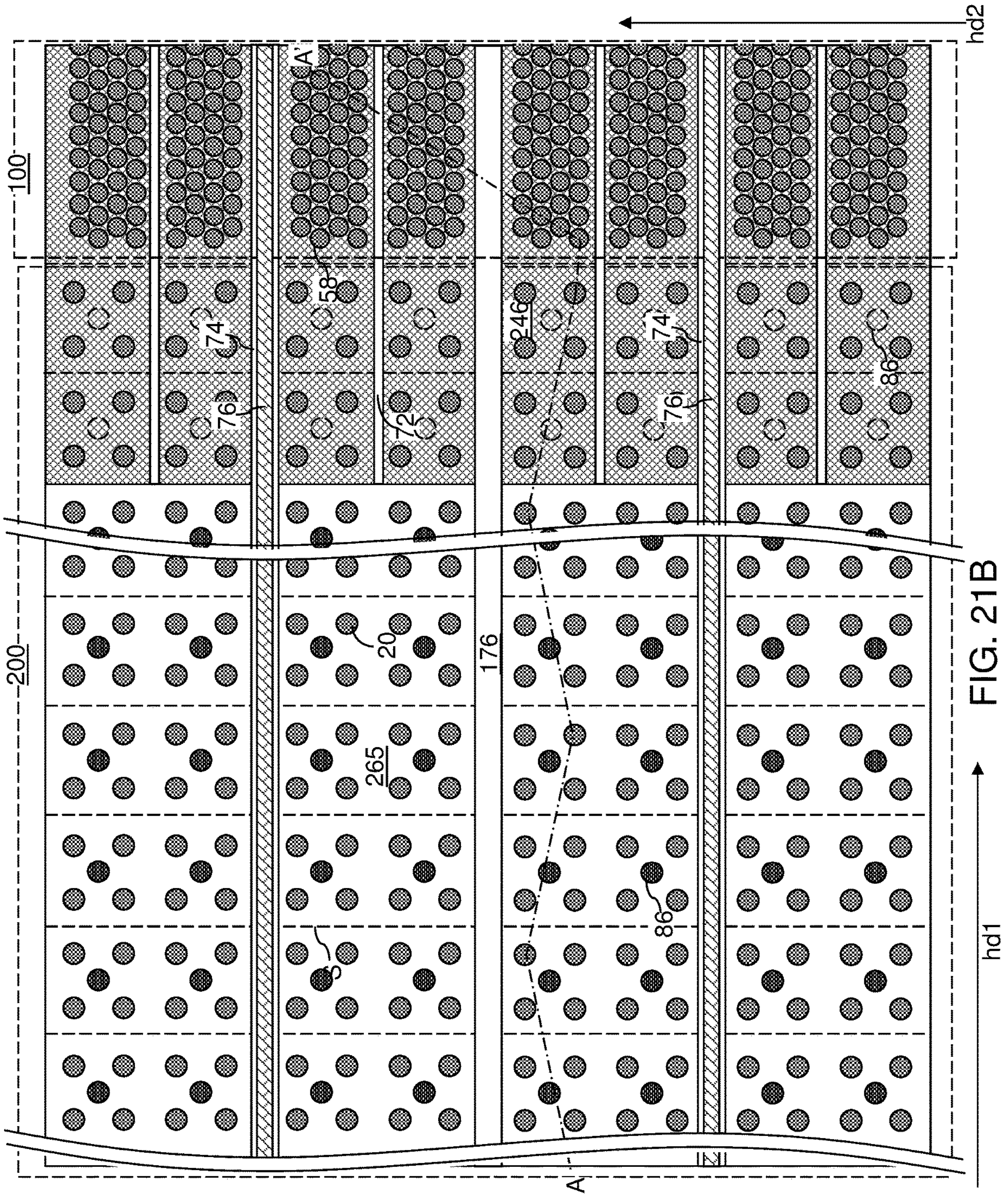
FIG. 21B is a horizontal cross-sectional view of the first exemplary structure along the horizontal plane B-B' of FIG. 21A. The zig-zag vertical plane A-A' corresponds to the plane of the vertical cross-sectional view of FIG. 21A.

Referring to FIGS. 21A and 21B, a via-level dielectric layer 282 can be formed over the contact-level dielectric layers 280. A photoresist layer (not shown) can be applied over the via-level dielectric layers 282, and can be lithographically patterned to form various contact via openings. For example, openings for forming drain contact via structures can be formed through the via-level dielectric layer 282 and the contact-level dielectric layer in the memory array region 100, and openings for forming layer contact via structures can be formed through the via-level dielectric layer 282, the contact-level dielectric layer 280, and the retro-stepped dielectric material portions (165, 265) in the staircase region 200. An anisotropic etch process is performed to transfer the pattern in the photoresist layer through the via-level dielectric layer 282, the contact-level dielectric layers 280, and underlying dielectric material portions. The drain regions 63 and the electrically conductive layers (146, 246) can be employed as etch stop structures. Drain contact via cavities can be formed over each drain region 63, and layer contact via cavities can be formed over each electrically conductive layer (146. 246) at the stepped surfaces underlying the first and second retro-stepped dielectric material portions (165, 265). The photoresist layer can be subsequently removed, for example, by ashing.

At least one conductive material can be deposited in the layer contact via cavities and the drain contact via cavities. The at least one conductive material can include at least one metallic material. Excess portions of the at least one conductive material can be removed from above the horizontal plane including the top surface of the via-level dielectric layer 282 by a planarization process. The planarization process can employ a recess etch process and/or a chemical mechanical planarization process. Remaining portions of the at least one conductive material in the drain contact via cavities constitute drain contact via structures 88. Remaining portions of the at least one conductive material in the layer contact via cavities constitute layer contact via structures 86.

Figure 22:
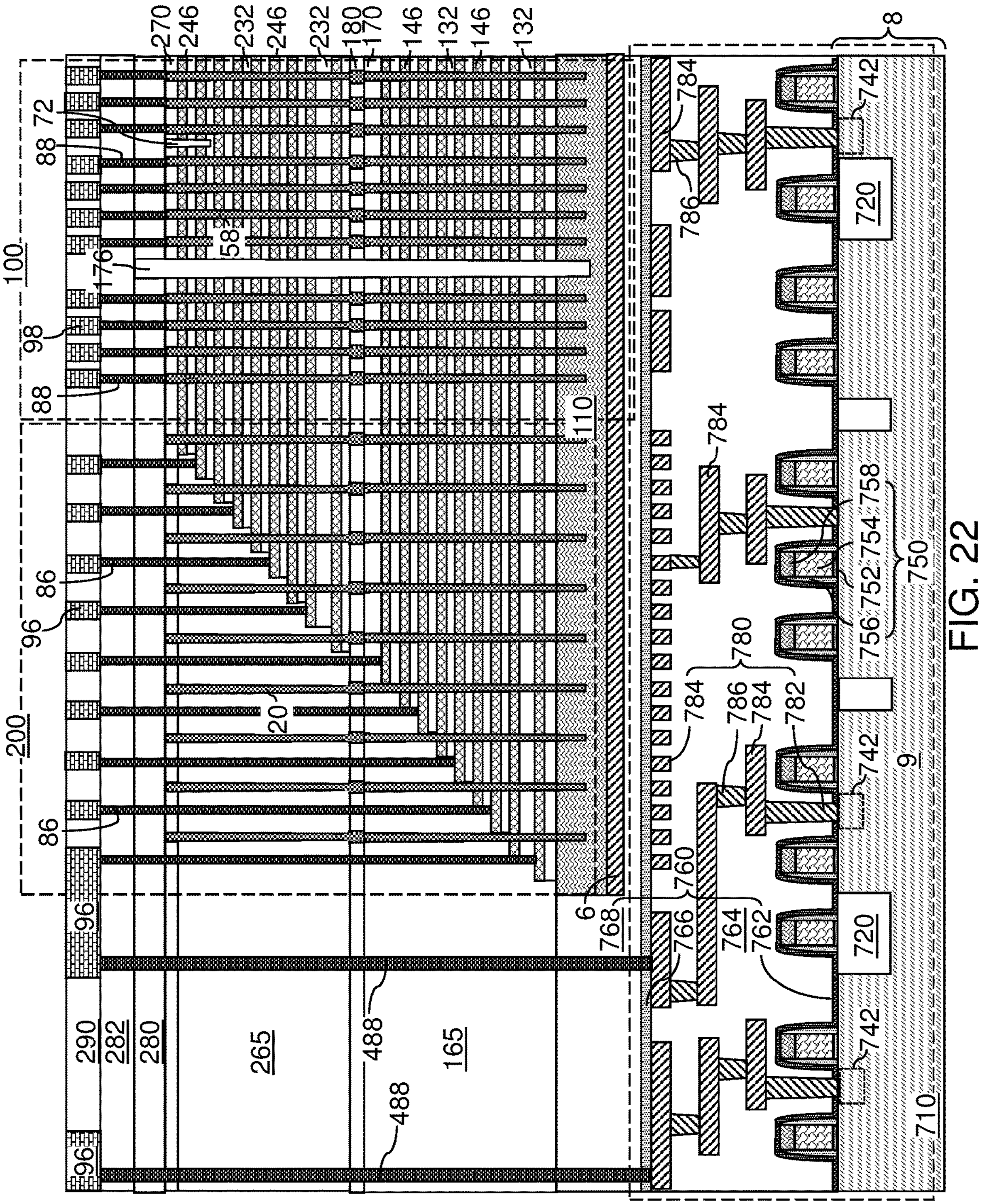
FIG. 22 is a vertical cross-sectional view of the first exemplary structure after formation of through-memory-level connection via structures and upper-level metal interconnect structures according to the first embodiment of the present disclosure.

Referring to FIG. 22, connection via structures (which are herein referred to as through-memory-level connection via structures 488) can be formed through the retro-stepped dielectric material portions (165, 265) on a respective one of the lower-level metal interconnect structures 780. Upper-level metal interconnect structures (96, 98) and upper-level dielectric material layers can be formed over the via-level dielectric layer 282. For example, the upper-level dielectric material layers may comprise a bit-line-level dielectric layer 290 and additional dielectric material layers (not shown). The upper-level metal interconnect structures (96, 98) may comprise bit line 98, bit-line-level metal lines 96, and additional metal lines and via structures (not shown) that are formed above the bit lines 98 and the bit-line-level metal lines 96.

In one embodiment, each of the alternating stacks {(132, 146), (232, 246)} has respective stepped surfaces having lateral extents along the first horizontal direction hd1 that decrease with a vertical distance from the semiconductor substrate 8. Retro-stepped dielectric material portions (165, 265) overlie the stepped surfaces of the alternating stacks {(132, 146), (232, 246)}. The through-memory-level connection via structures 488 vertically extend through a respective one of the retro-stepped dielectric material portions (165, 265). The peripheral circuitry is electrically connected to the electrically conductive layers (146, 246) and the vertical stacks of memory elements (which may comprise portions of memory films 50 located at levels of the electrically conductive layers (146, 246)) through lower-level metal interconnect structures 780 and through the upper-level metal interconnect structures.

Referring collectively to FIGS. 1A-22 and according to various embodiments of the present disclosure, a memory device comprises a source layer (112, 114, 116) comprising at least one doped semiconductor material, alternating stacks {(132, 146), (232, 246)} of insulating layers (132, 232) and electrically conductive layers (146, 246) located over the source layer (112, 114, 116), extending along a first horizontal direction hd1 and laterally spaced apart from each other along the second horizontal direction hd2 by backside trenches 79. The backside trenches 79 comprise at least one first backside trench containing with a respective backside contact via structure 76 comprising an electrically conductive material contacting the source layer (112, 114, 116), and at least one second backside trench containing a respective dielectric trench fill structure 176 which extends from above the topmost surfaces of the alternating stacks {(132, 146), (232, 246)} to at least a bottom surface of the source layer (112, 114, 116) (e.g., at least to the bottom of layer 112). The memory device also comprises memory openings 49. Each of the memory openings 49 vertically extends through a respective one of the alternating stacks {(132, 146), (232, 246)}. Memory opening fill structures 58 are located in the memory openings 49 and comprise a respective vertical stack of memory elements (e.g., portions of the memory film 50) and a respective vertical semiconductor channel 60.

In one embodiment, the source layer (112, 114, 116) comprises: a lower source-level material layer 112 comprising a first doped semiconductor material, an upper source-level material layer 116 comprising a second doped semiconductor material, and a source contact layer 114 comprising a third doped semiconductor material and located between the upper source-level material layer 116 and the lower source-level material layer 112.

In one embodiment, each of the respective backside contact via structures 76 contacts a surface of the source contact layer 114. In one embodiment, the source contact layer 114 contacts sidewalls of the vertical semiconductor channels 60. In one embodiment, each respective vertical stack of memory elements comprises a portion of a respective memory film 50 that laterally surrounds the respective vertical semiconductor channel 60, has a respective annular concave bottom surface contacting the source contact layer 114, and has a respective cylindrical outer surface contacting the upper source-level material layer 116 and each insulating layer within a respective one of the alternating stacks {(132, 146), (232, 246)}.

In one embodiment, each of the backside contact via structures 76 is laterally surrounded by and is laterally spaced from a respective neighboring pair of alternating stacks {(132, 146), (232, 246)} by a respective backside insulating spacer 74.

In one embodiment, the memory device further comprises a plurality contact-level dielectric layers 280, each overlying a respective one of the alternating stacks {(132, 146), (232, 246)} and a respective subset of the memory opening fill structures 58 and having a respective top surface located within a horizontal plane including top surfaces of the backside contact via structures 76 and the dielectric trench fill structures 176. In one embodiment, the at least one first backside trench 79 comprises a respective backside insulating spacer 74 laterally surrounding the respective backside contact via structure 76. In one embodiment, each of the plurality contact-level dielectric layers 280 contacts either sidewalls of a pair of backside insulating spacers 74, or a sidewall of a respective backside insulating spacer 74 and a sidewall of the dielectric trench fill structure 176.

In one embodiment, each of the memory opening fill structures 58 further comprises a respective drain region 63 comprising a respective doped semiconductor material, and each of the plurality contact-level dielectric layers 280 overlies a horizontal plane including top surface of the drain regions 63.

In one embodiment, a contact area between the source layer (112, 114, 116) and the dielectric trench fill structure 176 vertically extends continuously from a top surface of the source layer (112, 114, 116) to a bottom surface of the source layer (112, 114, 116).

In one embodiment, the memory device further comprises a semiconductor substrate 8 underlying the source layer (112, 114, 116), and a peripheral circuitry 710 located on the semiconductor substrate 8 and electrically connected to the electrically conductive layers (146, 246).

In one embodiment, each of the alternating stacks {(132, 146), (232, 246)} has respective stepped surfaces having lateral extents along the first horizontal direction hd1 that decrease with a vertical distance from the semiconductor substrate 8, retro-stepped dielectric material portions (165, 265) overlie the stepped surfaces of the alternating stacks {(132, 146), (232, 246)}, and the connection via structures 488 vertically extend through a respective one of the retro-stepped dielectric material portions (165, 265).

Figure 23A:
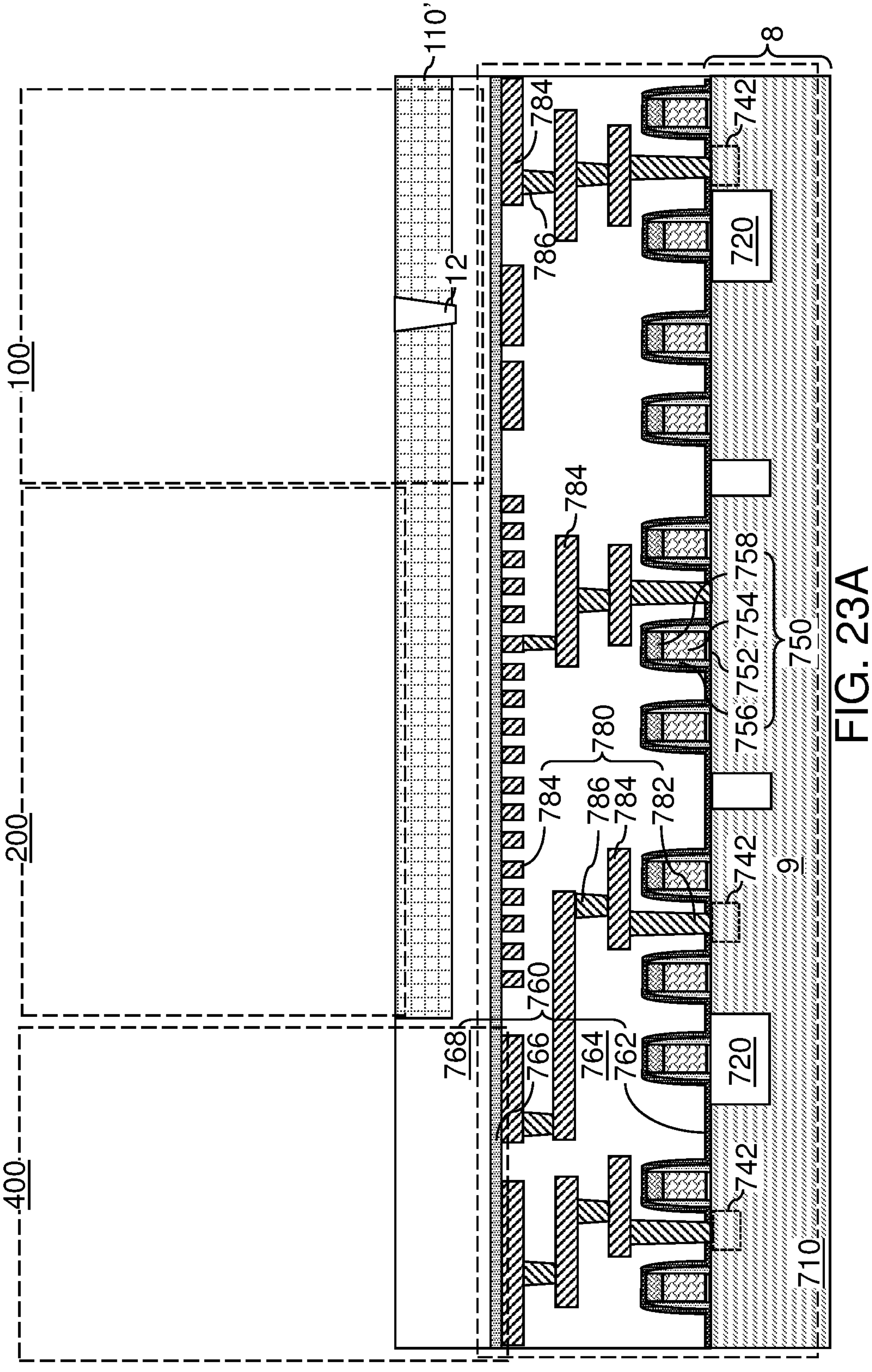
FIG. 23A is a vertical cross-sectional view of a second exemplary structure after formation of in-process source-level material layers and source isolation dielectric structures according to a second embodiment of the present disclosure.
Figure 23B:
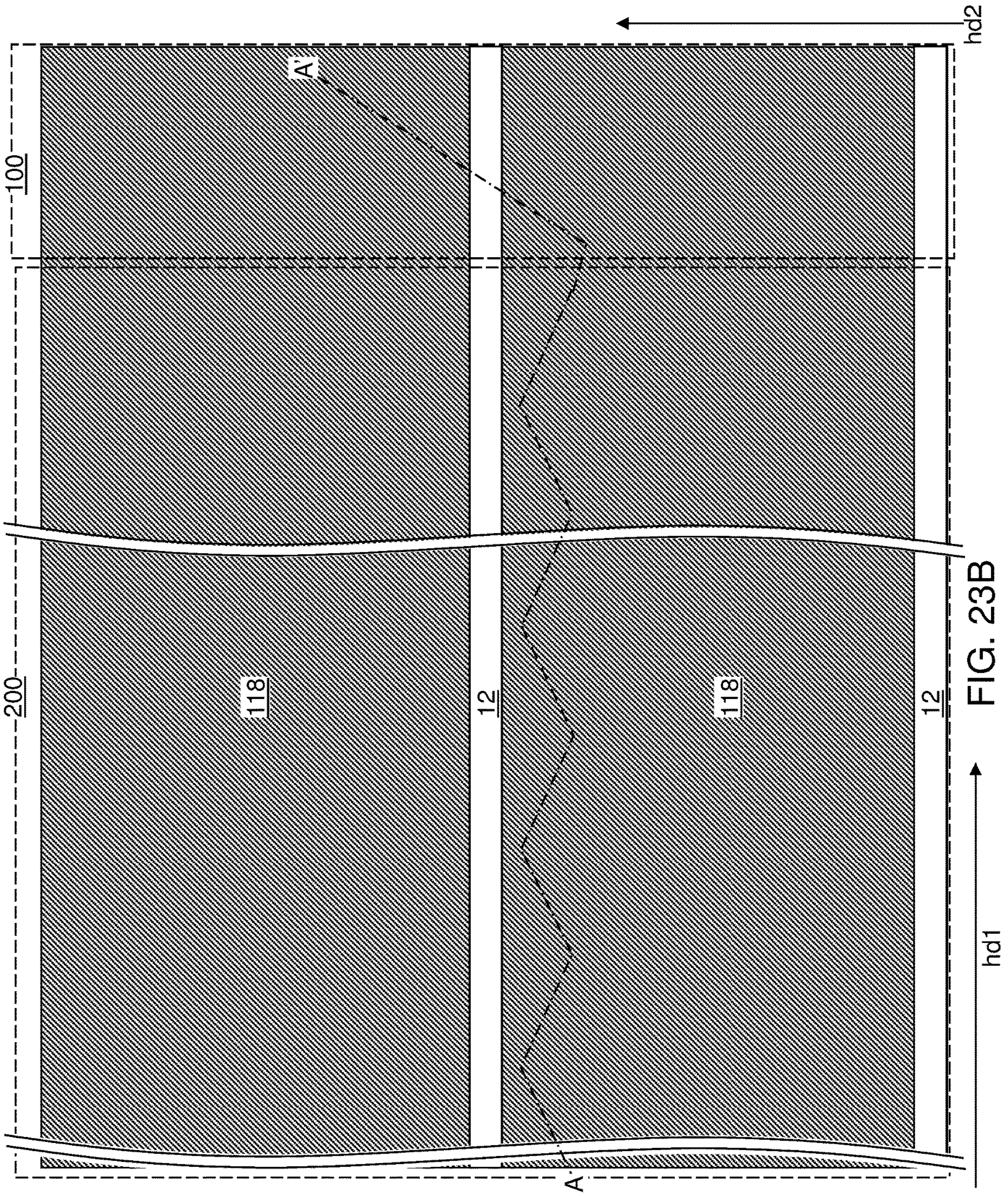
FIG. 23B is a top-down view of the second exemplary structure of FIG. 23A. The vertical plane A-A' is the plane of the vertical cross-sectional view of FIG. 23A.
Figure 23C:
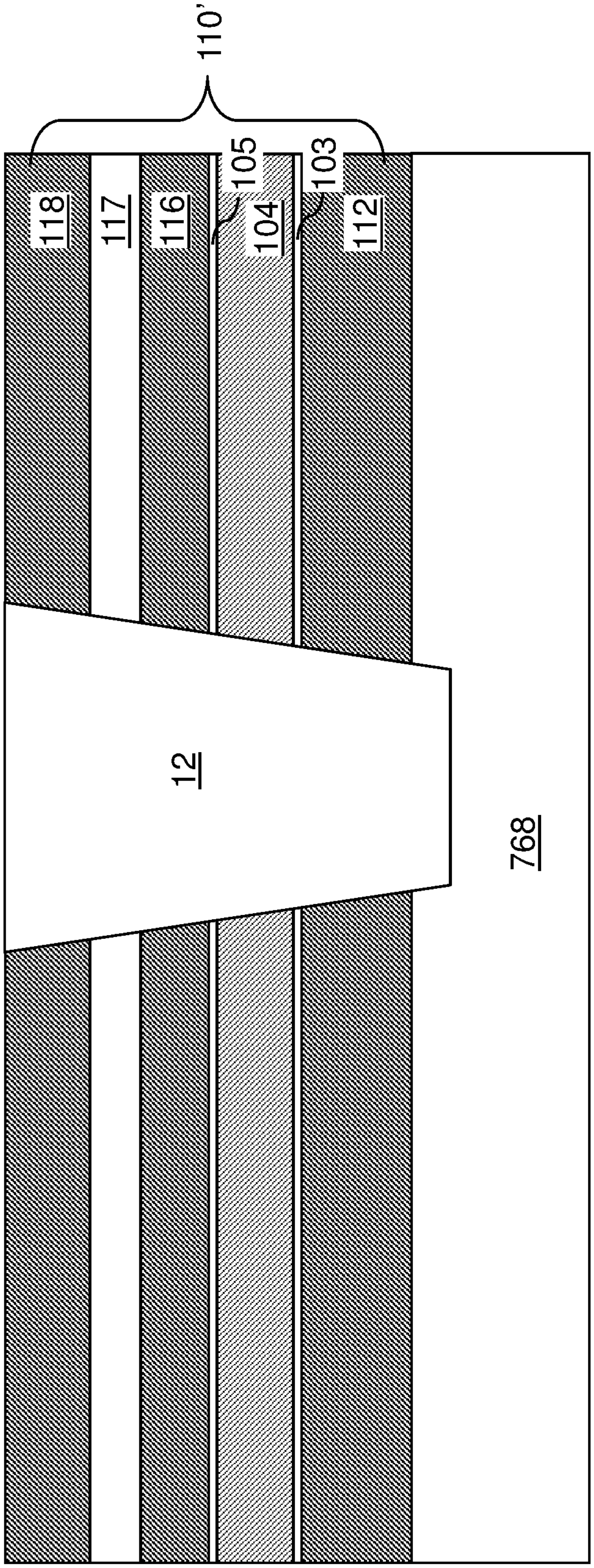
FIG. 23C is a vertical cross-sectional view of the second exemplary structure along the vertical plane C-C' of FIG. 23B.

Referring to FIGS. 23A-23C, a second exemplary structure according to a second embodiment of the present disclosure can be derived from the first exemplary structure illustrated in FIGS. 1A-1C by forming source isolation dielectric structures 12 through the in-process source-level material layers 110'. A photoresist layer (not shown) can be applied over the top surface of the first exemplary structure illustrated in FIGS. 1A-1C, and can be lithographically patterned to form slit-shaped openings that laterally extend along a first horizontal direction hd1. The areas of the slit-shaped openings may include, and may be greater than, areas of a subset of backside trenches to be subsequently formed. In one embodiment, the slit-shaped openings in the photoresist layer may have the same periodicity along a second horizontal direction hd2 that is perpendicular to the first horizontal direction hd1 as the periodicity of each instance of a unit structure to be subsequently formed.

An anisotropic etch process can be performed to transfer the patten of the openings in the photoresist layer through the in-process source-level material layers 110' and into an upper portion of the at least one second dielectric layer 768. Shallow trenches can be formed through the in-process source-level material layers 110' and in an upper portion of the at least one semiconductor dielectric layer 768. The in-process source-level material layers 110' can be divided into multiple discrete portions that are laterally spaced apart along the second horizontal direction hd2. A top surface of the at least one second dielectric layer 768 can be physically exposed at the bottom of each shallow trench. The shallow trenches may have tapered sidewalls such that the width of each shallow trench along the second horizontal direction hd2 increases with a vertical distance from the semiconductor substrate 8. The photoresist layer can be subsequently removed, for example, by ashing.

At least one dielectric fill material can be deposited in the shallow trenches, and excess portions of the at least one dielectric fill material can be removed from above the horizontal plane including the top surface of the in-process source-level material layers 110' by CMP and/or etchback. Remaining portions of the at least one dielectric fill material comprise source isolation dielectric structures 12. In one embodiment, each of the source isolation dielectric structures 12 may comprise a respective pair of lengthwise sidewalls that laterally extend along the first horizontal direction hd1.

The source isolation dielectric structures 12 can comprise a material which resists etching of the materials of the insulating layers and the sacrificial material layers to be formed in subsequent steps. For example, the source isolation dielectric structures 12 can comprise silicon carbonitride (SiCN), silicon oxycarbide (SiOC) or a dielectric metal oxide, such as aluminum oxide, hafnium oxide, tantalum oxide, etc.

Generally, a laterally alternating sequence (110', 12) of strips of in-process source-level material layers 110' and source isolation dielectric structures 12 can be formed over a substrate. In one embodiment, each of the source isolation dielectric structures 12 has a variable width along the second horizontal direction hd2 that increases with a vertical distance from the substrate.

Figure 24:
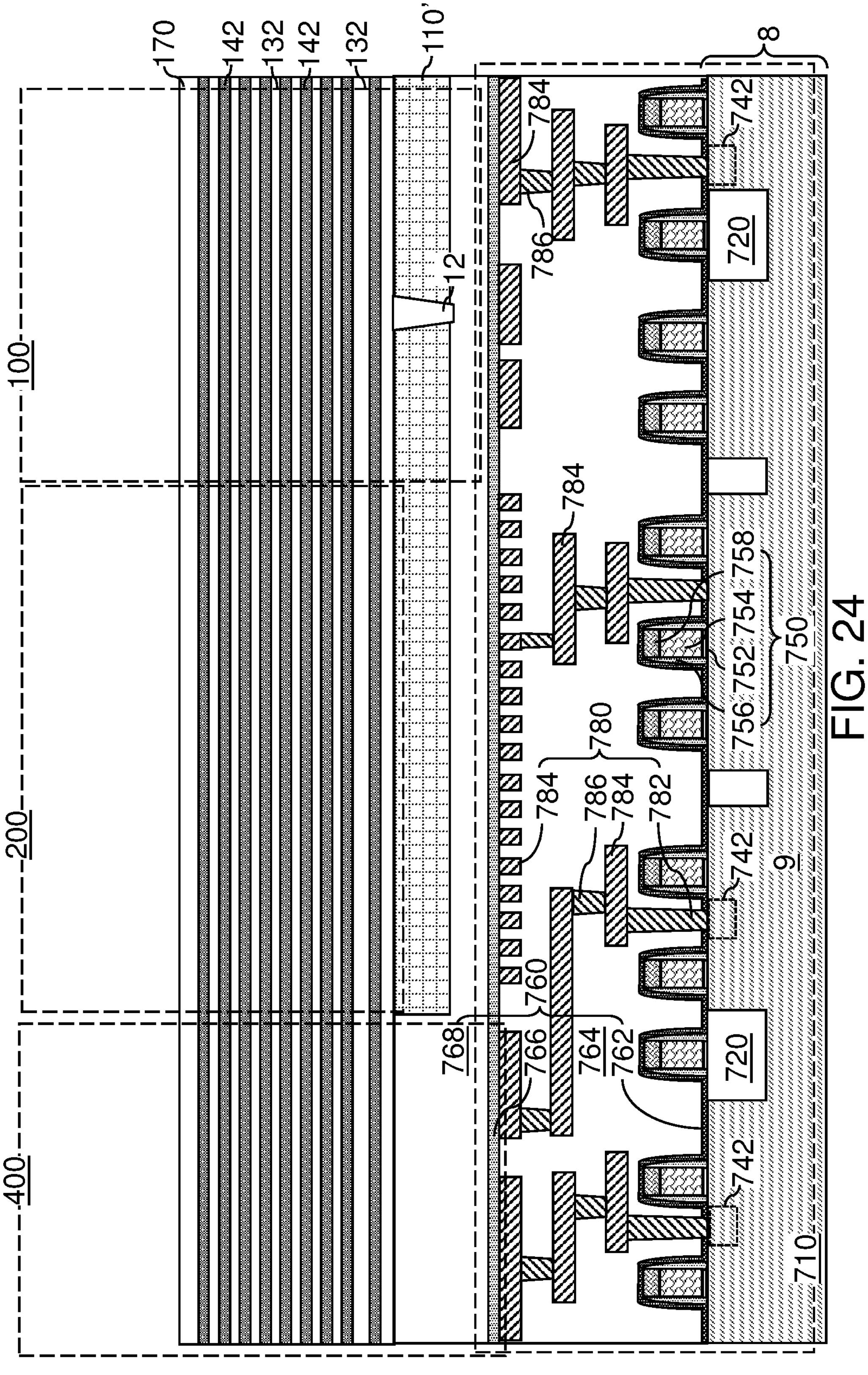
FIG. 24 is a vertical cross-sectional view of the second exemplary structure after formation of a first vertically alternating sequence of first insulating layers and first spacer material layers according to the second embodiment of the present disclosure.

Referring to FIG. 24, the processing steps described with reference to FIG. 2 can be performed to form a first vertically alternating sequence of first insulating layers 132 and first spacer material layers 142.

Figure 25:
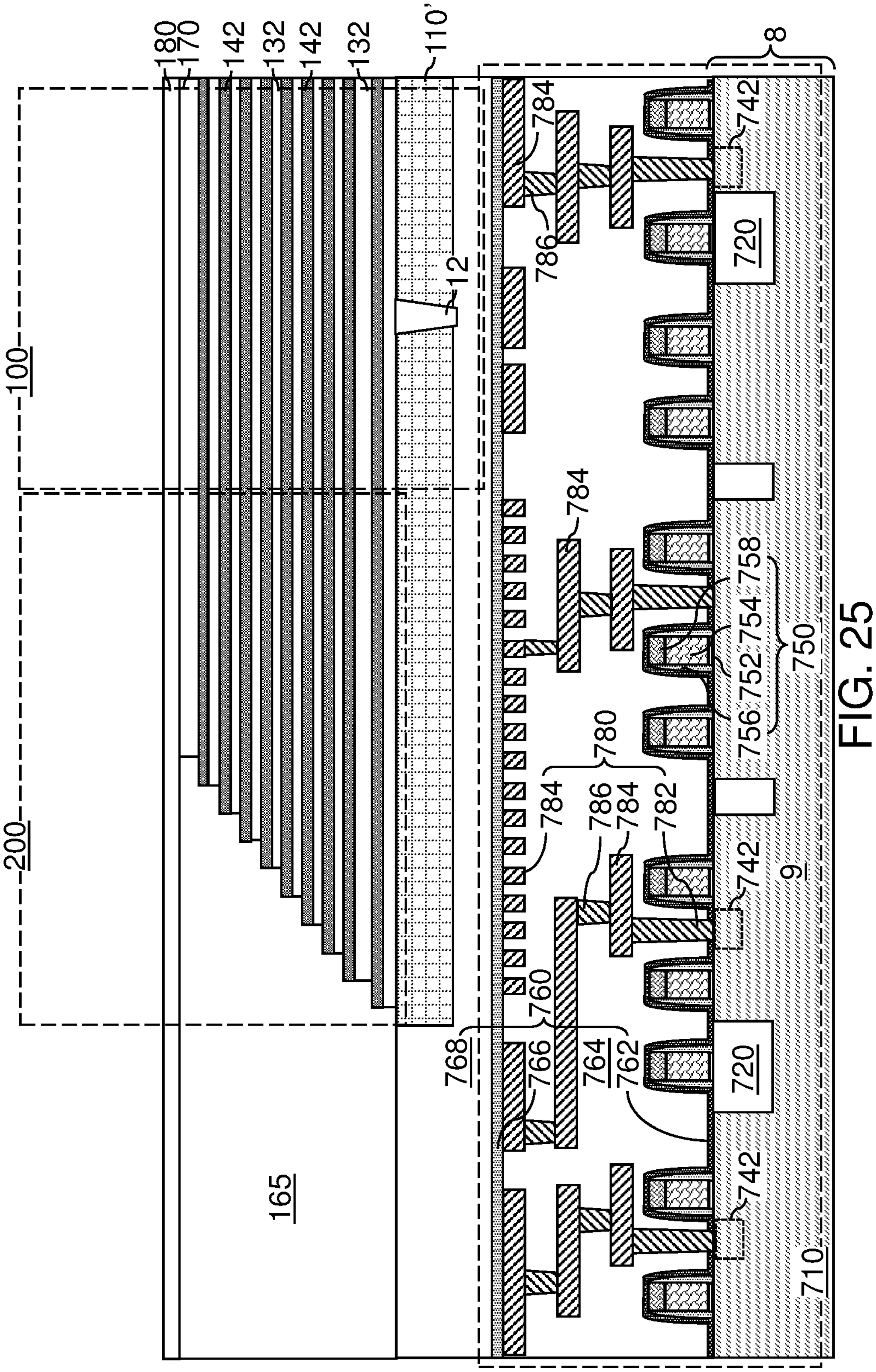
FIG. 25 is a vertical cross-sectional view of the second exemplary structure after patterning first stepped surfaces, a first retro-stepped dielectric material portion, and an inter-tier dielectric layer according to the second embodiment of the present disclosure.

Referring to FIG. 25, the processing steps described with reference to FIG. 3 can be performed to pattern first stepped surfaces, and to form a first retro-stepped dielectric material portion 165 and an inter-tier dielectric layer 180.

Figure 26A:
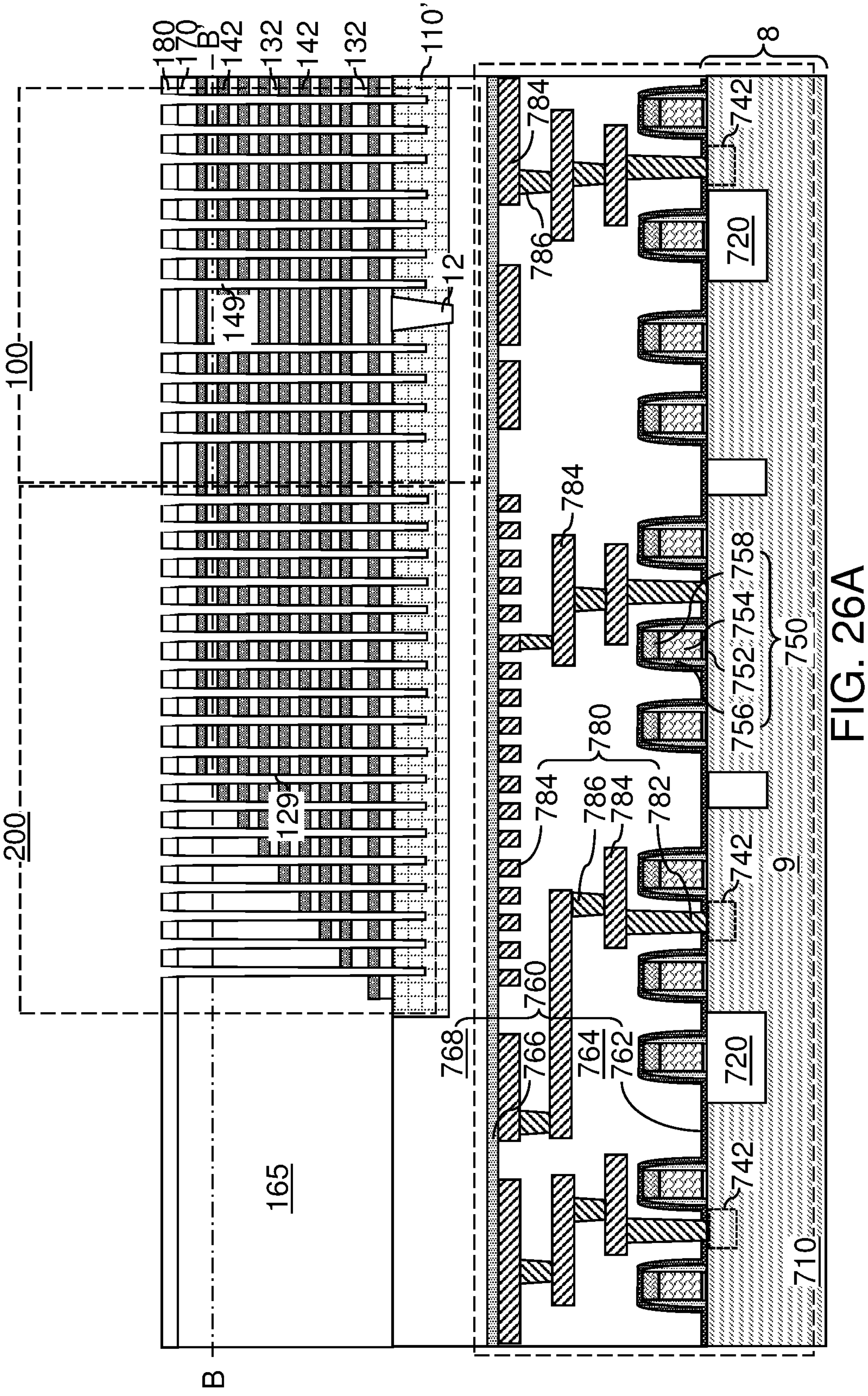
FIG. 26A is a vertical cross-sectional view of the second exemplary structure after formation of first-tier memory openings and first-tier support openings according to the second embodiment of the present disclosure.
Figure 26B:
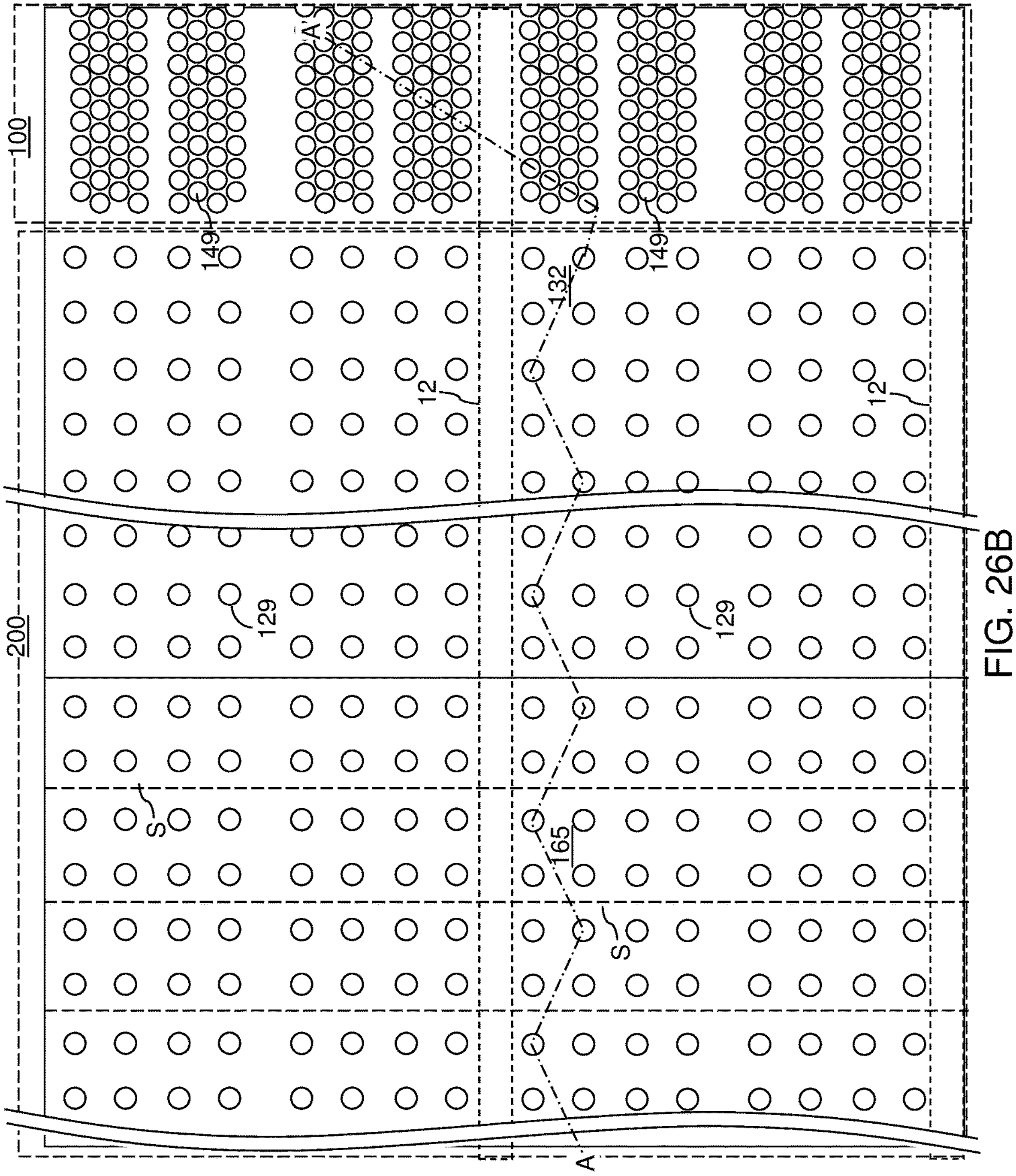
FIG. 26B is a horizontal cross-sectional view of the first exemplary structure along the horizontal plane B-B' of FIG. 26A. The zig-zag vertical plane A-A' corresponds to the plane of the vertical cross-sectional view of FIG. 26A.

Referring to FIGS. 26A and 26B, the processing steps of FIGS. 4A and 4B can be performed to form first-tier memory openings 149 and first-tier support openings 129. In one embodiment, each of the first-tier memory openings 149 and the first-tier support openings 129 can be formed directly into a respective layer stack of in-process source-level material layers 110' (as divided by the source isolation dielectric structures 12), and can be laterally offset from the source isolation dielectric structures 12.

Figure 27:
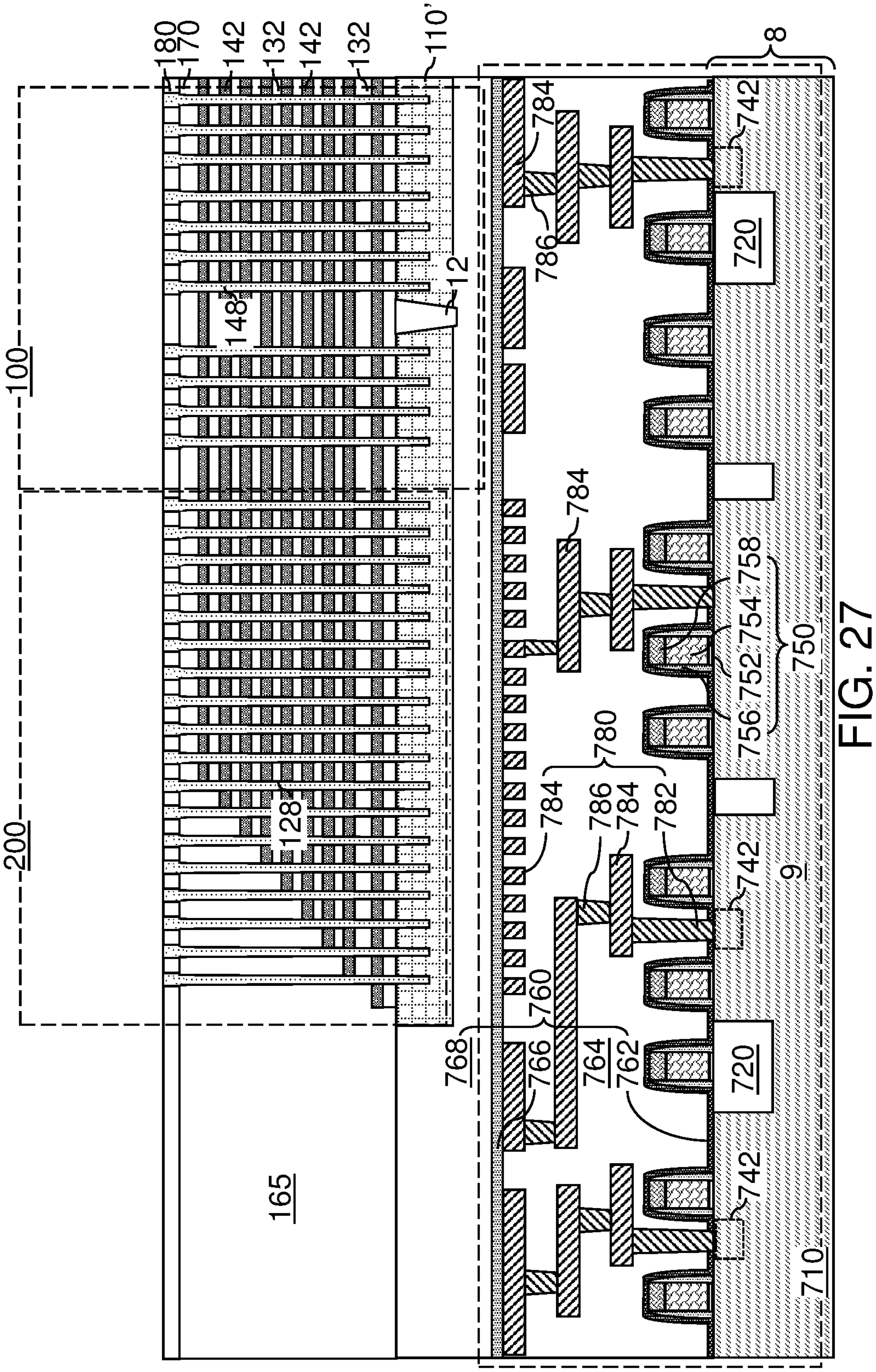
FIG. 27 is a vertical cross-sectional view of the second exemplary structure after formation of sacrificial memory opening fill portions and first-tier support opening fill portions according to the second embodiment of the present disclosure.

Referring to FIG. 27, the processing steps described with reference to FIG. 5 can be performed to form is a sacrificial first-tier memory opening fill portions 148 and sacrificial first-tier support opening fill portions 128.

Figure 28:
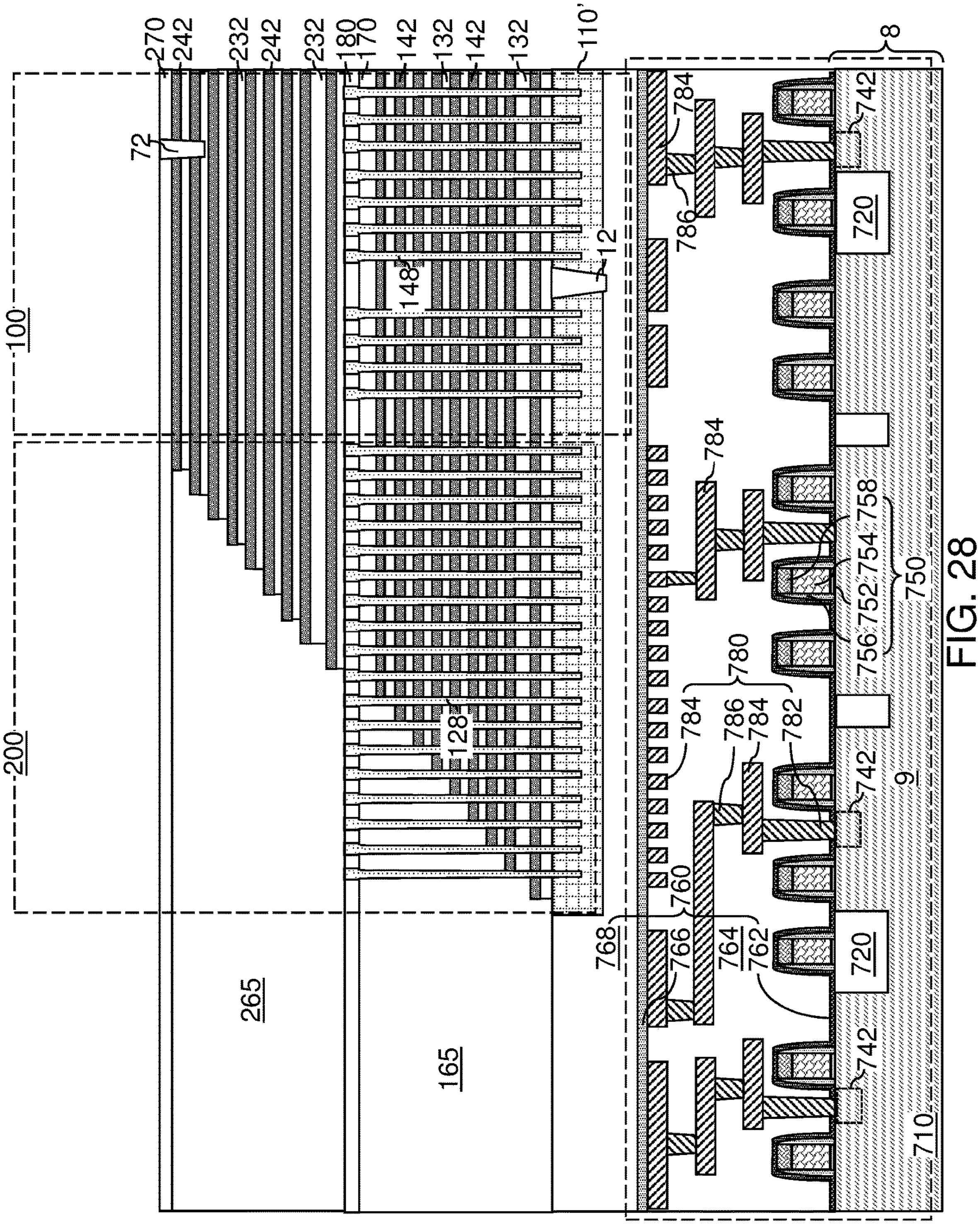
FIG. 28 is a vertical cross-sectional view of the second exemplary structure after formation of a second vertically alternating sequence of second insulating layers and second spacer material layers, second stepped surfaces, a second retro-stepped dielectric material portion, and drain-select-level isolation structures according to the second embodiment of the present disclosure.

Referring to FIG. 28, the processing steps described with reference to FIG. 6 can be performed to form a second vertically alternating sequence of second insulating layers 232 and second spacer material layers 242, second stepped surfaces, a second retro-stepped dielectric material portion 265, and drain-select-level isolation structures 72.

Figure 29:
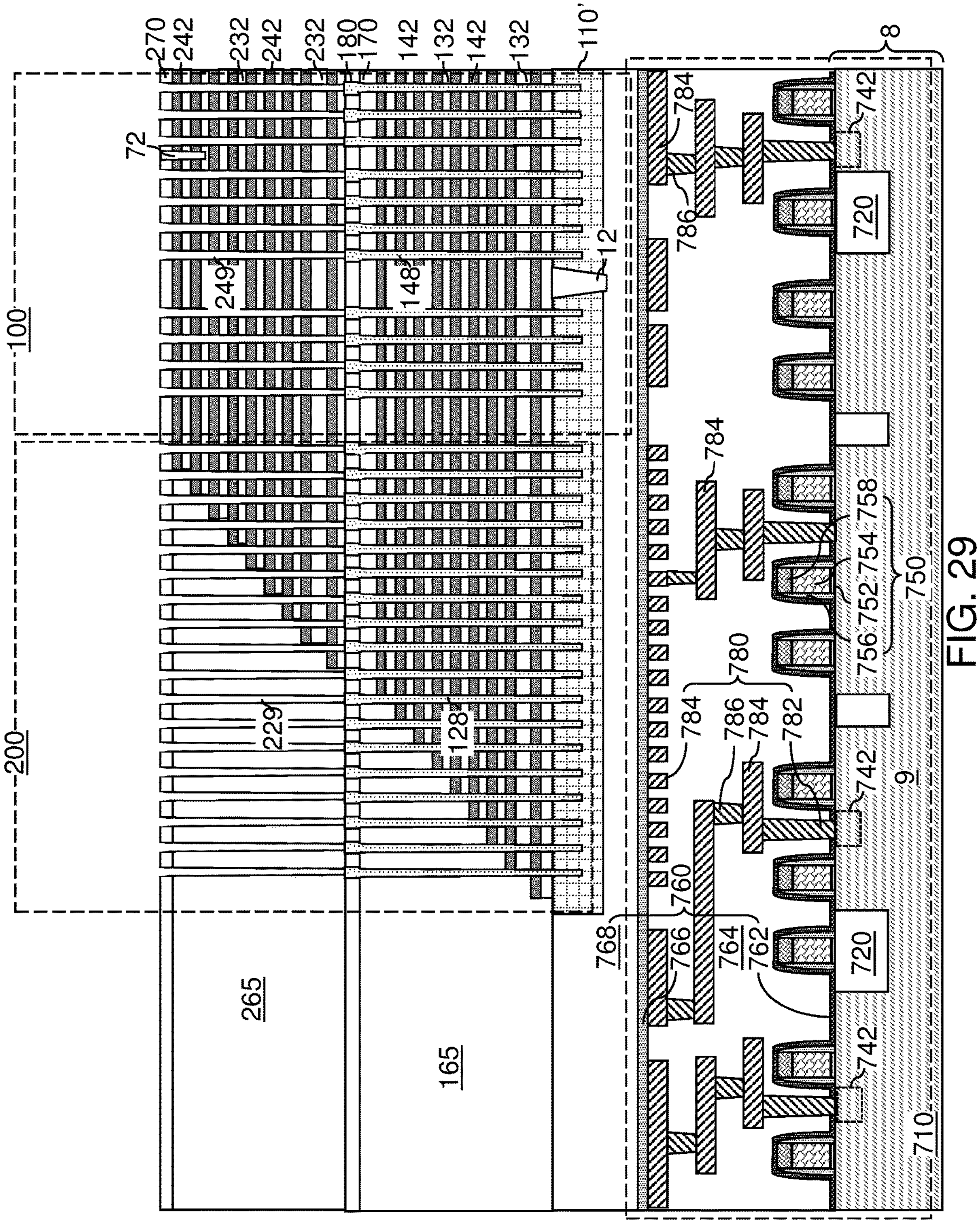
FIG. 29 is a vertical cross-sectional view of the second exemplary structure after formation of second-tier memory openings and second-tier support openings according to the second embodiment of the present disclosure.

Referring to FIG. 29, the processing steps described with reference to FIGS. 7A and 7B can be performed to form second-tier memory openings 249 and second-tier support openings 229.

Figure 30:
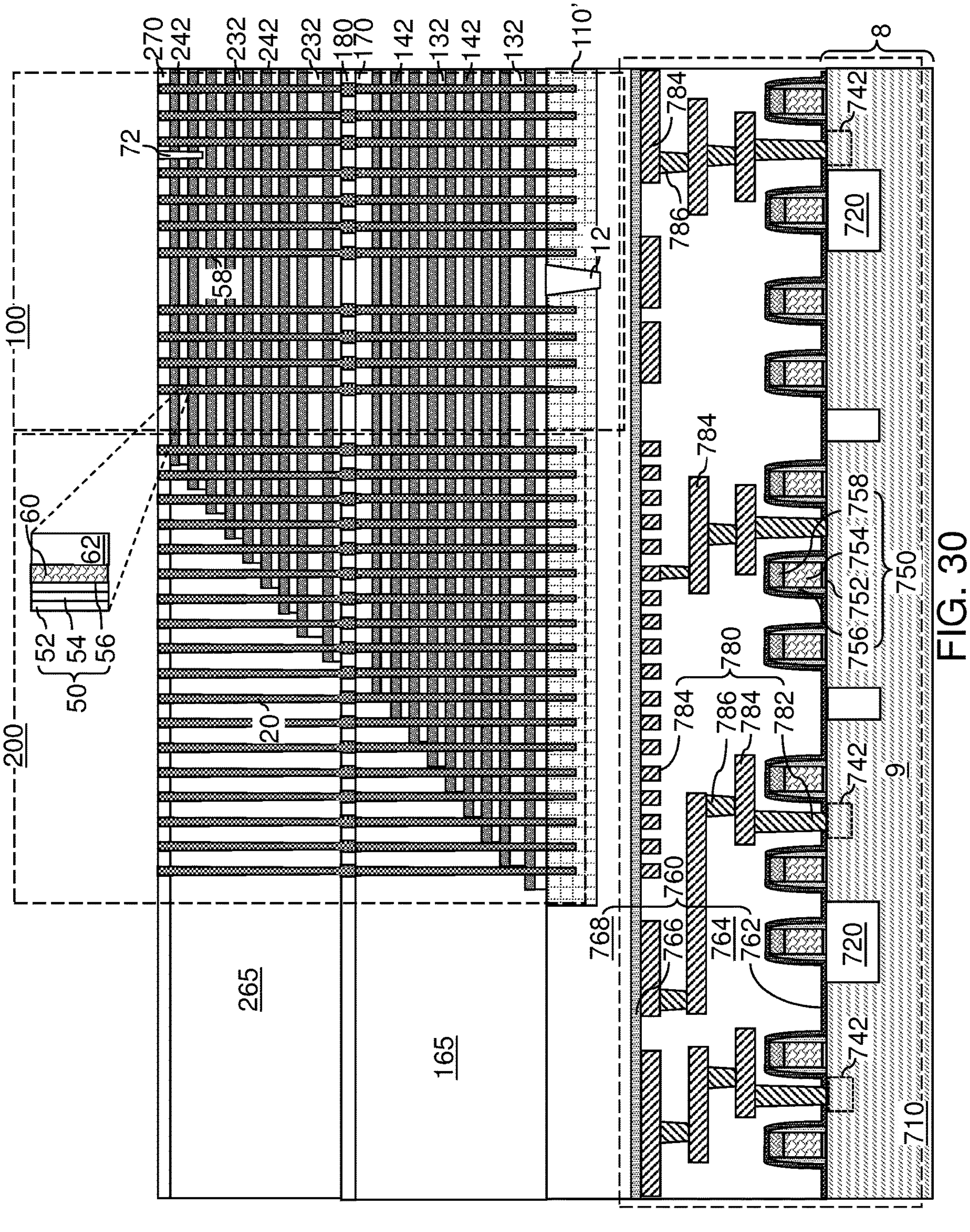
FIG. 30 is a vertical cross-sectional view of the second exemplary structure after formation of memory opening fill structures and support pillar structures according to the second embodiment of the present disclosure.
Figure 31A:
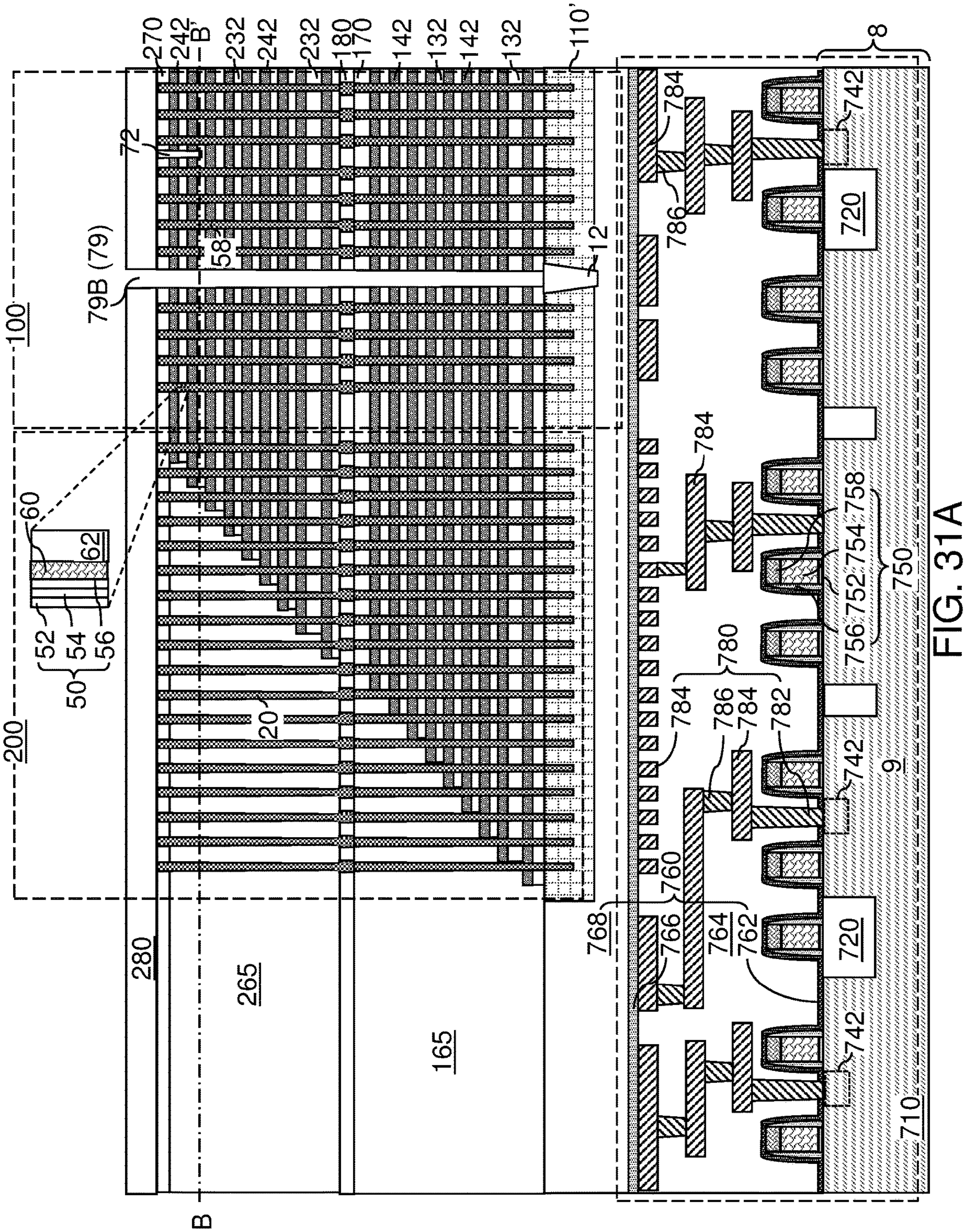
FIG. 31A is a vertical cross-sectional view of the second exemplary structure after formation of backside trenches according to the second embodiment of the present disclosure.
Figure 31B:
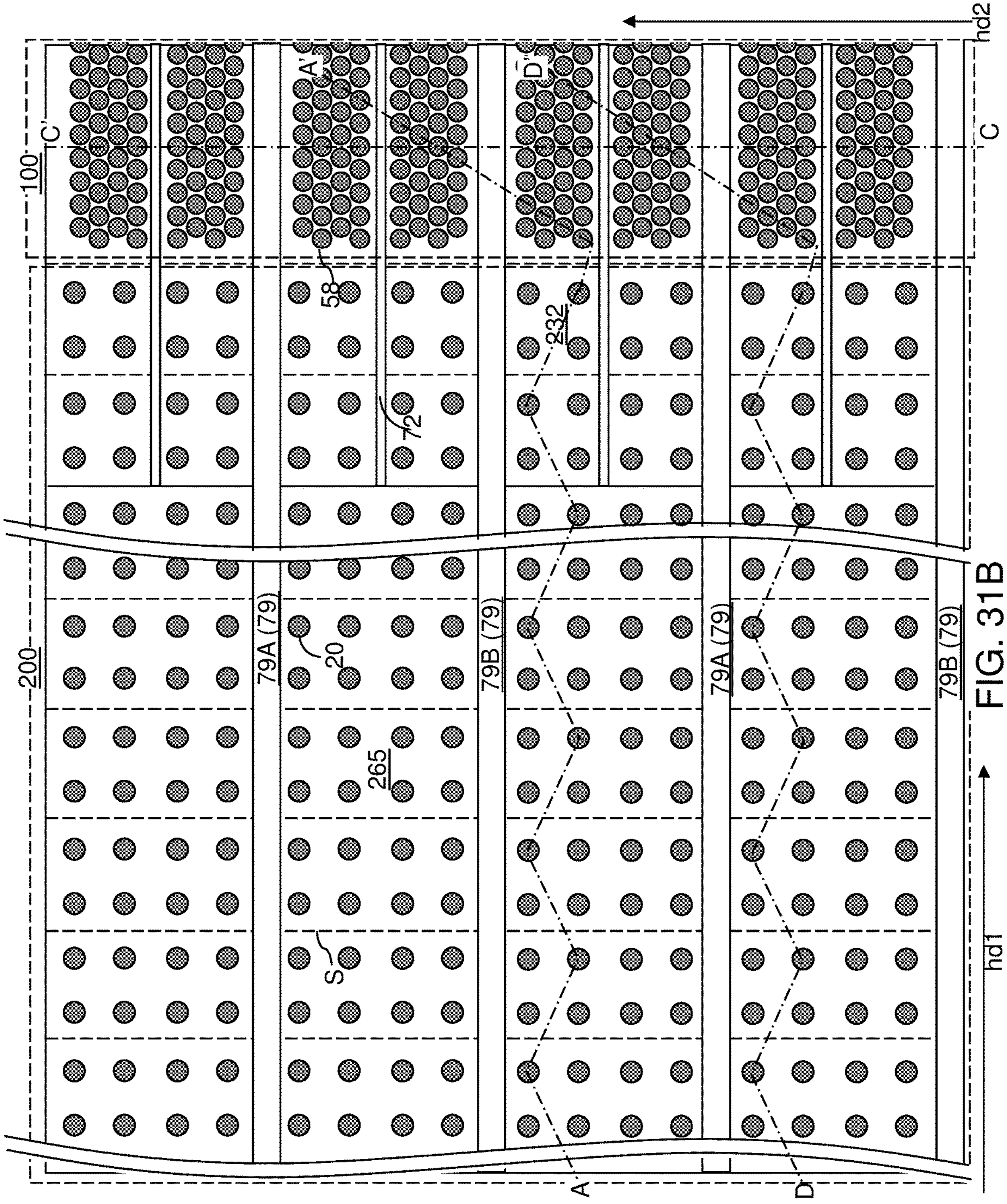
FIG. 31B is a horizontal cross-sectional view of the first exemplary structure along the horizontal plane B-B' of FIG. 31A. The zig-zag vertical plane A-A' corresponds to the plane of the vertical cross-sectional view of FIG. 31A.
Figure 31C:
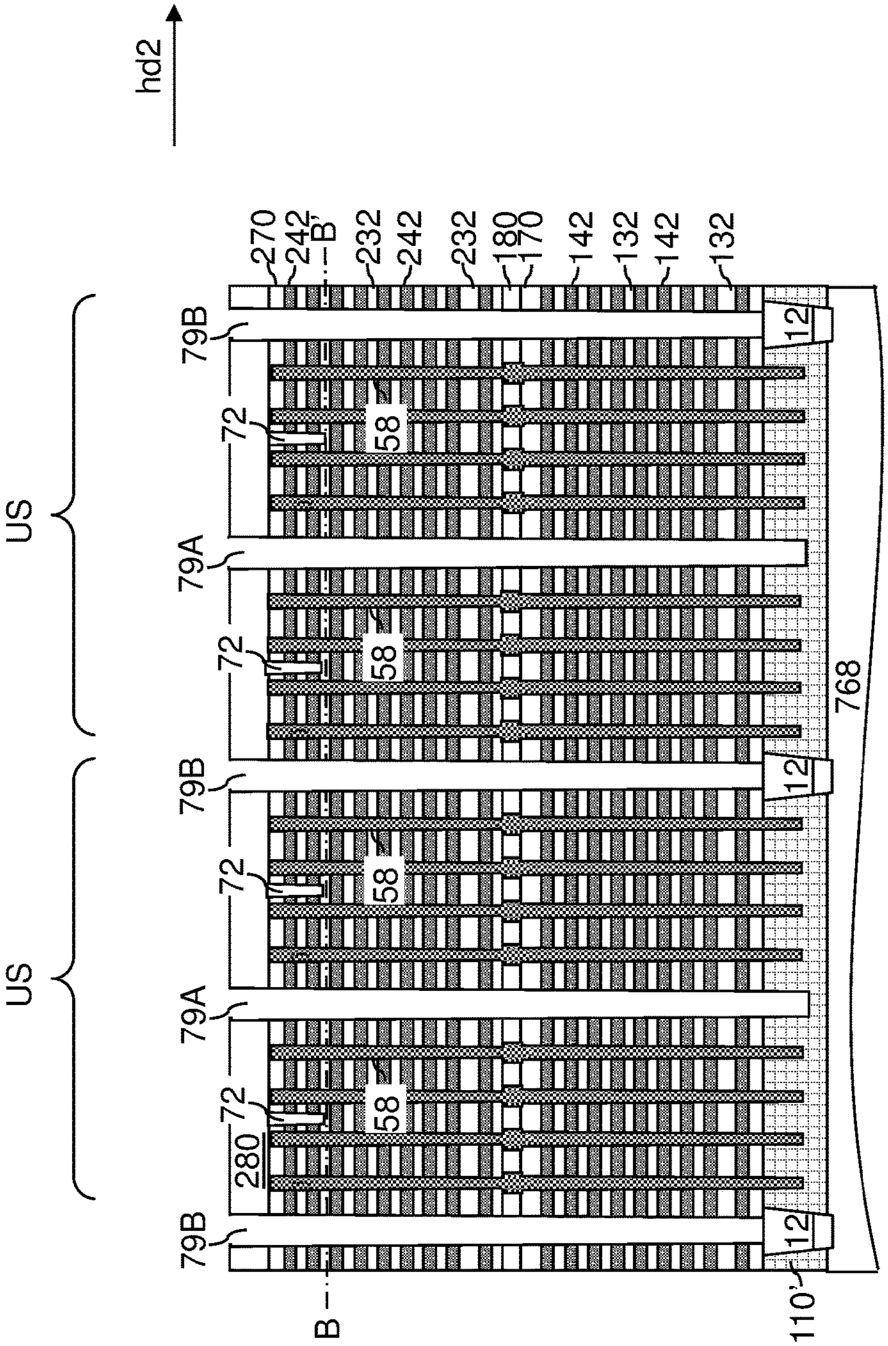
FIG. 31C is a vertical cross-sectional view of the second exemplary structure along the vertical plane C-C' of FIG. 31B.
Figure 31D:
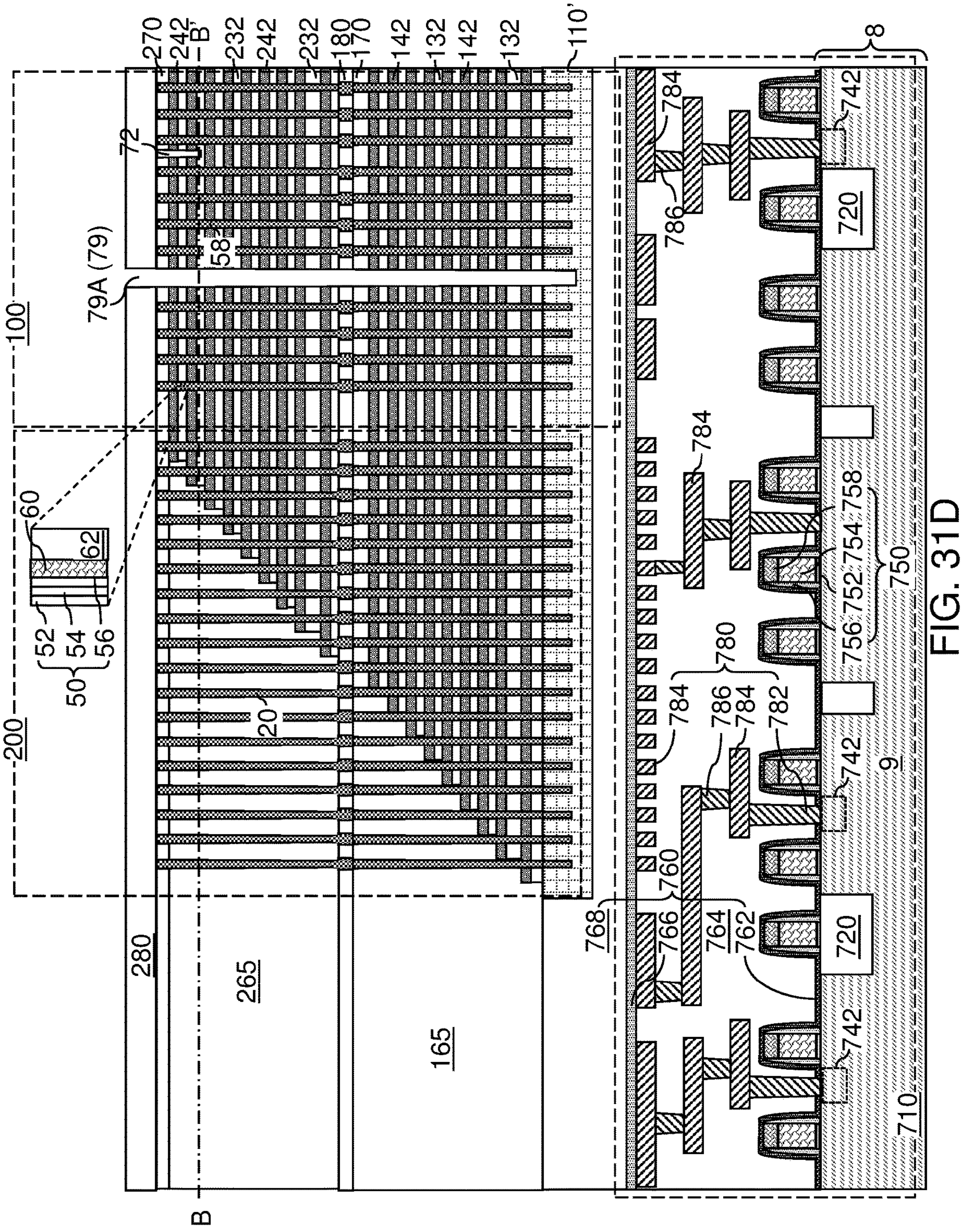
FIG. 31D is a vertical cross-sectional view of the second exemplary structure along the zig-zag vertical plane D-D' of FIG. 31B.
Figure 32A:
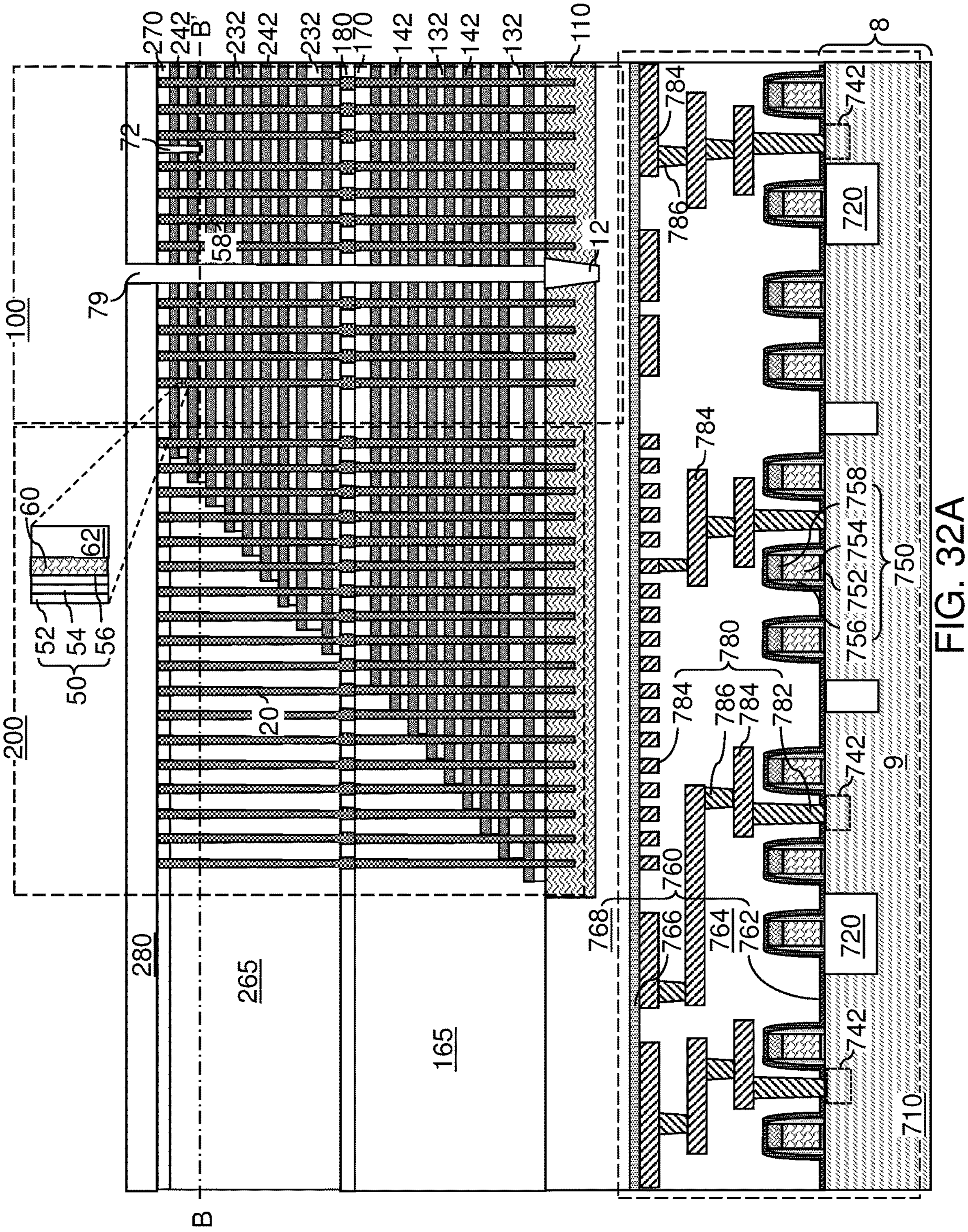
FIG. 32A is a vertical cross-sectional view of the second exemplary structure after replacement of the in-process source-level material layers with source-level material layers according to the second embodiment of the present disclosure.
Figure 32B:
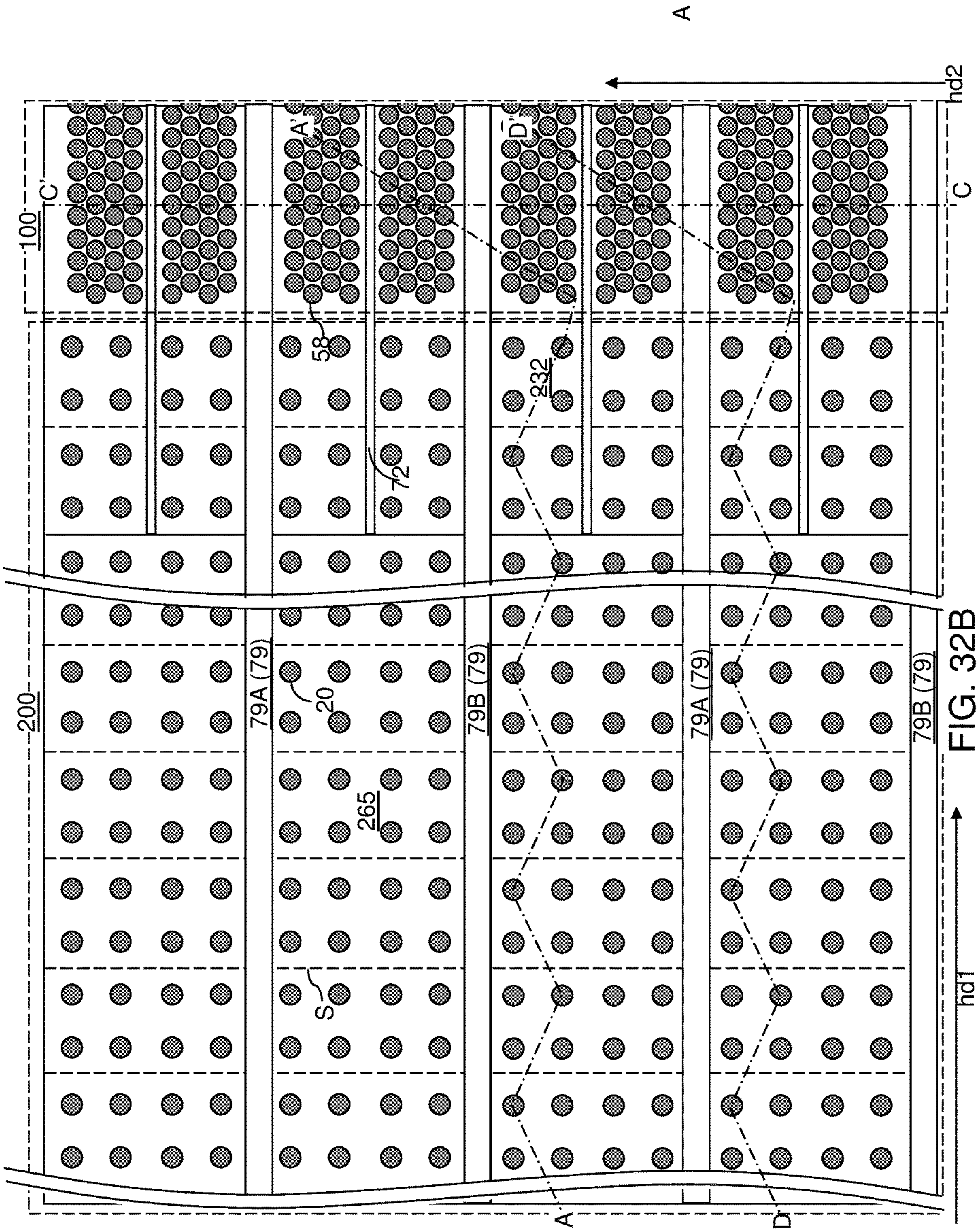
FIG. 32B is a horizontal cross-sectional view of the first exemplary structure along the horizontal plane B-B' of FIG. 32A. The zig-zag vertical plane A-A' corresponds to the plane of the vertical cross-sectional view of FIG. 32A.
Figure 32C:
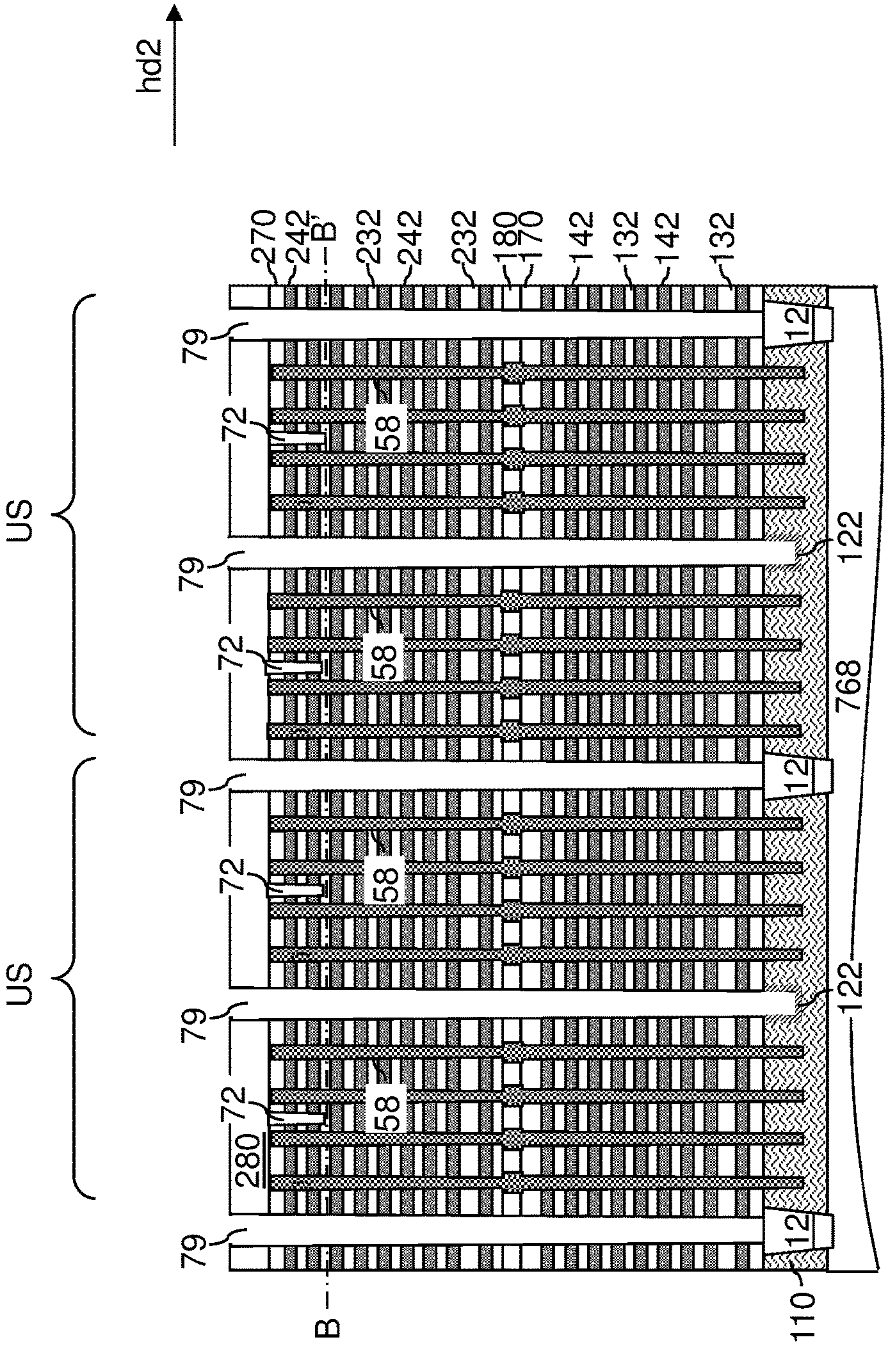
FIG. 32C is a vertical cross-sectional view of the second exemplary structure along the vertical plane C-C' of FIG. 32B.
Figure 32D:
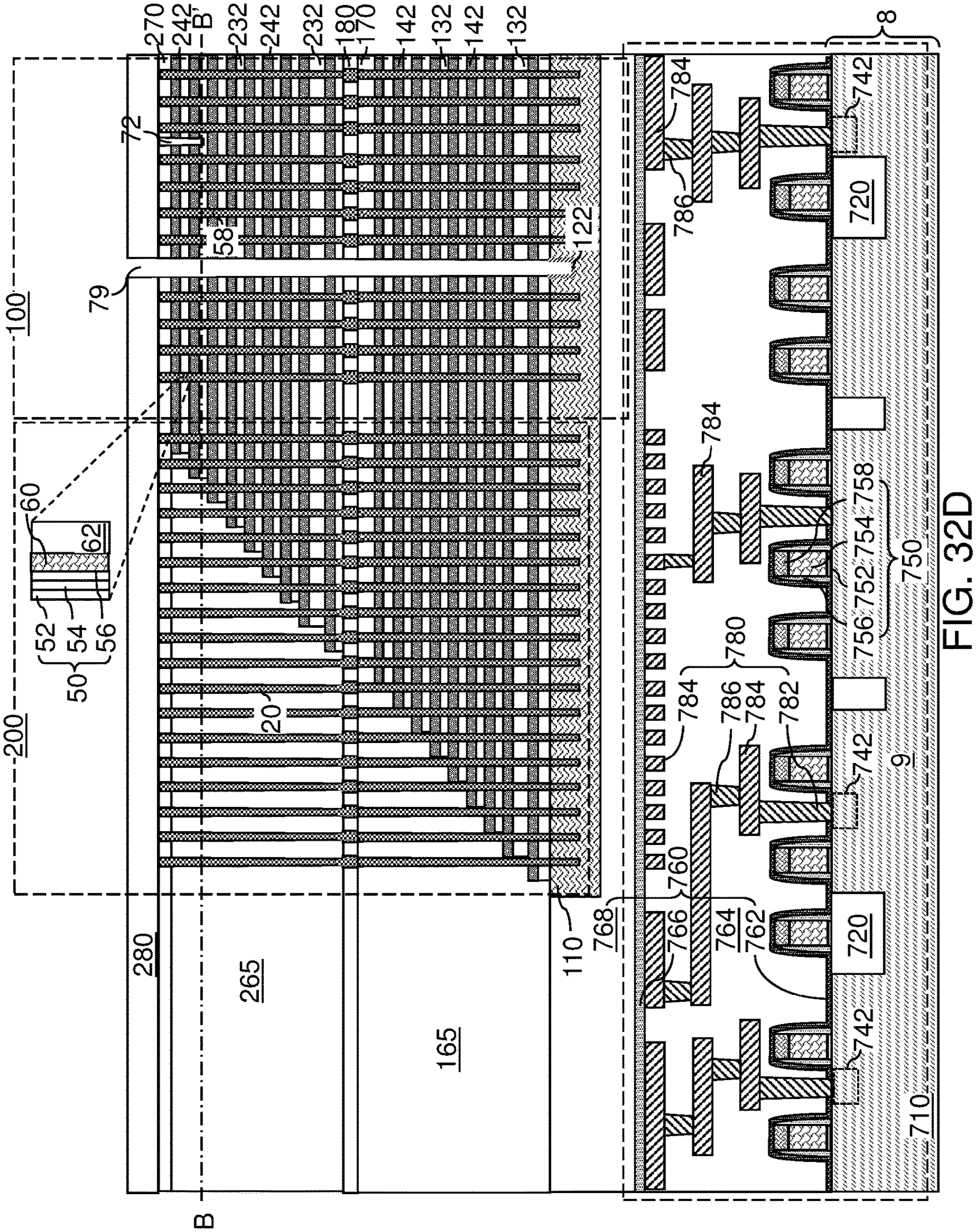
FIG. 32D is a vertical cross-sectional view of the second exemplary structure along the zig-zag vertical plane D-D' of FIG. 32B.

Referring to FIG. 30, the processing steps described with reference to FIGS. 8A and 8B, 9A-9D, and 10 can be performed to form memory opening fill structures 58 and support pillar structures 20. Each of the memory opening fill structures 58 comprises a respective vertical stack of memory elements (which may comprise portions of memory films 50 located at levels of the electrically conductive layers (146, 246)) and a respective vertical semiconductor channel 60.

Referring to FIGS. 31A-31D, the processing steps described with reference to FIGS. 11A-11C can be performed to form a contact-level dielectric layer 280 over the memory opening fill structures 58, and to form backside trenches 79. A first subset of the backside trenches 79A can be formed between a respective neighboring pair of source isolation dielectric structures 12, and a second subset of the backside trenches 79B can be formed on a respective one of the source isolation dielectric structures 12.

Generally, the vertically alternating sequences of insulating layers (132, 232) and spacer material layers (such as the sacrificial material layers (142, 242)) can be divided into alternating stacks {(132, 142), (232, 242)} of insulating layers (132, 232) and spacer material layers (such as the sacrificial material layers (142, 242)) by forming backside trenches 79. The backside trenches 79 comprise first backside trenches 79A that vertically extend into a respective one of the in-process source-level material layers 110' and second backside trenches 79B that vertically extend to a respective one of the source isolation dielectric structures 12.

The second exemplary structure can include a periodic repetition of a unit structure US that is repeated along the second horizontal direction hd2 within a periodicity. Each unit structure US includes a backside trench 79B within the second subset of the backside trenches 79 (i.e., a second backside trench), and one or more backside trenches 79A (within the first subset of the backside trenches 79 (i.e., one or more first backside trenches).

Surfaces of the in-process source-level material layers 110' can be physically exposed around the bottom portion of each first backside trench 79A. Each bottom portion of the second backside trenches 79B can be laterally surrounded by a respective one of the source dielectric isolation structures 12. Thus, surfaces of the stacks of the in-process source-level material layers 110' are not physically exposed to the second backside trenches 79B.

Referring to FIGS. 32A-32D, the processing steps described with reference to FIGS. 13A-13E may be performed to replace each layer stack of in-process source-level material layers 110' with a layer stack of source-level material layers 110. The in-process source-level material layers 110' are converted into source-level material layers 110 upon replacement of the sacrificial source layer 104 within each of the in-process source-level material layers 110' with a respective source contact layer 114. Each layer stack of source-level material layers 110 may include a respective source layer (112, 114, 116) including a lower source-level material layer 112, an upper source-level material layer 116, and a source contact layer 114. In one embodiment, the lower source-level material layer 112 comprises a first doped semiconductor material, the upper source-level material layer 116 comprises a second doped semiconductor material, and the source contact layer 114 comprises a third doped semiconductor material and located between the upper source-level material layer 116 and the lower source-level material layer 112.

Figure 33:
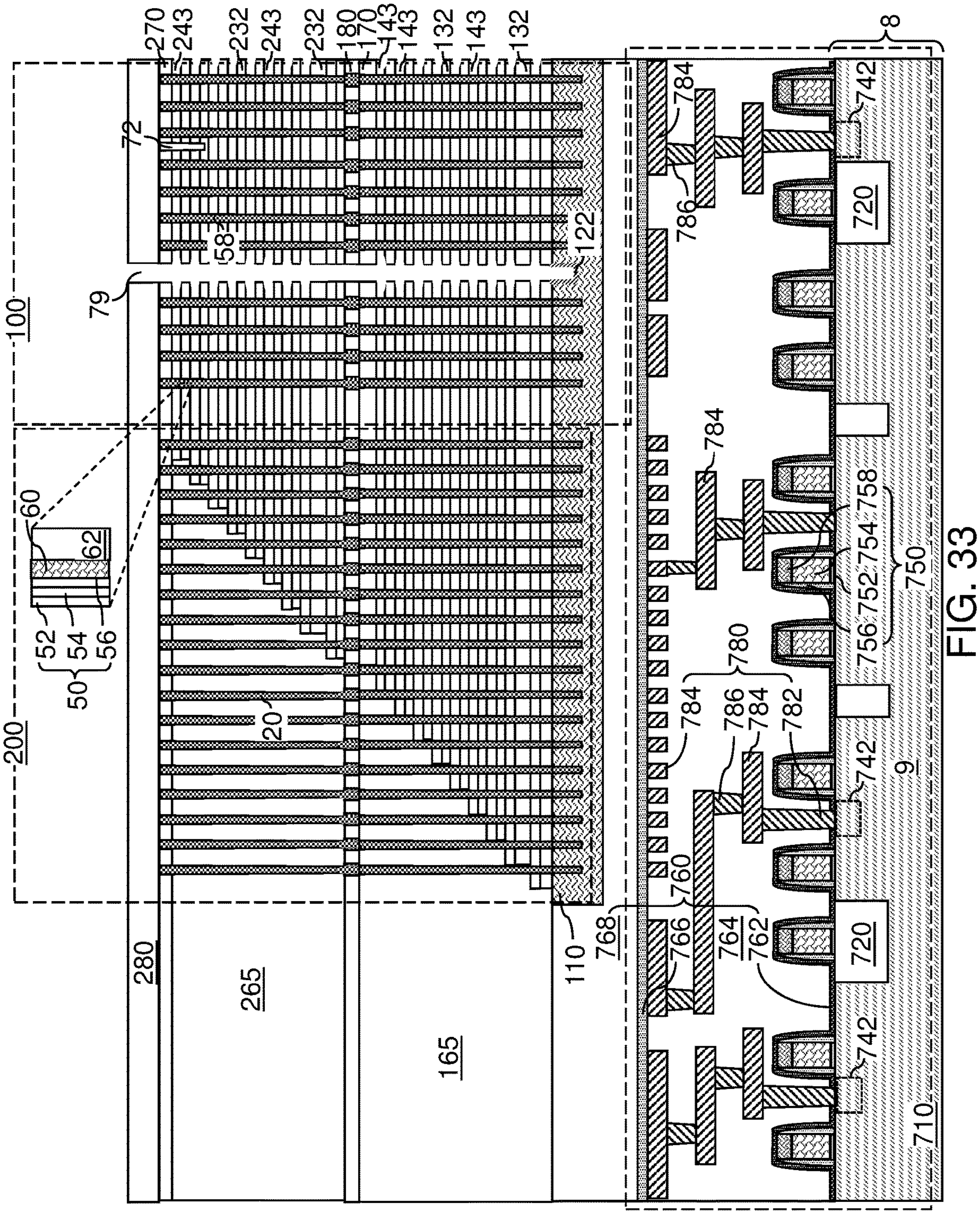
FIG. 33 is a vertical cross-sectional view of the second exemplary structure after formation of backside recesses according to the second embodiment of the present disclosure.
Figure 34A:
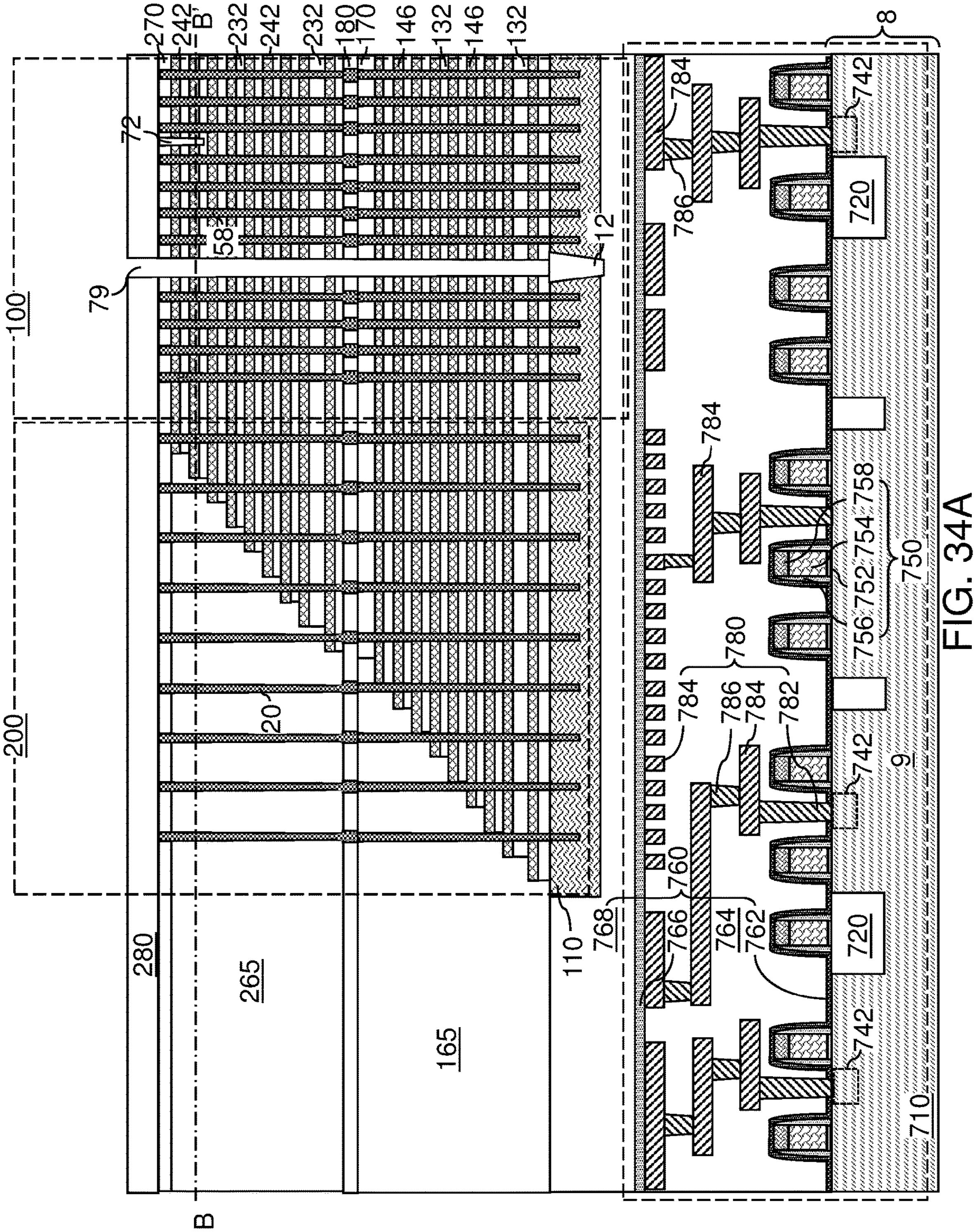
FIG. 34A is a vertical cross-sectional view of the second exemplary structure after formation of electrically conductive layers in the backside recesses according to the second embodiment of the present disclosure.
Figure 34B:
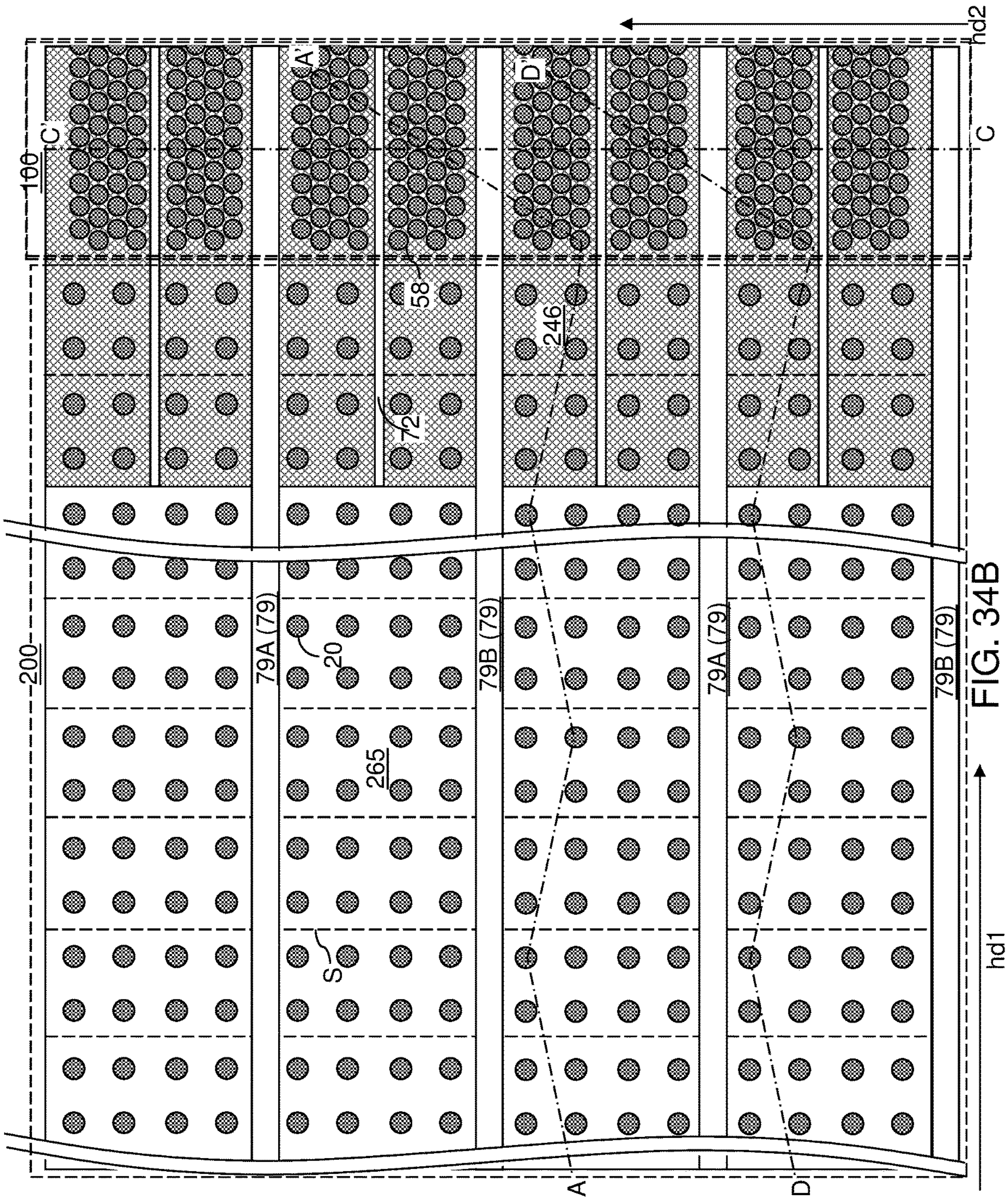
FIG. 34B is a horizontal cross-sectional view of the first exemplary structure along the horizontal plane B-B' of FIG. 34A. The zig-zag vertical plane A-A' corresponds to the plane of the vertical cross-sectional view of FIG. 34A.
Figure 34C:
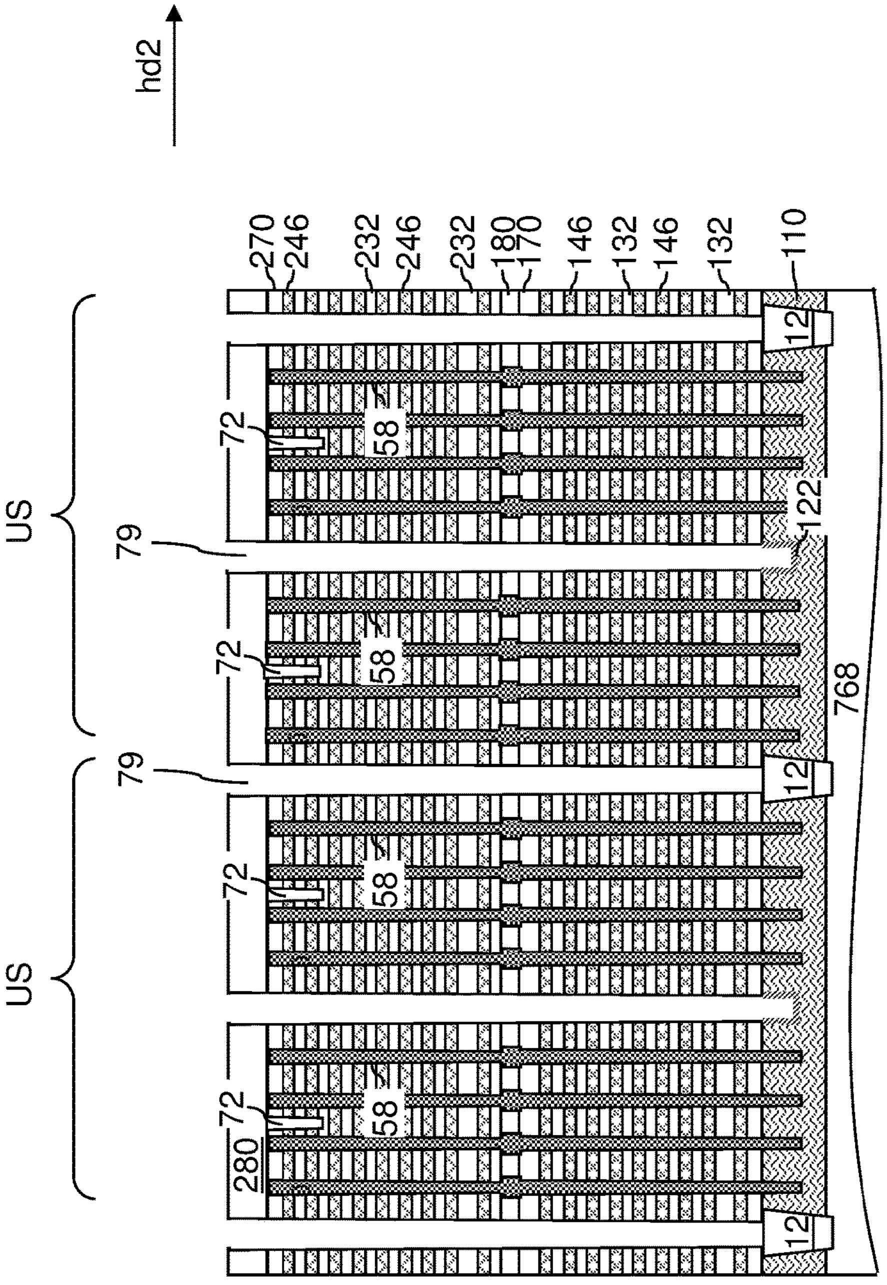
FIG. 34C is a vertical cross-sectional view of the second exemplary structure along the vertical plane C-C' of FIG. 34B.
Figure 34D:
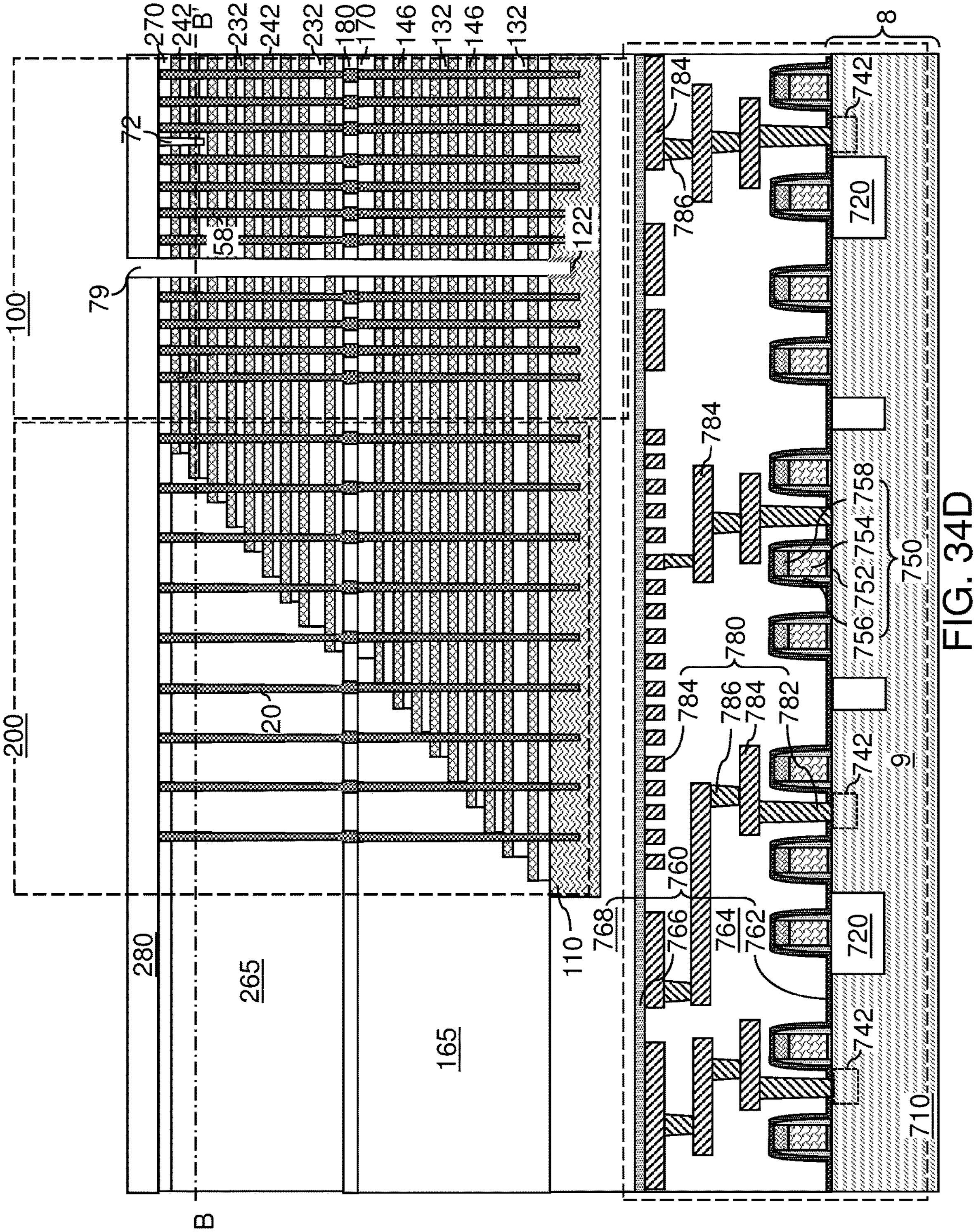
FIG. 34D is a vertical cross-sectional view of the second exemplary structure along the zig-zag vertical plane D-D' of FIG. 34B.

Referring to FIG. 33, the processing steps described with reference to FIG. 15 can be performed to form backside recesses (143, 243) by removing the sacrificial material layers (142, 242).

Referring to FIGS. 34A-34D, the processing steps described with reference to FIGS. 16A and 16B can be performed to form electrically conductive layers (146, 246) in the backside recesses (143, 243). Alternating stacks {(132, 146), (232, 246)} of insulating layers (132, 232) and electrically conductive layers (146, 246) that are laterally spaced apart among one another by the backside trenches 79 are formed.

Referring to FIGS. 35A-35E, the processing steps described with reference to FIGS. 19A-19F can be performed to form a backside trench fill structure (74, 76) in each backside trench 79. Each of the backside trench fill structures (74, 76) comprises a respective backside insulating spacer 74 and a respective backside contact via structure 76. The backside trench fill structures (74, 76) include first backside trench fill structures (74, 76) that are formed in the first backside trenches 79A and contact a source contact layer 114 of a respective layer stack of source-level material layers 110. Further, the backside trench fill structures (74, 76) include second backside trench fill structures (74D, 76D) that are formed in the second backside trenches 79 and contact a respective source isolation dielectric structure 12. The second backside trench fill structures (74D, 76D) do not contact the source contact layer 114 and thus comprise dummy backside trench fill structures because there is no electrical connection between the dummy backside contact via structures 76 and the source contact layer 114.

Each of the backside contact via structures 76 in the first backside trench fill structures (74, 76) is electrically connected to a respective underlying source contact layer 114. Each of the backside contact via structures 76D in the second backside trench fill structures (74, 76) is electrically isolated from the source contact layers 114 by a respective source isolation dielectric structure 12. In one embodiment, each recessed surface segment of a source layer (112, 114, 116) that is contacted by a respective backside contact via structures 76 (located within a respective first backside trench 79A) is a surface of the source contact layer 114.

The second exemplary structure includes multiple instances of a unit structure US that laterally extends along a first horizontal direction hd1 and repeated along a second horizontal direction hd2 that is perpendicular to the first horizontal direction hd1. Each instance of the unit structure US comprises a source layer (112, 114, 116) comprising at least one doped semiconductor material; a source isolation dielectric structure 12 contacting a first sidewall of the source layer (112, 114, 116) and laterally extending along the first horizontal direction hd1; alternating stacks {(132, 146), (232, 246)} of insulating layers (132, 232) and electrically conductive layers (146, 246) located over the source layer (112, 114, 116) and laterally spaced apart from each other along the second horizontal direction hd2 by at least one first backside trench 79A that is filled with a respective first backside trench fill structure (74, 76) that comprises a respective backside contact via structure 76 contacting a respective recessed surface segment of the source layer (112, 114, 116); memory openings 49 vertically extending through a respective one of the alternating stacks {(132, 146), (232, 246)}; memory opening fill structures 58 located in the memory openings 49 and comprising a respective vertical stack of memory elements (which may comprise portions of memory films 50 located at levels of the electrically conductive layers (146, 246)) and a respective vertical semiconductor channel 60; and a second backside trench fill structure (74D, 76D) contacting a top surface of the source isolation dielectric structure 12 and located in a second backside trench 79B located between an outermost alternating stack among the alternating stacks {(132, 146), (232, 246)} and a neighboring instance of the unit structure US.

Figure 35A:
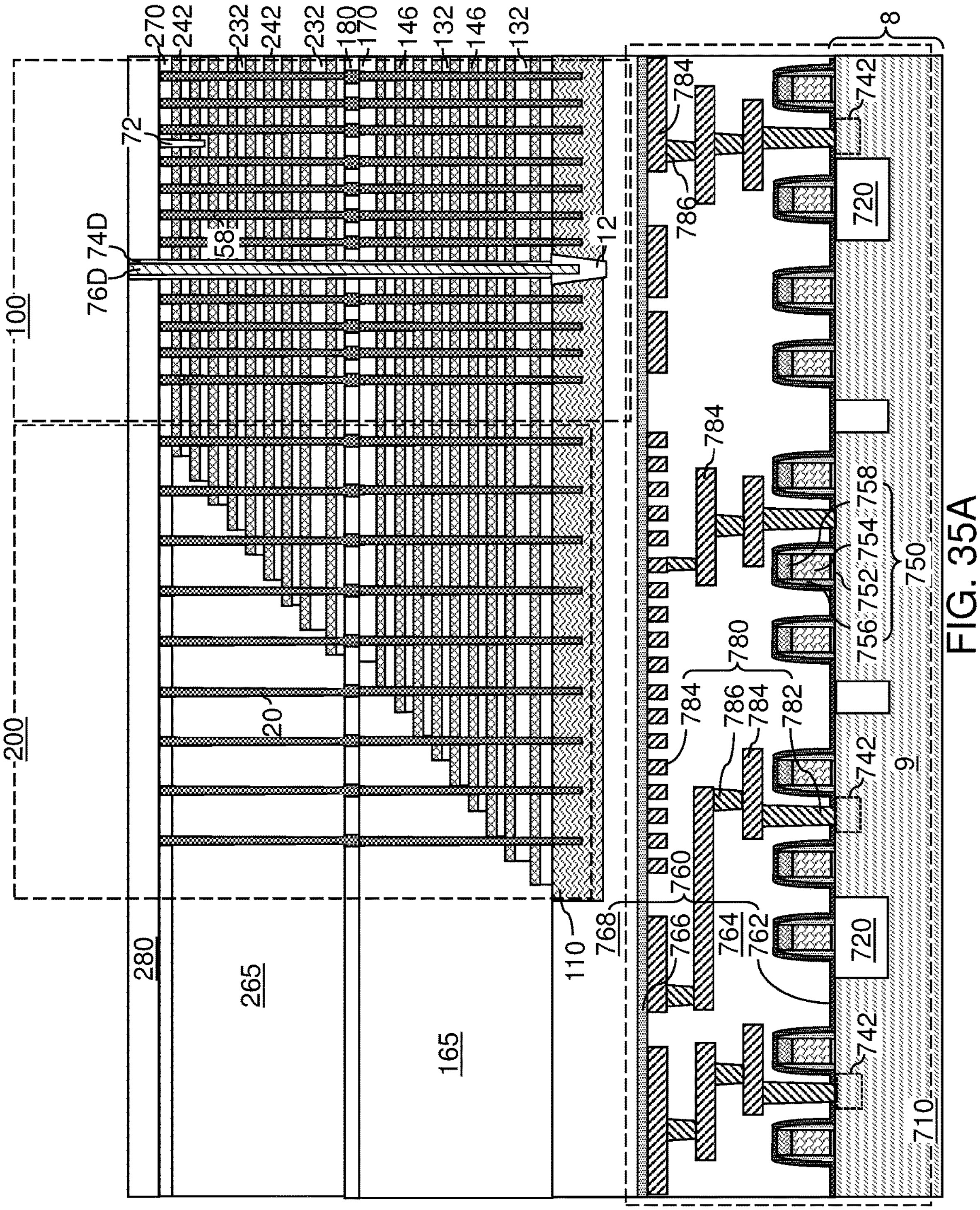
FIG. 35A is a vertical cross-sectional view of the second exemplary structure after formation of backside trench fill structures in the backside trenches according to the second embodiment of the present disclosure.
Figure 35B:
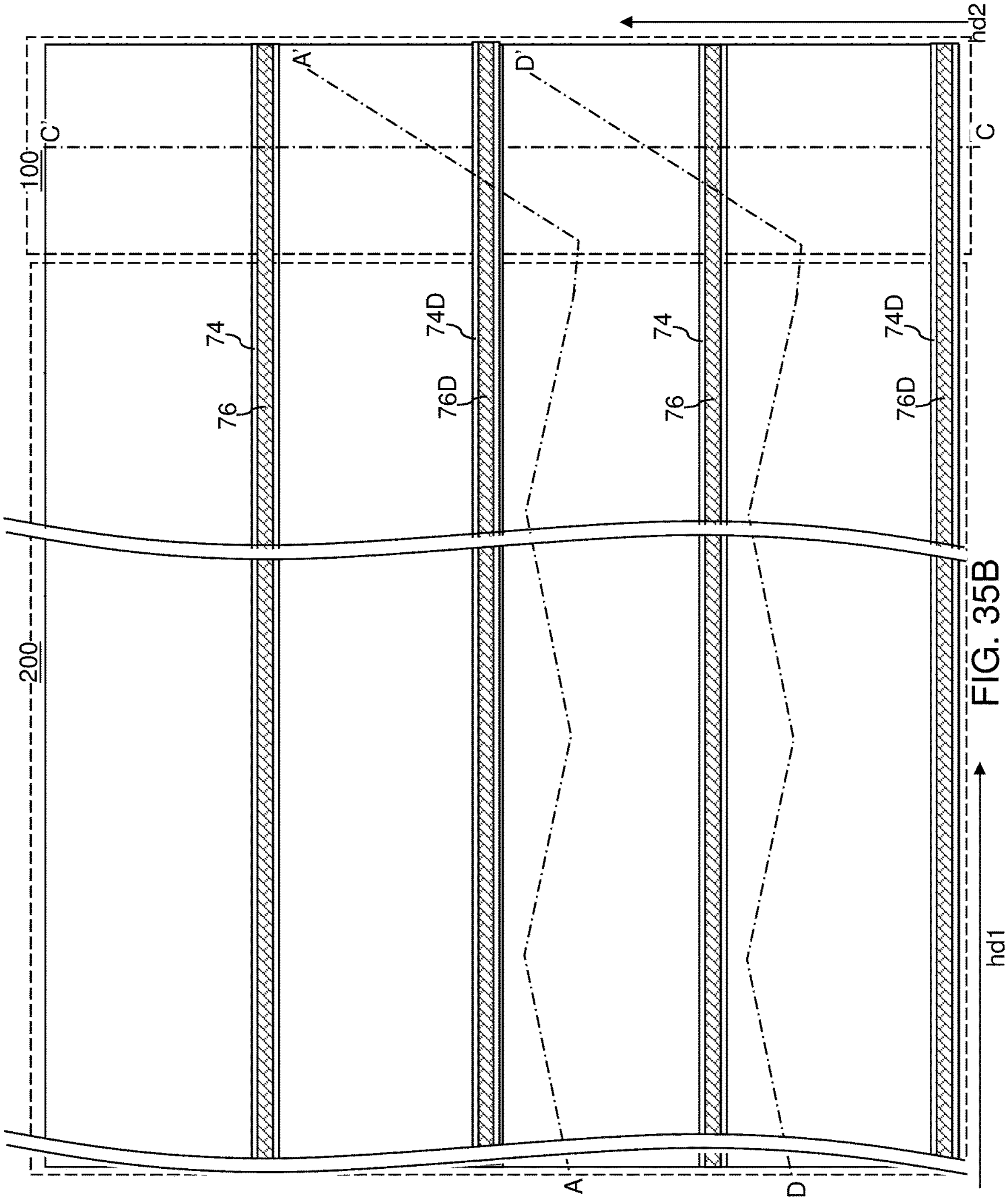
FIG. 35B is a top-down view of the second exemplary structure of FIG. 35A. The zig-zag vertical plane A-A' corresponds to the plane of the vertical cross-sectional view of FIG. 35A.
Figure 35C:
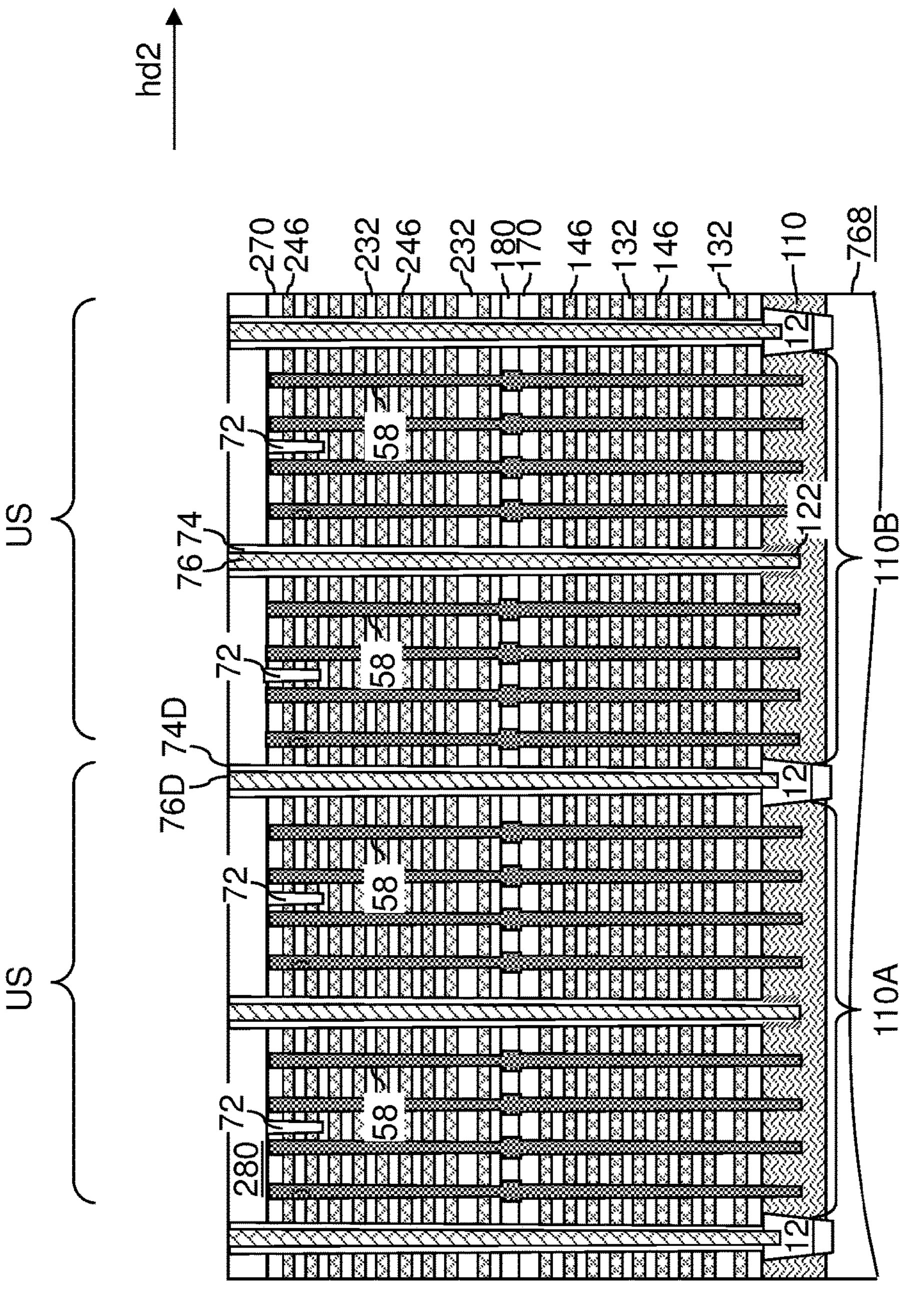
FIG. 35C is a vertical cross-sectional view of the second exemplary structure along the vertical plane C-C' of FIG. 35B.
Figure 35D:
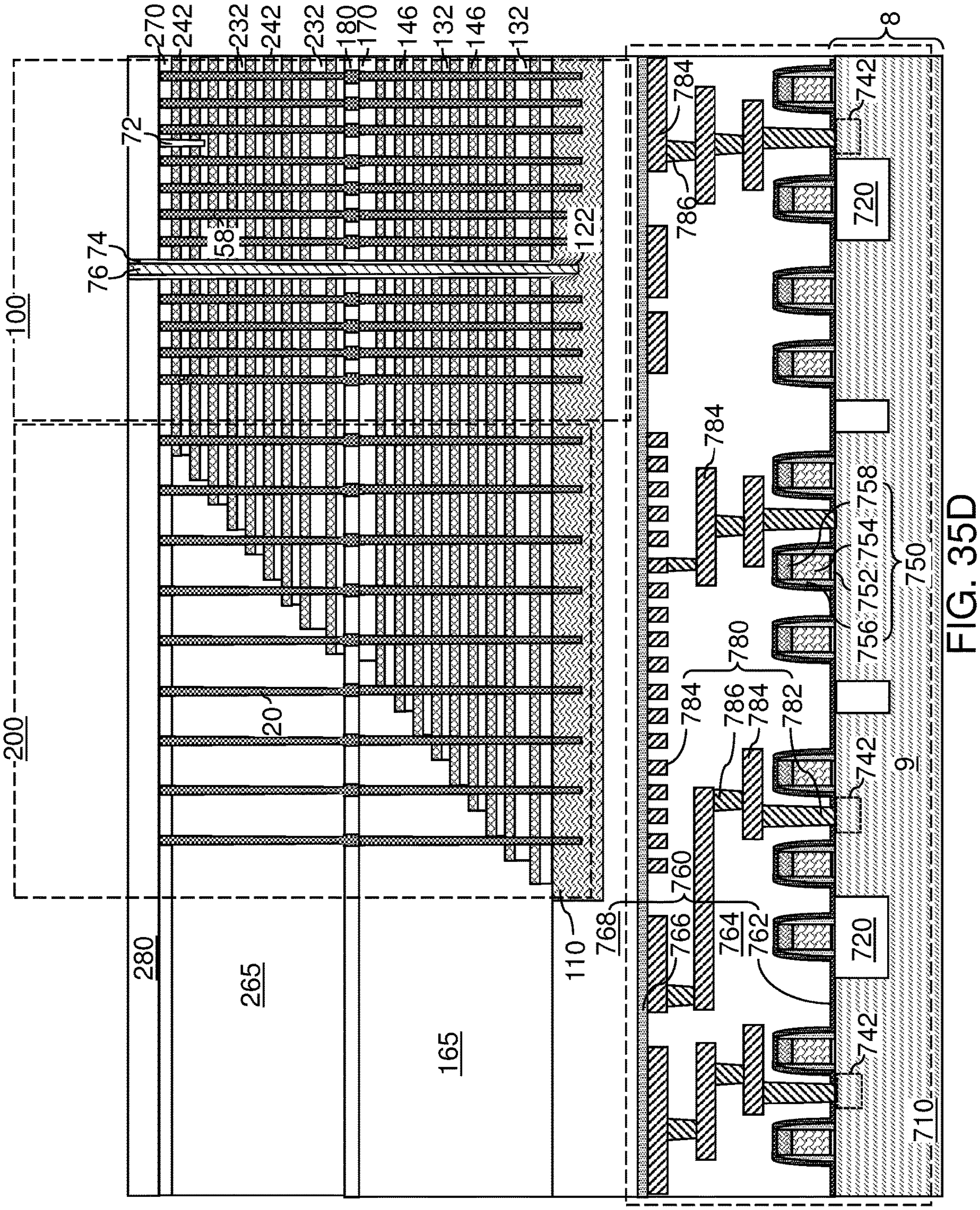
FIG. 35D is a vertical cross-sectional view of the second exemplary structure along the zig-zag vertical plane D-D' of FIG. 35B.
Figure 35E:
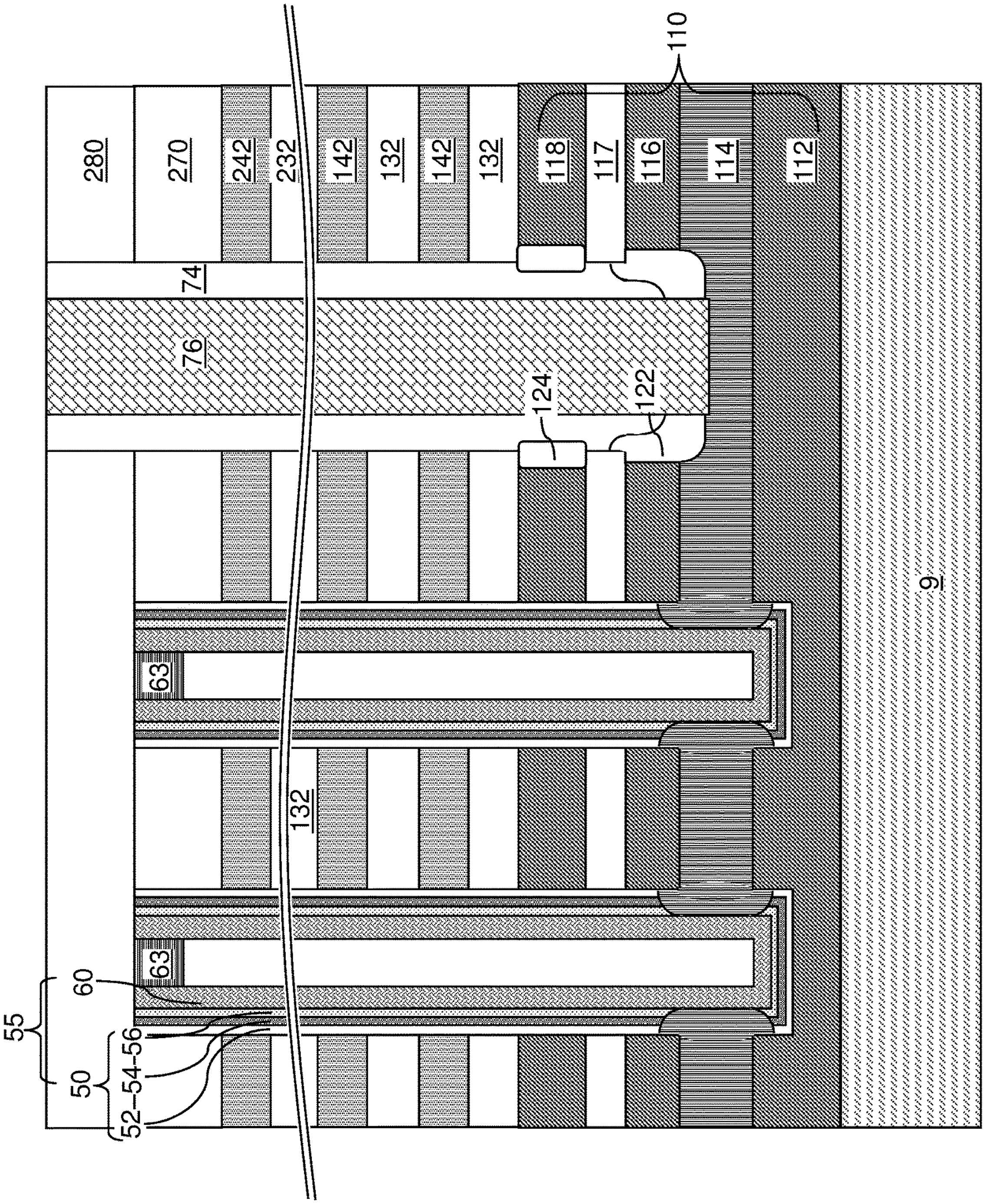
FIG. 35E is a magnified vertical cross-sectional view of a region of the second exemplary structure of FIGS. 35A-35D.

In one embodiment shown in FIG. 35C, a portion 110A of the source layer (112, 114, 116) within each instance of the unit structure US is electrically isolated from another portion 110B of the source layer (112, 114, 116) in a neighboring instance of the unit structure US by the source isolation dielectric structure 12. In one embodiment, the source layer (112, 114, 116) within each instance of the unit structure US comprises a second sidewall that contacts another source isolation dielectric structure 12 within another neighboring instance of the unit structure US. In one embodiment, each instance of the unit structure US comprises a plurality contact-level dielectric layers 280 overlying a respective one of the alternating stacks {(132, 146), (232, 246)} and a respective subset of the memory opening fill structures 58 and having a respective top surface located within a horizontal plane including each top surface of the at least one backside contact via structure 76.

Figure 36:
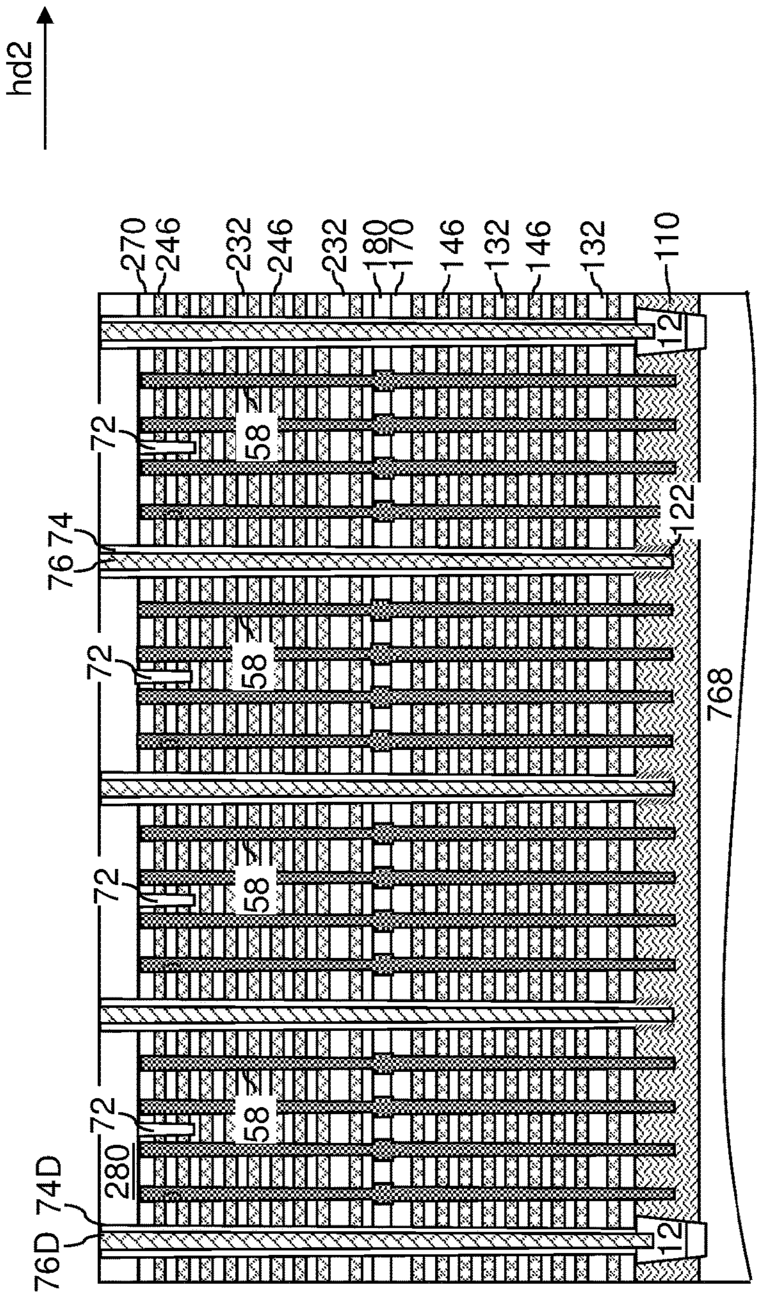
FIG. 36 is a vertical cross-sectional view of a first alternative configuration of the second exemplary structure according to the second embodiment of the present disclosure.

Referring to FIG. 36, a first alternative configuration of the second exemplary structure can be derived from the second exemplary structure illustrated in FIGS. 35A-35E by forming a plurality of first backside trenches 79A within each instance of the unit structure US, i.e., between each neighboring pair of second backside trenches 79B. Generally, at least one first backside trench 79A (and at least one first backside trench fill structure (74, 76) therein) can be formed between a neighboring pair of second backside trenches 79B (and a pair of second backside trench fill structures (74D, 76D) therein) within each instance of a unit structure US. The at least one first backside trench 79A may comprise a plurality of first backside trenches 79A containing a plurality of backside contact via structures 76 therein, and a source layer (112, 114, 116) can contact each of the plurality of backside contact via structures 76 within an instance of the unit structure US. In the illustrated example of FIG. 36, each instance of the unit structure US includes four alternating stacks of insulating layers (132, 232) and electrically conductive layers (146, 246) that are laterally spaced apart from each other by three first backside trench fill structures (74, 76).

Figure 37:
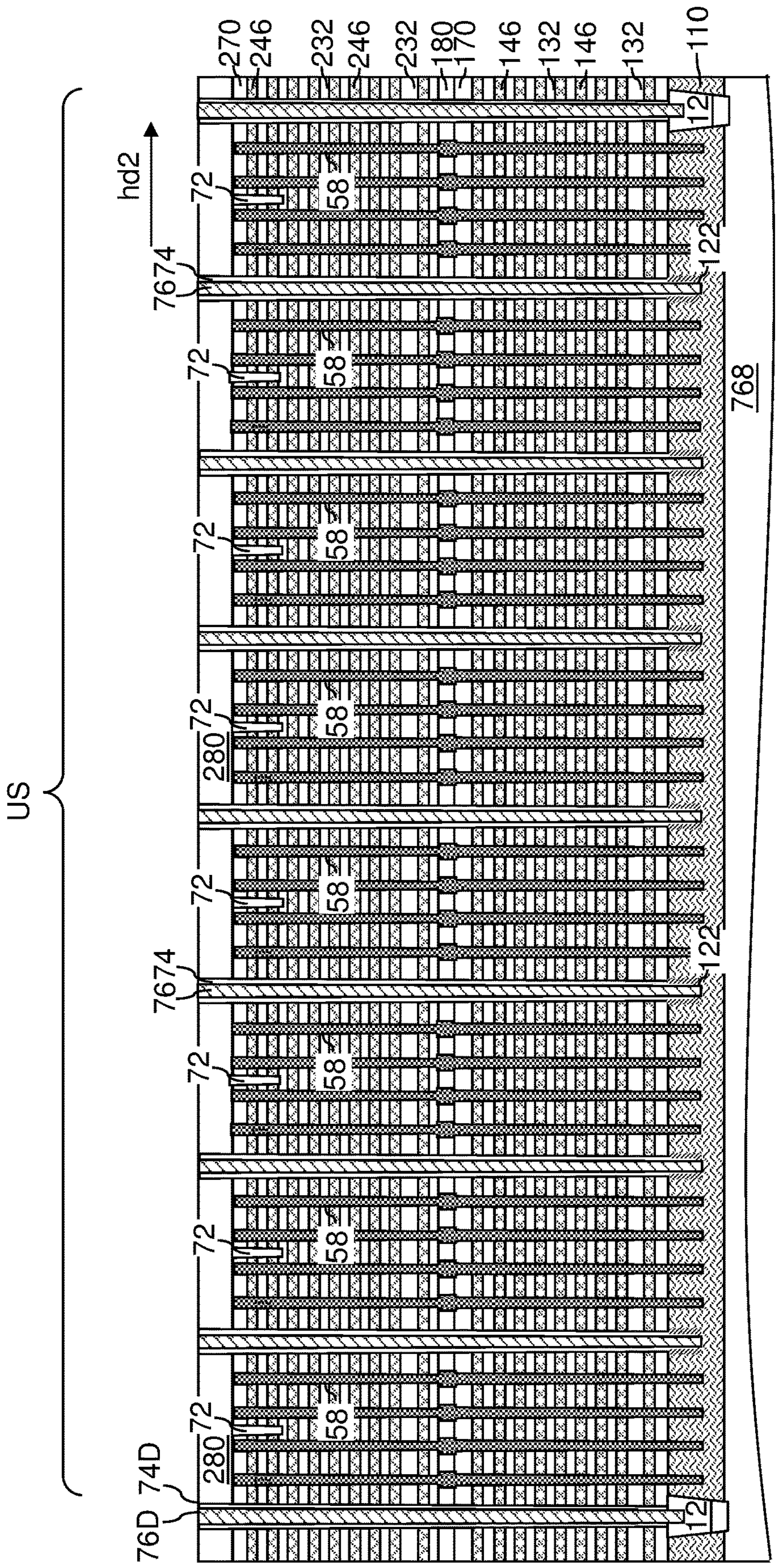
FIG. 37 is a vertical cross-sectional view of a second alternative configuration of the second exemplary structure according to the second embodiment of the present disclosure.

Referring to FIG. 37, a second alternative configuration of the second exemplary structure is illustrated, in which each instance of the unit structure US includes eight alternating stacks of insulating layers (132, 232) and electrically conductive layers (146, 246) that are laterally spaced apart from each other by seven first backside trench fill structures (74, 76).

Figure 38A:
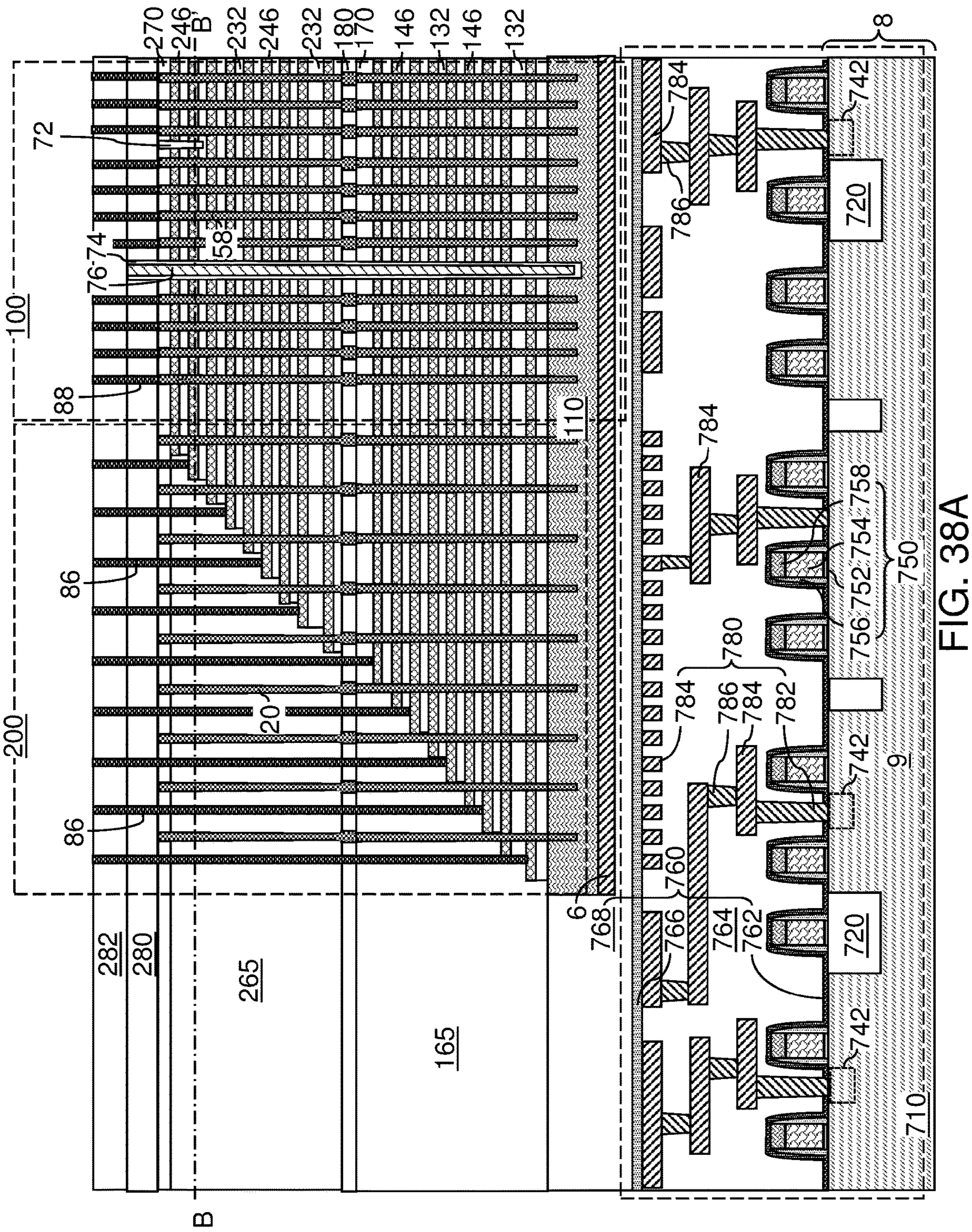
FIG. 38A is a vertical cross-sectional view of the second exemplary structure after formation of drain contact via structures and layer contact via structures according to the second embodiment of the present disclosure.
Figure 38B:
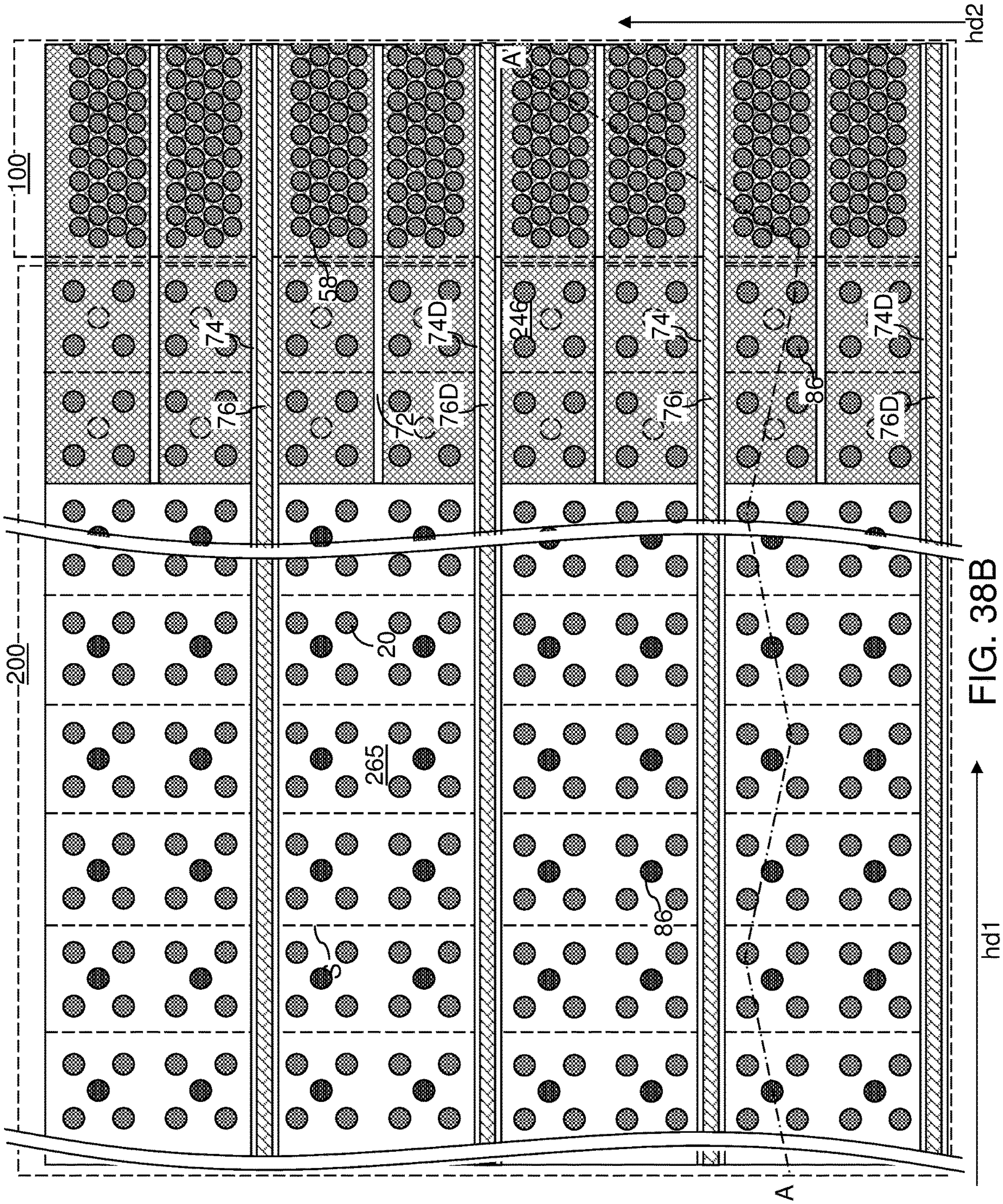
FIG. 38B is a horizontal cross-sectional view of the second exemplary structure of FIG. 38A. The zig-zag vertical plane A-A' corresponds to the plane of the vertical cross-sectional view of FIG. 38A.

Referring to FIGS. 38A and 38B, the processing steps described with reference to FIGS. 21A and 21B can be performed to form a via-level dielectric layer 282, drain contact via structures 88, and layer contact via structures 86.

Figure 39:
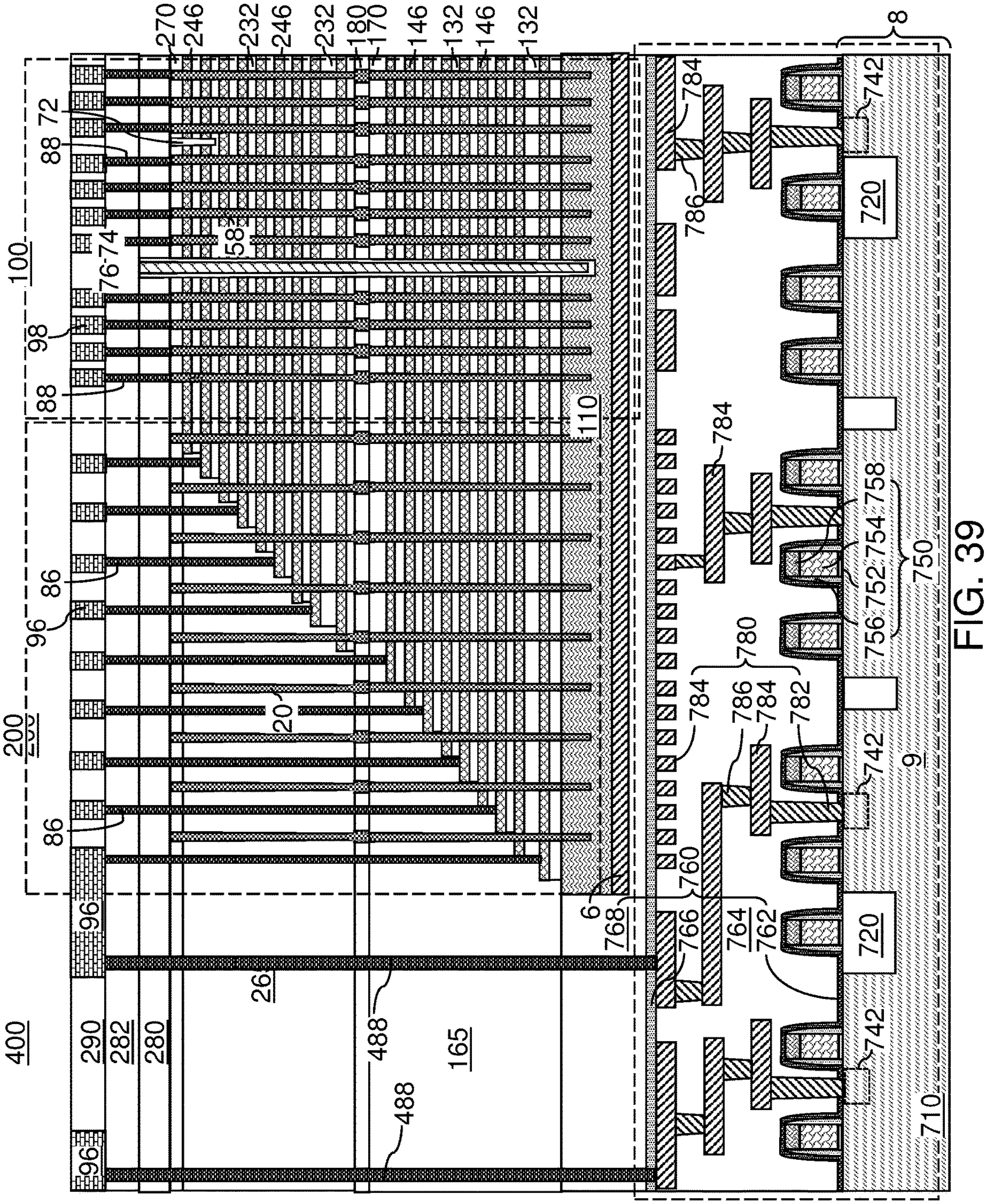
FIG. 39 is a vertical cross-sectional view of the second exemplary structure after formation of through-memory-level connection via structures and upper-level metal interconnect structures according to the second embodiment of the present disclosure.

Referring to FIG. 39, the processing steps described with reference to FIG. 22 can be performed to form through-memory-level connection via structures 488 and upper-level metal interconnect structures (96, 98).

In one embodiment, each of the alternating stacks {(132, 146), (232, 246)} has respective stepped surfaces having lateral extents along the first horizontal direction hd1 that decrease with a vertical distance from the semiconductor substrate 8. Retro-stepped dielectric material portions (165, 265) overlie the stepped surfaces of the alternating stacks {(132, 146), (232, 246)}. The through-memory-level connection via structures 488 vertically extend through a respective one of the retro-stepped dielectric material portions (165, 265). The peripheral circuitry is electrically connected to the electrically conductive layers (146, 246) and the vertical stacks of memory elements (which may comprise portions of memory films 50 located at levels of the electrically conductive layers (146, 246)) through lower-level metal interconnect structures 780 and through the upper-level metal interconnect structures.

Figure 40A:
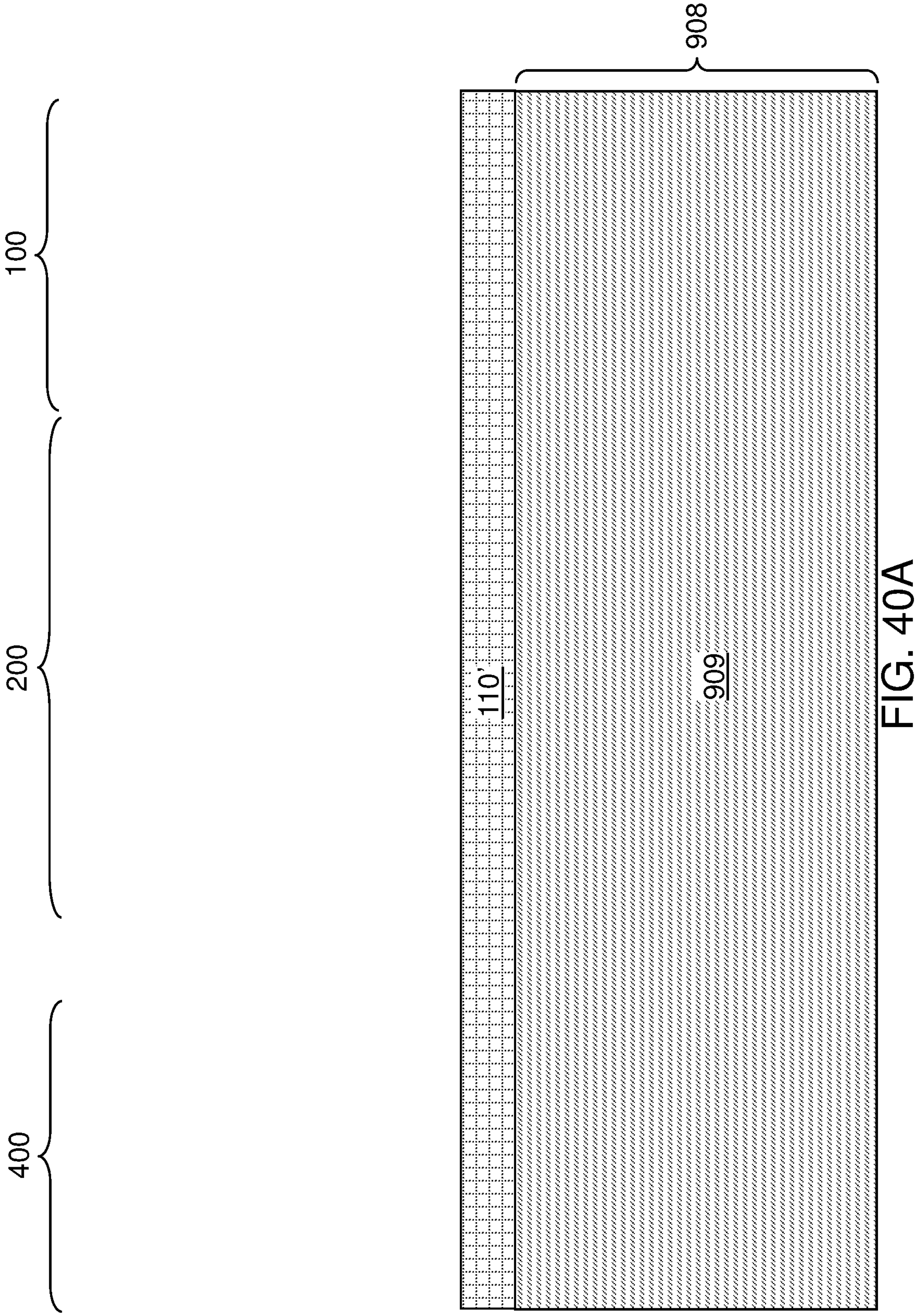
FIG. 40A is a vertical cross-sectional view of a third exemplary structure after formation of in-process source-level material layers and source-isolation dielectric structures on a substrate according to a third embodiment of the present disclosure.
Figure 40B:
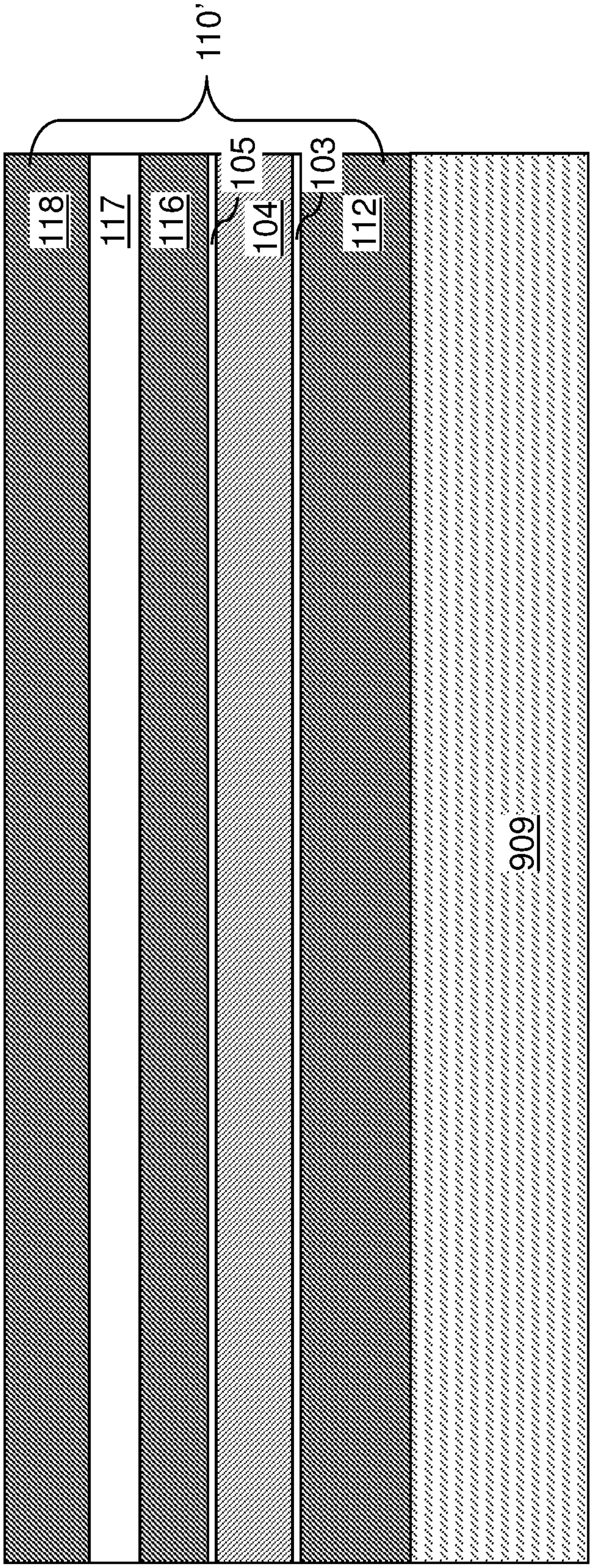
FIG. 40B is a magnified vertical cross-sectional view of the in-process source-level material layers in the third exemplary structure of FIG. 40A.

Referring to FIGS. 40A and 40B, a third exemplary structure according to a third embodiment of the present disclosure comprises a substrate 908 including a substrate material layer 909. The substrate 8 may comprise a semiconductor substrate, an insulating substrate, and/or a conductive substrate. Generally, the substrate 908 can be any substrate that may be employed as a carrier substrate, such as a silicon wafer. In one embodiment, the substrate material layer 909 may comprise a single crystalline semiconductor material layer (such as a single crystalline silicon epitaxial layer or a doped silicon well in a silicon wafer). Optionally, the substrate 908 may comprise a silicon on insulator substrate including an insulating layer (such as a silicon oxide layer) in an upper portion thereof.

In-process source-level material layers 110' can be formed on a top surface of the substrate 908. The in-process source-level material layers 110' may be the same as the in-process source-level material layers 110' described above.

Figure 41:
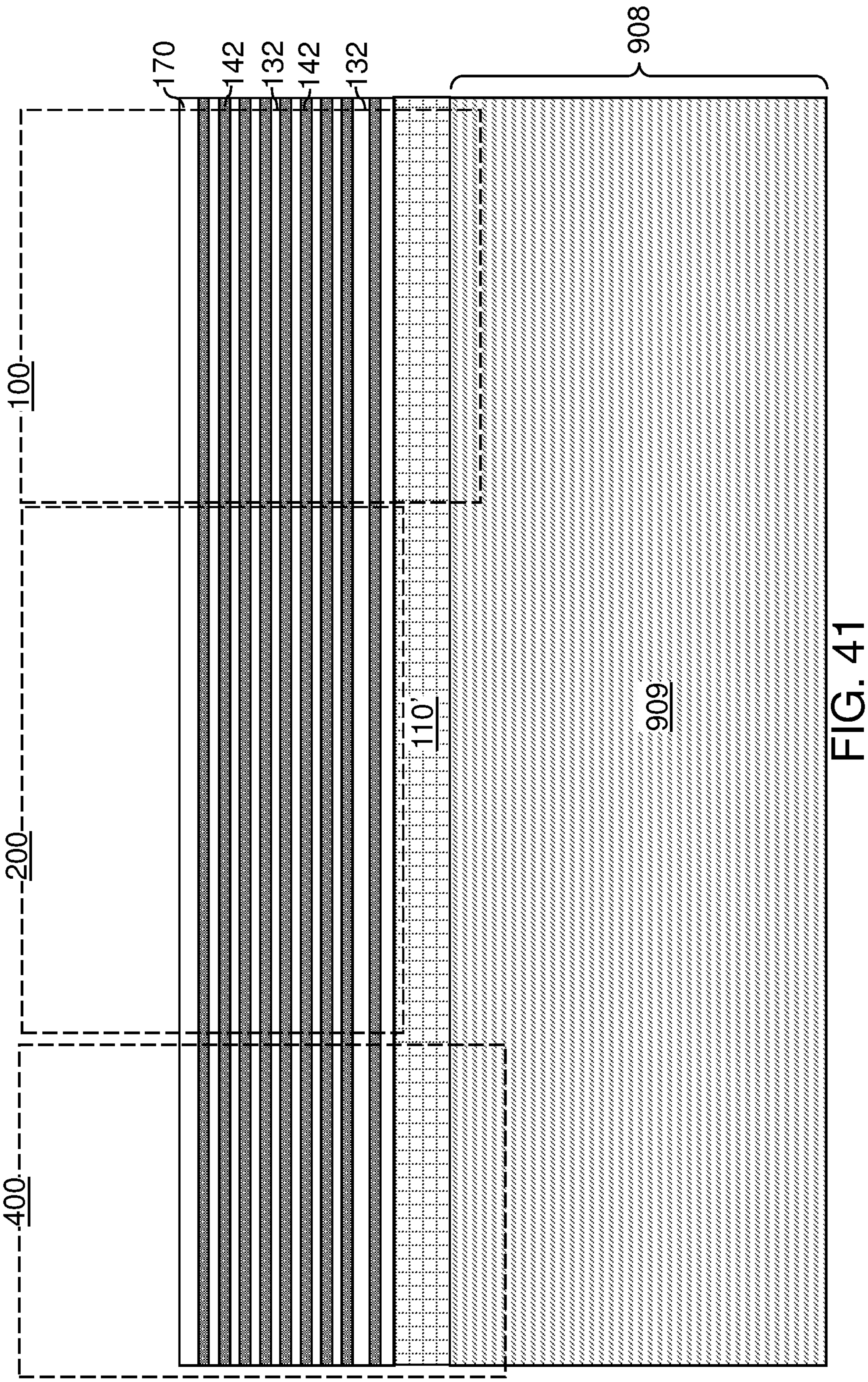
FIG. 41 is a vertical cross-sectional view of the third exemplary structure after formation of a first vertically alternating sequence of first insulating layers and first spacer material layers according to the third embodiment of the present disclosure.

Referring to FIG. 41, the processing steps described with reference to FIG. 2 can be performed to form a first vertically alternating sequence of first insulating layers 132 and first spacer material layers 142.

Figure 42:
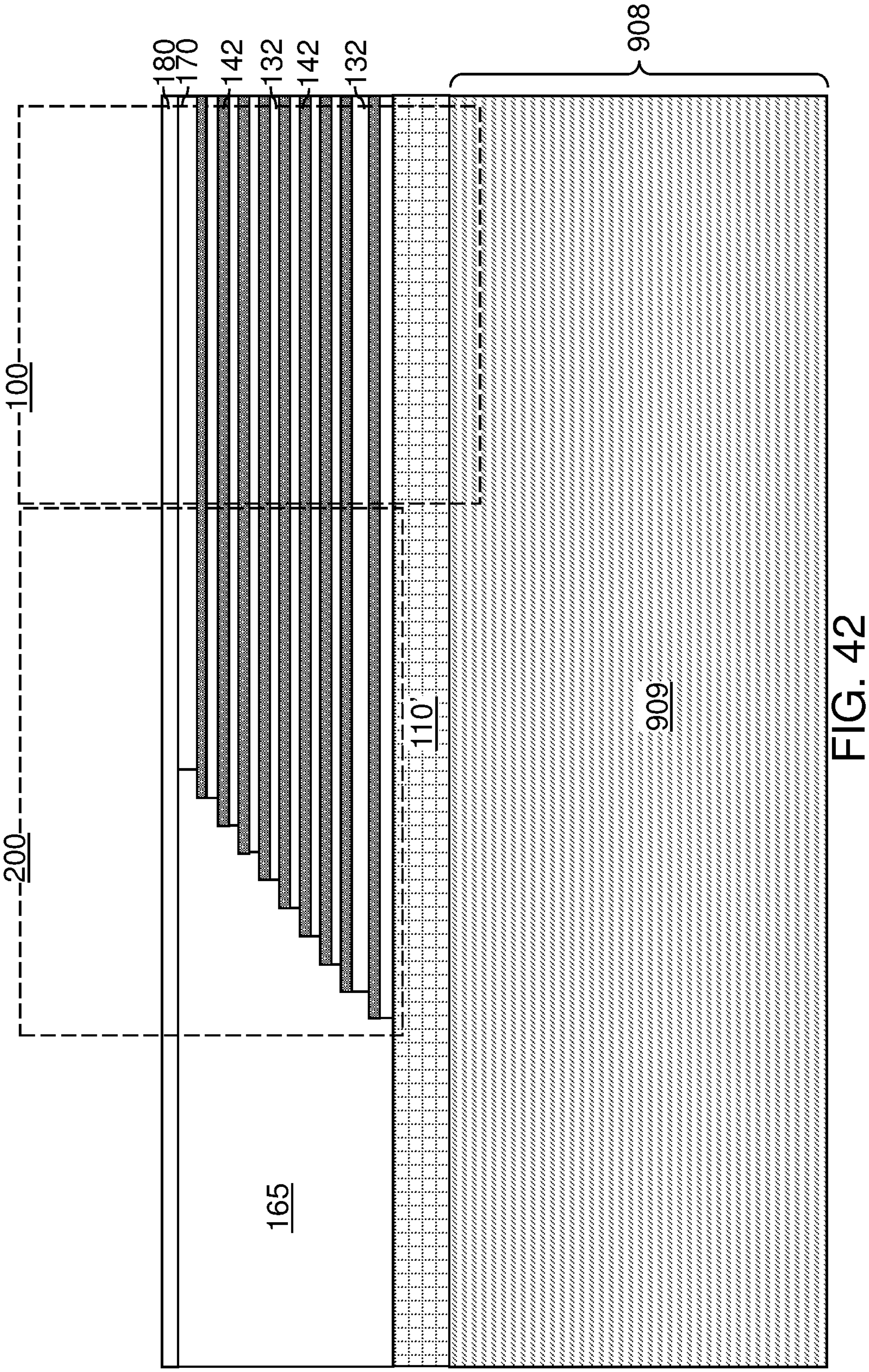
FIG. 42 is a vertical cross-sectional view of the third exemplary structure after patterning first stepped surfaces, a first retro-stepped dielectric material portion, and an inter-tier dielectric layer according to the third embodiment of the present disclosure.

Referring to FIG. 42, the processing steps described with reference to FIG. 3 can be performed to pattern first stepped surfaces, and to form a first retro-stepped dielectric material portion 165 and an inter-tier dielectric layer 180.

Figure 43A:
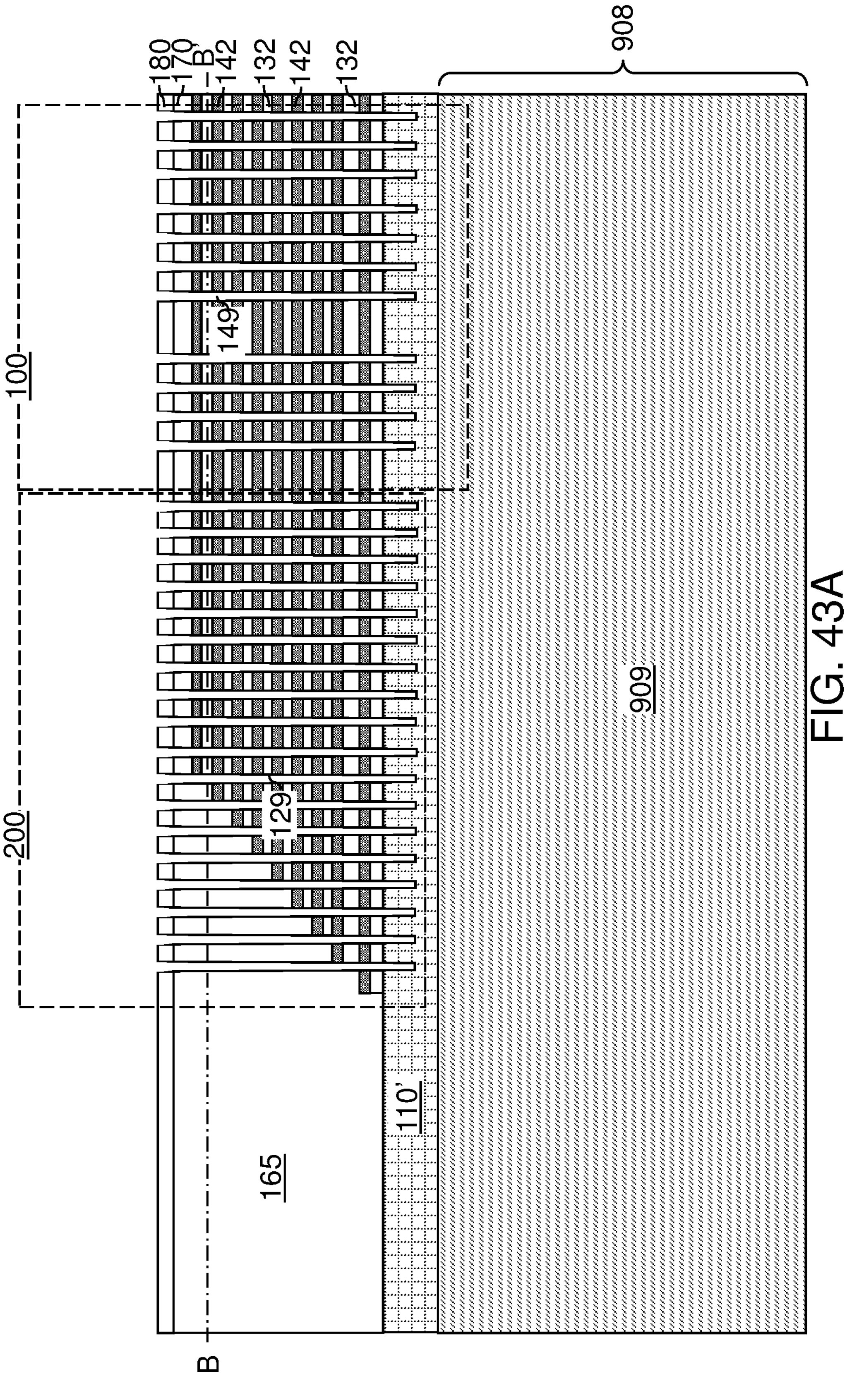
FIG. 43A is a vertical cross-sectional view of the third exemplary structure after formation of first-tier memory openings and first-tier support openings according to the third embodiment of the present disclosure.
Figure 43B:
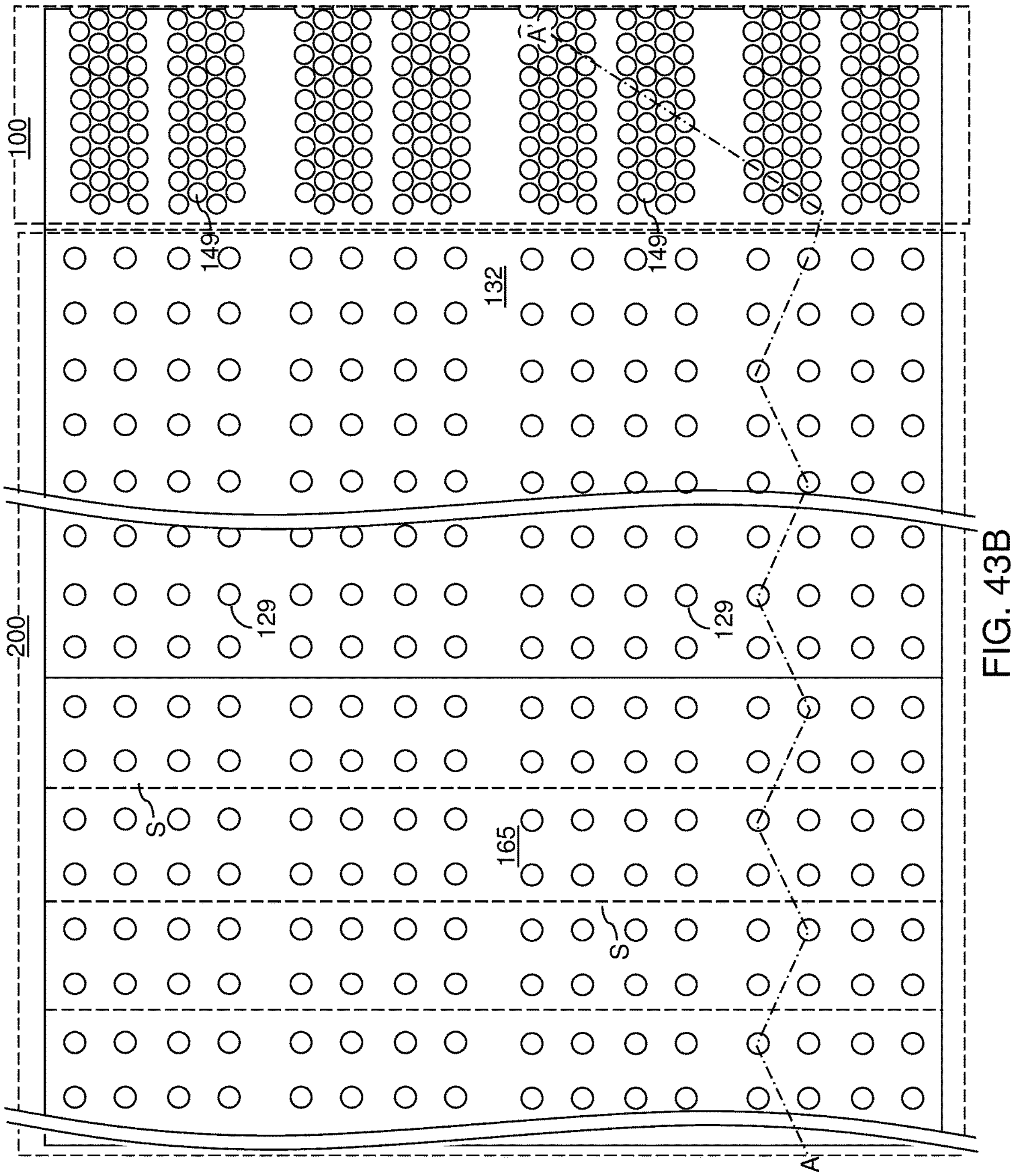
FIG. 43B is a horizontal cross-sectional view of the first exemplary structure along the horizontal plane B-B' of FIG. 43A. The zig-zag vertical plane A-A' corresponds to the plane of the vertical cross-sectional view of FIG. 43A.

Referring to FIGS. 43A and 43B, the processing steps of FIGS. 4A and 4B can be performed to form first-tier memory openings 149 and first-tier support openings 129. In one embodiment, each of the first-tier memory openings 149 and the first-tier support openings 129 can be formed directly into a respective layer stack of in-process source-level material layers 110'.

Figure 44:
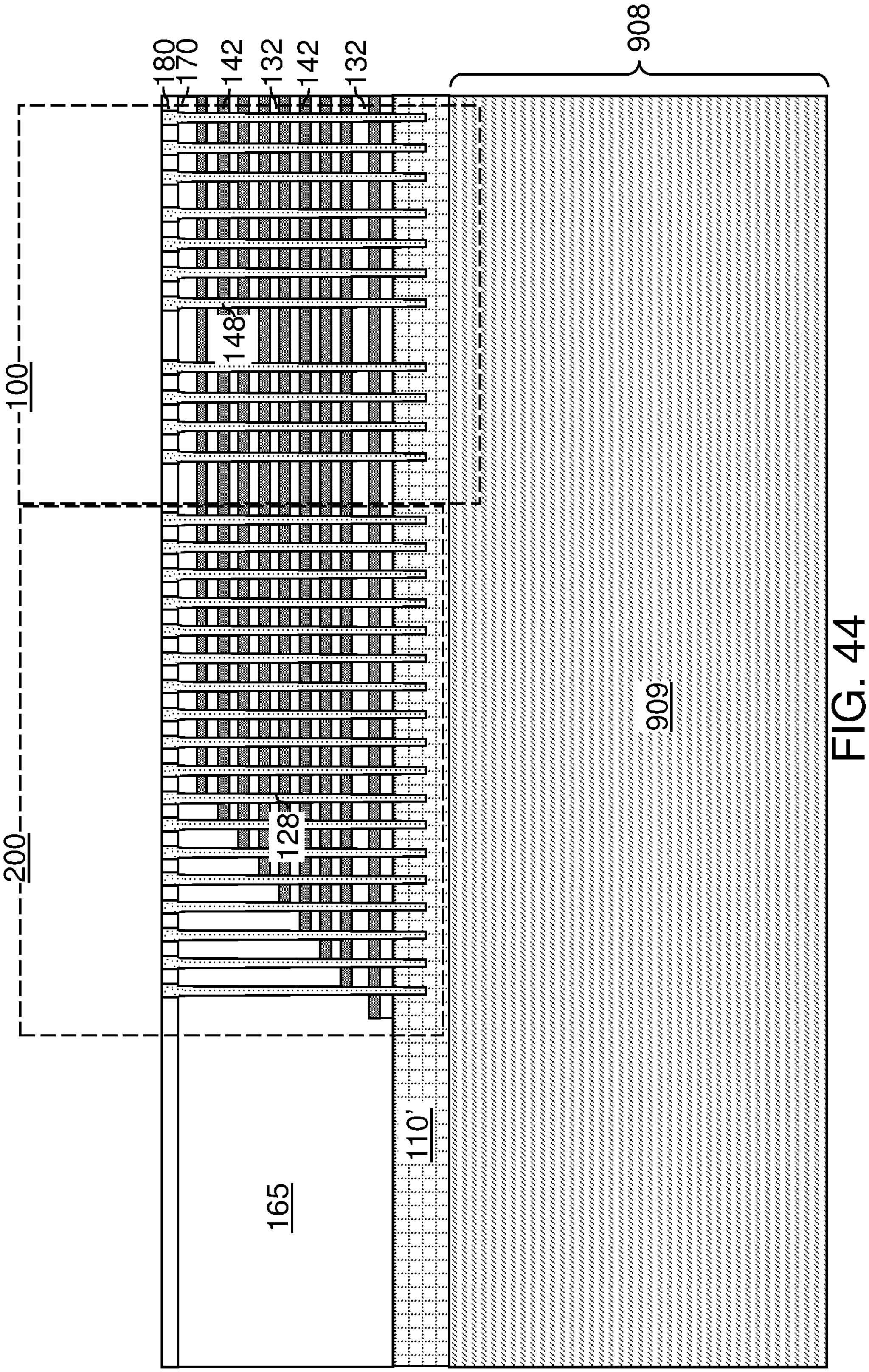
FIG. 44 is a vertical cross-sectional view of the third exemplary structure after formation of sacrificial memory opening fill portions and first-tier support opening fill portions according to the third embodiment of the present disclosure.

Referring to FIG. 44, the processing steps described with reference to FIG. 5 can be performed to form is a sacrificial first-tier memory opening fill portions 148 and sacrificial first-tier support opening fill portions 128.

Figure 45:
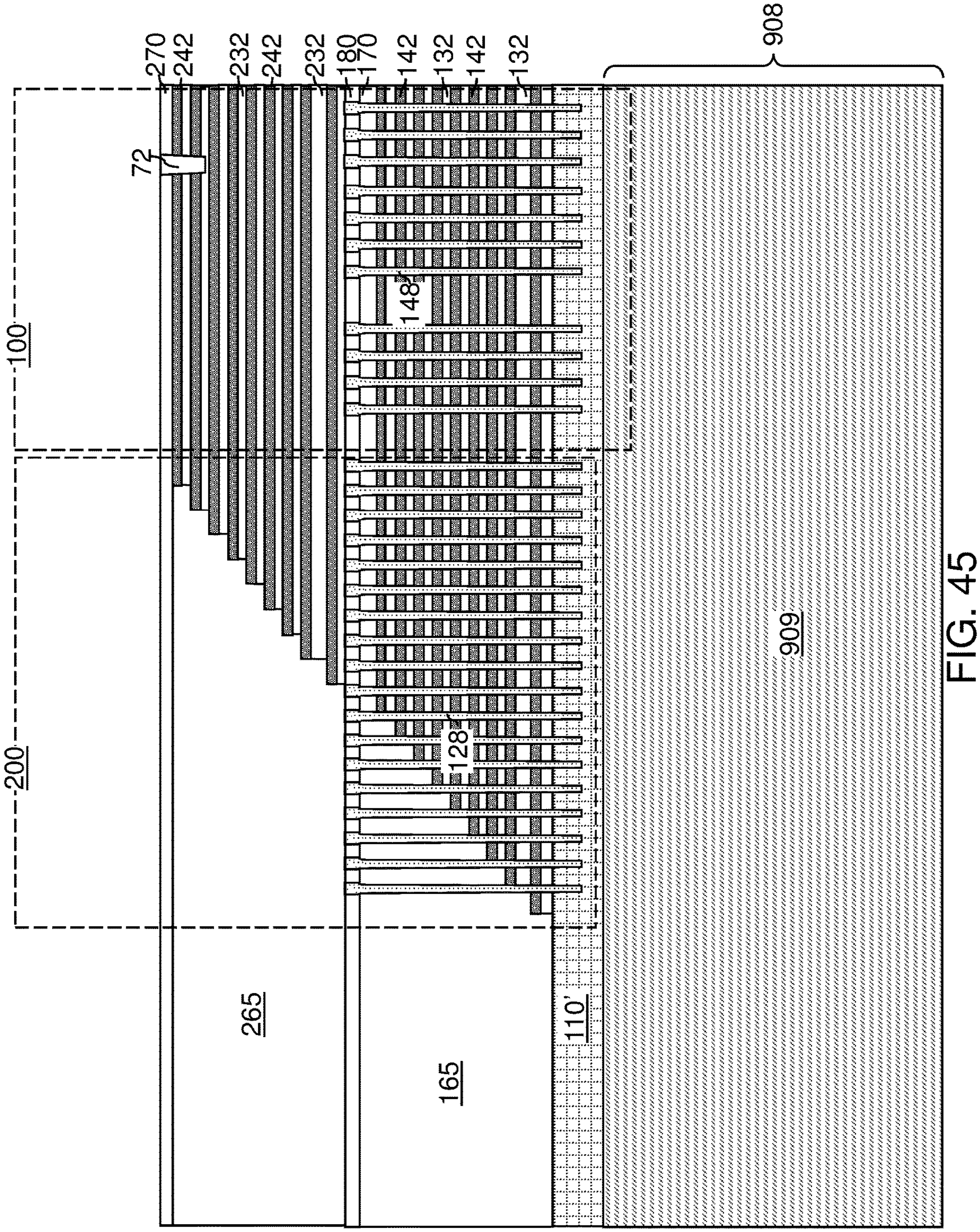
FIG. 45 is a vertical cross-sectional view of the third exemplary structure after formation of a second vertically alternating sequence of second insulating layers and second spacer material layers, second stepped surfaces, a second retro-stepped dielectric material portion, and drain-select-level isolation structures according to the third embodiment of the present disclosure.

Referring to FIG. 45, the processing steps described with reference to FIG. 6 can be performed to form a second vertically alternating sequence of second insulating layers 232 and second spacer material layers 242, second stepped surfaces, a second retro-stepped dielectric material portion 265, and drain-select-level isolation structures 72.

Figure 46A:
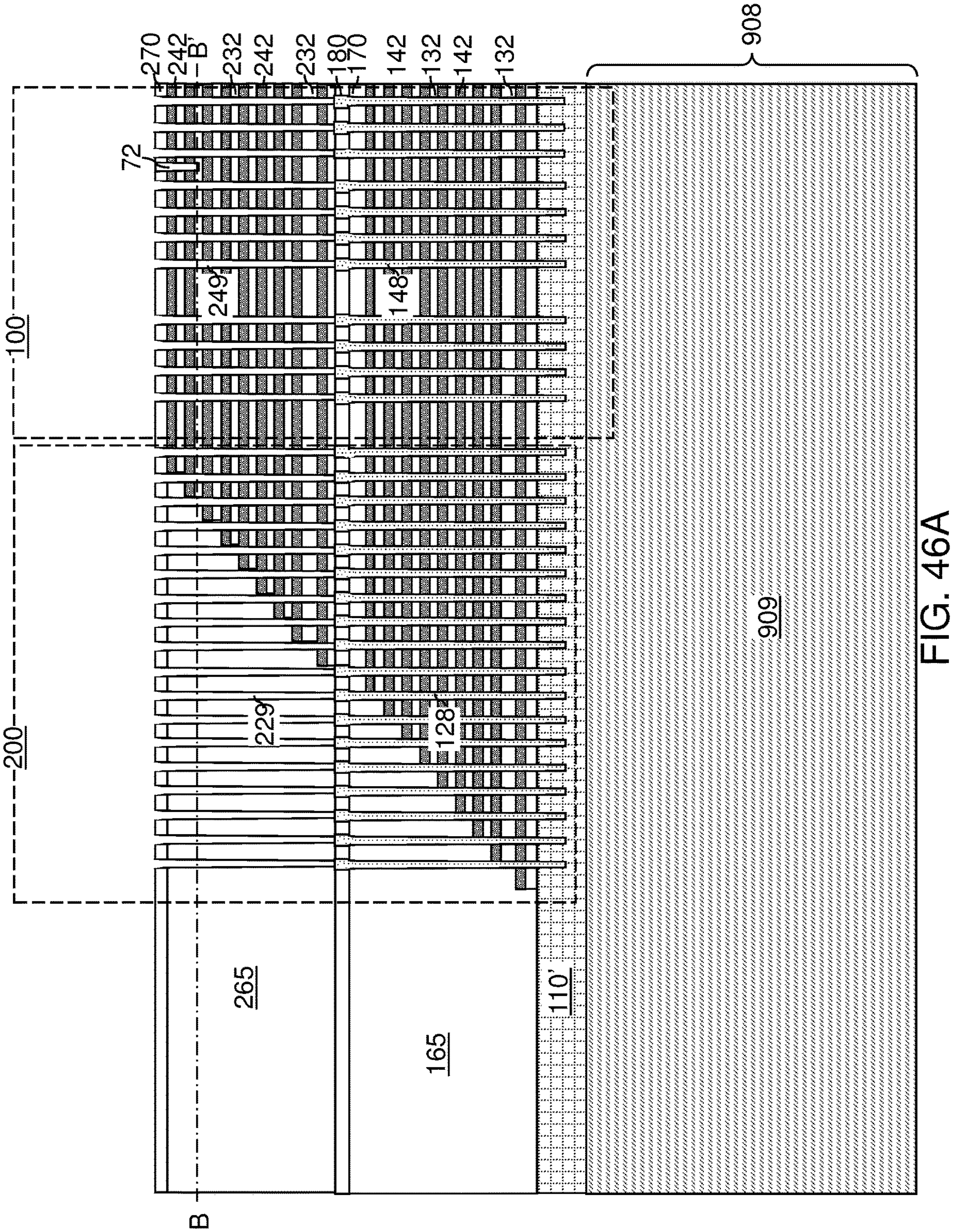
FIG. 46A is a vertical cross-sectional view of the third exemplary structure after formation of second-tier memory openings and second-tier support openings according to the third embodiment of the present disclosure.
Figure 46B:
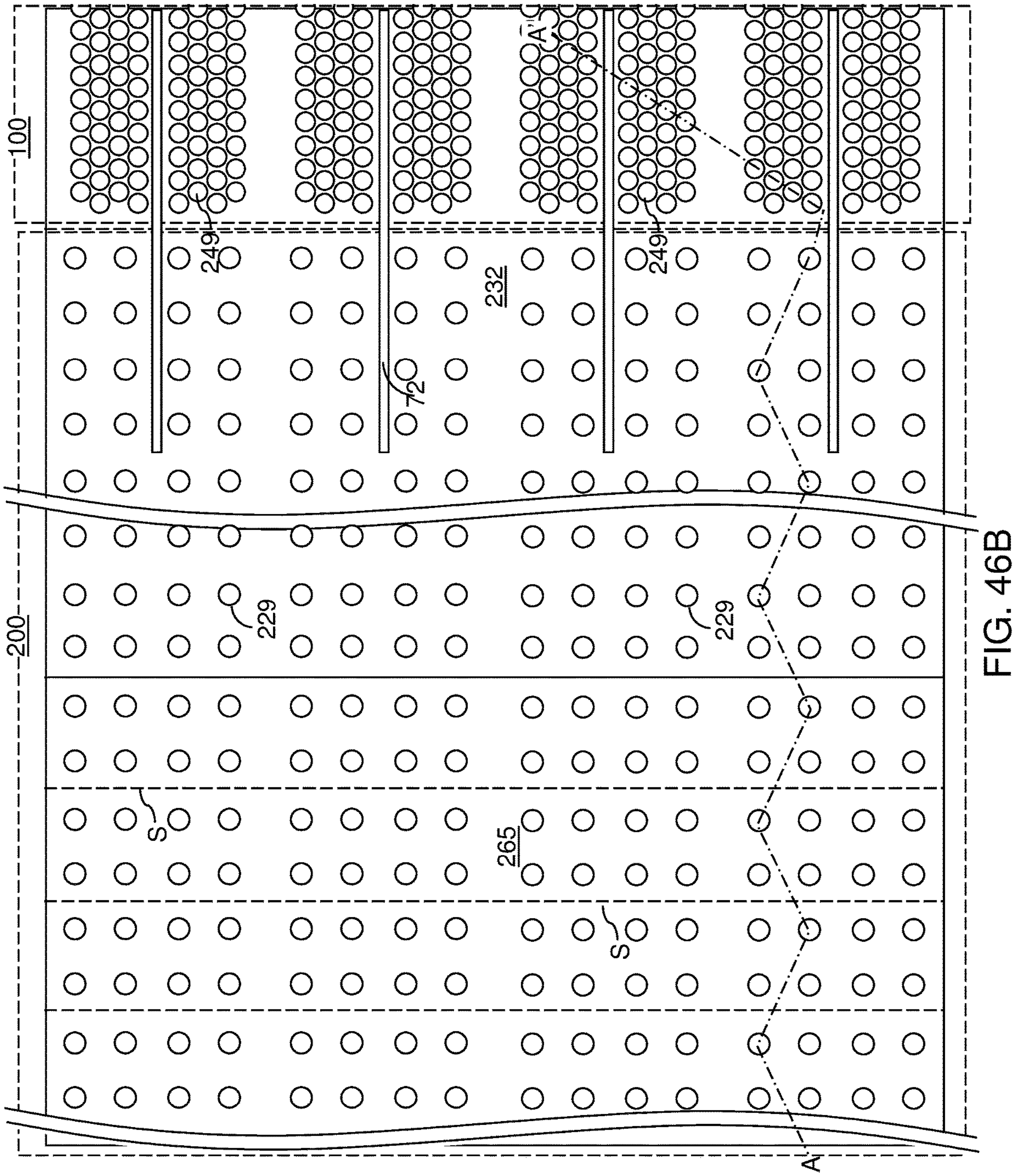
FIG. 46B is a top-down view of the third exemplary structure of FIG. 46A. The zig-zag vertical plane A-A' corresponds to the plane of the vertical cross-sectional view of FIG. 46A.

Referring to FIGS. 46A and 46B, the processing steps described with reference to FIGS. 7A and 7B can be performed to form second-tier memory openings 249 and second-tier support openings 229.

Figure 47:
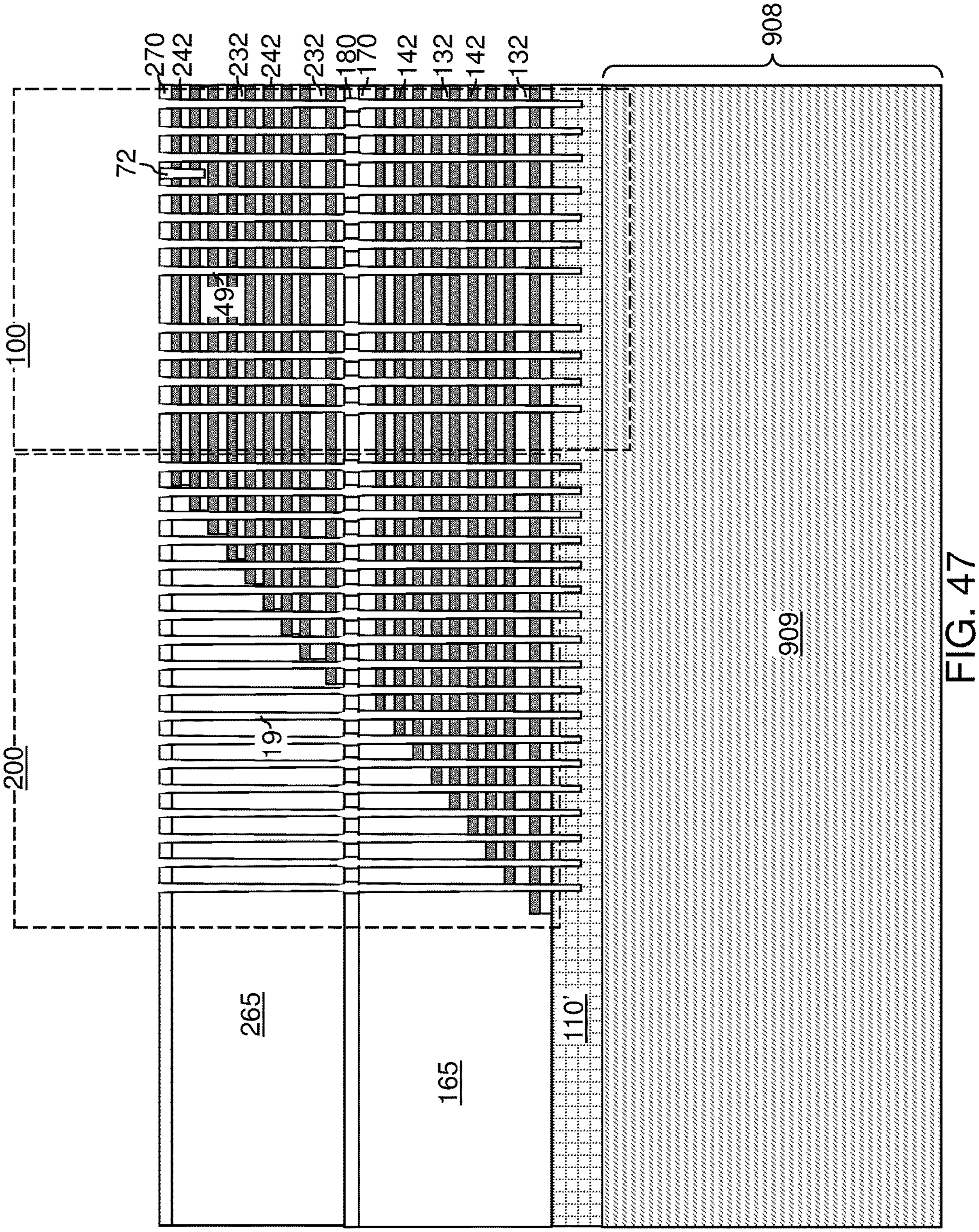
FIG. 47 is a vertical cross-sectional view of the third exemplary structure after formation of inter-tier memory openings according to the third embodiment of the present disclosure.

Referring to FIG. 47, the processing steps described with reference to FIGS. 8A and 8B can be performed to form inter-tier memory openings 49 and inter-tier support openings 19.

Figure 48A:
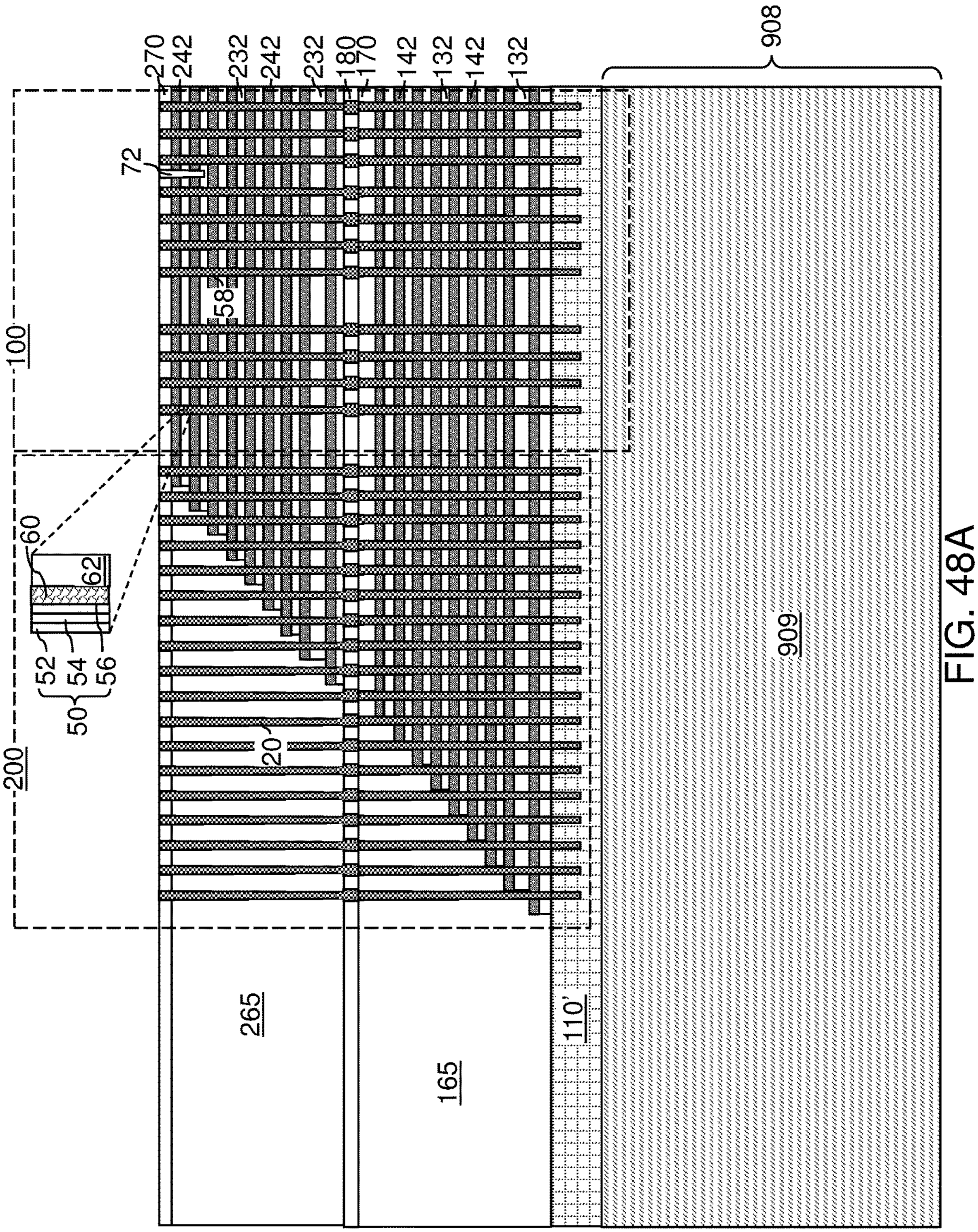
FIG. 48A is a vertical cross-sectional view of the third exemplary structure after formation of memory opening fill structures and support pillar structures according to the third embodiment of the present disclosure.
Figure 48B:
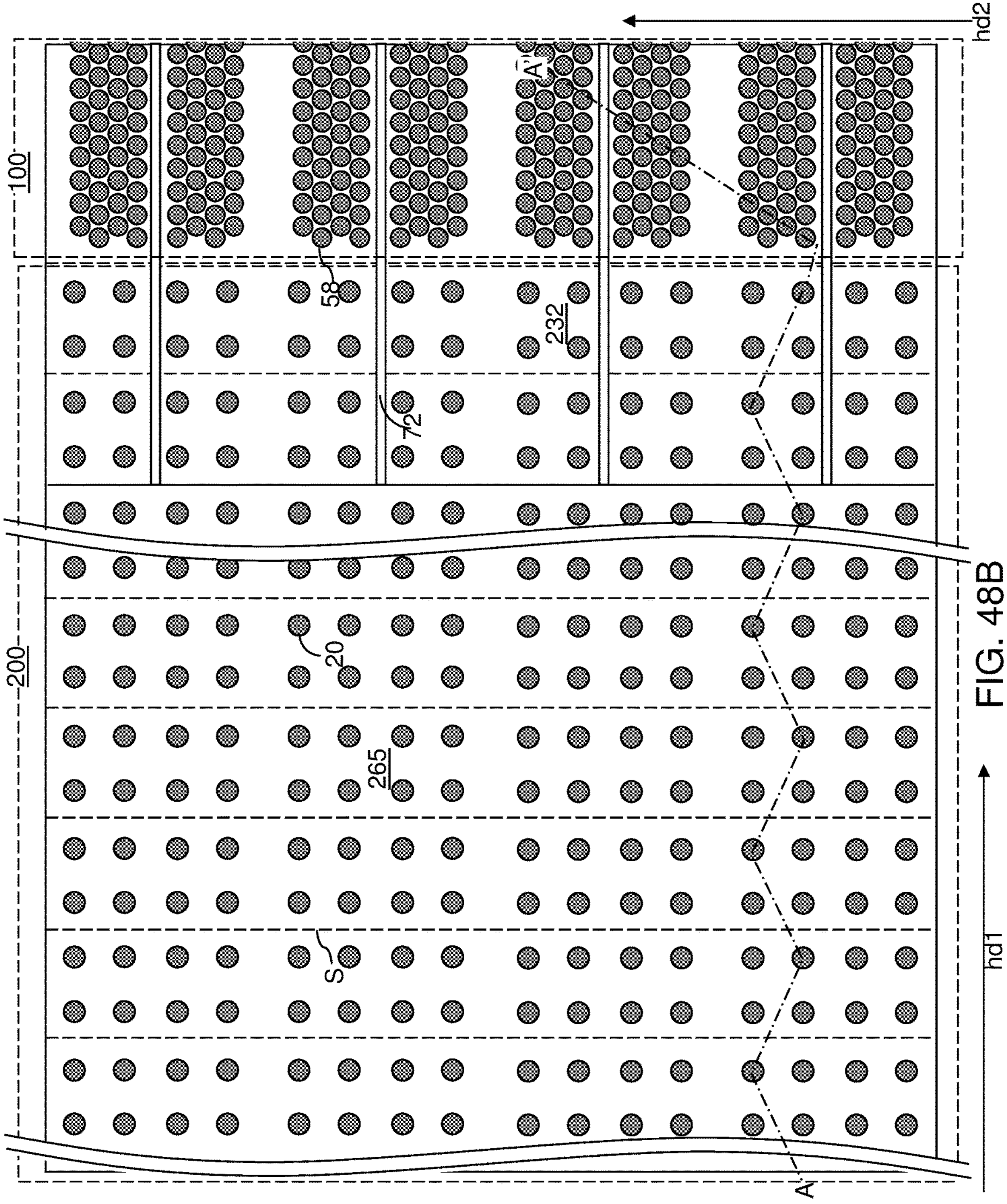
FIG. 48B is a top-down view of the third exemplary structure of FIG. 48A. The zig-zag vertical plane A-A' corresponds to the plane of the vertical cross-sectional view of FIG. 48A.

Referring to FIGS. 48A and 48B, the processing steps of FIGS. 9A-9D and 10 can be performed to form memory opening fill structures 58 and support pillar structures 20. Each of the memory opening fill structures 58 comprises a respective vertical stack of memory elements (which may comprise portions of memory films 50 located at levels of the electrically conductive layers (146, 246)) and a respective vertical semiconductor channel 60.

Figure 49A:
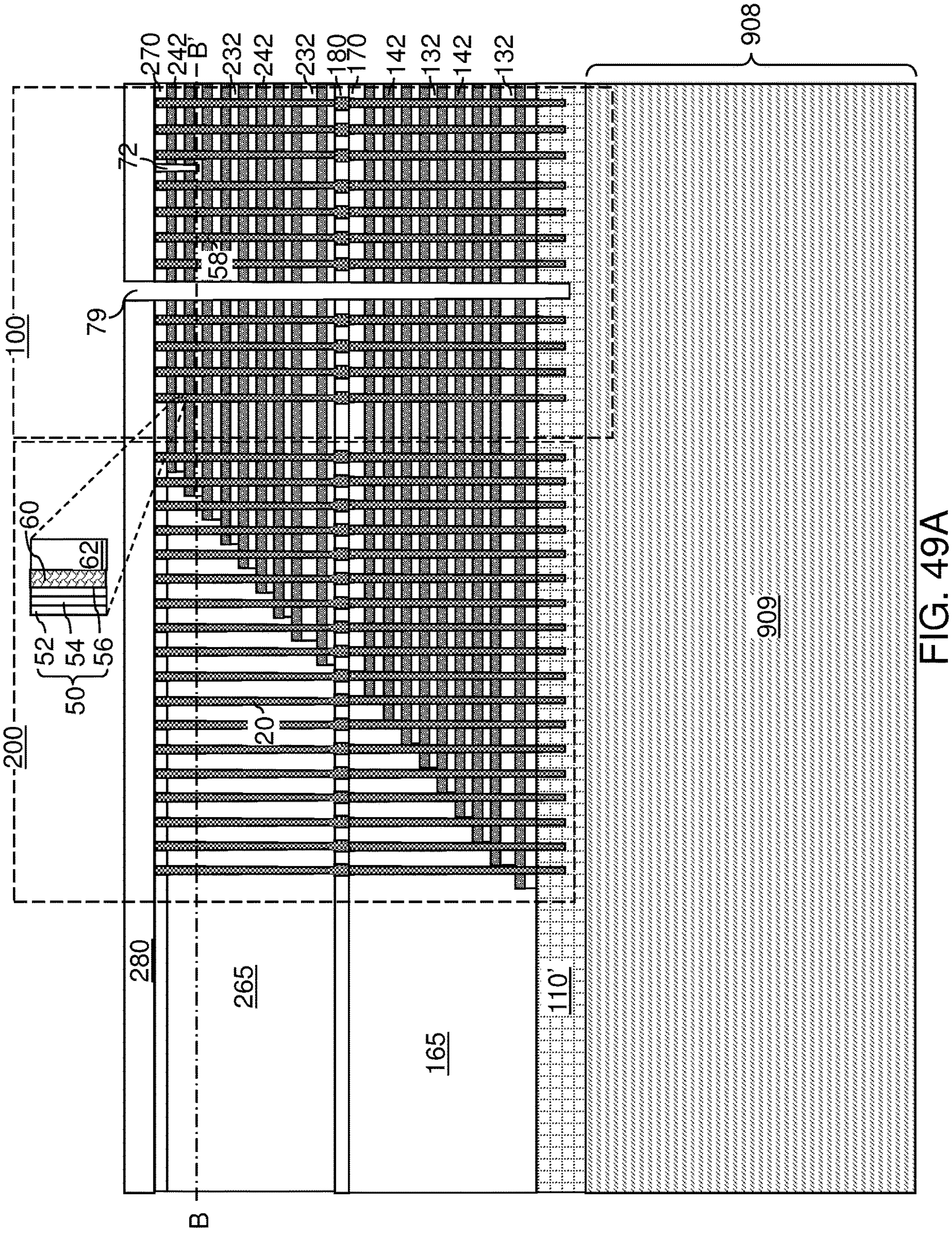
FIG. 49A is a vertical cross-sectional view of the third exemplary structure after formation of backside trenches according to the third embodiment of the present disclosure.
Figure 49B:
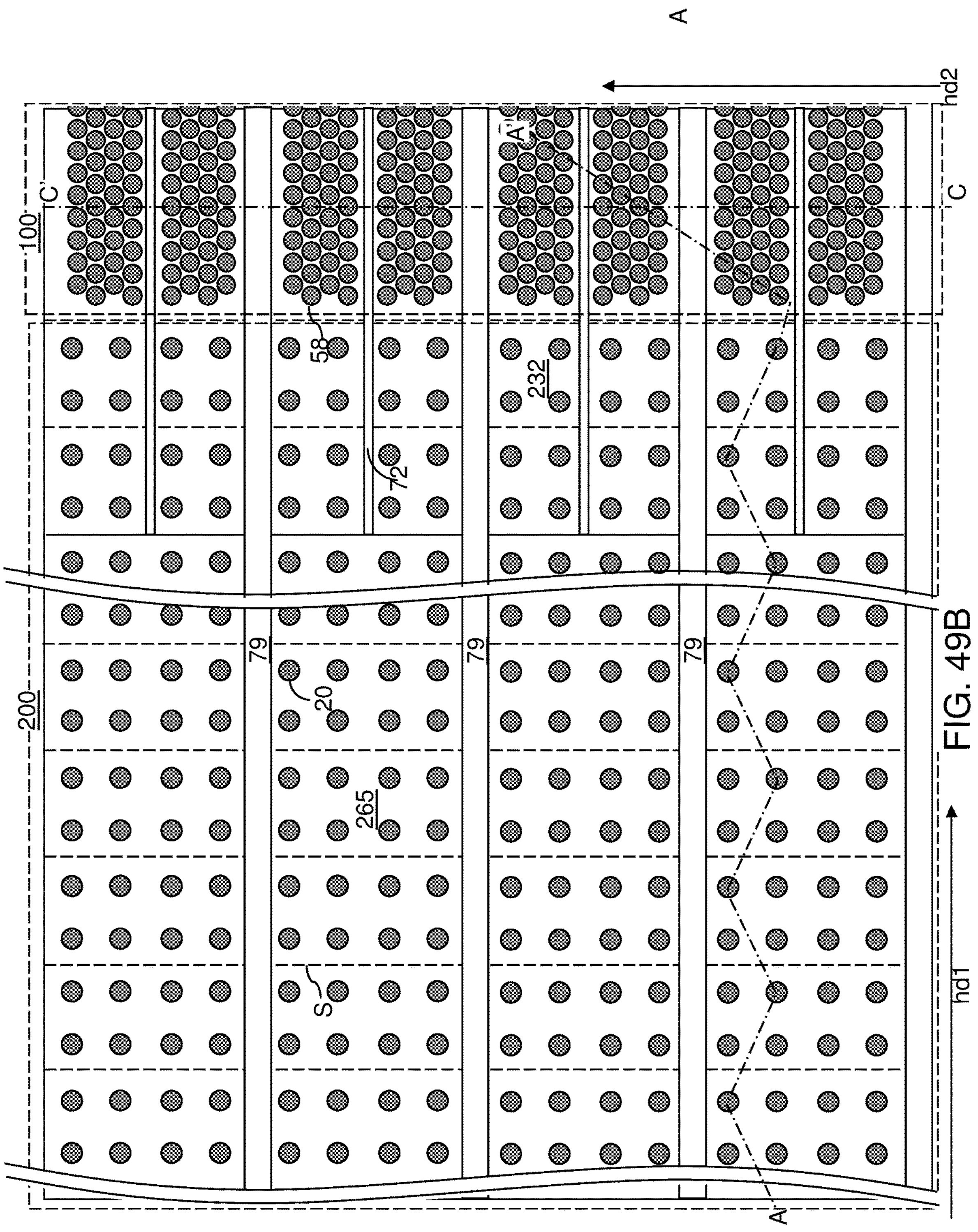
FIG. 49B is a top-down view of the third exemplary structure of FIG. 49A. The zig-zag vertical plane A-A' corresponds to the plane of the vertical cross-sectional view of FIG. 49A.
Figure 49C:
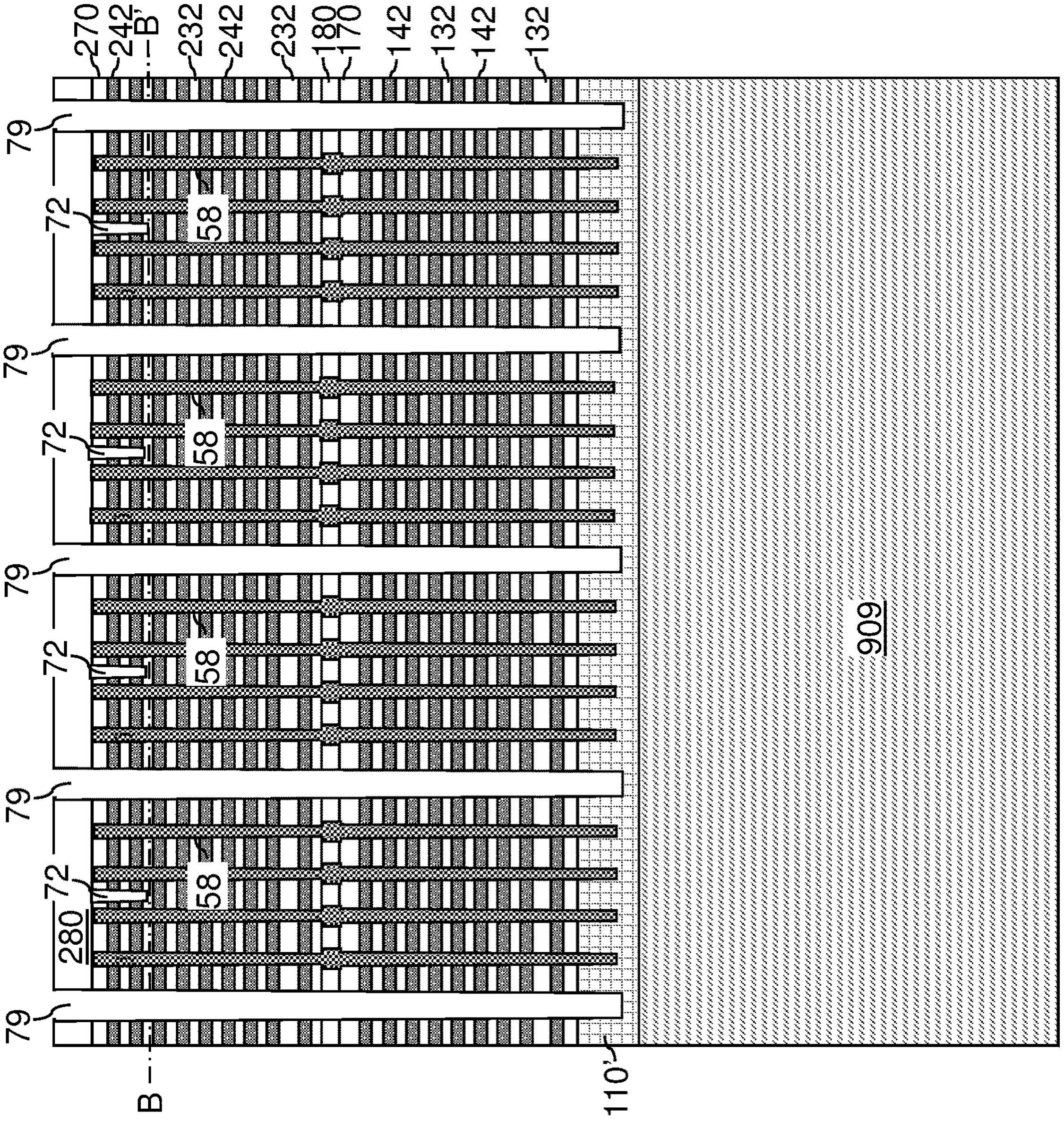
FIG. 49C is a vertical cross-sectional view of the third exemplary structure along the vertical plane C-C' of FIG. 49B.

Referring to FIGS. 49A-49C, the processing steps described with reference to FIGS. 11A-11C can be performed to form a contact-level dielectric layer 280 over the memory opening fill structures 58, and to form backside trenches 79. The vertically alternating sequences of insulating layers (132, 232) and spacer material layers (such as the sacrificial material layers (142, 242)) can be divided into alternating stacks {(132, 142), (232, 242)} of insulating layers (132, 232) and spacer material layers (such as the sacrificial material layers (142, 242)) by forming backside trenches 79. Surfaces of the in-process source-level material layers 110' can be physically exposed around the bottom portion of each backside trench 79.

Figure 50:
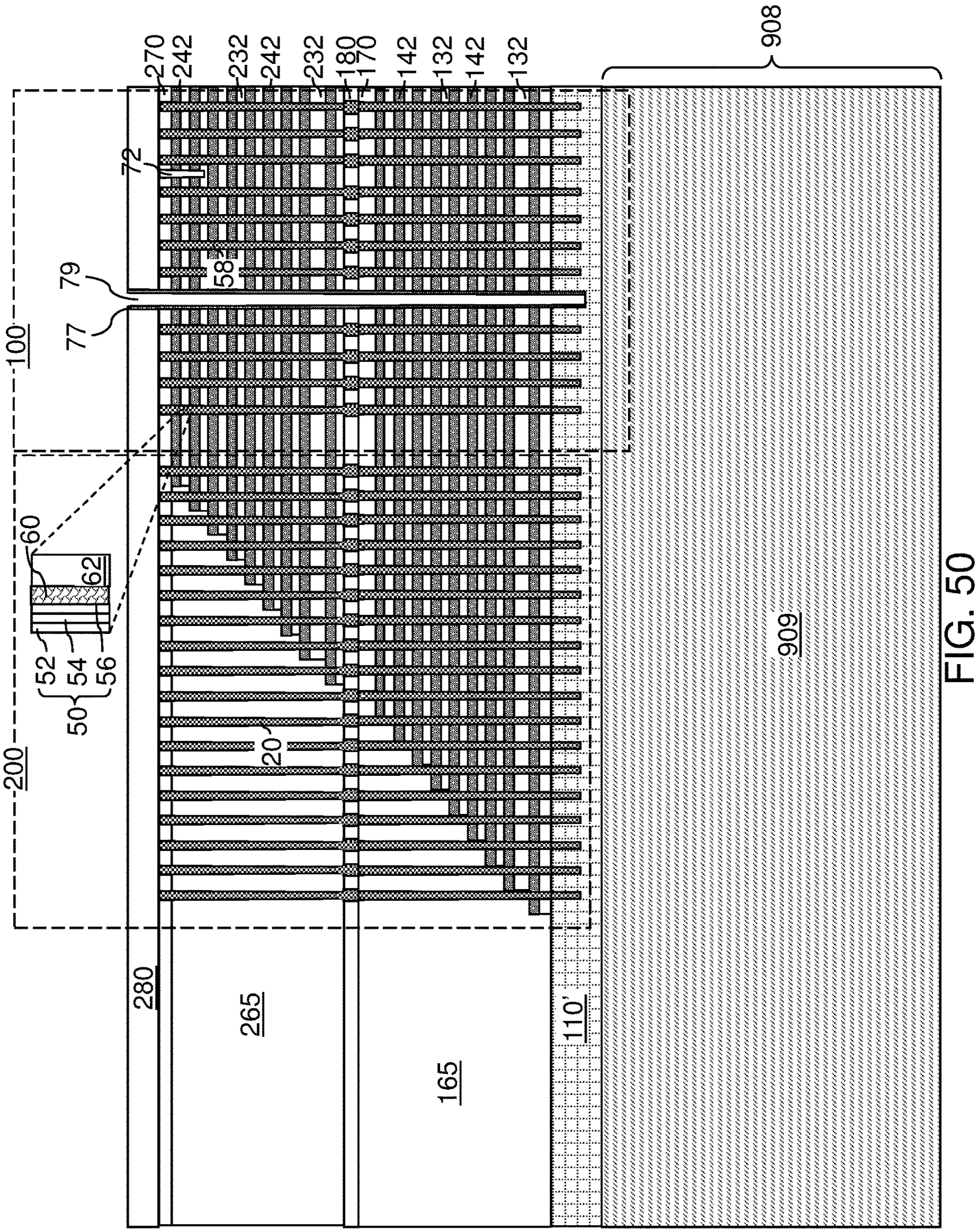
FIG. 50 is a vertical cross-sectional view of the third exemplary structure after formation of sacrificial backside insulating spacers according to the third embodiment of the present disclosure.

Referring to FIG. 50, the processing steps described with reference to FIG. 12 can be performed.

Figure 51A:
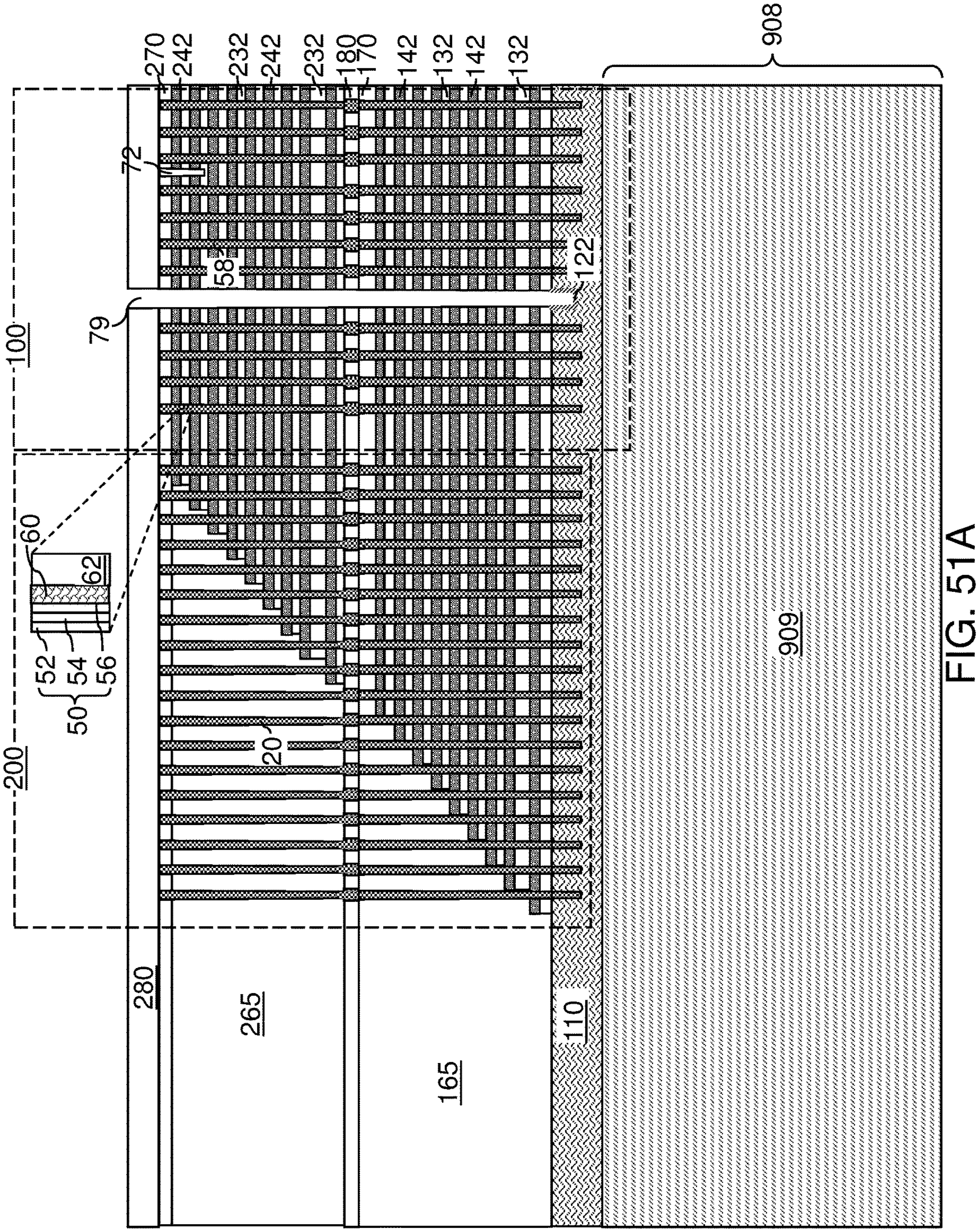
FIG. 51A is a vertical cross-sectional view of the third exemplary structure after replacement of the in-process source-level material layers with source-level material layers according to the third embodiment of the present disclosure.
Figure 51B:
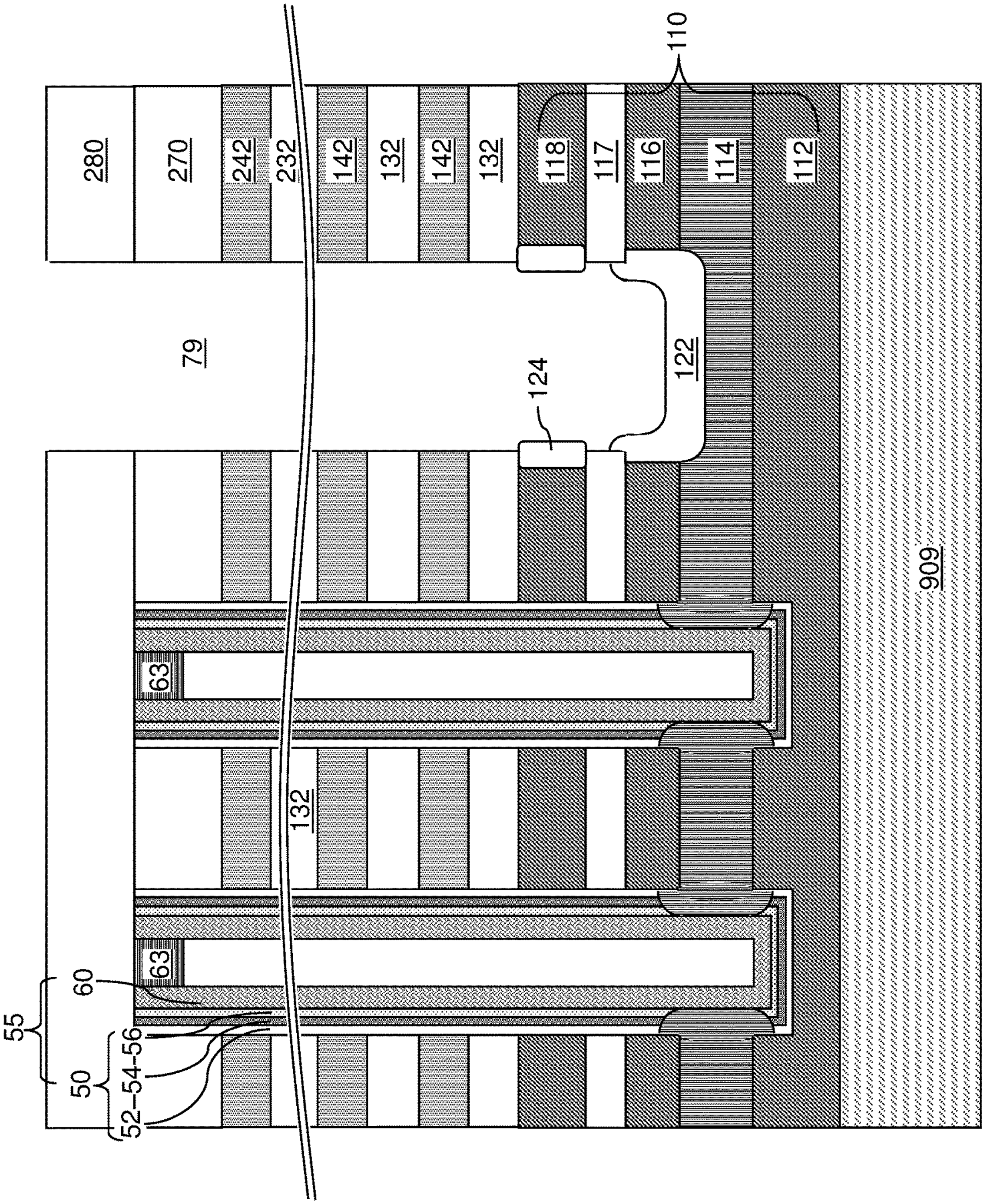
FIG. 51B is a magnified vertical cross-sectional view of a region of the third exemplary structure of FIG. 51A.

Referring to FIGS. 51A and 51B, the processing steps described with reference to FIGS. 13A-13E may be performed to replace each layer stack of in-process source-level material layers 110' with a layer stack of source-level material layers 110. The in-process source-level material layers 110' are converted into source-level material layers 110 upon replacement of the sacrificial source layer 104 with a source contact layer 114. The source-level material layers 110 include a source layer (112, 114, 116) including a lower source-level material layer 112, an upper source-level material layer 116, and a source contact layer 114. In one embodiment, the lower source-level material layer 112 comprises a first doped semiconductor material, the upper source-level material layer 116 comprises a second doped semiconductor material, and the source contact layer 114 comprises a third doped semiconductor material and located between the upper source-level material layer 116 and the lower source-level material layer 112.

In the third exemplary structure, the various component layers within the source-level material layers 110 can be formed as continuous layers. As such, the source-level material layers 110 are also referred to as continuous source-level material layers 110. The third exemplary structure can be provided in a memory die, which is subsequently bonded to a logic die.

Figure 52:
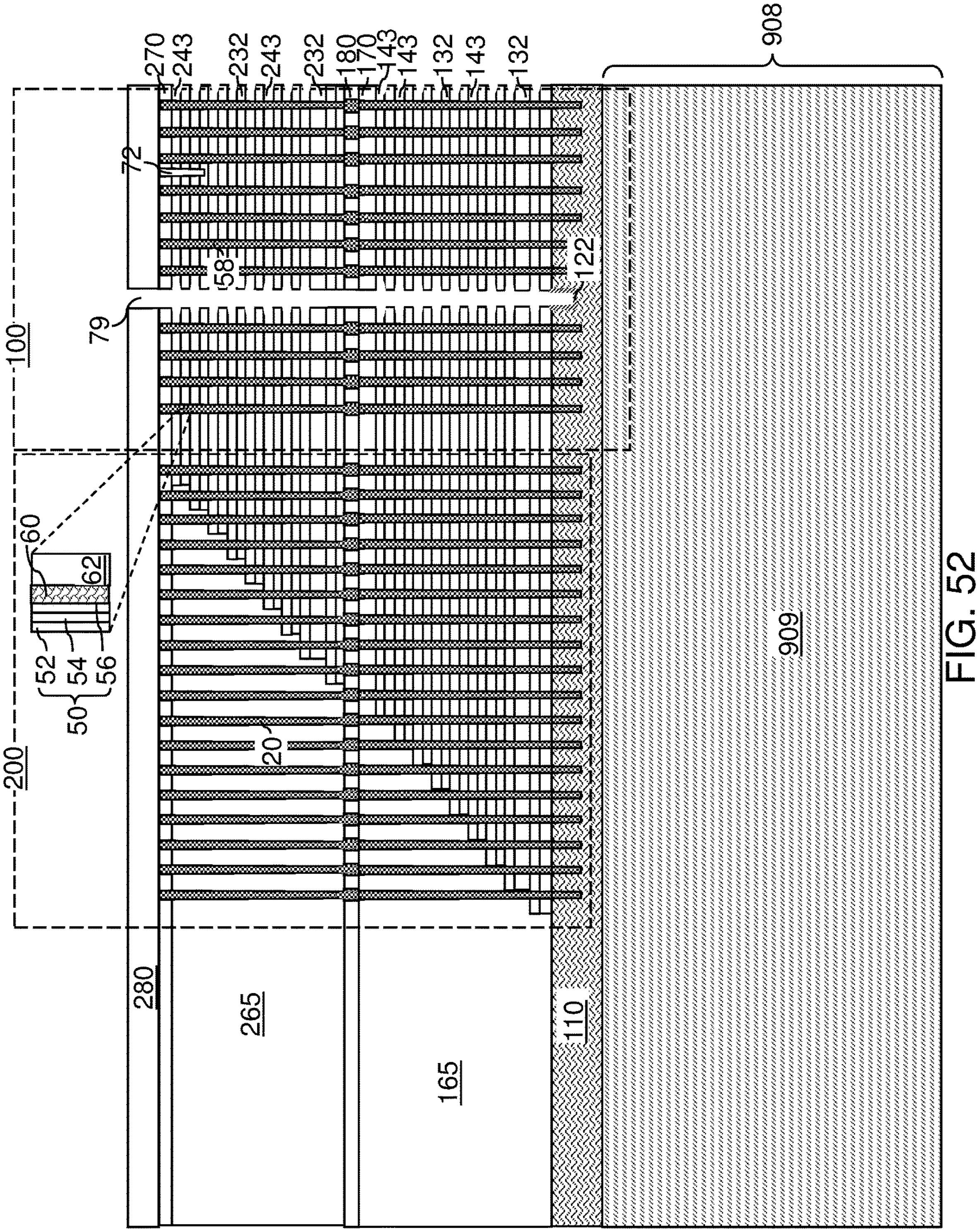
FIG. 52 is a vertical cross-sectional view of the third exemplary structure after formation of backside recesses according to the third embodiment of the present disclosure.

Referring to FIG. 52, the processing steps described with reference to FIG. 15 can be performed to form backside recesses (143, 243) by removing the sacrificial material layers (142, 242).

Figure 53A:
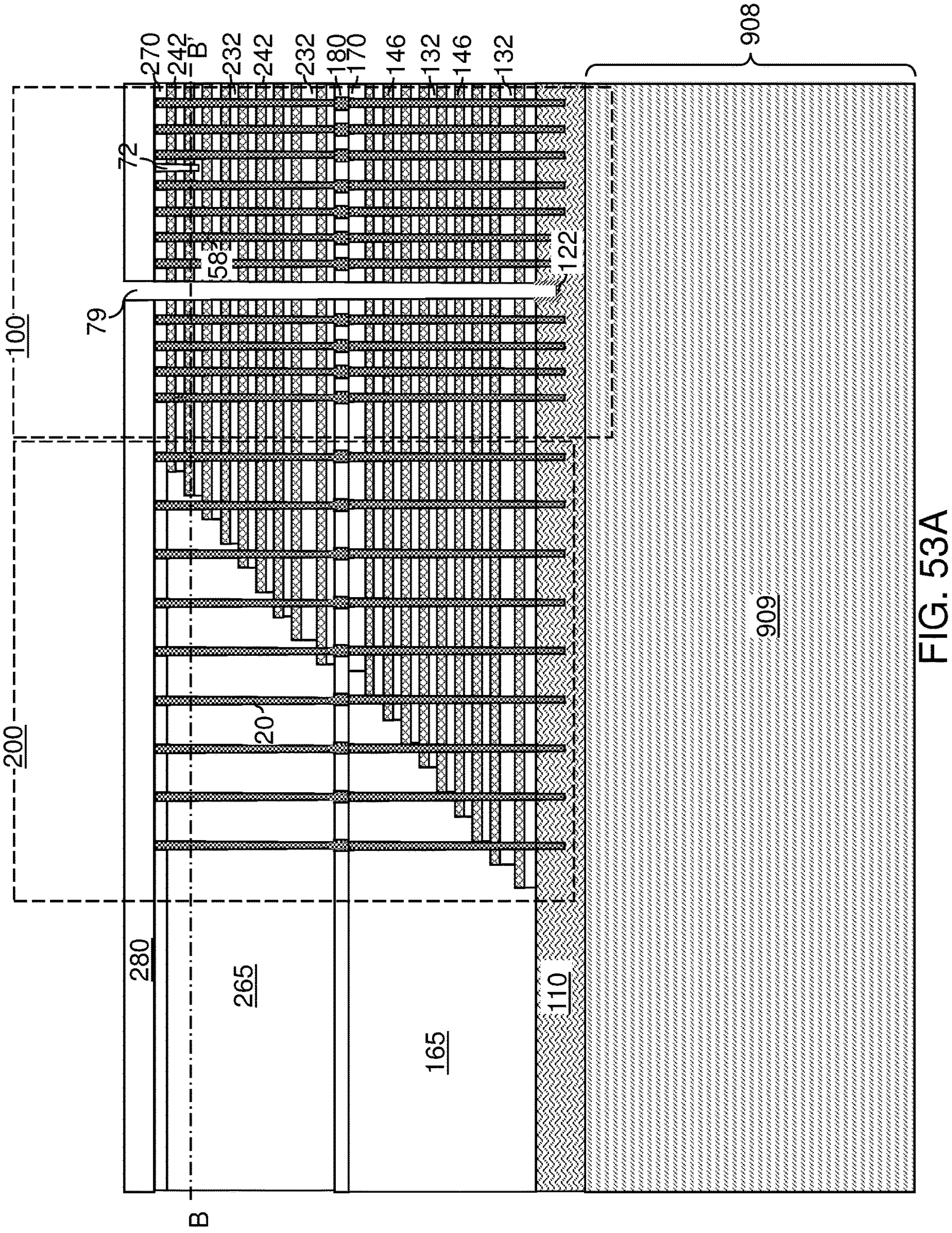
FIG. 53A is a vertical cross-sectional view of the third exemplary structure after formation of electrically conductive layers in the backside recesses according to the third embodiment of the present disclosure.
Figure 53B:
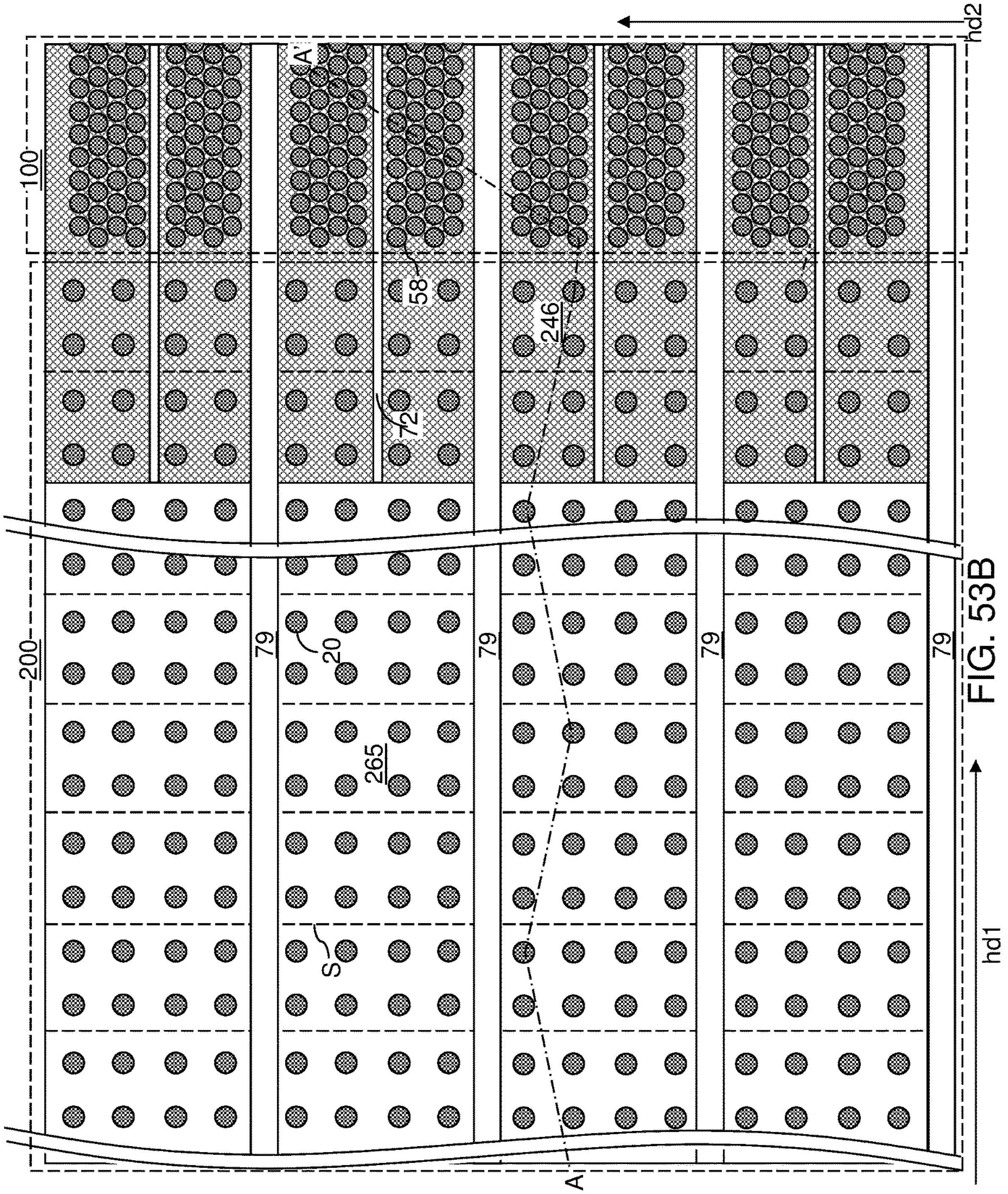
FIG. 53B is a top-down view of the third exemplary structure of FIG. 53A. The zig-zag vertical plane A-A' corresponds to the plane of the vertical cross-sectional view of FIG. 53A.
Figure 54A:
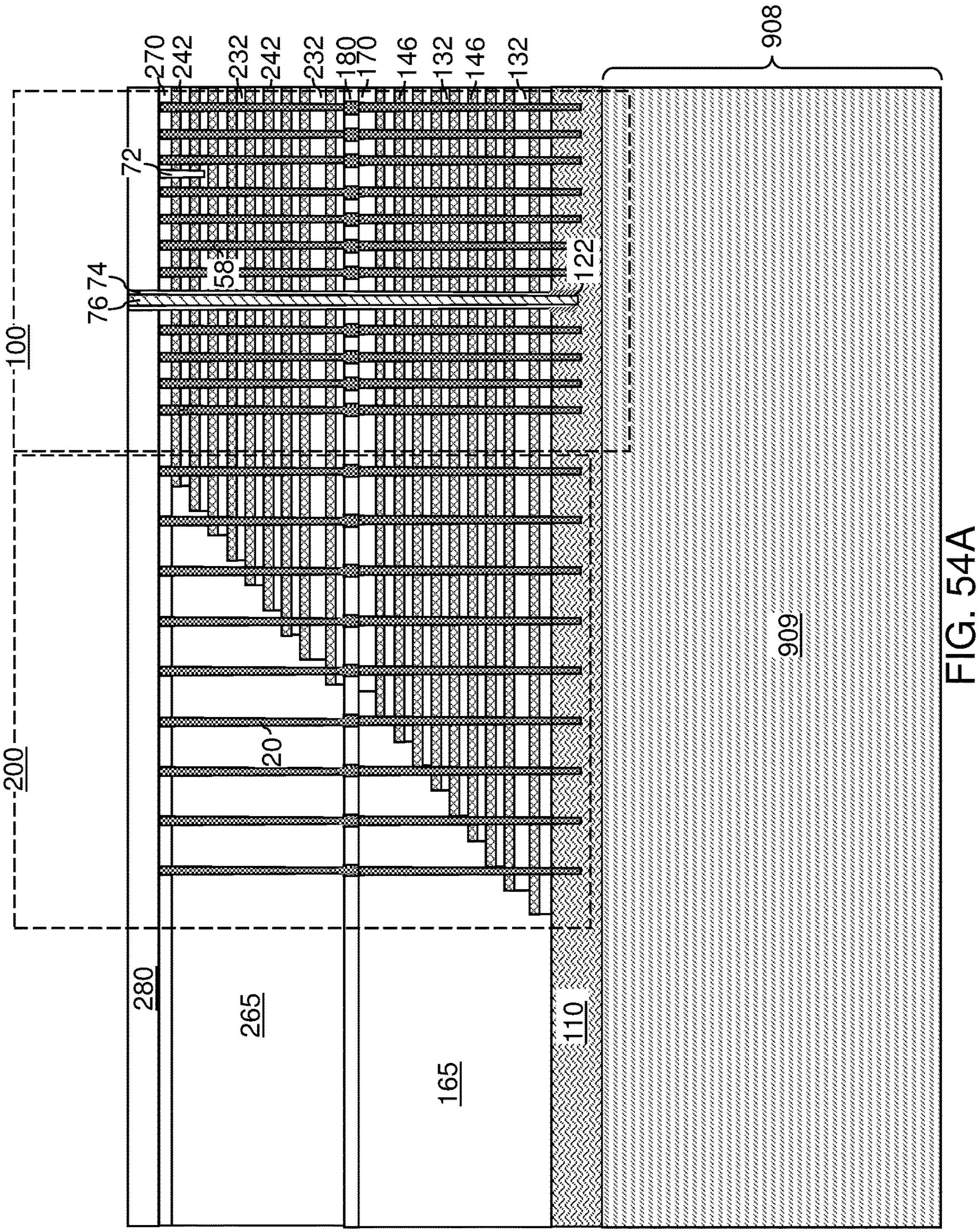
FIG. 54A is a vertical cross-sectional view of the third exemplary structure after formation of backside trench fill structures in the backside trenches according to the third embodiment of the present disclosure.
Figure 54B:
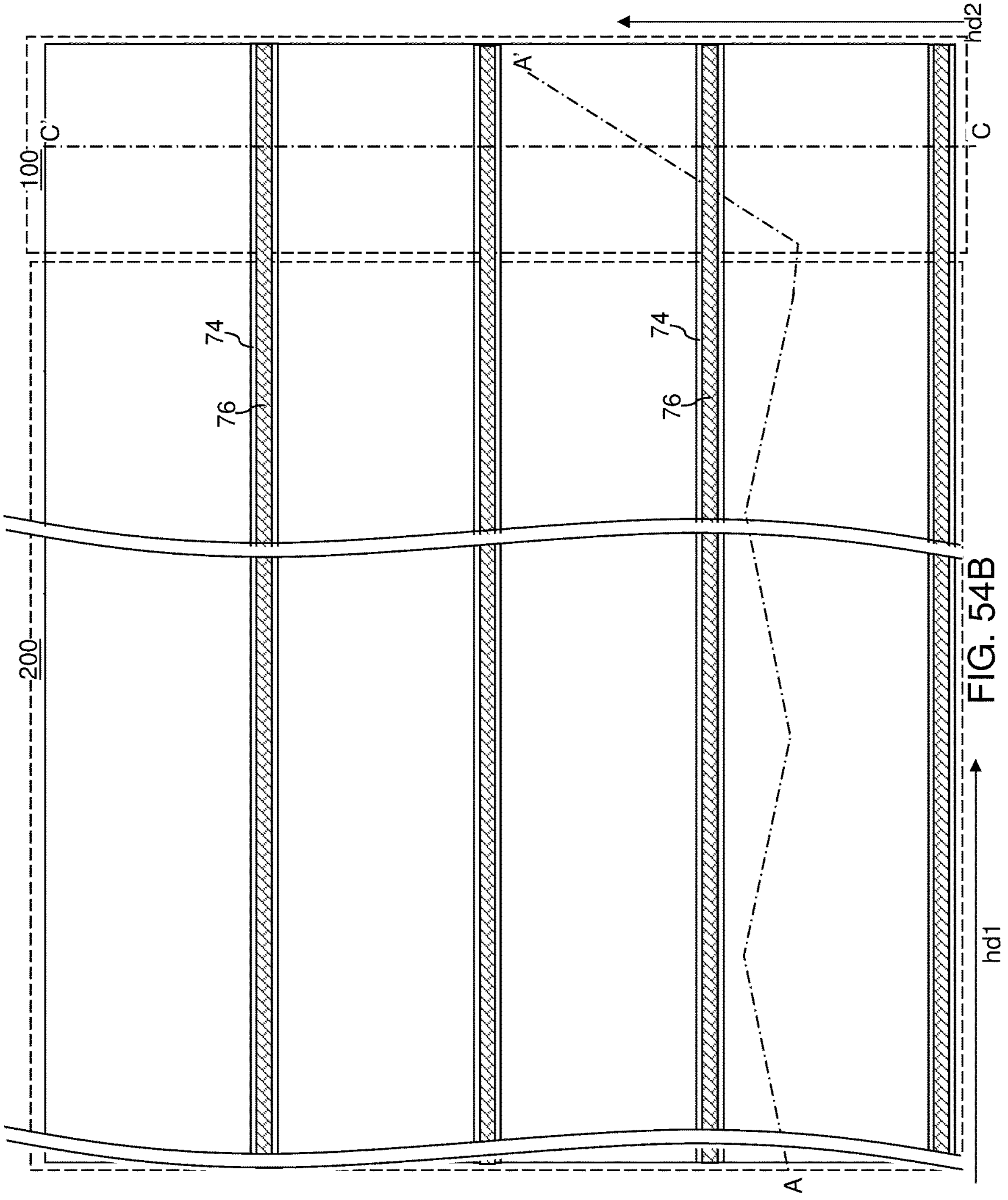
FIG. 54B is a top-down view of the third exemplary structure of FIG. 54A. The zig-zag vertical plane A-A' corresponds to the plane of the vertical cross-sectional view of FIG. 54A.
Figure 54C:
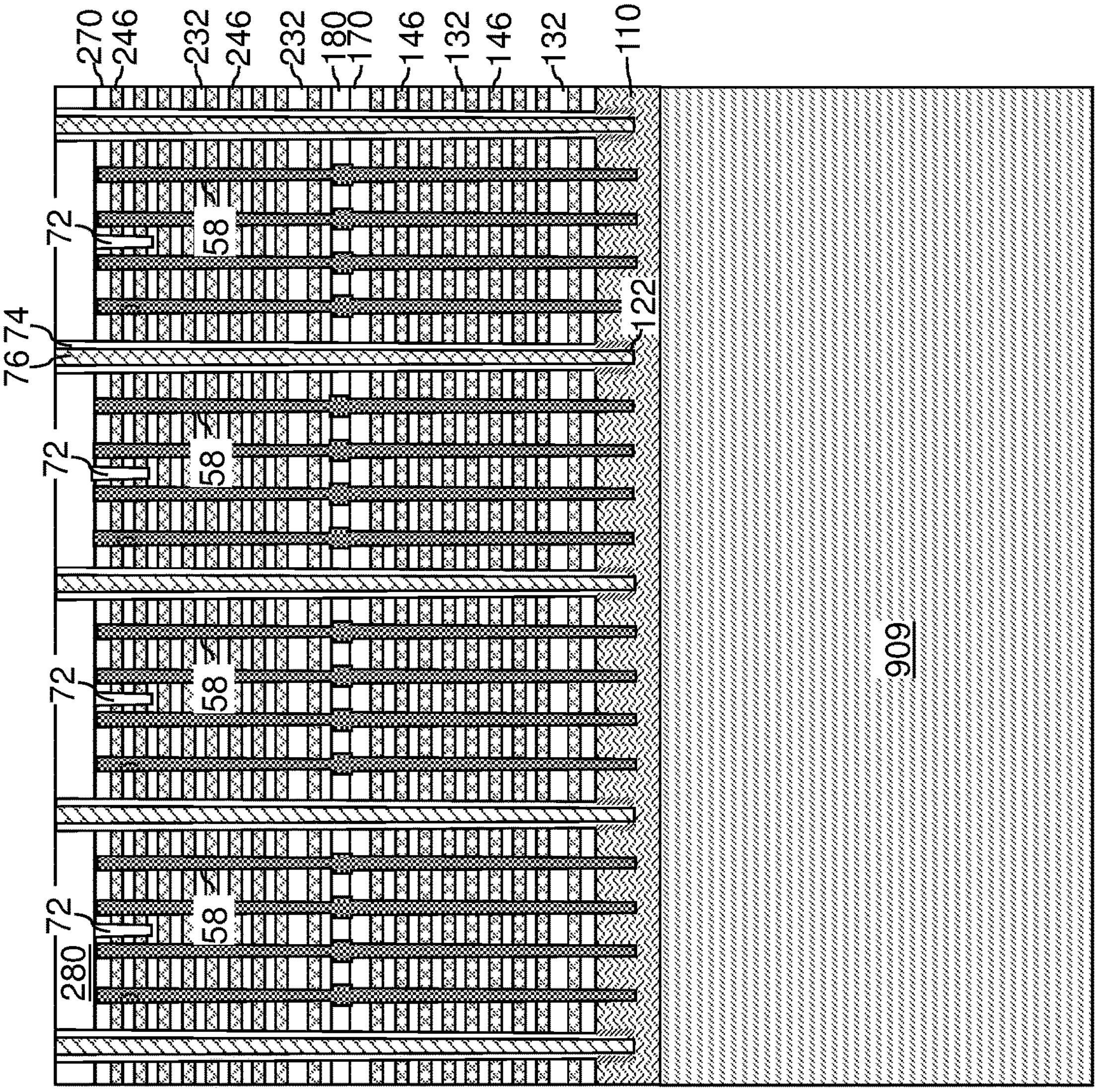
FIG. 54C is a vertical cross-sectional view of the third exemplary structure along the vertical plane C-C' of FIG. 54B.
Figure 54D:
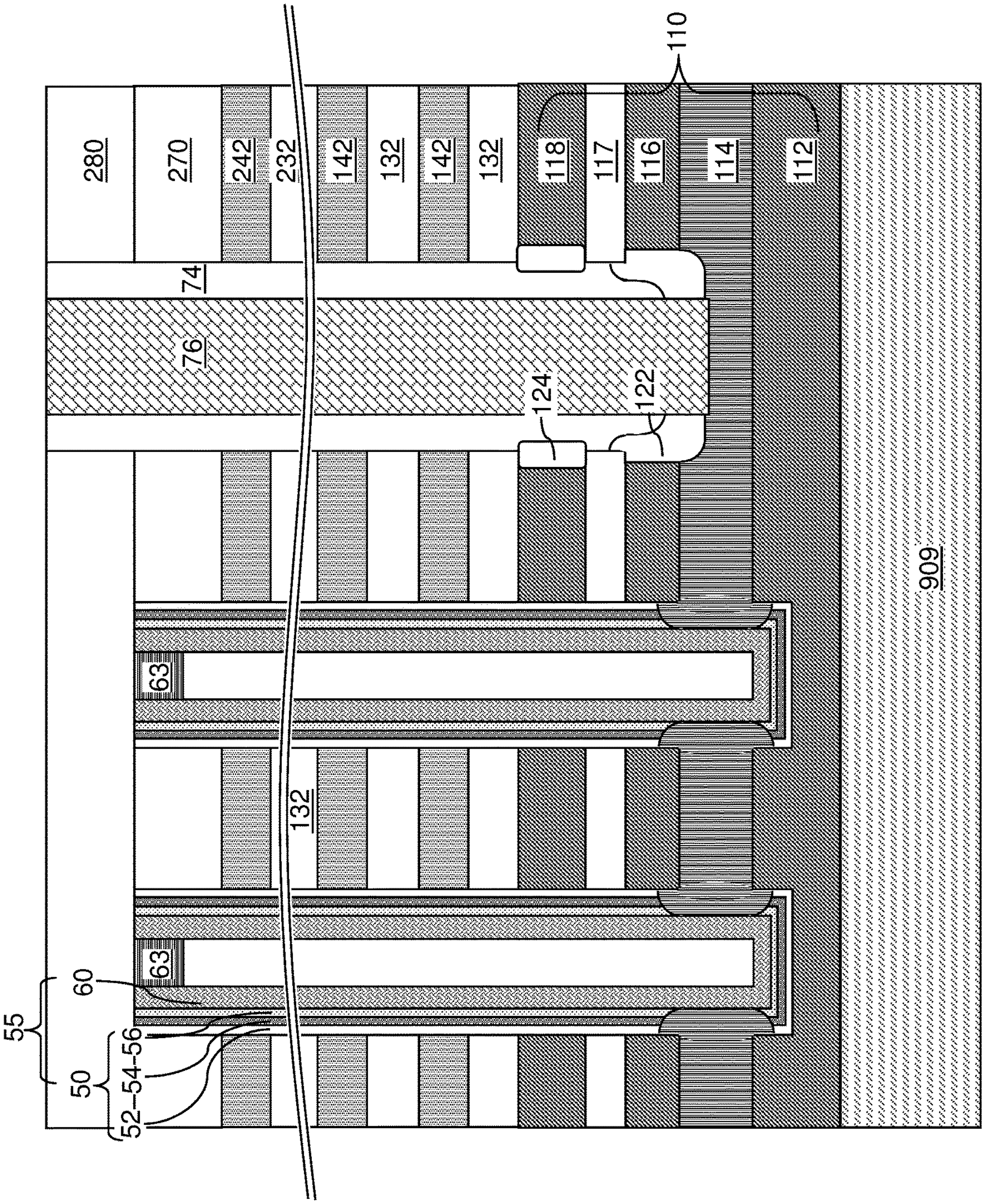
FIG. 54D is a magnified vertical cross-sectional view of a region of the third exemplary structure of FIGS. 54A-54C.

Referring to FIGS. 53A and 53B, the processing steps described with reference to FIGS. 16A and 16B can be performed to form electrically conductive layers (146, 246) in the backside recesses (143, 243). Alternating stacks {(132, 146), (232, 246)} of insulating layers (132, 232) and electrically conductive layers (146, 246) that are laterally spaced apart from each other by the backside trenches 79 are formed. The alternating stacks {(132, 146), (232, 246)} of insulating layers (132, 232) and electrically conductive layers (146, 246) are laterally spaced apart from each other along the second horizontal direction hd1 by the backside trenches 79, which laterally extend along the first horizontal direction hd1.

Referring to FIGS. 54A-54D, the processing steps described with reference to FIGS. 19A-19F can be performed to form a backside trench fill structure (74, 76) in each backside trench 79. Each of the backside trench fill structures (74, 76) comprises a respective backside insulating spacer 74 and a respective backside contact via structure 76. The backside trench fill structures (74, 76) contact the source contact layer 114. Each of the backside contact via structures 76 in the backside trench fill structures (74, 76) is electrically connected to the source contact layer 114. In one embodiment, each respective backside contact via structures 76 contacts a surface of the source contact layer 114. Each backside contact via structure 76 is laterally surrounded by and is laterally spaced from a respective neighboring pair of alternating stacks {(132, 146), (232, 246)} by a respective backside insulating spacer 74.

Figure 55A:
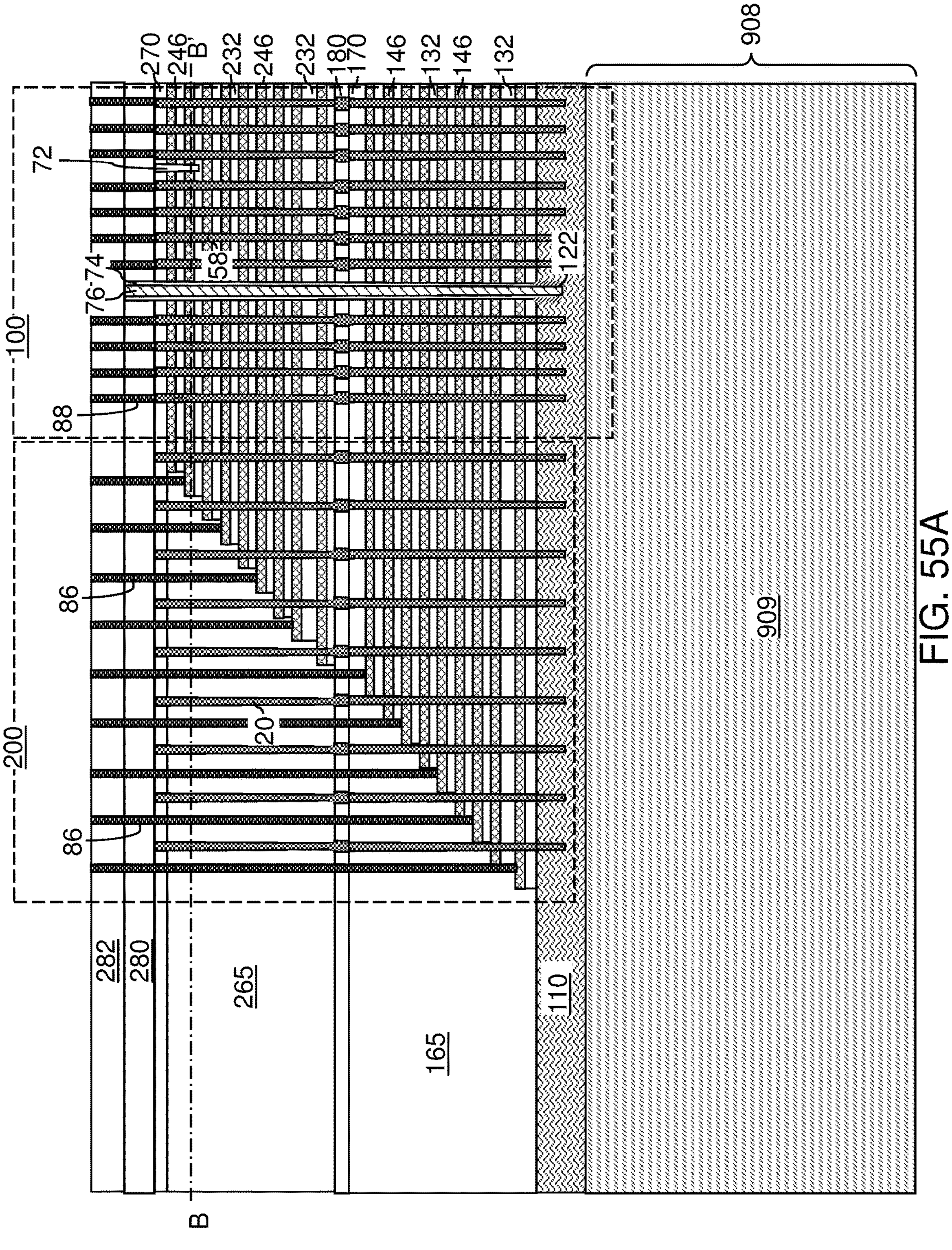
FIG. 55A is a vertical cross-sectional view of the third exemplary structure after formation of drain contact via structures and layer contact via structures according to the third embodiment of the present disclosure.
Figure 55B:
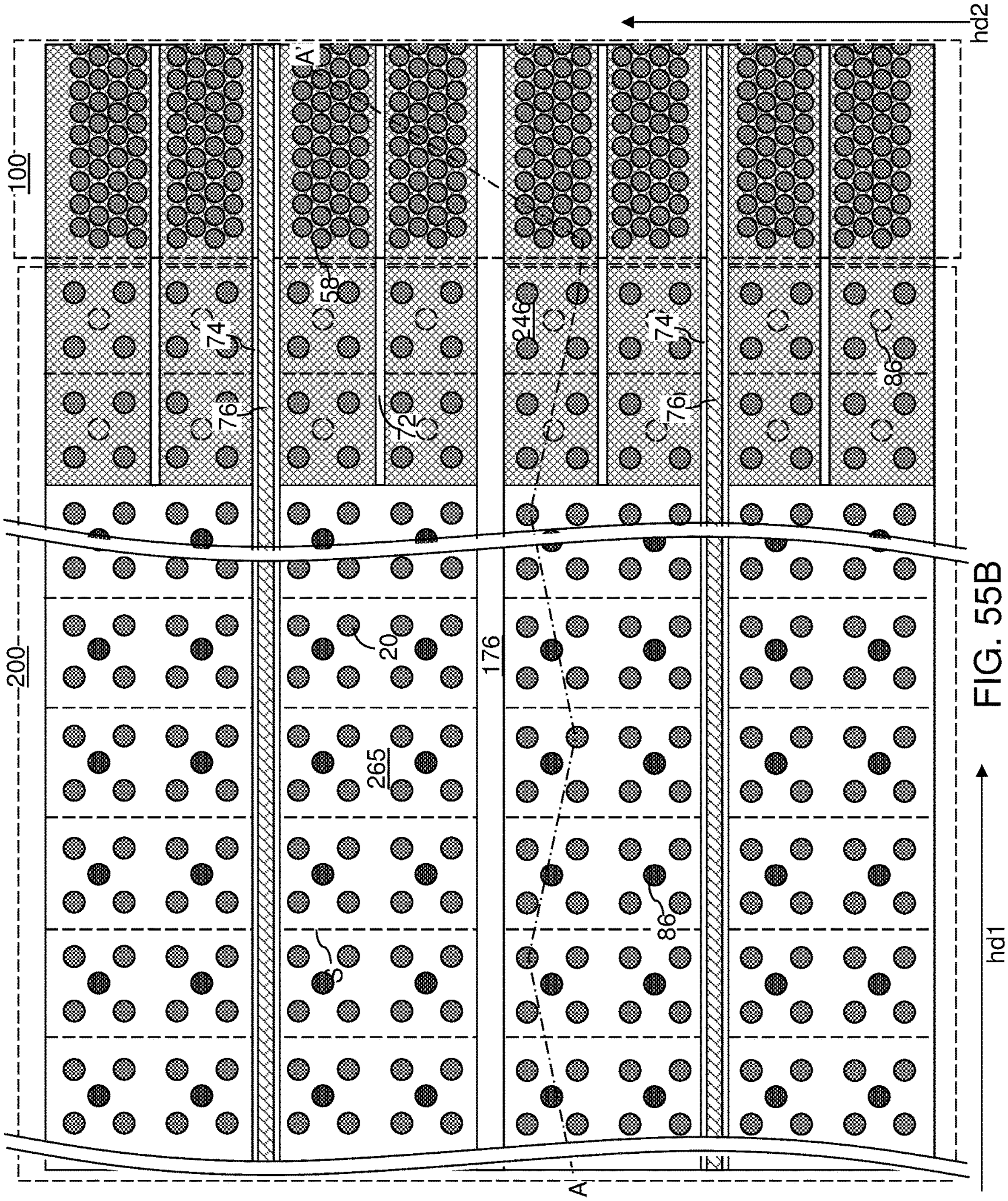
FIG. 55B is a horizontal cross-sectional view of the third exemplary structure of FIG. 55A. The zig-zag vertical plane A-A' corresponds to the plane of the vertical cross-sectional view of FIG. 55A.

Referring to FIGS. 55A and 55B, the processing steps described with reference to FIGS. 21A and 21B can be performed to form a via-level dielectric layer 282, drain contact via structures 88, and layer contact via structures 86.

Figure 56:
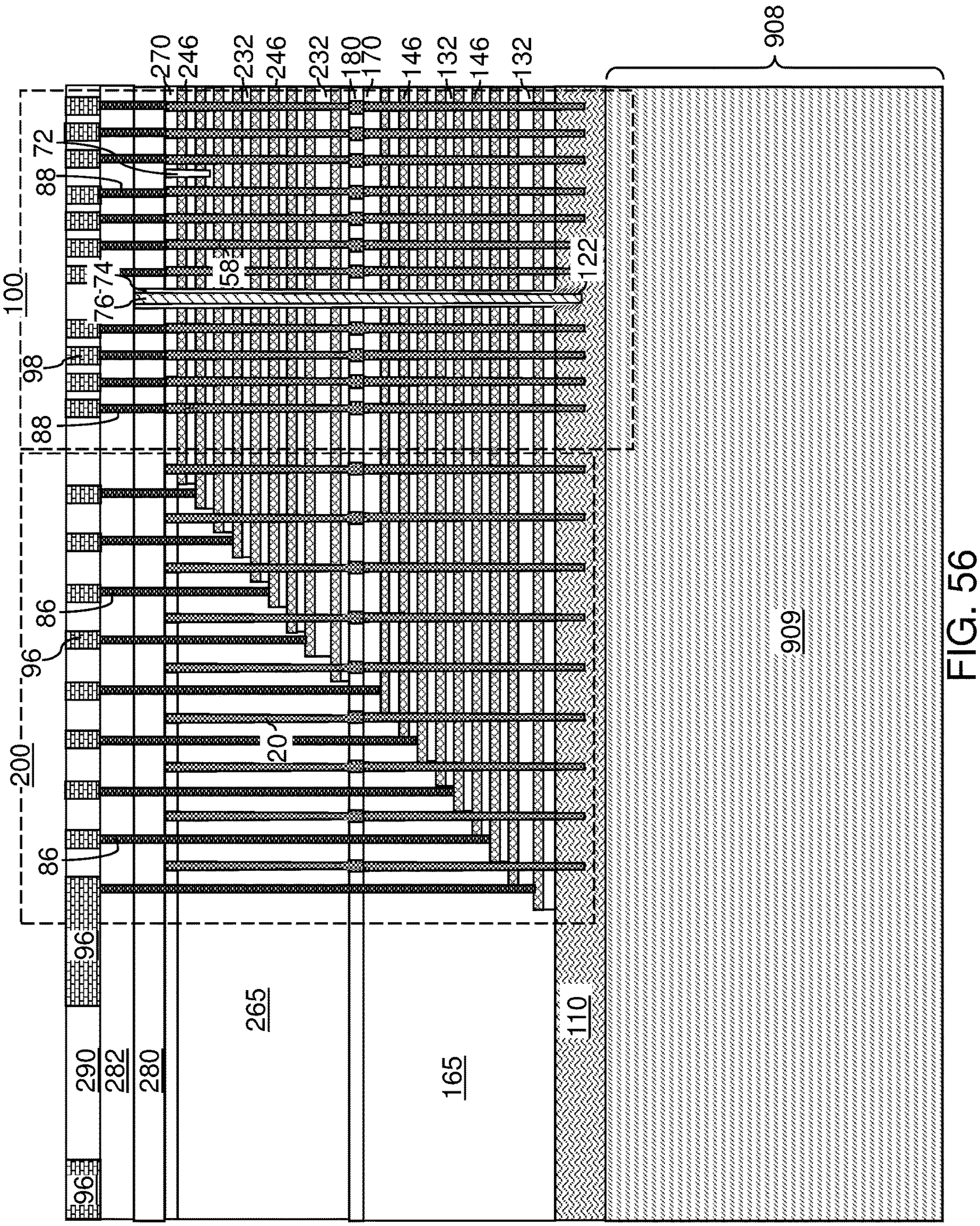
FIG. 56 is a vertical cross-sectional view of the third exemplary structure after formation of metal interconnect structures according to the third embodiment of the present disclosure.

Referring to FIG. 56, the processing steps described with reference to FIG. 22 can be performed to form metal interconnect structures (96, 98).

Figure 57:
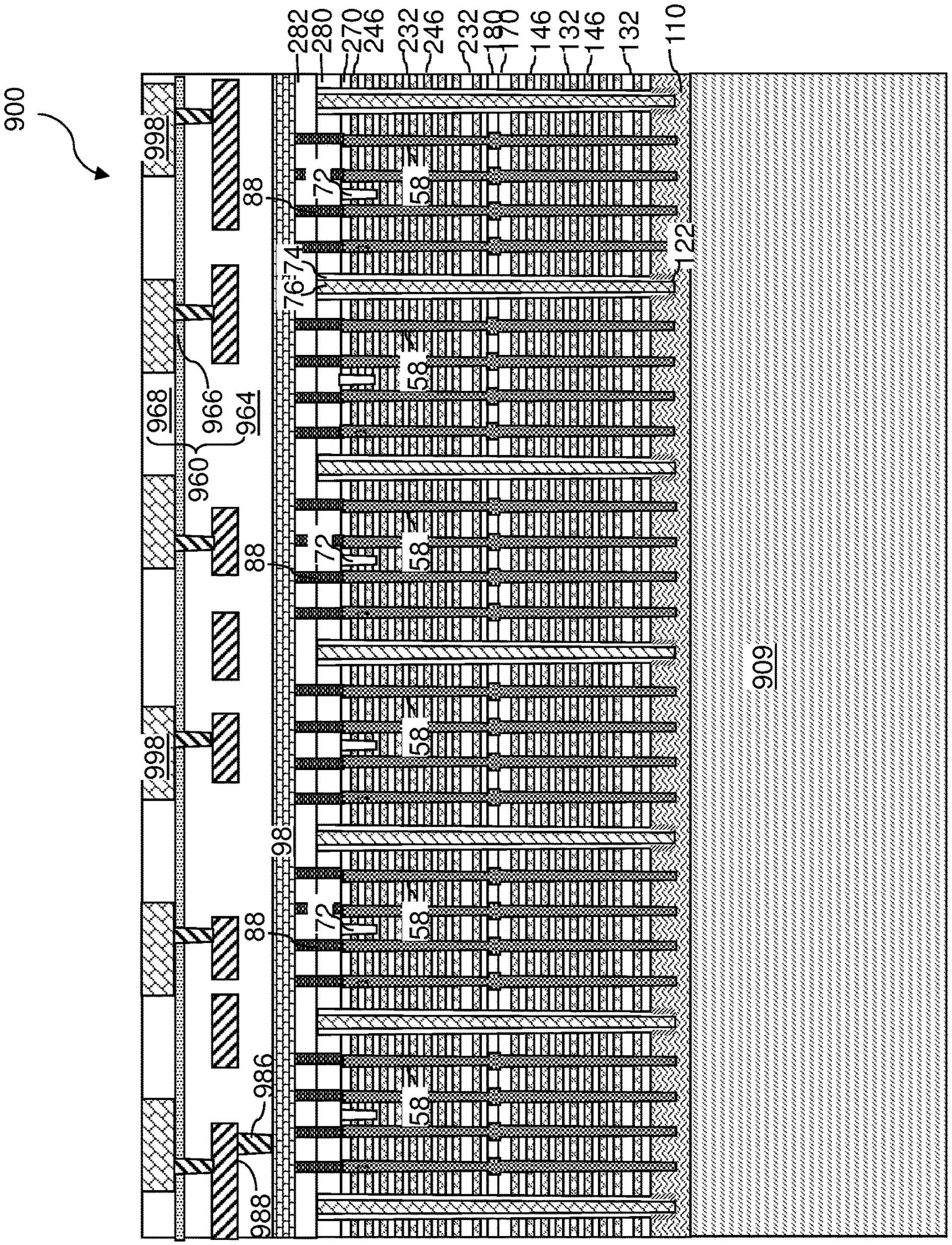
FIG. 57 is a vertical cross-sectional view of the third exemplary structure after formation of a memory die according to the third embodiment of the present disclosure.

Referring to FIG. 57, additional dielectric material layers 960 and additional metal interconnect structures (986, 988) can be subsequently formed. The additional dielectric material layers 960 may comprise interconnect-level dielectric material layers 964, a passivation dielectric layer 966, and a pad-level dielectric material layer 968. The additional dielectric material layers 960 are also referred to as memory-side dielectric material layers 960. The additional metal interconnect structures (986, 988) may comprise memory-side metal lines 988 and memory-side metal via structures 986. Memory-side bonding pads 998 may be formed in the pad-level dielectric material layer 968. In one embodiment, the memory-side bonding pads 998 may comprise metal bonding pads that are configured for metal-to-metal bonding such as copper-to-copper bonding. This completes a memory die 900.

Figure 58:
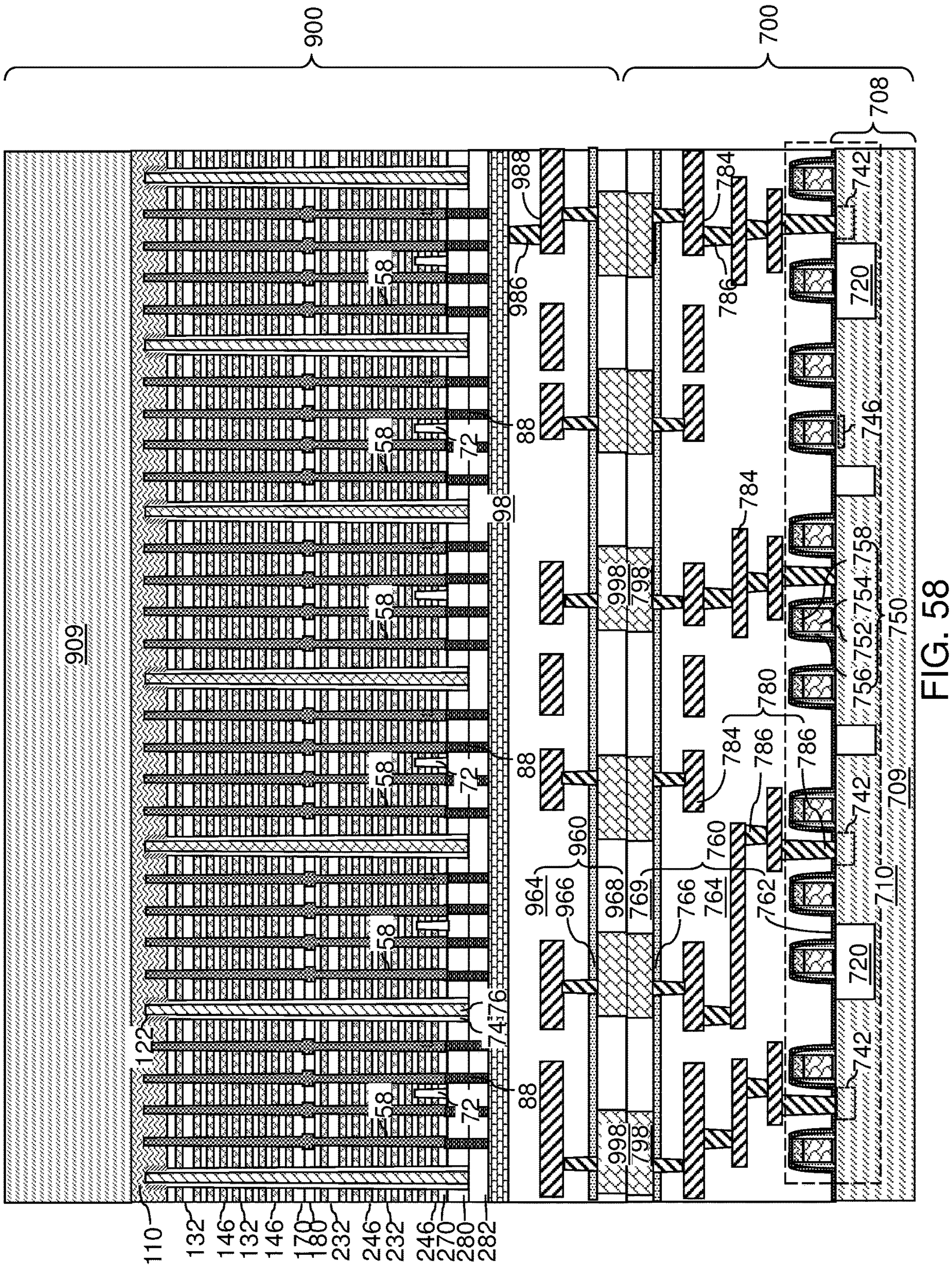
FIG. 58 is a vertical cross-sectional view of the third exemplary structure after bonding a logic die to the memory die according to the third embodiment of the present disclosure.

Referring to FIG. 58, a logic die 700 is provided, which comprises a logic-side substrate 708 including a logic-side substrate semiconductor layer 709 and a peripheral circuit 710 formed on a top surface of the logic-side substrate semiconductor layer 709. The peripheral circuit 710 can be configured to control operation of the electrically conductive layers (146, 246) and the bit lines 98 and may have a same set of components and may provide a same functionality as the peripheral circuit 710 described above. In the third exemplary structure, the dielectric material layers that correspond to the lower-level dielectric material layers 760 in the first and second exemplary structures are referred to as logic-side dielectric material layers 760, and the metal interconnect structures that correspond to the lower-level metal interconnect structures 780 in the first and second exemplary structures are referred to as logic-side metal interconnect structures 780. The logic-side dielectric material layers 760 may comprise a pad-level dielectric material layer 769 embedding logic-side boding pads 798. In one embodiment, the logic-side bonding pads 798 may comprise metal bonding pads that are configured for metal-to-metal bonding such as copper-to-copper bonding. The pattern of the logic-side bonding pads 798 as seen in a top-down view may be a mirror image pattern of the patten of the memory-side bonding pads 998 as seen in a top-down view.

The logic die 700 can be bonded to the memory die 900 by aligning the logic-side bonding pads 798 to the memory-side bonding pads 998, and by inducing metal-to-metal bonding between mating pairs of the logic-side bonding pads 798 and the memory-side bonding pads 998.

Figure 59:
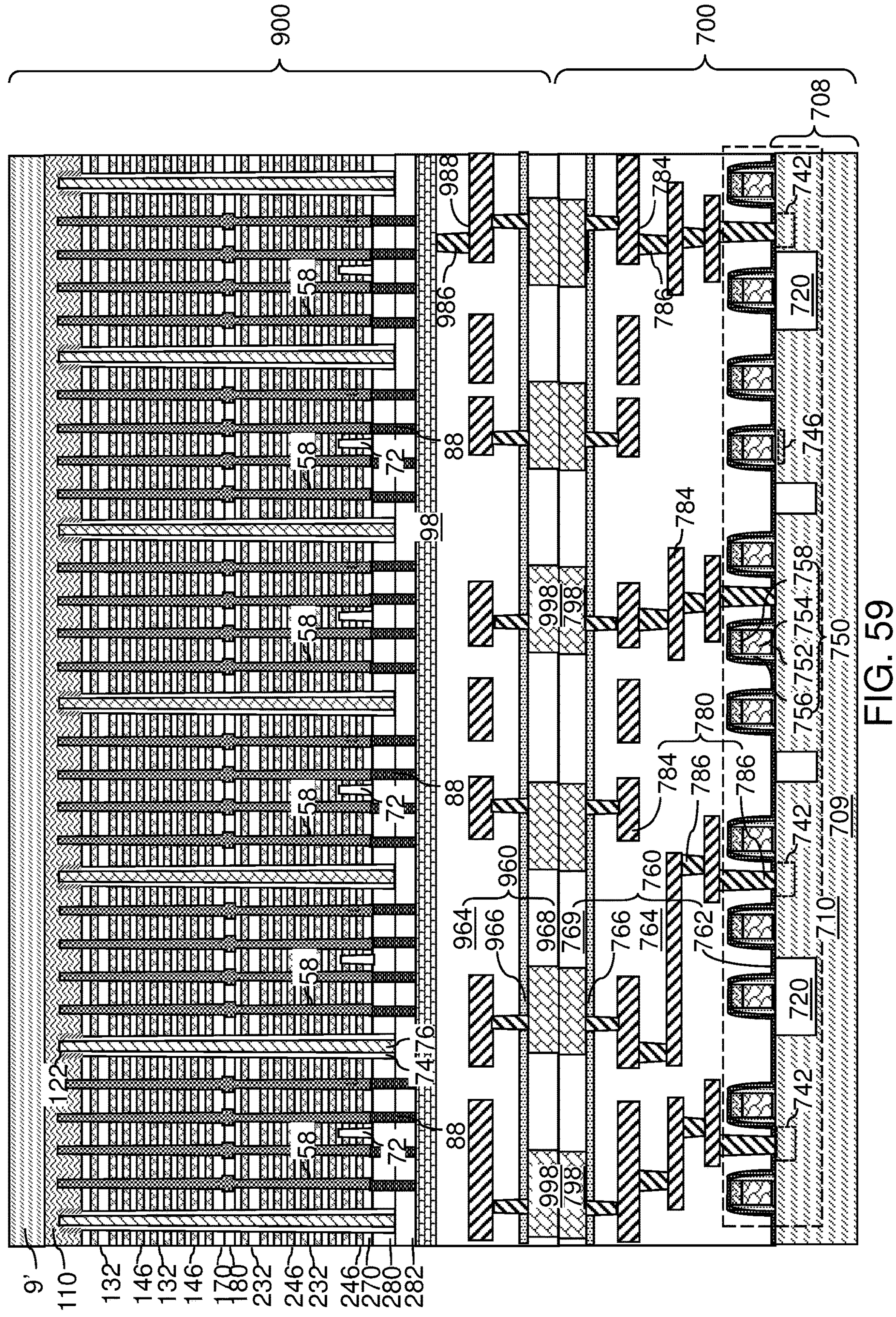
FIG. 59 is a vertical cross-sectional view of the third exemplary structure after thinning the memory-side substrate of the memory die according to the third embodiment of the present disclosure.

Referring to FIG. 59, at least a backside portion of the substrate 909 of the memory die 900 can be removed. In one embodiment, the substrate material layer 909 of the substrate 909 of the memory die 900 can be thinned from the backside, for example, by grinding, polishing, cleaving, at least one anisotropic etch process, and/or at least one isotropic etch process. In one embodiment, the substrate material layer 909 may comprise a single crystalline semiconductor layer such as a single crystalline silicon layer, and a single crystalline semiconductor layer 9' comprising a remaining portion of the substrate material layer 909 may be present on the backside of the source-level material layers 110. In this case, the single crystalline semiconductor layer 9' may be in direct contact with the lower source-level semiconductor layer 112. In one embodiment, the lower source-level semiconductor layer 112 may be formed as a single crystalline doped semiconductor (e.g., silicon) material layer having epitaxial alignment with the single crystalline semiconductor layer 9'. In one embodiment, the thickness of the single crystalline semiconductor layer 9' may be in a range from 100 nm to 5 microns, although lesser and greater thicknesses may also be employed. In one embodiment, the single crystalline semiconductor layer 9' may have a doping of the second conductivity type.

Alternatively, the substrate material layer 909 may be entirely removed by grinding, polishing, cleaving, at least one anisotropic etch process, and/or at least one isotropic etch process. In this case, a backside surface (i.e., a bottom surface) of the lower source-level semiconductor layer 112 may be physically exposed.

Figure 60:
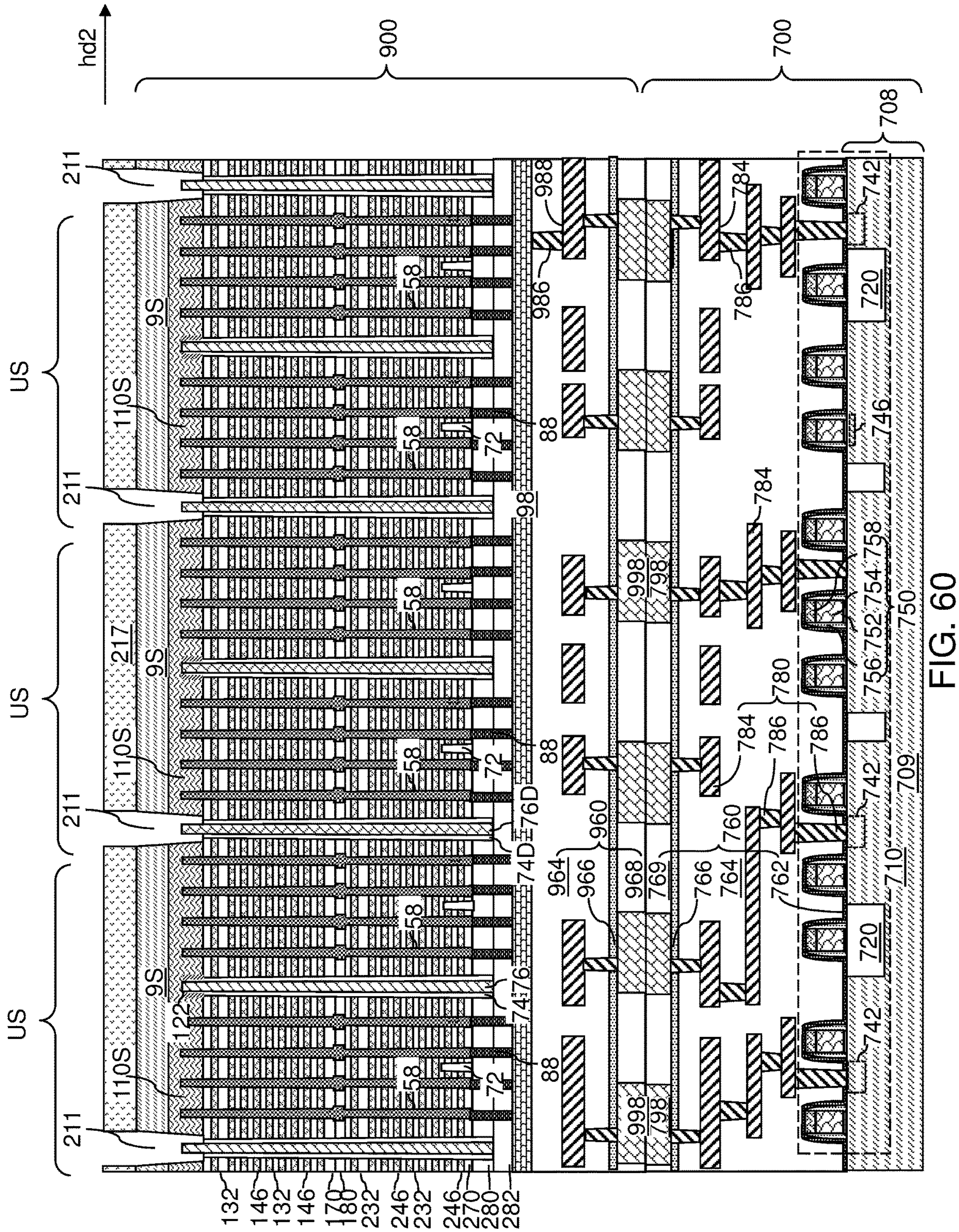
FIG. 60 is a vertical cross-sectional view of the third exemplary structure after patterning the memory-side substrate and source-level material layers according to the third embodiment of the present disclosure.

Referring to FIG. 60, a photoresist layer 217 can be formed over the backside of the source-level material layers 110. In one embodiment, the photoresist layer 217 may be formed over the backside of the single crystalline semiconductor layer 9'. The photoresist layer 217 can be lithographically patterned with a periodicity along the second horizontal direction hd2 that is equal to integer multiples of the periodicity of the backside trench fill structures (74, 76) along the second horizontal direction hd2. The ratio of the periodicity of the pattern in the photoresist layer 217 along the second horizontal direction hd2 to the periodicity of the backside trench fill structures (74, 76) along the second horizontal direction hd2 may be an integer that is greater than 1, i.e., 2, 3, 4, etc. Thus, the pattern of the photoresist layer 217 is a repetition of unit photoresist pattern that is repeated along the second horizontal direction hd2.

Each unit pattern in the patterned photoresist layer 217 includes a single slit-shaped opening that overlies a respective one of the backside trench fill structures (74, 76). The patterned photoresist layer 217 may cover all areas except the areas of the slit-shaped openings. Each slit-shaped opening in the photoresist layer 217 laterally extends along the first horizontal direction hd1 with a uniform width along the second horizontal direction hd2. Each slit-shaped opening in the photoresist layer 217 overlies and may be wider than a respective underlying backside trench fill structure (74, 76).

An anisotropic etch process can be performed to transfer the pattern of the openings in the patterned photoresist layer 217 through the optional single crystalline semiconductor layer 9' and through the continuous source-level material layer 110. Source isolation trenches 211 can be formed in each volume from which materials of the optional single crystalline semiconductor layer 9' and through the continuous source-level material layer 110 are etched. In one embodiment, horizontal surfaces of most proximal insulating layers 32 of the alternating stacks {(132, 146), (23,2 246)} can be physically exposed at the bottom of each source isolation trench 211. In one embodiment, an entirety of an end surface of a backside trench fill structure (74, 76) may be physically exposed and/or vertically recessed underneath each source isolation trench 211. The single crystalline semiconductor layer 9', if present, can be divided into a plurality of single crystalline semiconductor strips 9S.

Generally, the continuous source-level material layers 110 is divided into a plurality of source-level material layer portions (110A, 110B, 110C) by forming the source isolation trenches 211 through the continuous source-level material layers 110. The backside trenches 79 comprise first backside trenches 79 (which are filled with first backside trench fill structures (74, 76)) that are covered by a respective layer stack of source-level material layers 110 and second backside trenches 79 (which are filled with second (e.g., dummy) backside trench fill structures (74D, 76D)) that underlie a respective one of the source isolation trenches 211. In other words, the first backside trenches 79 are covered by respective source-level material layers 110, and each of the second backside trenches 79 is exposed underneath a respective one of the source isolation trenches 211 upon formation of the source isolation trenches 211.

In one embodiment, the source isolation trenches 211 may be formed with tapered sidewalls. In this case, each of the source isolation trenches 211 may have a variable width along the second horizontal direction hd2 that increases with a vertical distance from the alternating stack {(132, 146), (232, 246)}. The patterned photoresist layer 217 can be subsequently removed, for example, by ashing.

Figure 61A:
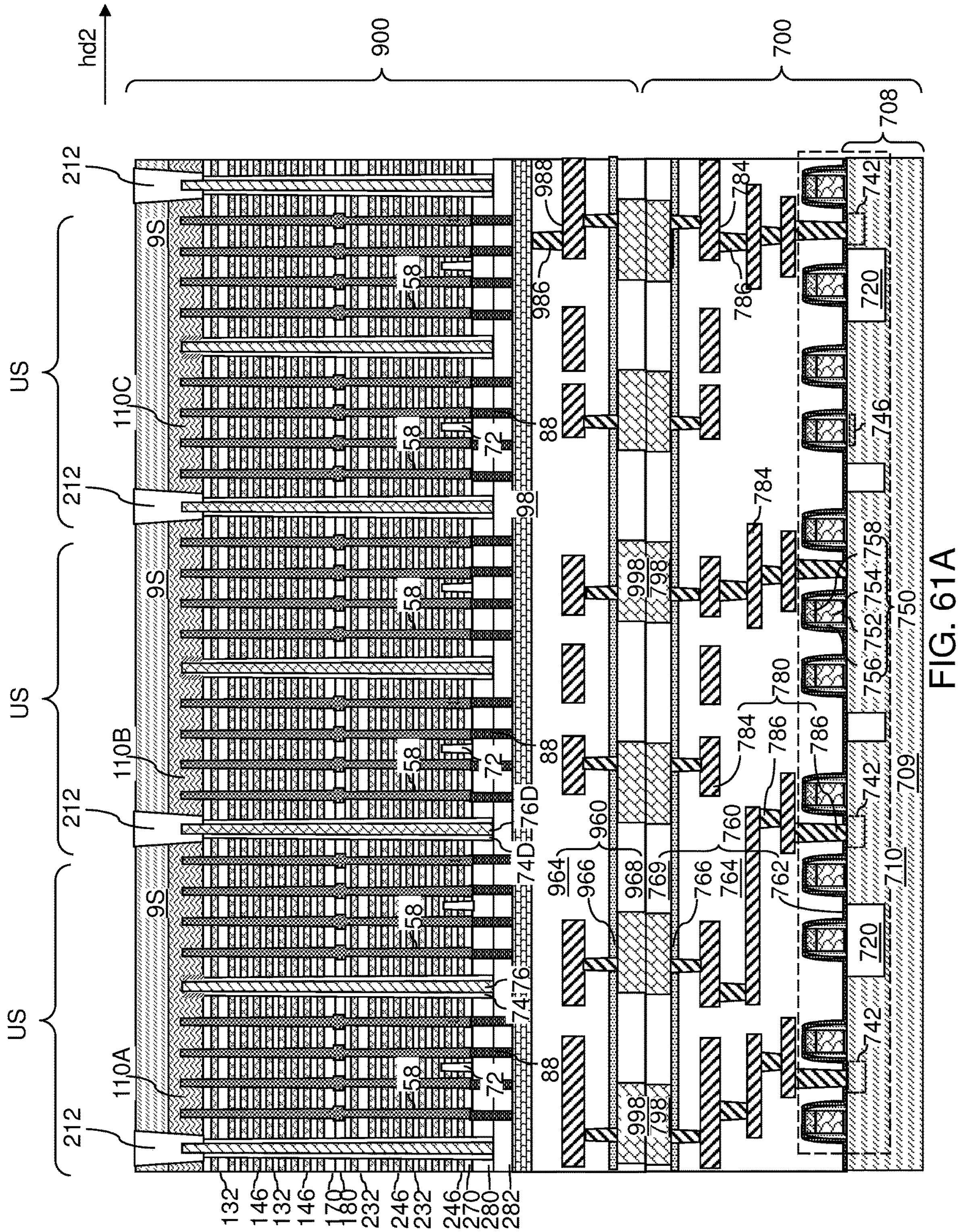
FIG. 61A is a vertical cross-sectional view of the third exemplary structure after formation of source isolation dielectric structures according to the third embodiment of the present disclosure.

Referring to FIG. 61A, at least one dielectric fill material can be deposited in the source isolation trenches 211. A planarization process can be performed to remove portions of the at least one dielectric fill material from above the horizontal plane including the top surfaces (backside surfaces) of the source-level dielectric material layers 110. The planarization process may comprise, for example, a recess etch process and/or a chemical mechanical polishing process. Each remaining portion of the at least one dielectric fill material filling a respective source isolation trench 211 constitutes a source isolation dielectric structure 212. In one embodiment, the source isolation dielectric structure 212 has a variable width along the second horizontal direction hd2 that increases with a vertical distance from the alternating stack {(132, 146), (232, 246)}. The source isolation dielectric structure 212 can comprise silicon oxide, silicon nitride, silicon oxynitride, silicon carbonitride (SiCN), silicon oxycarbide (SiOC) or a dielectric metal oxide, such as aluminum oxide, hafnium oxide, tantalum oxide, etc.

The third exemplary structure comprises multiple instances of a unit structure US that laterally extends along a first horizontal direction hd1 and repeated along a second horizontal direction hd2 that is perpendicular to the first horizontal direction hd1. Each instance of the unit structure US comprises: a source layer (112, 114, 116) comprising at least one doped semiconductor material; a source isolation dielectric structure 212 contacting a first sidewall of the source layer (112, 114, 116) and laterally extending along the first horizontal direction hd1; alternating stacks {(132, 146), (232, 246)} of insulating layers (132, 232) and electrically conductive layers (146, 246) located over the source layer (112, 114, 116) and laterally spaced apart from each other along the second horizontal direction hd2 by at least one first backside trench 79 that is filled with a respective first backside trench fill structure (74, 76) that comprises a respective backside contact via structure 76 contacting a respective recessed surface segment of the source layer (112, 114, 116); memory openings 49 vertically extending through a respective one of the alternating stacks {(132, 146), (232, 246)}; memory opening fill structures 58 located in the memory openings 49 and comprising a respective vertical stack of memory elements (which may comprise portions of memory films 50 located at levels of the electrically conductive layers (146, 246)) and a respective vertical semiconductor channel 60; and a second backside trench fill structure (74D, 76D) contacting a top surface of the source isolation dielectric structure 212 and located in a second backside trench 79 located between an outermost alternating stack among the alternating stacks {(132, 146), (232, 246)} and a neighboring instance of the unit structure US.

Within each instance of the unit structure US, the source layer portion 110A is electrically isolated from another source layer portion 110B in a neighboring instance of the unit structure US by the source isolation dielectric structure 212. The source layer (112, 114, 116) comprises a second sidewall that contacts another source isolation dielectric structure 212 within a neighboring instance of the unit structure US.

In one embodiment, the backside trenches 79 comprise multiple repetitions of a unit pattern including at least one first backside trench 79 and a second backside trench 79 that are repeated along a second horizontal direction hd2. In one embodiment, each instance of the unit structure US comprises a plurality contact-level dielectric layers 280 overlying a respective one of the alternating stacks {(132, 146), (232, 246)} and a respective subset of the memory opening fill structures 58 and having a respective top surface located within a horizontal plane including each top surface of the at least one backside contact via structure 76.

The third exemplary structure comprises a memory device. In one embodiment, the multiple instances of the unit structure US are located in a memory die 900, and the memory device further comprises a logic die 700 that is bonded to the memory die 900. The logic die 700 comprises a peripheral circuitry 710 that is electrically connected to the electrically conductive layers (146, 246) and the bit lines 98 in each instance of the unit structure US through logic-side metal interconnect structures located in the logic die 700, and logic-side bonding pads 798 located in the logic die 700. The memory device comprises memory-side bonding pads 998 located in the memory die 900, and memory-side metal interconnect structures 980 overlying the multiple instances of the unit structure US and located in the memory die 900.

Figure 61B:
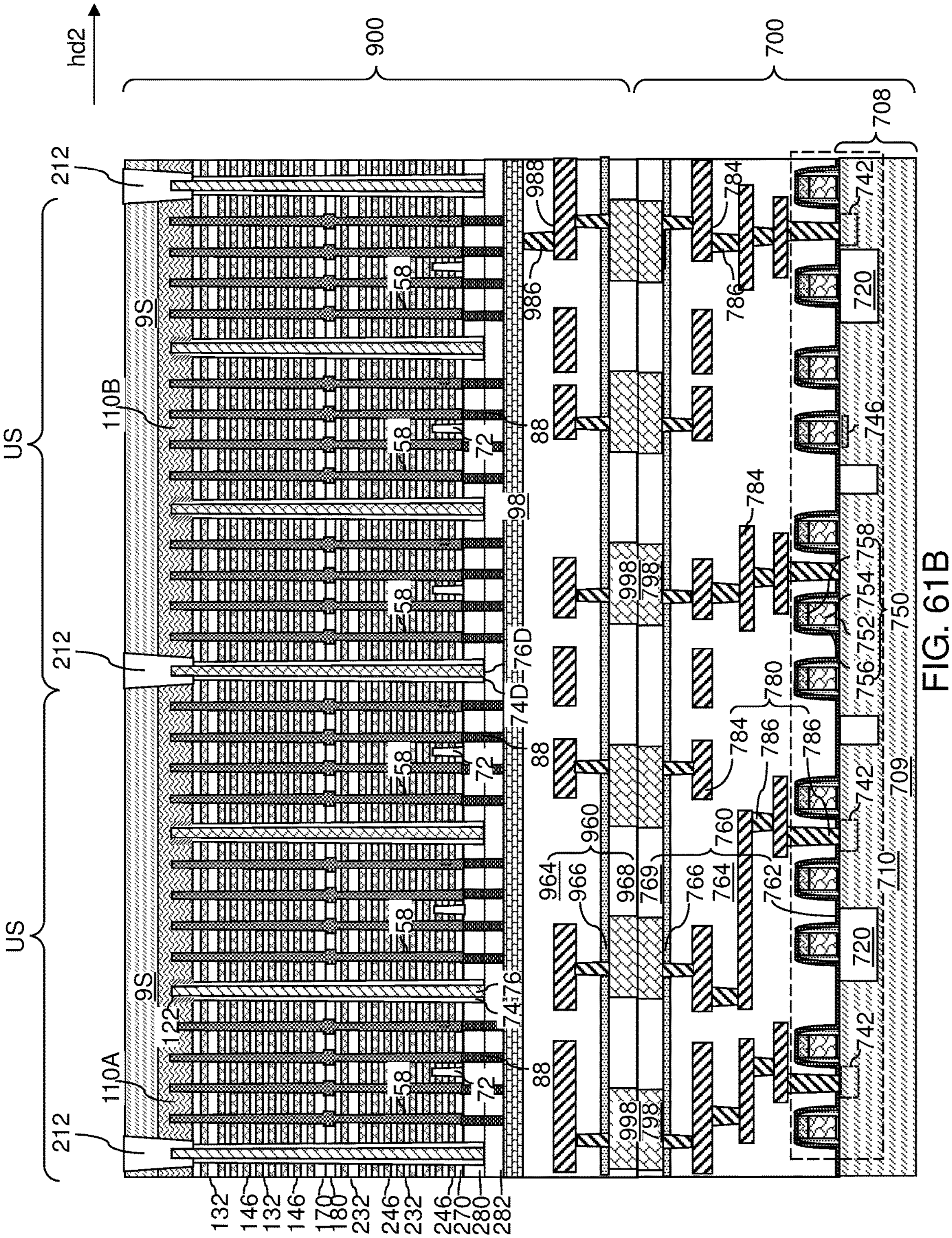
FIG. 61B is a vertical cross-sectional view of a first alternative embodiment of the third exemplary structure at the processing steps of FIG. 61A.

Referring to FIG. 61B, a first alternative embodiment of the third exemplary structure can be derived from the third exemplary structure described above by changing the pattern of the source isolation dielectric structures 212. Generally, each instance of the unit structure US comprises at least one first backside trench 79 and a second backside trench 79. In one embodiment, the at least one first backside trench 79 comprises a plurality of first backside trenches 79 containing a plurality of backside contact via structures 76 therein; and the source layer (112, 114, 116) in each instance of the unit structure US contacts each of the plurality of backside contact via structures 76. In the illustrated example of FIG. 61B, each instance of the unit structure US includes three alternating stacks of insulating layers (132, 232) and electrically conductive layers (146, 246), two first backside trench fill structures (74, 76) including two backside contact via structures 76 in direct contact with a source contact layer 114 within a source layer (112, 114, 116), and one dummy backside trench fill structure (74D, 76D) including a dummy backside contact via structure 76D that is electrically isolated from the source layer (112, 114, 116).

Figure 61C:
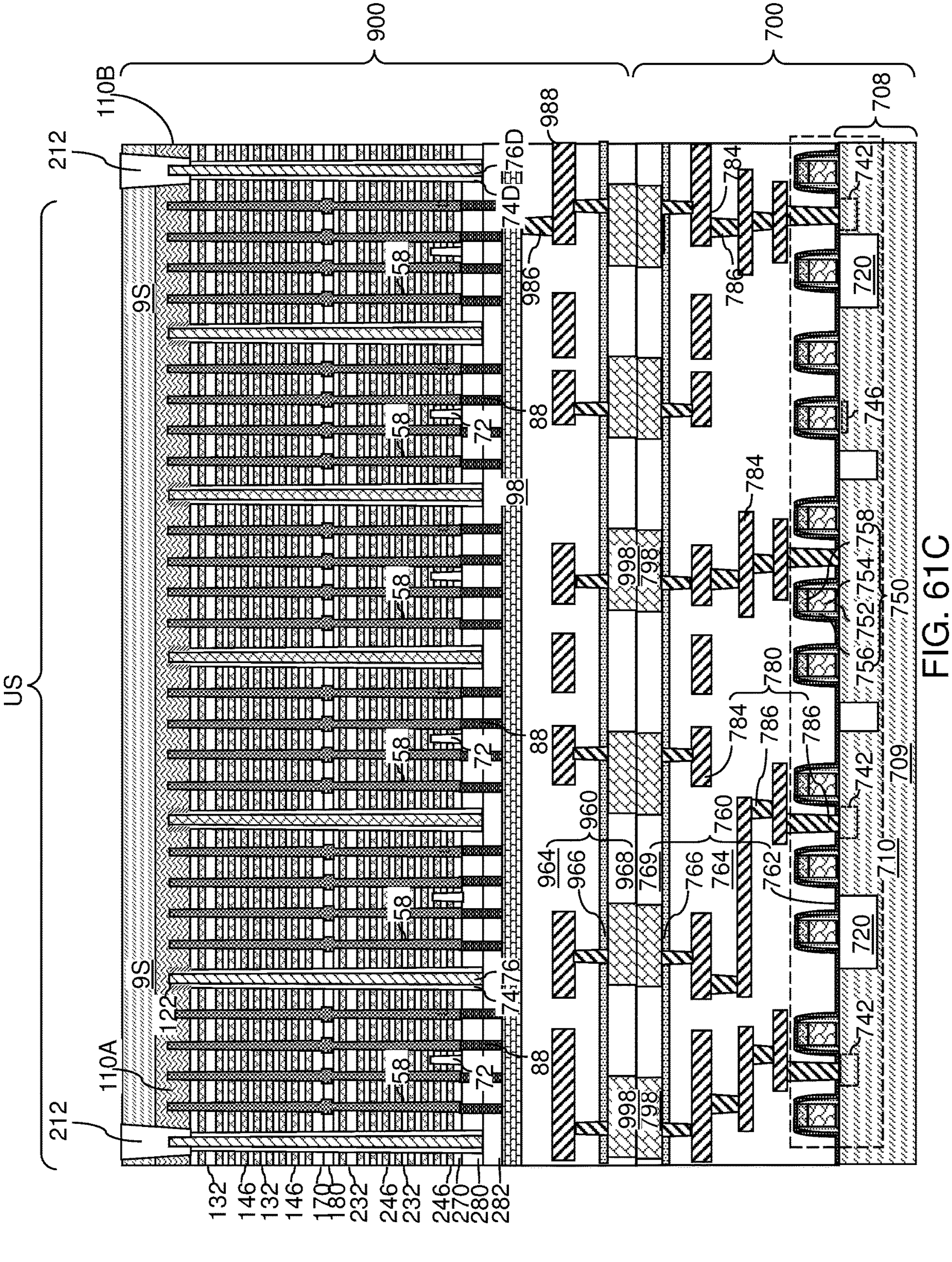
FIG. 61C is a vertical cross-sectional view of a second alternative embodiment of the third exemplary structure at the processing steps of FIG. 61A.

Referring to FIG. 61C, a second alternative embodiment of the third exemplary structure is illustrated. Each instance of the unit structure US includes six alternating stacks of insulating layers (132, 232) and electrically conductive layers (146, 246), five first backside trench fill structures (74, 76) including five backside contact via structures 76 in direct contact with a source contact layer 114 within a source layer (112, 114, 116), and one dummy backside trench fill structure (74D, 76D) including a dummy backside contact via structure 76D that is electrically isolated from the source layer (112, 114, 116).

Generally, the number of first backside trench fill structures (74, 76) within each unit structure may be 1, or any integer greater than 1.

Figure 62:
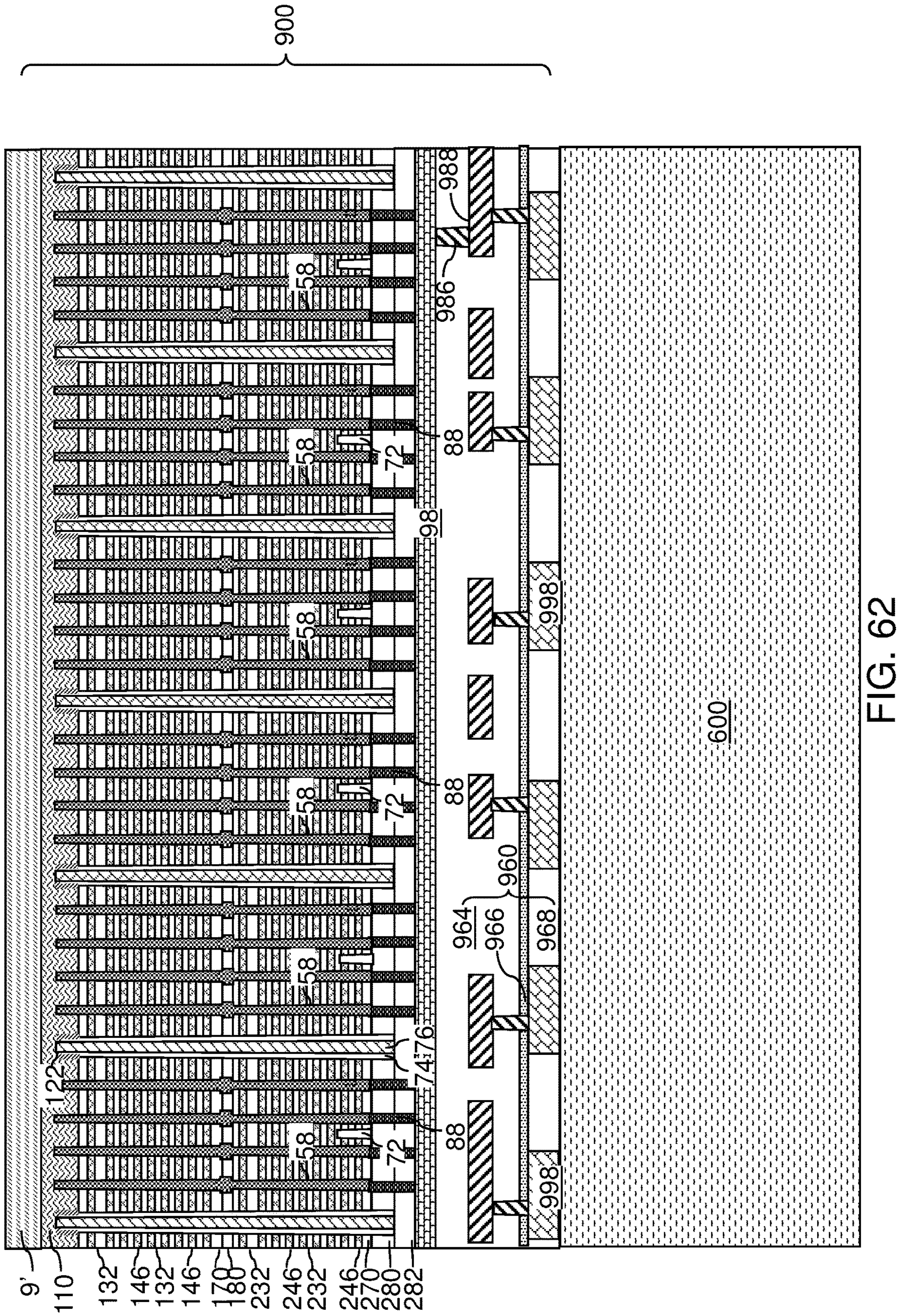
FIG. 62 is a vertical cross-sectional view of a third alternative embodiment of the third exemplary structure after attaching a carrier substrate to the memory die according to the third embodiment of the present disclosure.

Referring to FIG. 62, a third alternative embodiment of the third exemplary structure can be derived from the third exemplary structure illustrated in FIG. 57 by attaching a carrier substrate 600 to the memory die 900, and by removing at least a backside portion of the substrate 909 of the memory die 900 by performing the processing steps described with reference to FIG. 59.

Figure 63:
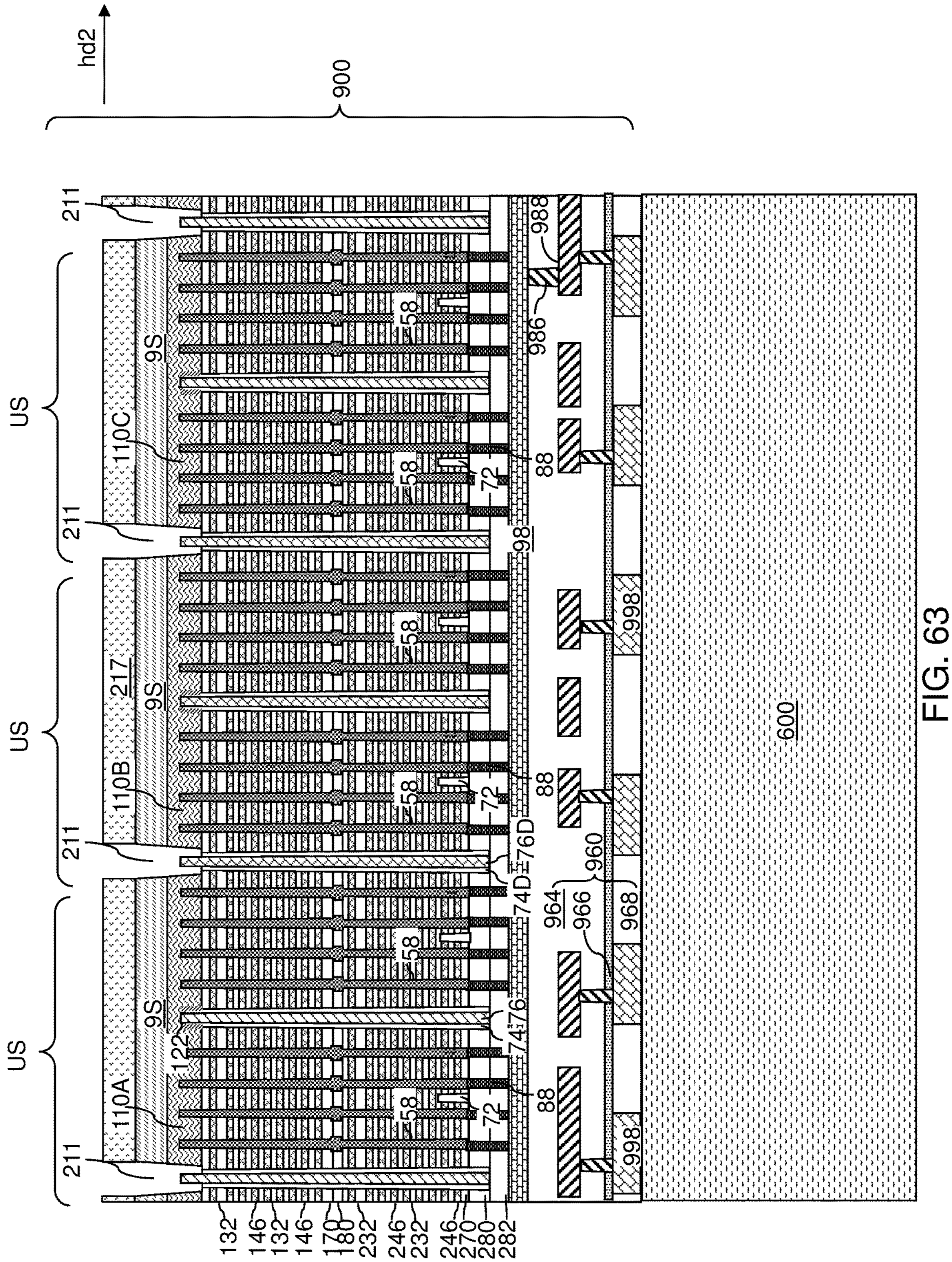
FIG. 63 is a vertical cross-sectional view of the third alternative embodiment of the third exemplary structure after thinning the memory-side substrate and patterning the memory-side substrate and source-level material layers according to the third embodiment of the present disclosure.

Referring to FIG. 63, the processing steps described with reference to FIG. 60 can be performed to form source isolation trenches 211.

Figure 64:
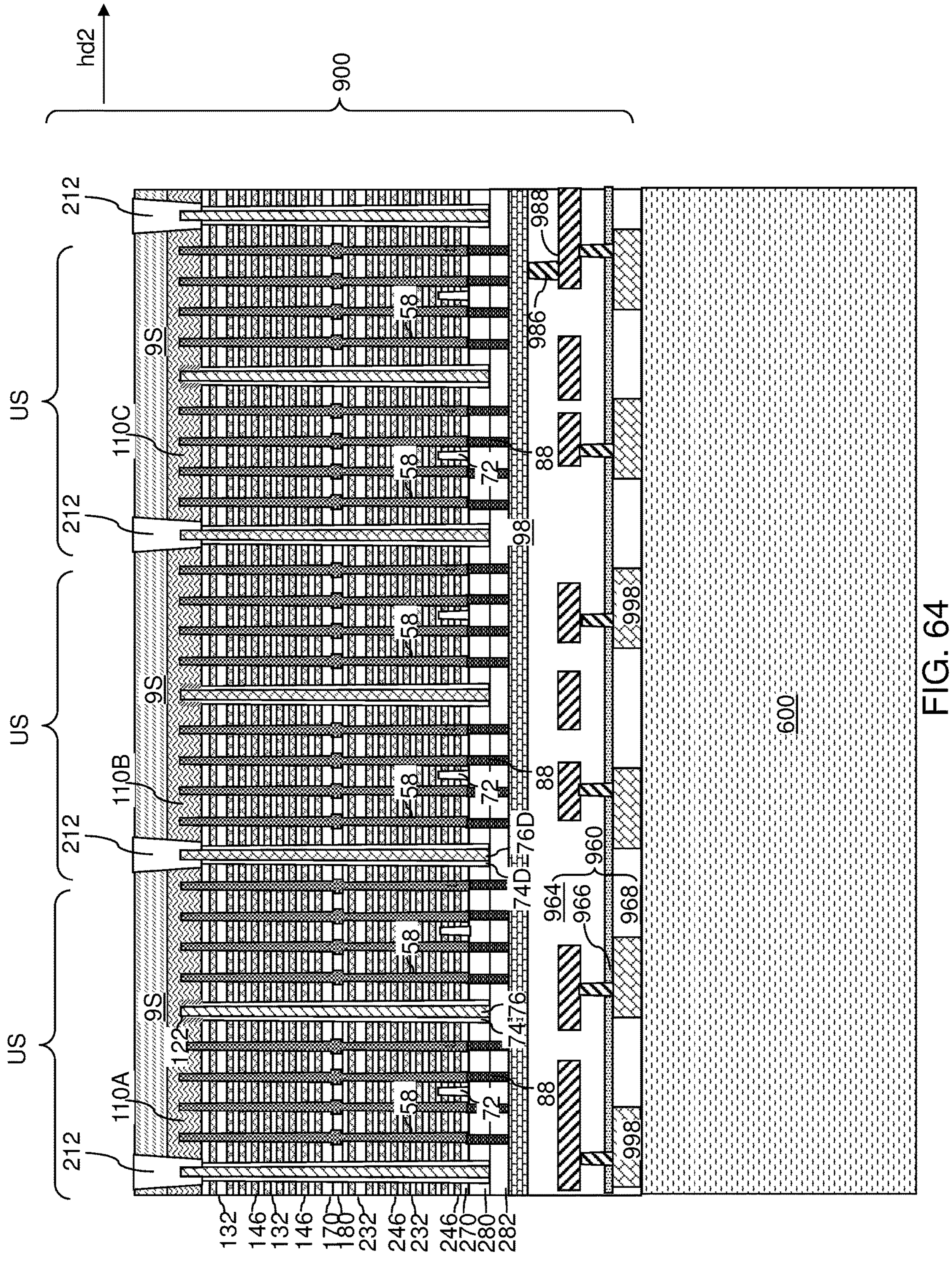
FIG. 64 is a vertical cross-sectional view of the third alternative embodiment of the third exemplary structure after formation of source isolation dielectric structures according to the third embodiment of the present disclosure.

Referring to FIG. 64, the processing steps described with reference to FIGS. 61A-61C can be performed to form source isolation dielectric structures 212 in the source isolation trenches 211.

Figure 65:
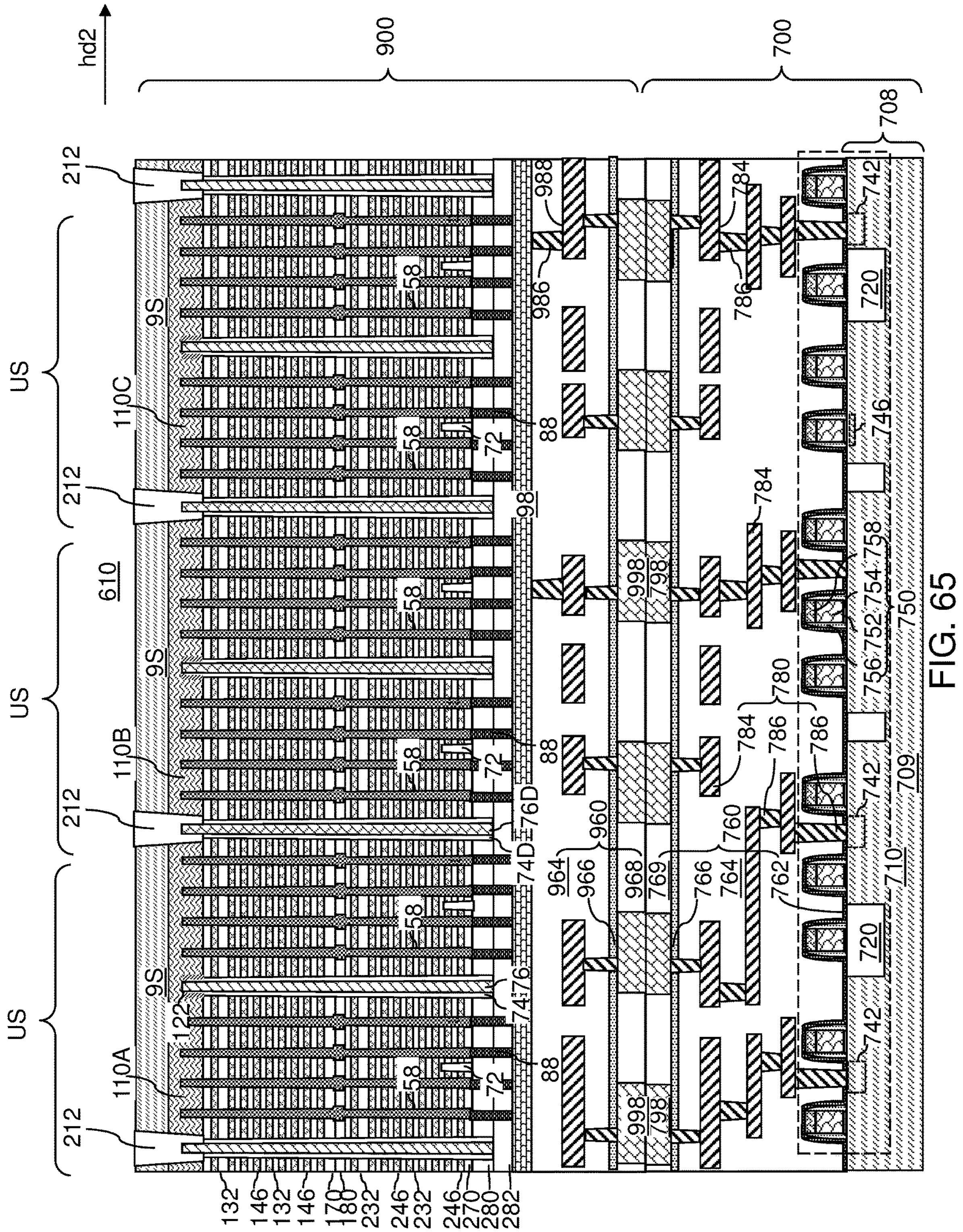
FIG. 65 is a vertical cross-sectional view of the third alternative embodiment of the third exemplary structure after detaching the carrier substrate and bonding a logic die and forming a backside insulating layer and backside contact via structures according to the third embodiment of the present disclosure.

Referring to FIG. 65, the carrier substrate 600 may be detached from the memory die 900, and a logic die 700 described above may be bonded to the memory die 900, for example, by inducing metal-to-metal bonding between mating pairs of logic-side bonding pads 798 and memory-side bonding pads 998.

Generally, the source isolation trenches 211 and the source isolation dielectric structures 212 may be formed on a backside of the memory die 900 prior to or after attaching the memory die 900 to the logic die 700.

Referring to FIGS. 23A-65 and related drawings and according to various embodiments of the present disclosure, a memory device comprises a source layer (112, 114, 116) comprising at least one doped semiconductor material, a source isolation dielectric structure (12, 212) laterally extending along a first horizontal direction hd1 and laterally separating the source layer into first source layer portion 110A and a second source layer portion 110B which is electrically isolated from the first source layer portion 110A, alternating stacks {(132, 146), (232, 246)} of insulating layers (132, 232) and electrically conductive layers (146, 246) located over the source layer (112, 114, 116), extending along the first horizontal direction hd1 and laterally spaced apart from each other along a second horizontal direction hd2 by at least one first backside trench 79A that is filled with a respective first backside trench fill structure (74, 76) that comprises a respective first backside contact via structure 76 contacting the source layer (112, 114, 116), and at least one second backside trench 79B that is filled with a respective second backside trench fill structure (74D, 76D) that comprises a respective second dummy backside contact via structure 76D contacting the source isolation dielectric structure (12, 112), memory openings 49, wherein each of the memory openings vertically extends through a respective one of the alternating stacks, and memory opening fill structures 58 located in the memory openings and comprising a respective vertical stack of memory elements (e.g., portions of a memory film 50) and a respective vertical semiconductor channel 60.

In one embodiment, the at least one first backside trench 79A comprises a plurality of first backside trenches 79A containing a plurality of first backside contact via structures 76 therein, and the first source layer portion 110A contacts each of the plurality of first backside contact via structures 79A.

In one embodiment, the source isolation dielectric structure 12 has a variable width along the second horizontal direction that increase with a vertical distance from the alternating stacks. In another embodiment, the source isolation dielectric structure 212 has a variable width along the second horizontal direction that decreases with a vertical distance from the alternating stacks.

In one embodiment, the source layer comprises a lower source-level material layer 112 comprising a first doped semiconductor material, an upper source-level material layer 116 comprising a second doped semiconductor material, and a source contact layer 114 comprising a third doped semiconductor material and located between the upper source-level material layer and the lower source-level material layer. Each of the respective first backside contact via structures 76 contacts a surface the source contact layer 114 located in the first source layer portion 110A or in the second source layer portion 110B. In one embodiment, the source contact layer 114 contacts a sidewall of the vertical semiconductor channels 60. In one embodiment, the respective vertical stack of memory elements comprise a portion respective memory film 50 that laterally surrounds the respective vertical semiconductor channel 60, has a respective annular concave bottom surface contacting the source contact layer, and has a respective cylindrical outer surface contacting the upper source-level material layer and each insulating layer within a respective one of the alternating stacks.

In one embodiment, the first backside trench fill structure further comprises a first backside insulating spacer 74 that laterally surrounds the first backside contact via structure 76, the second backside trench fill structure further comprises a second backside insulating spacer 74D that laterally surrounds the second dummy backside contact via structure 76D, and the second dummy backside contact via structure 76D is electrically isolated from the source layer by the source isolation dielectric structure (12, 212). In one embodiment, a contact area between the source layer (112, 114, 116) and the source isolation dielectric structure (12, 212) vertically extends continuously from a top surface of the source layer to a bottom surface of the source layer.

In one embodiment, the memory device comprises: a semiconductor substrate 8 underlying the source layer (112, 114, 116) and a peripheral circuitry located on the semiconductor substrate 8 and electrically connected to the electrically conductive layers (146, 246).

In one embodiment, the source layer and the alternating stack are located in memory die 900. The memory device further comprises a logic die 700 that is bonded to the memory die 900, wherein the logic die 700 comprises a peripheral circuitry that is electrically connected to the electrically conductive layers (146, 246) through logic-side metal interconnect structures located in the logic die 700, logic-side bonding pads located in the logic die 700, memory-side bonding pads located in the memory die 900, and memory-side metal interconnect structures overlying the multiple instances of the unit structure US and located in the memory die 900.

The various embodiments of the present disclosure provide configurations in which the source layer (112, 114, 116) is separated into electrically isolated portions (110A, 100B, etc.) in different memory blocks. The portions (110A, 110B) in adjacent blocks are electrically isolated from each other by a dielectric trench fill structure 176 or by a source isolation dielectric structure (12, 212). This reduces the probability of read disturb between adjacent memory blocks, since the word lines in unselected blocks are electrically floating. Furthermore, a lower operating current may be used due to the decrease in resistive load due to electrically isolating adjacent memory blocks from each other. Finally, cracks in one block would not render the entire memory plane containing plural blocks inactive, since the blocks in the same plane are electrically isolated from each other.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word “comprise” or “include” contemplates all embodiments in which the word “consist essentially of” or the word “consists of” replaces the word “comprise” or “include,” unless explicitly stated otherwise. Where the third embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

a source layer comprising at least one doped semiconductor material;

a source isolation dielectric structure laterally extending along a first horizontal direction and laterally separating the source layer into first source layer portion and a second source layer portion which is electrically isolated from the first source layer portion;

alternating stacks of insulating layers and electrically conductive layers located over the source layer, extending along the first horizontal direction and laterally spaced apart from each other along a second horizontal direction by at least one first backside trench that is filled with a respective first backside trench fill structure that comprises a respective first backside contact via structure contacting the source layer, and at least one second backside trench that is filled with a respective second backside trench fill structure that comprises a respective second dummy backside contact via structure contacting the source isolation dielectric structure;

memory openings, wherein each of the memory openings vertically extends through a respective one of the alternating stacks; and memory opening fill structures located in the memory openings and comprising a respective vertical stack of memory elements and a respective vertical semiconductor channel, wherein a sidewall of the respective vertical semiconductor channel is in contact with the source layer.

2. The memory device of claim 1, wherein:

the at least one first backside trench comprises a plurality of first backside trenches containing a plurality of first backside contact via structures therein; and the first source layer portion contacts each of the plurality of first backside contact via structures.

3. The memory device of claim 1, wherein the source isolation dielectric structure has a variable width along the second horizontal direction that increase with a vertical distance from the alternating stacks.

4. The memory device of claim 1, wherein the source isolation dielectric structure has a variable width along the second horizontal direction that decreases with a vertical distance from the alternating stacks.

5. The memory device of claim 1, wherein the source layer comprises:

a lower source-level material layer comprising a first doped semiconductor material;

an upper source-level material layer comprising a second doped semiconductor material; and a source contact layer comprising a third doped semiconductor material and located between the upper source-level material layer and the lower source-level material layer.

6. The memory device of claim 5, wherein each of the respective first backside contact via structures contacts a surface the source contact layer located in the first source layer portion or in the second source layer portion.

7. The memory device of claim 5, wherein:

the source contact layer contacts a sidewall of the vertical semiconductor channels; and the respective vertical stack of memory elements comprise a portion of a respective memory film that laterally surrounds the respective vertical semiconductor channel, has a respective annular concave bottom surface contacting the source contact layer, and has a respective cylindrical outer surface contacting the upper source-level material layer and each insulating layer within a respective one of the alternating stacks.

8. The memory device of claim 1, wherein the source isolation dielectric structure comprises silicon oxycarbide or silicon carbonitride.

9. The memory device of claim 1, wherein:

the first backside trench fill structure further comprises a first backside insulating spacer that laterally surrounds the first backside contact via structure;

the second backside trench fill structure further comprises a second backside insulating spacer that laterally surrounds the second dummy backside contact via structure; and the second dummy backside contact via structure is electrically isolated from the source layer by the source isolation dielectric structure.

10. The memory device of claim 1, wherein a contact area between the source layer and the source isolation dielectric structure vertically extends continuously from a top surface of the source layer to a bottom surface of the source layer.

11. The memory device of claim 1, further comprising a plurality contact-level dielectric layers, each overlying a respective one of the alternating stacks and a respective subset of the memory opening fill structures and having a respective top surface located within a horizontal plane including each top surface of the at least one backside contact via structure.

12. The memory device of claim 1, further comprising:

a semiconductor substrate underlying the source layer;

a peripheral circuitry located on the semiconductor substrate and electrically connected to the electrically conductive layers.

13. The memory device of claim 1, wherein the source layer and the alternating stacks are located in a memory die.

14. The memory device of claim 13, further comprising a logic die that is bonded to the memory die, wherein the logic die comprises a peripheral circuitry that is electrically connected to the electrically conductive layers in the memory die through logic-side metal interconnect structures located in the logic die, logic-side bonding pads located in the logic die, memory-side bonding pads located in the memory die, and memory-side metal interconnect structures located in the memory die.

* * * * *